(12) United States Patent
Sorrels et al.

(10) Patent No.: US 7,539,474 B2
(45) Date of Patent: *May 26, 2009

(54) DC OFFSET, RE-RADIATION, AND I/Q SOLUTIONS USING UNIVERSAL FREQUENCY TRANSLATION TECHNOLOGY

(75) Inventors: David F. Sorrels, Jacksonville, FL (US); Michael J. Bultman, Jacksonville, FL (US); Robert W. Cook, Switzerland, FL (US); Jonathan S. Jensen, Salt Lake City, UT (US); Martin R. Johnson, Salt Lake City, UT (US); Richard C. Looke, Jacksonville, FL (US); Charley D Moses, Jr., Jacksonville, FL (US); Gregory S. Rawlins, Lake Mary, FL (US); Michael W. Rawlins, Lake Mary, FL (US); Robert T. Short, Salt Lake City, UT (US); Jamison L. Young, Woods Cross, UT (US)

(73) Assignee: ParkerVision, Inc., Jacksonville, FL (US)

( * ) Notice: Subject to any disclaimer, the term of this patent is extended or adjusted under 35 U.S.C. 154(b) by 645 days.

This patent is subject to a terminal disclaimer.

(21) Appl. No.: 11/059,536

(22) Filed: Feb. 17, 2005

(65) Prior Publication Data

US 2005/0143042 A1 Jun. 30, 2005

Related U.S. Application Data

(63) Continuation of application No. 09/526,041, filed on Mar. 14, 2000, now Pat. No. 6,879,817.

(60) Provisional application No. 60/180,667, filed on Feb. 7, 2000, provisional application No. 60/177,705, filed on Jan. 24, 2000, provisional application No. 60/177,702, filed on Jan. 24, 2000, provisional application No. 60/171,502, filed on Dec. 22, 1999, provisional application No. 60/171,496, filed on Dec. 22, 1999, provisional application No. 60/171,349, filed on Dec. 21, 1999, provisional application No. 60/158,047, filed on Oct. 7, 1999, provisional application No. 60/129,839, filed on Apr. 16, 1999.

(51) Int. Cl.
*H04B 1/10* (2006.01)
*H04Q 7/20* (2006.01)

(52) U.S. Cl. .................. 455/296; 455/207; 455/209; 455/313; 455/323

(58) Field of Classification Search ............... 455/70, 455/118, 207, 209, 296, 307, 313–314, 323, 455/333–334, 337–339; 327/113–116; 329/315, 329/345, 347; 375/324, 328, 340
See application file for complete search history.

(56) References Cited

U.S. PATENT DOCUMENTS 2,057,613 A 10/1936 Gardner (Continued)

FOREIGN PATENT DOCUMENTS

DE 1936252 1/1971

(Continued)

(Continued)

English-language Abstract of Japanese Patent Publication No. JP 58-031622, data supplied by ep.espacenet.com, 1 page (Feb. 24, 1983—Date of publication of application).

(Continued)

*Primary Examiner*—Lee Nguyen
(74) *Attorney, Agent, or Firm*—Sterne, Kessler, Goldstein & Fox P.L.L.C.

(57) ABSTRACT

Methods, systems, and apparatuses for down-converting an electromagnetic (EM) signal by aliasing the EM signal, and applications thereof are described herein. Reducing or eliminating DC offset voltages and re-radiation generated when down-converting an electromagnetic (EM) signal is also described herein. Down-converting a signal and improving receiver dynamic range is also described herein.

21 Claims, 120 Drawing Sheets

U.S. PATENT DOCUMENTS

| | | |
|---|---|---|
| 2,241,078 A | 5/1941 | Vreeland |
| 2,270,385 A | 1/1942 | Skillman |
| 2,283,575 A | 5/1942 | Roberts |
| 2,358,152 A | 9/1944 | Earp |
| 2,410,350 A | 10/1946 | Labin et al. |
| 2,451,430 A | 10/1948 | Barone |
| 2,462,069 A | 2/1949 | Chatterjea et al. |
| 2,462,181 A | 2/1949 | Grosselfinger |
| 2,472,798 A | 6/1949 | Fredendall |
| 2,497,859 A | 2/1950 | Boughtwood et al. |
| 2,499,279 A | 2/1950 | Peterson |
| 2,530,824 A | 11/1950 | King |
| 2,802,208 A | 8/1957 | Hobbs |
| 2,985,875 A | 5/1961 | Grisdale et al. |
| 3,023,309 A | 2/1962 | Foulkes |
| 3,069,679 A | 12/1962 | Sweeney et al. |
| 3,104,393 A | 9/1963 | Vogelman |
| 3,114,106 A | 12/1963 | McManus |
| 3,118,117 A | 1/1964 | King et al. |
| 3,226,643 A | 12/1965 | McNair |
| 3,246,084 A | 4/1966 | Kryter |
| 3,258,694 A | 6/1966 | Shepherd |
| 3,383,598 A | 5/1968 | Sanders |
| 3,384,822 A | 5/1968 | Miyagi |
| 3,454,718 A | 7/1969 | Perreault |
| 3,523,291 A | 8/1970 | Pierret |
| 3,548,342 A | 12/1970 | Maxey |
| 3,555,428 A | 1/1971 | Perreault |
| 3,614,627 A | 10/1971 | Runyan et al. |
| 3,614,630 A | 10/1971 | Rorden |
| 3,617,892 A | 11/1971 | Hawley et al. |
| 3,617,898 A | 11/1971 | Janning, Jr. |
| 3,621,402 A | 11/1971 | Gardner |
| 3,622,885 A | 11/1971 | Oberdorf et al. |
| 3,623,160 A | 11/1971 | Giles et al. |
| 3,626,417 A | 12/1971 | Gilbert |
| 3,629,696 A | 12/1971 | Bartelink |
| 3,641,442 A | 2/1972 | Boucher |
| 3,643,168 A | 2/1972 | Manicki |
| 3,662,268 A | 5/1972 | Gans et al. |
| 3,689,841 A | 9/1972 | Bello et al. |
| 3,694,754 A | 9/1972 | Baltzer |
| 3,702,440 A | 11/1972 | Moore |
| 3,714,577 A | 1/1973 | Hayes |
| 3,715,730 A | 2/1973 | Cerny, Jr. |
| 3,717,844 A | 2/1973 | Barret et al. |
| 3,719,903 A | 3/1973 | Goodson |
| 3,735,048 A | 5/1973 | Tomsa et al. |
| 3,736,513 A | 5/1973 | Wilson |
| 3,737,778 A | 6/1973 | Van Gerwen et al. |
| 3,739,282 A | 6/1973 | Bruch et al. |
| 3,764,921 A | 10/1973 | Huard |
| 3,767,984 A | 10/1973 | Shinoda et al. |
| 3,806,811 A | 4/1974 | Thompson |
| 3,809,821 A | 5/1974 | Melvin |
| 3,852,530 A | 12/1974 | Shen |
| 3,868,601 A | 2/1975 | MacAfee |
| 3,940,697 A | 2/1976 | Morgan |
| 3,949,300 A | 4/1976 | Sadler |
| 3,967,202 A | 6/1976 | Batz |
| 3,980,945 A | 9/1976 | Bickford |
| 3,987,280 A | 10/1976 | Bauer |
| 3,991,277 A | 11/1976 | Hirata |
| 4,003,002 A | 1/1977 | Snijders et al. |
| 4,004,237 A | 1/1977 | Kratzer |
| 4,013,966 A | 3/1977 | Campbell |
| 4,016,366 A | 4/1977 | Kurata |
| 4,017,798 A | 4/1977 | Gordy et al. |
| 4,019,140 A | 4/1977 | Swerdlow |
| 4,032,847 A | 6/1977 | Unkauf |
| 4,035,732 A | 7/1977 | Lohrmann |
| 4,045,740 A | 8/1977 | Baker |
| 4,047,121 A | 9/1977 | Campbell |
| 4,048,598 A | 9/1977 | Knight |
| 4,051,475 A | 9/1977 | Campbell |
| 4,066,841 A | 1/1978 | Young |
| 4,066,919 A | 1/1978 | Huntington |
| 4,080,573 A | 3/1978 | Howell |
| 4,081,748 A | 3/1978 | Batz |
| 4,115,737 A | 9/1978 | Hongu et al. |
| 4,130,765 A | 12/1978 | Arakelian et al. |
| 4,130,806 A | 12/1978 | Van Gerwen et al. |
| 4,132,952 A | 1/1979 | Hongu et al. |
| 4,142,155 A | 2/1979 | Adachi |
| 4,143,322 A | 3/1979 | Shimamura |
| 4,145,659 A | 3/1979 | Wolfram |
| 4,158,149 A | 6/1979 | Otofuji |
| 4,170,764 A | 10/1979 | Salz et al. |
| 4,173,164 A | 11/1979 | Adachi et al. |
| 4,204,171 A | 5/1980 | Sutphin, Jr. |
| 4,210,872 A | 7/1980 | Gregorian |
| 4,220,977 A | 9/1980 | Yamanaka |
| 4,241,451 A | 12/1980 | Maixner et al. |
| 4,245,355 A | 1/1981 | Pascoe et al. |
| 4,250,458 A | 2/1981 | Richmond et al. |
| 4,253,066 A | 2/1981 | Fisher et al. |
| 4,253,067 A | 2/1981 | Caples et al. |
| 4,253,069 A | 2/1981 | Nossek |
| 4,286,283 A | 8/1981 | Clemens |
| 4,308,614 A | 12/1981 | Fisher et al. |
| 4,313,222 A | 1/1982 | Katthän |
| 4,320,361 A | 3/1982 | Kikkert |
| 4,320,536 A | 3/1982 | Dietrich |
| 4,334,324 A | 6/1982 | Hoover |
| 4,346,477 A | 8/1982 | Gordy |
| 4,355,401 A | 10/1982 | Ikoma et al. |
| 4,356,558 A | 10/1982 | Owen et al. |
| 4,360,867 A | 11/1982 | Gonda |
| 4,363,132 A | 12/1982 | Collin |
| 4,363,976 A | 12/1982 | Minor |
| 4,365,217 A | 12/1982 | Berger et al. |
| 4,369,522 A | 1/1983 | Cerny, Jr. et al. |
| 4,370,572 A | 1/1983 | Cosand et al. |
| 4,380,828 A | 4/1983 | Moon |
| 4,384,357 A | 5/1983 | deBuda et al. |
| 4,389,579 A | 6/1983 | Stein |
| 4,392,255 A | 7/1983 | Del Giudice |
| 4,393,352 A | 7/1983 | Volpe et al. |
| 4,393,395 A | 7/1983 | Hacke et al. |
| 4,405,835 A | 9/1983 | Jansen et al. |
| 4,409,877 A | 10/1983 | Budelman |
| 4,430,629 A | 2/1984 | Betzl et al. |
| 4,439,787 A | 3/1984 | Mogi et al. |
| 4,441,080 A | 4/1984 | Saari |
| 4,446,438 A | 5/1984 | Chang et al. |
| 4,456,990 A | 6/1984 | Fisher et al. |
| 4,463,320 A | 7/1984 | Dawson |
| 4,470,145 A | 9/1984 | Williams |
| 4,472,785 A | 9/1984 | Kasuga |
| 4,479,226 A | 10/1984 | Prabhu et al. |
| 4,481,490 A | 11/1984 | Huntley |
| 4,481,642 A | 11/1984 | Hanson |
| 4,483,017 A | 11/1984 | Hampel et al. |
| 4,484,143 A | 11/1984 | French et al. |
| 4,485,347 A | 11/1984 | Hirasawa et al. |
| 4,485,488 A | 11/1984 | Houdart |
| 4,488,119 A | 12/1984 | Marshall |
| 4,504,803 A | 3/1985 | Lee et al. |
| 4,510,467 A | 4/1985 | Chang et al. |
| 4,517,519 A | 5/1985 | Mukaiyama |
| 4,517,520 A | 5/1985 | Ogawa |
| 4,518,935 A | 5/1985 | van Roermund |
| 4,521,892 A | 6/1985 | Vance et al. |
| 4,562,414 A | 12/1985 | Linder et al. |

| Patent | Date | Inventor |
|---|---|---|
| 4,563,773 A | 1/1986 | Dixon, Jr. et al. |
| 4,577,157 A | 3/1986 | Reed |
| 4,583,239 A | 4/1986 | Vance |
| 4,591,736 A | 5/1986 | Hirao et al. |
| 4,591,930 A | 5/1986 | Baumeister |
| 4,596,046 A | 6/1986 | Richardson et al. |
| 4,602,220 A | 7/1986 | Kurihara |
| 4,603,300 A | 7/1986 | Welles, II et al. |
| 4,612,464 A | 9/1986 | Ishikawa et al. |
| 4,612,518 A | 9/1986 | Gans et al. |
| 4,616,191 A | 10/1986 | Galani et al. |
| 4,621,217 A | 11/1986 | Saxe et al. |
| 4,628,517 A | 12/1986 | Schwarz et al. |
| 4,633,510 A | 12/1986 | Suzuki et al. |
| 4,634,998 A | 1/1987 | Crawford |
| 4,648,021 A | 3/1987 | Alberkrack |
| 4,651,034 A | 3/1987 | Sato |
| 4,651,210 A | 3/1987 | Olson |
| 4,653,117 A | 3/1987 | Heck |
| 4,660,164 A | 4/1987 | Leibowitz |
| 4,663,744 A | 5/1987 | Russell et al. |
| 4,675,882 A | 6/1987 | Lillie et al. |
| 4,688,237 A | 8/1987 | Brault |
| 4,688,253 A | 8/1987 | Gumm |
| 4,716,376 A | 12/1987 | Daudelin |
| 4,716,388 A | 12/1987 | Jacobs |
| 4,718,113 A | 1/1988 | Rother et al. |
| 4,726,041 A | 2/1988 | Prohaska et al. |
| 4,733,403 A | 3/1988 | Simone |
| 4,734,591 A | 3/1988 | Ichitsubo |
| 4,737,969 A | 4/1988 | Steel et al. |
| 4,740,675 A | 4/1988 | Brosnan et al. |
| 4,740,792 A | 4/1988 | Sagey et al. |
| 4,743,858 A | 5/1988 | Everard |
| 4,745,463 A | 5/1988 | Lu |
| 4,751,468 A | 6/1988 | Agoston |
| 4,757,538 A | 7/1988 | Zink |
| 4,761,798 A | 8/1988 | Griswold, Jr. et al. |
| 4,768,187 A | 8/1988 | Marshall |
| 4,769,612 A | 9/1988 | Tamakoshi et al. |
| 4,771,265 A | 9/1988 | Okui et al. |
| 4,772,853 A | 9/1988 | Hart |
| 4,785,463 A | 11/1988 | Janc et al. |
| 4,789,837 A | 12/1988 | Ridgers |
| 4,791,584 A | 12/1988 | Greivenkamp, Jr. |
| 4,801,823 A | 1/1989 | Yokoyama |
| 4,806,790 A | 2/1989 | Sone |
| 4,810,904 A | 3/1989 | Crawford |
| 4,810,976 A | 3/1989 | Cowley et al. |
| 4,811,362 A | 3/1989 | Yester, Jr. et al. |
| 4,811,422 A | 3/1989 | Kahn |
| 4,814,649 A | 3/1989 | Young |
| 4,816,704 A | 3/1989 | Fiori, Jr. |
| 4,819,252 A | 4/1989 | Christopher |
| 4,833,445 A | 5/1989 | Buchele |
| 4,841,265 A | 6/1989 | Watanabe et al. |
| 4,845,389 A | 7/1989 | Pyndiah et al. |
| 4,855,894 A | 8/1989 | Asahi et al. |
| 4,857,928 A | 8/1989 | Gailus et al. |
| 4,862,121 A | 8/1989 | Hochschild et al. |
| 4,866,441 A | 9/1989 | Conway et al. |
| 4,868,654 A | 9/1989 | Juri et al. |
| 4,870,659 A | 9/1989 | Oishi et al. |
| 4,871,987 A | 10/1989 | Kawase |
| 4,873,492 A | 10/1989 | Myer |
| 4,885,587 A | 12/1989 | Wiegand et al. |
| 4,885,671 A | 12/1989 | Peil |
| 4,885,756 A | 12/1989 | Fontanes et al. |
| 4,888,557 A | 12/1989 | Puckette, IV et al. |
| 4,890,302 A | 12/1989 | Muilwijk |
| 4,893,316 A | 1/1990 | Janc et al. |
| 4,893,341 A | 1/1990 | Gehring |
| 4,894,766 A | 1/1990 | De Agro |
| 4,896,152 A | 1/1990 | Tiemann |
| 4,902,979 A | 2/1990 | Puckette, IV |
| 4,908,579 A | 3/1990 | Tawfik et al. |
| 4,910,752 A | 3/1990 | Yester, Jr. et al. |
| 4,914,405 A | 4/1990 | Wells |
| 4,920,510 A | 4/1990 | Senderowicz et al. |
| 4,922,452 A | 5/1990 | Larsen et al. |
| 4,931,716 A | 6/1990 | Jovanovic et al. |
| 4,931,921 A | 6/1990 | Anderson |
| 4,943,974 A | 7/1990 | Motamedi |
| 4,944,025 A | 7/1990 | Gehring et al. |
| 4,955,079 A | 9/1990 | Connerney et al. |
| 4,965,467 A | 10/1990 | Bilterijst |
| 4,967,160 A | 10/1990 | Quievy et al. |
| 4,970,703 A | 11/1990 | Hariharan et al. |
| 4,972,436 A | 11/1990 | Halim et al. |
| 4,982,353 A | 1/1991 | Jacob et al. |
| 4,984,077 A | 1/1991 | Uchida |
| 4,995,055 A | 2/1991 | Weinberger et al. |
| 5,003,621 A | 3/1991 | Gailus |
| 5,005,169 A | 4/1991 | Bronder et al. |
| 5,006,810 A | 4/1991 | Popescu |
| 5,006,854 A | 4/1991 | White et al. |
| 5,010,585 A | 4/1991 | Garcia |
| 5,012,245 A | 4/1991 | Scott et al. |
| 5,014,130 A | 5/1991 | Heister et al. |
| 5,014,304 A | 5/1991 | Nicollini et al. |
| 5,015,963 A | 5/1991 | Sutton |
| 5,016,242 A | 5/1991 | Tang |
| 5,017,924 A | 5/1991 | Guiberteau et al. |
| 5,020,149 A | 5/1991 | Hemmie |
| 5,020,154 A | 5/1991 | Zierhut |
| 5,052,050 A | 9/1991 | Collier et al. |
| 5,058,107 A | 10/1991 | Stone et al. |
| 5,062,122 A | 10/1991 | Pham et al. |
| 5,063,387 A | 11/1991 | Mower |
| 5,065,409 A | 11/1991 | Hughes et al. |
| 5,083,050 A | 1/1992 | Vasile |
| 5,091,921 A | 2/1992 | Minami |
| 5,095,533 A | 3/1992 | Loper et al. |
| 5,095,536 A | 3/1992 | Loper |
| 5,111,152 A | 5/1992 | Makino |
| 5,113,094 A | 5/1992 | Grace et al. |
| 5,113,129 A | 5/1992 | Hughes |
| 5,115,409 A | 5/1992 | Stepp |
| 5,122,765 A | 6/1992 | Pataut |
| 5,124,592 A | 6/1992 | Hagino |
| 5,126,682 A | 6/1992 | Weinberg et al. |
| 5,131,014 A | 7/1992 | White |
| 5,136,267 A | 8/1992 | Cabot |
| 5,140,699 A | 8/1992 | Kozak |
| 5,140,705 A | 8/1992 | Kosuga |
| 5,150,124 A | 9/1992 | Moore et al. |
| 5,151,661 A | 9/1992 | Caldwell et al. |
| 5,157,687 A | 10/1992 | Tymes |
| 5,159,710 A | 10/1992 | Cusdin |
| 5,164,985 A | 11/1992 | Nysen et al. |
| 5,170,414 A | 12/1992 | Silvian |
| 5,172,019 A | 12/1992 | Naylor et al. |
| 5,172,070 A | 12/1992 | Hiraiwa et al. |
| 5,179,731 A | 1/1993 | Tränkle et al. |
| 5,191,459 A | 3/1993 | Thompson et al. |
| 5,196,806 A | 3/1993 | Ichihara |
| 5,204,642 A | 4/1993 | Asghar et al. |
| 5,212,827 A | 5/1993 | Meszko et al. |
| 5,214,787 A | 5/1993 | Karkota, Jr. |
| 5,218,562 A | 6/1993 | Basehore et al. |
| 5,220,583 A | 6/1993 | Solomon |
| 5,220,680 A | 6/1993 | Lee |
| 5,222,144 A | 6/1993 | Whikehart |
| 5,230,097 A | 7/1993 | Currie et al. |
| 5,239,496 A | 8/1993 | Vancraeynest |
| 5,239,686 A | 8/1993 | Downey |

| | | |
|---|---|---|
| 5,239,687 A | 8/1993 | Chen |
| 5,241,561 A | 8/1993 | Barnard |
| 5,249,203 A | 9/1993 | Loper |
| 5,251,218 A | 10/1993 | Stone et al. |
| 5,251,232 A | 10/1993 | Nonami |
| 5,260,970 A | 11/1993 | Henry et al. |
| 5,260,973 A | 11/1993 | Watanabe |
| 5,263,194 A | 11/1993 | Ragan |
| 5,263,196 A | 11/1993 | Jasper |
| 5,263,198 A | 11/1993 | Geddes et al. |
| 5,267,023 A | 11/1993 | Kawasaki |
| 5,278,826 A | 1/1994 | Murphy et al. |
| 5,282,023 A | 1/1994 | Scarpa |
| 5,282,222 A | 1/1994 | Fattouche et al. |
| 5,287,516 A | 2/1994 | Schaub |
| 5,293,398 A | 3/1994 | Hamao et al. |
| 5,303,417 A | 4/1994 | Laws |
| 5,307,517 A | 4/1994 | Rich |
| 5,315,583 A | 5/1994 | Murphy et al. |
| 5,319,799 A | 6/1994 | Morita |
| 5,321,852 A | 6/1994 | Seong |
| 5,325,204 A | 6/1994 | Scarpa |
| 5,337,014 A | 8/1994 | Najle et al. |
| 5,339,054 A | 8/1994 | Taguchi |
| 5,339,395 A | 8/1994 | Pickett et al. |
| 5,339,459 A | 8/1994 | Schiltz et al. |
| 5,345,239 A | 9/1994 | Madni et al. |
| 5,353,306 A | 10/1994 | Yamamoto |
| 5,355,114 A | 10/1994 | Sutterlin et al. |
| 5,361,408 A | 11/1994 | Watanabe et al. |
| 5,369,404 A | 11/1994 | Galton |
| 5,369,789 A | 11/1994 | Kosugi et al. |
| 5,369,800 A | 11/1994 | Takagi et al. |
| 5,375,146 A | 12/1994 | Chalmers |
| 5,379,040 A | 1/1995 | Mizomoto et al. |
| 5,379,141 A | 1/1995 | Thompson et al. |
| 5,388,063 A | 2/1995 | Takatori et al. |
| 5,389,839 A | 2/1995 | Heck |
| 5,390,215 A | 2/1995 | Antia et al. |
| 5,390,364 A | 2/1995 | Webster et al. |
| 5,400,084 A | 3/1995 | Scarpa |
| 5,404,127 A | 4/1995 | Lee et al. |
| 5,410,195 A | 4/1995 | Ichihara |
| 5,410,270 A | 4/1995 | Rybicki et al. |
| 5,410,541 A | 4/1995 | Hotto |
| 5,410,743 A | 4/1995 | Seely et al. |
| 5,412,352 A | 5/1995 | Graham |
| 5,416,449 A | 5/1995 | Joshi |
| 5,416,803 A | 5/1995 | Janer |
| 5,422,909 A | 6/1995 | Love et al. |
| 5,422,913 A | 6/1995 | Wilkinson |
| 5,423,082 A | 6/1995 | Cygan et al. |
| 5,428,638 A | 6/1995 | Cioffi et al. |
| 5,428,640 A | 6/1995 | Townley |
| 5,434,546 A | 7/1995 | Palmer |
| 5,438,329 A | 8/1995 | Gastouniotis et al. |
| 5,438,692 A | 8/1995 | Mohindra |
| 5,440,311 A | 8/1995 | Gallagher et al. |
| 5,444,415 A | 8/1995 | Dent et al. |
| 5,444,416 A | 8/1995 | Ishikawa et al. |
| 5,444,865 A | 8/1995 | Heck et al. |
| 5,446,421 A | 8/1995 | Kechkaylo |
| 5,446,422 A | 8/1995 | Mattila et al. |
| 5,448,602 A | 9/1995 | Ohmori et al. |
| 5,451,899 A | 9/1995 | Lawton |
| 5,454,007 A | 9/1995 | Dutta |
| 5,454,009 A | 9/1995 | Fruit et al. |
| 5,461,646 A | 10/1995 | Anvari |
| 5,463,356 A | 10/1995 | Palmer |
| 5,463,357 A | 10/1995 | Hobden |
| 5,465,071 A | 11/1995 | Kobayashi et al. |
| 5,465,410 A | 11/1995 | Hiben et al. |
| 5,465,415 A | 11/1995 | Bien |
| 5,465,418 A | 11/1995 | Zhou et al. |
| 5,471,162 A | 11/1995 | McEwan |
| 5,471,665 A | 11/1995 | Pace et al. |
| 5,479,120 A | 12/1995 | McEwan |
| 5,479,447 A | 12/1995 | Chow et al. |
| 5,481,570 A | 1/1996 | Winters |
| 5,483,193 A | 1/1996 | Kennedy et al. |
| 5,483,245 A | 1/1996 | Ruinet |
| 5,483,549 A | 1/1996 | Weinberg et al. |
| 5,483,600 A | 1/1996 | Werrbach |
| 5,483,691 A | 1/1996 | Heck et al. |
| 5,483,695 A | 1/1996 | Pardoen |
| 5,490,173 A | 2/1996 | Whikehart et al. |
| 5,490,176 A | 2/1996 | Peltier |
| 5,493,581 A | 2/1996 | Young et al. |
| 5,493,721 A | 2/1996 | Reis |
| 5,495,200 A | 2/1996 | Kwan et al. |
| 5,495,202 A | 2/1996 | Hsu |
| 5,495,500 A | 2/1996 | Jovanovich et al. |
| 5,499,267 A | 3/1996 | Ohe et al. |
| 5,500,758 A | 3/1996 | Thompson et al. |
| 5,512,946 A | 4/1996 | Murata et al. |
| 5,513,389 A | 4/1996 | Reeser et al. |
| 5,515,014 A | 5/1996 | Troutman |
| 5,517,688 A | 5/1996 | Fajen et al. |
| 5,519,890 A | 5/1996 | Pinckley |
| 5,523,719 A | 6/1996 | Longo et al. |
| 5,523,726 A | 6/1996 | Kroeger et al. |
| 5,523,760 A | 6/1996 | McEwan |
| 5,535,402 A | 7/1996 | Leibowitz et al. |
| 5,539,770 A | 7/1996 | Ishigaki |
| 5,551,076 A | 8/1996 | Bonn |
| 5,552,789 A | 9/1996 | Schuermann |
| 5,555,453 A | 9/1996 | Kajimoto et al. |
| 5,557,641 A | 9/1996 | Weinberg |
| 5,557,642 A | 9/1996 | Williams |
| 5,559,809 A | 9/1996 | Jeon et al. |
| 5,563,550 A | 10/1996 | Toth |
| 5,564,097 A | 10/1996 | Swanke |
| 5,574,755 A | 11/1996 | Persico |
| 5,579,341 A | 11/1996 | Smith et al. |
| 5,579,347 A | 11/1996 | Lindquist et al. |
| 5,584,068 A | 12/1996 | Mohindra |
| 5,589,793 A | 12/1996 | Kassapian |
| 5,592,131 A | 1/1997 | Labreche et al. |
| 5,600,680 A | 2/1997 | Mishima et al. |
| 5,602,847 A | 2/1997 | Pagano et al. |
| 5,602,868 A | 2/1997 | Wilson |
| 5,604,592 A | 2/1997 | Kotidis et al. |
| 5,604,732 A | 2/1997 | Kim et al. |
| 5,606,731 A | 2/1997 | Pace et al. |
| 5,608,531 A | 3/1997 | Honda et al. |
| 5,610,946 A | 3/1997 | Tanaka et al. |
| RE35,494 E | 4/1997 | Nicollini |
| 5,617,451 A | 4/1997 | Mimura et al. |
| 5,619,538 A | 4/1997 | Sempel et al. |
| 5,621,455 A | 4/1997 | Rogers et al. |
| 5,628,055 A | 5/1997 | Stein |
| 5,630,227 A | 5/1997 | Bella et al. |
| 5,633,610 A | 5/1997 | Maekawa et al. |
| 5,633,815 A | 5/1997 | Young |
| 5,634,207 A | 5/1997 | Yamaji et al. |
| 5,636,140 A | 6/1997 | Lee et al. |
| 5,638,396 A | 6/1997 | Klimek |
| 5,640,415 A | 6/1997 | Pandula |
| 5,640,424 A | 6/1997 | Banavong et al. |
| 5,640,428 A | 6/1997 | Abe et al. |
| 5,640,698 A | 6/1997 | Shen et al. |
| 5,642,071 A | 6/1997 | Sevenhans et al. |
| 5,648,985 A | 7/1997 | Bjerede et al. |
| 5,650,785 A | 7/1997 | Rodal |
| 5,659,372 A | 8/1997 | Patel et al. |
| 5,661,424 A | 8/1997 | Tang |

| | | | | | |
|---|---|---|---|---|---|
| 5,663,878 A | 9/1997 | Walker | 5,847,594 A | 12/1998 | Mizuno |
| 5,663,986 A | 9/1997 | Striffler | 5,859,878 A | 1/1999 | Phillips et al. |
| 5,668,836 A | 9/1997 | Smith et al. | 5,864,754 A | 1/1999 | Hotto |
| 5,675,392 A | 10/1997 | Nayebi et al. | 5,870,670 A | 2/1999 | Ripley et al. |
| 5,678,220 A | 10/1997 | Fournier | 5,872,446 A | 2/1999 | Cranford, Jr. et al. |
| 5,678,226 A | 10/1997 | Li et al. | 5,878,088 A | 3/1999 | Knutson et al. |
| 5,680,078 A | 10/1997 | Ariie | 5,881,375 A | 3/1999 | Bonds |
| 5,680,418 A | 10/1997 | Croft et al. | 5,883,548 A | 3/1999 | Assard et al. |
| 5,682,099 A | 10/1997 | Thompson et al. | 5,884,154 A | 3/1999 | Sano et al. |
| 5,689,413 A | 11/1997 | Jaramillo et al. | 5,887,001 A | 3/1999 | Russell |
| 5,694,096 A | 12/1997 | Ushiroku et al. | 5,892,380 A | 4/1999 | Quist |
| 5,697,074 A | 12/1997 | Makikallio et al. | 5,894,239 A | 4/1999 | Bonaccio et al. |
| 5,699,006 A | 12/1997 | Zele et al. | 5,894,496 A | 4/1999 | Jones |
| 5,703,584 A | 12/1997 | Hill | 5,896,304 A | 4/1999 | Tiemann et al. |
| 5,705,949 A | 1/1998 | Alelyunas et al. | 5,896,347 A | 4/1999 | Tomita et al. |
| 5,705,955 A | 1/1998 | Freeburg et al. | 5,896,562 A | 4/1999 | Heinonen |
| 5,710,992 A | 1/1998 | Sawada et al. | 5,898,912 A | 4/1999 | Heck et al. |
| 5,710,998 A | 1/1998 | Opas | 5,900,746 A | 5/1999 | Sheahan |
| 5,714,910 A | 2/1998 | Skoczen et al. | 5,900,747 A | 5/1999 | Brauns |
| 5,715,281 A | 2/1998 | Bly et al. | 5,901,054 A | 5/1999 | Leu et al. |
| 5,721,514 A | 2/1998 | Crockett et al. | 5,901,187 A | 5/1999 | Iinuma |
| 5,724,002 A | 3/1998 | Hulick | 5,901,344 A | 5/1999 | Opas |
| 5,724,041 A | 3/1998 | Inoue et al. | 5,901,347 A | 5/1999 | Chambers et al. |
| 5,724,653 A | 3/1998 | Baker et al. | 5,901,348 A | 5/1999 | Bang et al. |
| 5,729,577 A | 3/1998 | Chen | 5,901,349 A | 5/1999 | Guegnaud et al. |
| 5,729,829 A | 3/1998 | Talwar et al. | 5,903,178 A | 5/1999 | Miyatsuji et al. |
| 5,732,333 A | 3/1998 | Cox et al. | 5,903,187 A | 5/1999 | Claverie et al. |
| 5,734,683 A | 3/1998 | Hulkko et al. | 5,903,196 A | 5/1999 | Salvi et al. |
| 5,736,895 A | 4/1998 | Yu et al. | 5,903,421 A | 5/1999 | Furutani et al. |
| 5,737,035 A | 4/1998 | Rotzoll | 5,903,553 A | 5/1999 | Sakamoto et al. |
| 5,742,189 A | 4/1998 | Yoshida et al. | 5,903,595 A | 5/1999 | Suzuki |
| 5,745,846 A | 4/1998 | Myer et al. | 5,903,609 A | 5/1999 | Kool et al. |
| 5,748,683 A | 5/1998 | Smith et al. | 5,903,827 A | 5/1999 | Kennan et al. |
| 5,751,154 A | 5/1998 | Tsugai | 5,903,854 A | 5/1999 | Abe et al. |
| 5,757,858 A | 5/1998 | Black et al. | 5,905,433 A | 5/1999 | Wortham |
| 5,757,870 A | 5/1998 | Miya et al. | 5,905,449 A | 5/1999 | Tsubouchi et al. |
| RE35,829 E | 6/1998 | Sanderford, Jr. | 5,907,149 A | 5/1999 | Marckini |
| 5,760,629 A | 6/1998 | Urabe et al. | 5,907,197 A | 5/1999 | Faulk |
| 5,760,632 A | 6/1998 | Kawakami et al. | 5,909,447 A | 6/1999 | Cox et al. |
| 5,760,645 A | 6/1998 | Comte et al. | 5,909,460 A | 6/1999 | Dent |
| 5,764,087 A | 6/1998 | Clark | 5,911,116 A | 6/1999 | Nosswitz |
| 5,767,726 A | 6/1998 | Wang | 5,911,123 A | 6/1999 | Shaffer et al. |
| 5,768,118 A | 6/1998 | Faulk et al. | 5,914,622 A | 6/1999 | Inoue |
| 5,768,323 A | 6/1998 | Kroeger et al. | 5,915,278 A | 6/1999 | Mallick |
| 5,770,985 A | 6/1998 | Ushiroku et al. | 5,918,167 A | 6/1999 | Tiller et al. |
| 5,771,442 A | 6/1998 | Wang et al. | 5,920,199 A | 7/1999 | Sauer |
| 5,777,692 A | 7/1998 | Ghosh | 5,926,065 A | 7/1999 | Wakai et al. |
| 5,777,771 A | 7/1998 | Smith | 5,926,513 A | 7/1999 | Suominen et al. |
| 5,778,022 A | 7/1998 | Walley | 5,933,467 A | 8/1999 | Sehier et al. |
| 5,781,600 A | 7/1998 | Reeve et al. | 5,937,013 A | 8/1999 | Lam et al. |
| 5,784,689 A | 7/1998 | Kobayashi | 5,943,370 A | 8/1999 | Smith |
| 5,786,844 A | 7/1998 | Rogers et al. | 5,945,660 A | 8/1999 | Nakasuji et al. |
| 5,787,125 A | 7/1998 | Mittel | 5,949,827 A | 9/1999 | DeLuca et al. |
| 5,790,587 A | 8/1998 | Smith et al. | 5,952,895 A | 9/1999 | McCune, Jr. et al. |
| 5,793,801 A | 8/1998 | Fertner | 5,953,642 A | 9/1999 | Feldtkeller et al. |
| 5,793,817 A | 8/1998 | Wilson | 5,955,992 A | 9/1999 | Shattil |
| 5,793,818 A | 8/1998 | Claydon et al. | 5,959,850 A | 9/1999 | Lim |
| 5,801,654 A | 9/1998 | Traylor | 5,960,033 A | 9/1999 | Shibano et al. |
| 5,802,463 A | 9/1998 | Zuckerman | 5,970,053 A | 10/1999 | Schick et al. |
| 5,805,460 A | 9/1998 | Greene et al. | 5,973,570 A | 10/1999 | Salvi et al. |
| 5,809,060 A | 9/1998 | Cafarella et al. | 5,982,315 A | 11/1999 | Bazarjani et al. |
| 5,812,546 A | 9/1998 | Zhou et al. | 5,982,329 A | 11/1999 | Pittman et al. |
| 5,818,582 A | 10/1998 | Fernandez et al. | 5,986,600 A | 11/1999 | McEwan |
| 5,818,869 A | 10/1998 | Miya et al. | 5,994,689 A | 11/1999 | Charrier |
| 5,825,254 A | 10/1998 | Lee | 5,995,030 A | 11/1999 | Cabler |
| 5,825,257 A | 10/1998 | Klymyshyn et al. | 5,999,561 A | 12/1999 | Naden et al. |
| 5,834,979 A | 11/1998 | Yatsuka | 6,005,506 A | 12/1999 | Bazarjani et al. |
| 5,834,985 A | 11/1998 | Sundegård | 6,005,903 A | 12/1999 | Mendelovicz |
| 5,834,987 A | 11/1998 | Dent | 6,011,435 A | 1/2000 | Takeyabu et al. |
| 5,841,324 A | 11/1998 | Williams | 6,014,176 A | 1/2000 | Nayebi et al. |
| 5,841,811 A | 11/1998 | Song | 6,014,551 A | 1/2000 | Pesola et al. |
| 5,844,449 A | 12/1998 | Abeno et al. | 6,018,262 A | 1/2000 | Noro et al. |
| 5,844,868 A | 12/1998 | Takahashi et al. | 6,018,553 A | 1/2000 | Sanielevici et al. |

| | | | | | | | |
|---|---|---|---|---|---|---|---|
| 6,026,286 | A | 2/2000 | Long | 6,327,313 | B1 | 12/2001 | Traylor et al. |
| 6,028,887 | A | 2/2000 | Harrison et al. | 6,330,244 | B1 | 12/2001 | Swartz et al. |
| 6,031,217 | A | 2/2000 | Aswell et al. | 6,335,656 | B1 | 1/2002 | Goldfarb et al. |
| 6,034,566 | A | 3/2000 | Ohe | 6,353,735 | B1 | 3/2002 | Sorrells et al. |
| 6,038,265 | A | 3/2000 | Pan et al. | 6,363,262 | B1 | 3/2002 | McNicol |
| 6,041,073 | A | 3/2000 | Davidovici et al. | 6,366,622 | B1 | 4/2002 | Brown et al. |
| 6,047,026 | A | 4/2000 | Chao et al. | 6,366,765 | B1 | 4/2002 | Hongo et al. |
| 6,049,573 | A | 4/2000 | Song | 6,370,371 | B1 | 4/2002 | Sorrells et al. |
| 6,049,706 | A | 4/2000 | Cook et al. | 6,385,439 | B1 | 5/2002 | Hellberg |
| 6,054,889 | A | 4/2000 | Kobayashi | 6,393,070 | B1 | 5/2002 | Reber |
| 6,057,714 | A | 5/2000 | Andrys et al. | 6,400,963 | B1 | 6/2002 | Glöckler et al. |
| 6,061,551 | A | 5/2000 | Sorrells et al. | 6,404,758 | B1 | 6/2002 | Wang |
| 6,061,555 | A | 5/2000 | Bultman et al. | 6,404,823 | B1 | 6/2002 | Grange et al. |
| 6,064,054 | A | 5/2000 | Waczynski et al. | 6,421,534 | B1 | 7/2002 | Cook et al. |
| 6,067,329 | A | 5/2000 | Kato et al. | 6,437,639 | B1 | 8/2002 | Nguyen et al. |
| 6,072,996 | A | 6/2000 | Smith | 6,438,366 | B1 | 8/2002 | Lindfors et al. |
| 6,073,001 | A | 6/2000 | Sokoler | 6,441,659 | B1 | 8/2002 | Demone |
| 6,076,015 | A | 6/2000 | Hartley et al. | 6,441,694 | B1 | 8/2002 | Turcotte et al. |
| 6,078,630 | A | 6/2000 | Prasanna | 6,445,726 | B1 | 9/2002 | Gharpurey |
| 6,081,691 | A | 6/2000 | Renard et al. | 6,459,721 | B1 | 10/2002 | Mochizuki et al. |
| 6,084,465 | A | 7/2000 | Dasgupta | 6,509,777 | B2 | 1/2003 | Razavi et al. |
| 6,084,922 | A | 7/2000 | Zhou et al. | 6,512,544 | B1 | 1/2003 | Merrill et al. |
| 6,085,073 | A | 7/2000 | Palermo et al. | 6,512,785 | B1 | 1/2003 | Zhou et al. |
| 6,088,348 | A | 7/2000 | Bell, III et al. | 6,512,798 | B1 | 1/2003 | Akiyama et al. |
| 6,091,289 | A | 7/2000 | Song et al. | 6,516,185 | B1 | 2/2003 | MacNally |
| 6,091,939 | A | 7/2000 | Banh | 6,531,979 | B1 | 3/2003 | Hynes |
| 6,091,940 | A | 7/2000 | Sorrells et al. | 6,542,722 | B1 | 4/2003 | Sorrells et al. |
| 6,091,941 | A | 7/2000 | Moriyama et al. | 6,546,061 | B2 | 4/2003 | Signell et al. |
| 6,094,084 | A | 7/2000 | Abou-Allam et al. | 6,560,301 | B1 | 5/2003 | Cook et al. |
| 6,097,762 | A | 8/2000 | Suzuki et al. | 6,560,451 | B1 | 5/2003 | Somayajula |
| 6,098,046 | A | 8/2000 | Cooper et al. | 6,567,483 | B1 | 5/2003 | Dent et al. |
| 6,098,886 | A | 8/2000 | Swift et al. | 6,580,902 | B1 | 6/2003 | Sorrells et al. |
| 6,112,061 | A | 8/2000 | Rapeli | 6,591,310 | B1 | 7/2003 | Johnson |
| 6,121,819 | A | 9/2000 | Traylor | 6,597,240 | B1 | 7/2003 | Walburger et al. |
| 6,125,271 | A | 9/2000 | Rowland, Jr. | 6,600,795 | B1 | 7/2003 | Ohta et al. |
| 6,128,746 | A | 10/2000 | Clark et al. | 6,600,911 | B1 | 7/2003 | Morishige et al. |
| 6,137,321 | A | 10/2000 | Bazarjani | 6,608,647 | B1 | 8/2003 | King |
| 6,144,236 | A | 11/2000 | Vice et al. | 6,611,569 | B1 | 8/2003 | Schier et al. |
| 6,144,331 | A | 11/2000 | Jiang | 6,618,579 | B1 | 9/2003 | Smith et al. |
| 6,144,846 | A | 11/2000 | Durec | 6,625,470 | B1 | 9/2003 | Fourtet et al. |
| 6,147,340 | A | 11/2000 | Levy | 6,628,328 | B1 | 9/2003 | Yokouchi et al. |
| 6,147,763 | A | 11/2000 | Steinlechner | 6,633,194 | B2 | 10/2003 | Arnborg et al. |
| 6,150,890 | A | 11/2000 | Damgaard et al. | 6,634,555 | B1 | 10/2003 | Sorrells et al. |
| 6,151,354 | A | 11/2000 | Abbey | 6,639,939 | B1 | 10/2003 | Naden et al. |
| 6,160,280 | A | 12/2000 | Bonn et al. | 6,647,250 | B1 | 11/2003 | Bultman et al. |
| 6,167,247 | A | 12/2000 | Kannell et al. | 6,647,270 | B1 | 11/2003 | Himmelstein |
| 6,169,733 | B1 | 1/2001 | Lee | 6,686,879 | B2 | 2/2004 | Shattil |
| 6,175,728 | B1 | 1/2001 | Mitama | 6,687,493 | B1 | 2/2004 | Sorrells et al. |
| 6,178,319 | B1 | 1/2001 | Kashima | 6,690,232 | B2 | 2/2004 | Ueno et al. |
| 6,182,011 | B1 | 1/2001 | Ward | 6,690,741 | B1 | 2/2004 | Larrick, Jr. et al. |
| 6,198,941 | B1 | 3/2001 | Aho et al. | 6,694,128 | B1 | 2/2004 | Sorrells et al. |
| 6,204,789 | B1 | 3/2001 | Nagata | 6,697,603 | B1 | 2/2004 | Lovinggood et al. |
| 6,208,636 | B1 | 3/2001 | Tawil et al. | 6,704,549 | B1 | 3/2004 | Sorrells et al. |
| RE37,138 | E | 4/2001 | Dent | 6,704,558 | B1 | 3/2004 | Sorrells et al. |
| 6,211,718 | B1 | 4/2001 | Souetinov | 6,731,146 | B1 | 5/2004 | Gallardo |
| 6,212,369 | B1 | 4/2001 | Avasarala | 6,738,609 | B1 | 5/2004 | Clifford |
| 6,215,475 | B1 | 4/2001 | Meyerson et al. | 6,741,139 | B2 | 5/2004 | Pleasant et al. |
| 6,215,828 | B1 | 4/2001 | Signell et al. | 6,741,650 | B1 | 5/2004 | Painchaud et al. |
| 6,223,061 | B1 | 4/2001 | Dacus et al. | 6,775,684 | B1 | 8/2004 | Toyoyama et al. |
| 6,225,848 | B1 | 5/2001 | Tilley et al. | 6,798,351 | B1 | 9/2004 | Sorrells et al. |
| 6,230,000 | B1 | 5/2001 | Tayloe | 6,801,253 | B1 | 10/2004 | Yonemoto et al. |
| 6,246,695 | B1 | 6/2001 | Seazholtz et al. | 6,813,320 | B1 | 11/2004 | Claxton et al. |
| 6,259,293 | B1 | 7/2001 | Hayase et al. | 6,813,485 | B2 | 11/2004 | Sorrells et al. |
| 6,266,518 | B1 | 7/2001 | Sorrells et al. | 6,823,178 | B2 | 11/2004 | Pleasant et al. |
| 6,275,542 | B1 | 8/2001 | Katayama et al. | 6,836,650 | B2 | 12/2004 | Sorrells et al. |
| 6,298,065 | B1 | 10/2001 | Dombkowski et al. | 6,850,742 | B2 | 2/2005 | Fayyaz |
| 6,307,894 | B2 | 10/2001 | Eidson et al. | 6,853,690 | B1 | 2/2005 | Sorrells et al. |
| 6,308,058 | B1 | 10/2001 | Souetinov et al. | 6,865,399 | B2 | 3/2005 | Fujioka et al. |
| 6,313,685 | B1 | 11/2001 | Rabii | 6,873,836 | B1 | 3/2005 | Sorrells et al. |
| 6,313,700 | B1 | 11/2001 | Nishijima et al. | 6,876,846 | B2 | 4/2005 | Tamaki et al. |
| 6,314,279 | B1 | 11/2001 | Mohindra | 6,879,817 | B1 | 4/2005 | Sorrells et al. |
| 6,317,589 | B1 | 11/2001 | Nash | 6,882,194 | B2 | 4/2005 | Belot et al. |
| 6,321,073 | B1 | 11/2001 | Luz et al. | 6,892,057 | B2 | 5/2005 | Nilsson |

| | | | |
|---|---|---|---|
| 6,892,062 B2 | 5/2005 | Lee et al. | |
| 6,894,988 B1 | 5/2005 | Zehavi | |
| 6,909,739 B1 | 6/2005 | Eerola et al. | |
| 6,910,015 B2 | 6/2005 | Kawai | |
| 6,917,796 B2 | 7/2005 | Setty et al. | |
| 6,920,311 B2 | 7/2005 | Rofougaran et al. | |
| 6,959,178 B2 | 10/2005 | Macedo et al. | |
| 6,963,626 B1 | 11/2005 | Shaeffer et al. | |
| 6,963,734 B2 | 11/2005 | Sorrells et al. | |
| 6,973,476 B1 | 12/2005 | Naden et al. | |
| 6,975,848 B2 | 12/2005 | Rawlins et al. | |
| 6,999,747 B2 | 2/2006 | Su | |
| 7,006,805 B1 | 2/2006 | Sorrells et al. | |
| 7,010,286 B2 | 3/2006 | Sorrells et al. | |
| 7,010,559 B2 | 3/2006 | Rawlins et al. | |
| 7,016,663 B2 | 3/2006 | Sorrells et al. | |
| 7,027,786 B1 | 4/2006 | Smith et al. | |
| 7,039,372 B1 | 5/2006 | Sorrells et al. | |
| 7,050,058 B2 | 5/2006 | Sorrells et al. | |
| 7,054,296 B1 | 5/2006 | Sorrells et al. | |
| 7,065,162 B1 | 6/2006 | Sorrells et al. | |
| 7,072,390 B1 | 7/2006 | Sorrells et al. | |
| 7,072,427 B2 | 7/2006 | Rawlins et al. | |
| 7,072,433 B2 | 7/2006 | Bell | |
| 7,076,011 B2 | 7/2006 | Cook et al. | |
| 7,082,171 B1 | 7/2006 | Johnson et al. | |
| 7,085,335 B2 | 8/2006 | Rawlins et al. | |
| 7,107,028 B2 | 9/2006 | Sorrells et al. | |
| 7,110,435 B1 | 9/2006 | Sorrells et al. | |
| 7,110,444 B1 | 9/2006 | Sorrells et al. | |
| 7,149,487 B2 | 12/2006 | Yoshizawa | |
| 7,190,941 B2 | 3/2007 | Sorrells et al. | |
| 7,193,965 B1 | 3/2007 | Nevo et al. | |
| 7,194,044 B2 | 3/2007 | Birkett et al. | |
| 7,194,246 B2 | 3/2007 | Sorrells et al. | |
| 7,197,081 B2 | 3/2007 | Saito | |
| 7,209,725 B1 | 4/2007 | Sorrells et al. | |
| 7,212,581 B2 | 5/2007 | Birkett et al. | |
| 7,218,899 B2 | 5/2007 | Sorrells et al. | |
| 7,218,907 B2 | 5/2007 | Sorrells et al. | |
| 7,224,749 B2 | 5/2007 | Sorrells et al. | |
| 7,233,969 B2 | 6/2007 | Rawlins et al. | |
| 7,236,754 B2 | 6/2007 | Sorrells et al. | |
| 7,245,886 B2 | 7/2007 | Sorrells et al. | |
| 7,272,164 B2 | 9/2007 | Sorrells et al. | |
| 7,292,835 B2 | 11/2007 | Sorrells et al. | |
| 7,295,826 B1 | 11/2007 | Cook et al. | |
| 7,308,242 B2 | 12/2007 | Sorrells et al. | |
| 7,321,640 B2 | 1/2008 | Milne et al. | |
| 7,321,735 B1 | 1/2008 | Smith et al. | |
| 7,321,751 B2 | 1/2008 | Sorrells et al. | |
| 7,358,801 B2 | 4/2008 | Perdoor et al. | |
| 7,376,410 B2 | 5/2008 | Sorrells et al. | |
| 7,379,515 B2 | 5/2008 | Johnson et al. | |
| 7,379,883 B2 | 5/2008 | Sorrells | |
| 7,386,292 B2 | 6/2008 | Sorrells et al. | |
| 7,389,100 B2 | 6/2008 | Sorrells et al. | |
| 7,433,910 B2 | 10/2008 | Rawlins et al. | |
| 7,454,453 B2 | 11/2008 | Rawlins et al. | |
| 7,460,584 B2 | 12/2008 | Parker et al. | |
| 2001/0015673 A1 | 8/2001 | Yamashita et al. | |
| 2001/0036818 A1 | 11/2001 | Dobrovolny | |
| 2002/0021685 A1 | 2/2002 | Sakusabe | |
| 2002/0037706 A1 | 3/2002 | Ichihara | |
| 2002/0080728 A1 | 6/2002 | Sugar et al. | |
| 2002/0132642 A1 | 9/2002 | Hines et al. | |
| 2002/0163921 A1 | 11/2002 | Ethridge et al. | |
| 2003/0045263 A1 | 3/2003 | Wakayama et al. | |
| 2003/0078011 A1 | 4/2003 | Cheng et al. | |
| 2003/0081781 A1 | 5/2003 | Jensen et al. | |
| 2003/0103581 A1 | 6/2003 | Rawlins et al. | |
| 2003/0149579 A1 | 8/2003 | Begemann et al. | |
| 2003/0181186 A1 | 9/2003 | Sorrells et al. | |
| 2003/0181189 A1 | 9/2003 | Sorrells et al. |
| 2003/0181190 A1 | 9/2003 | Sorrells et al. |
| 2003/0193364 A1 | 10/2003 | Liu et al. |
| 2004/0002321 A1 | 1/2004 | Sorrells et al. |
| 2004/0125879 A1 | 7/2004 | Jaussi et al. |
| 2006/0002491 A1 | 1/2006 | Darabi et al. |
| 2006/0039449 A1 | 2/2006 | Fontana et al. |
| 2006/0209599 A1 | 9/2006 | Kato et al. |

FOREIGN PATENT DOCUMENTS

| | | |
|---|---|---|
| DE | 35 41 031 A1 | 5/1986 |
| DE | 42 37 692 C1 | 3/1994 |
| DE | 196 27 640 A1 | 1/1997 |
| DE | 692 21 098 T2 | 1/1998 |
| DE | 196 48 915 A1 | 6/1998 |
| DE | 197 35 798 C1 | 7/1998 |
| EP | 0 035 166 A1 | 9/1981 |
| EP | 0 087 336 A1 | 8/1983 |
| EP | 0 099 265 A1 | 1/1984 |
| EP | 0 087 336 B1 | 7/1986 |
| EP | 0 254 844 A2 | 2/1988 |
| EP | 0 276 130 A2 | 7/1988 |
| EP | 0 276 130 A3 | 7/1988 |
| EP | 0 193 899 B1 | 6/1990 |
| EP | 0 380 351 A2 | 8/1990 |
| EP | 0 380 351 A3 | 2/1991 |
| EP | 0 411 840 A2 | 2/1991 |
| EP | 0 423 718 A2 | 4/1991 |
| EP | 0 411 840 A3 | 7/1991 |
| EP | 0 486 095 A1 | 5/1992 |
| EP | 0 423 718 A3 | 8/1992 |
| EP | 0 512 748 A2 | 11/1992 |
| EP | 0 529 836 A1 | 3/1993 |
| EP | 0 548 542 A1 | 6/1993 |
| EP | 0 512 748 A3 | 7/1993 |
| EP | 0 560 228 S1 | 9/1993 |
| EP | 0 632 288 A2 | 1/1995 |
| EP | 0 632 577 A1 | 1/1995 |
| EP | 0 643 477 A2 | 3/1995 |
| EP | 0 643 477 A3 | 3/1995 |
| EP | 0 411 840 B1 | 10/1995 |
| EP | 0 696 854 A1 | 2/1996 |
| EP | 0 632 288 A3 | 7/1996 |
| EP | 0 732 803 A1 | 9/1996 |
| EP | 0 486 095 B1 | 2/1997 |
| EP | 0 782 275 A2 | 7/1997 |
| EP | 0 785 635 A1 | 7/1997 |
| EP | 0 789 449 A2 | 8/1997 |
| EP | 0 789 449 A3 | 8/1997 |
| EP | 0 795 955 A2 | 9/1997 |
| EP | 0 795 955 A3 | 9/1997 |
| EP | 0 795 978 A2 | 9/1997 |
| EP | 0 817 369 A2 | 1/1998 |
| EP | 0 817 369 A3 | 1/1998 |
| EP | 0 837 565 A1 | 4/1998 |
| EP | 0 862 274 A1 | 9/1998 |
| EP | 0 874 499 A2 | 10/1998 |
| EP | 0 512 748 B1 | 11/1998 |
| EP | 0 877 476 A1 | 11/1998 |
| EP | 0 977 351 A1 | 2/2000 |
| FR | 2 245 130 | 4/1975 |
| FR | 2 669 787 A1 | 5/1992 |
| FR | 2 743 231 A1 | 7/1997 |
| GB | 2 161 344 A | 1/1986 |
| GB | 2 215 945 A | 9/1989 |
| GB | 2 324 919 A | 11/1998 |
| JP | 47-2314 | 2/1972 |
| JP | 55-66057 | 5/1980 |
| JP | 56-114451 | 9/1981 |
| JP | 58-7903 | 1/1983 |
| JP | 58-031622 | 2/1983 |
| JP | 58-133004 | 8/1983 |

| | | |
|---|---|---|
| JP | 59-022438 | 2/1984 |
| JP | 59-123318 | 7/1984 |
| JP | 59-144249 | 8/1984 |
| JP | 60-58705 | 4/1985 |
| JP | 60-130203 | 7/1985 |
| JP | 61-30821 | 2/1986 |
| JP | 61-193521 | 8/1986 |
| JP | 61-232706 | 10/1986 |
| JP | 61-245749 | 11/1986 |
| JP | 62-12381 | 1/1987 |
| JP | 62-047214 | 2/1987 |
| JP | 63-54002 | 3/1988 |
| JP | 63-65587 | 3/1988 |
| JP | 63-153691 | 6/1988 |
| JP | 63-274214 | 11/1988 |
| JP | 64-048557 | 2/1989 |
| JP | 2-39632 | 2/1990 |
| JP | 2-131629 | 5/1990 |
| JP | 2-276351 | 11/1990 |
| JP | 4-123614 | 4/1992 |
| JP | 4-127601 | 4/1992 |
| JP | 4-154227 | 5/1992 |
| JP | 5-175730 | 7/1993 |
| JP | 5-175734 | 7/1993 |
| JP | 5-327356 | 12/1993 |
| JP | 6-237276 | 8/1994 |
| JP | 6-284038 | 10/1994 |
| JP | 7-154344 | 6/1995 |
| JP | 7-307620 | 11/1995 |
| JP | 8-23359 | 1/1996 |
| JP | 8-32556 | 2/1996 |
| JP | 8-139524 | 5/1996 |
| JP | 9-36664 | 2/1997 |
| JP | 9-171399 | 6/1997 |
| JP | 10-41860 | 2/1998 |
| JP | 10-96778 | 4/1998 |
| JP | 10-173563 | 6/1998 |
| JP | 11-98205 | 4/1999 |
| WO | WO 80/01633 A1 | 8/1980 |
| WO | WO 91/18445 A1 | 11/1991 |
| WO | WO 94/05087 A1 | 3/1994 |
| WO | WO 95/01006 A1 | 1/1995 |
| WO | WO 96/02977 A1 | 2/1996 |
| WO | WO 96/08078 A1 | 3/1996 |
| WO | WO 96/39750 A1 | 12/1996 |
| WO | WO 97/08839 A2 | 3/1997 |
| WO | WO 97/08839 A3 | 3/1997 |
| WO | WO 97/38490 A1 | 10/1997 |
| WO | WO 98/00953 A1 | 1/1998 |
| WO | WO 98/24201 A1 | 6/1998 |
| WO | WO 98/40968 A2 | 9/1998 |
| WO | WO 98/40968 A3 | 9/1998 |
| WO | WO 98/53556 A2 | 11/1998 |
| WO | WO 99/23755 A1 | 5/1999 |
| WO | WO 00/31659 A1 | 6/2000 |

OTHER PUBLICATIONS

English-language Abstract of Japanese Patent Publication No. JP 61-245749, data supplied by ep.espacenet.com 1 page (Nov. 1, 1986—Date of publication of application).

English-language Abstract of Japanese Patent Publication No. JP 64-048557, data supplied by ep.espacenet.com, 1 page (Feb. 23, 1989—Date of publication of application).

English-language Abstract of Japanese Patent Publication No. JP 59-022438, data supplied by ep.espacenet.com, 1 page (Feb. 4, 1984—Date of publication of application).

English-language Abstract of Japanese Patent Publication No. JP 59-123318, data supplied by ep.espacenet.com, 1 page (Jul. 17, 1984—Date of publication of application).

English-language Abstract of Japanese Patent Publication No. JP 61-193521, data supplied by ep.espacenet.com, 1 page (Aug. 28, 1986—Date of publication of application).

English-language Abstract of Japanese Patent Publication No. JP 62-047214, data supplied by ep.espacenet.com, 1 page (Feb. 28, 1987—Date of publication of application).

English-language Abstract of Japanese Patent Publication No. JP 63-274214, data supplied by ep.espacenet.com, 1 page (Nov. 11, 1988—Date of publication of application).

English-language Computer Translation of Japanese Patent Publication No. JP 10-173563, provided by the JPO, 10 pages (Jun. 26, 1998—Date of publication of application) and cited in U.S. Appl. No. 10/305,299, directed to related subject matter.

*What is I/Q Data?*, printed Sep. 16, 2006, from http://zone.ni.com, 8 pages (Copyright 2003).

English-language Abstract of Japanese Patent Publication No. JP 61-232706, data supplied by the espacenet, 1 page (Oct. 17, 1986—Date of publication of application).

English-language Abstract of Japanese Patent Publication No. JP 9-171399, data supplied by the espacenet, 1 page (Jun. 30, 1997—Date of publication of application).

English-language Abstract of Japanese Patent Publication No. JP 10-41860, data supplied by the espacenet, 1 page (Feb. 13, 1998—Date of publication of application).

Gaudiosi, J., "Retailers will bundle Microsoft's Xbox with games and peripherals," *Video Store Magazine*, vol. 23, Issue 36, p. 8, 2 pages (Sep. 2-8, 2001).

English-language Translation of German Patent Publication No. DT 1936252, translation provided by Transperfect Translations, 12 pages (Jan. 28, 1971—Date of publication of application).

English-language Abstract of Japanese Patent Publication No. JP 62-12381, data supplied by the espacenet, 1 page (Jan. 21, 1987—Date of publication of application).

English-language Abstract of Japanese Patent Publication No. JP 4-154227, data supplied by the espacenet, 1 page (May 27, 1992—Date of publication of application).

English-language Abstract of Japanese Patent Publication No. JP 6-284038, data supplied by the espacenet, 1 page (Oct. 7, 1994—Date of publication of application).

English-language Abstract of Japanese Patent Publication No. JP 10-96778, data supplied by the espacenet, 1 page (Apr. 14, 1998—Date of publication of application).

English-language Abstract of Japanese Patent Publication No. JP 11-98205, data supplied by the espacenet, 1 page (Apr. 9, 1999—Date of publication of application).

English Abstract for German Patent No. DE 692 21 098 T2, 1 page, data supplied from the espacenet.

Aghvami, H. et al., "Land Mobile Satellites Using the Highly Elliptic Orbits- The UK T-SAT Mobile Payload," *Fourth International Conference on Satellite Systems for Mobile Communications and Navigation*, IEE, pp. 147-153 (Oct. 17-19, 1988).

Akers, N.P. et al., "RF Sampling Gates: a Brief Review," *IEE Proceedings*, IEE, vol. 133, Part A, No. 1, pp. 45-49 (Jan. 1986).

Al-Ahmad, H.A.M. et al., "Doppler Frequency Correction for a Non-Geostationary Communications Satellite. Techniques for CERS and T-SAT," *Electronics Division Colloquium on Low Noise Oscillators and Synthesizers*, IEE, pp. 4/1-4/5 (Jan. 23, 1986).

Ali, I. et al., "Doppler Characterization for LEO Satellites," *IEEE Transactions on Communications*, IEEE, vol. 46, No. 3, pp. 309-313 (Mar. 1998).

Allan, D.W., "Statistics of Atomic Frequency Standards," *Proceedings Of The IEEE Special Issue on Frequency Stability*, IEEE, pp. 221-230 (Feb. 1966).

Allstot, D.J. et al., "MOS Switched Capacitor Ladder Filters," *IEEE Journal of Solid-State Circuits*, IEEE, vol. SC-13, No. 6, pp. 806-814 (Dec. 1978).

Allstot, D.J. and Black Jr. W.C., "Technological Design Considerations for Monolithic MOS Switched-Capacitor Filtering Systems," *Proceedings of the IEEE*, IEEE, vol. 71, No. 8, pp. 967-986 (Aug. 1983).

Alouini, M. et al., "Channel Characterization and Modeling for Ka-Band Very Small Aperture Terminals," *Proceedings Of the IEEE*, IEEE, vol. 85, No. 6, pp. 981-997 (Jun. 1997).

Andreyev, G.A. and Ogarev, S.A., "Phase Distortions of Keyed Millimeter-Wave Signals in the Case of Propagation in a Turbulent Atmosphere," *Telecommunications and Radio Engineering*, Scripta Technica, vol. 43, No. 12, pp. 87-90 (Dec. 1988).

Antonetti, A. et al., "Optoelectronic Sampling in the Picosecond Range," *Optics Communications*, North-Holland Publishing Company, vol. 21, No. 2, pp. 211-214 (May 1977).

Austin, J. et al., "Doppler Correction of the Telecommunication Payload Oscillators in the UK T-SAT," *18th European Microwave Conference*, Microwave Exhibitions and Publishers Ltd., pp. 851-857 (Sep. 12-15, 1988).

Auston, D.H., "Picosecond optoelectronic switching and gating in silicon," *Applied Physics Letters*, American Institute of Physics, vol. 26, No. 3, pp. 101-103 (Feb. 1, 1975).

Baher, H., "Transfer Functions for Switched-Capacitor and Wave Digital Filters," *IEEE Transactions on Circuits and Systems*, IEEE Circuits and Systems Society, vol. CAS-33, No. 11, pp. 1138-1142 (Nov. 1986).

Baines, R., "The DSP Bottleneck," *IEEE Communications Magazine*, IEEE Communications Society, pp. 46-54 (May 1995).

Banjo, O.P. and Vilar, E., "Binary Error Probabilities on Earth-Space Links Subject to Scintillation Fading," *Electronics Letters*, IEE, vol. 21, No. 7, pp. 296-297 (Mar. 28, 1985).

Banjo, O.P. and Vilar, E., "The Dependence of Slant Path Amplitude Scintillations on Various Meteorological Parameters," *Fifth International Conference on Antennas and Propagation (ICAP 87) Part 2: Propagation*, IEE, pp. 277-280 (Mar. 30-Apr. 2, 1987).

Banjo, O.P. and Vilar, E. "Measurement and Modeling of Amplitude Scintillations on Low-Elevation Earth-Space Paths and Impact on Communication Systems," *IEEE Transactions on Communications*, IEEE Communications Society, vol. COM-34, No. 8, pp. 774-780 (Aug. 1986).

Banjo, O.P. et al., "Tropospheric Amplitude Spectra Due to Absorption and Scattering in Earth-Space Paths," *Fourth International Conference on Antennas and Propagation (ICAP 85)*, IEE, pp. 77-82 (Apr. 16-19, 1985).

Basili,P. et al., "Case Study of Intense Scintillation Events on the OTS Path," *IEEE Transactions on Antennas and Propagation*, IEEE, vol. 38, No. 1, pp. 107-113 (Jan. 1990).

Basili, P. et al., "Observation of High $C^2$ and Turbulent Path Length on OTS Space-Earth Link," *Electronics Letters*, IEE, vol. 24, No. 17, pp. 1114-1116 (Aug. 18, 1988).

Blakey, J.R. et al., "Measurement of Atmospheric Millimetre-Wave Phase Scintillations in an Absorption Region," *Electronics Letters*, IEE, vol. 21, No. 11, pp. 486-487 (May 23, 1985).

Burgueño, A. et al., "Influence of rain gauge integration time on the rain rate statistics used in microwave communications," *annales des tèlècommunications*, International Union of Radio Science, pp. 522-527 (Sep./Oct. 1988).

Burgueño, A. et al., "Long-Term Joint Statistical Analysis of Duration and Intensity of Rainfall Rate with Application to Microwave Communications," *Fifth International Conference on Antennas and Propagation (ICAP 87) Part 2: Propagation*, IEE, pp. 198-201 (Mar. 30-Apr. 2, 1987).

Burgueño, A. et al., "Long-Term Statistics of Precipitation Rate Return Periods in the Context of Microwave Communications," *Sixth International Conference on Antennas and Propagation (ICAP 89) Part 2: Propagation*, IEE, pp. 297-301 (Apr. 4-7, 1989).

Burgueño, A. et al., "Spectral Analysis of 49 Years of Rainfall Rate and Relation to Fade Dynamics," *IEEE Transactions on Communications*, IEEE Communications Society, vol. 38, No. 9, pp. 1359-1366 (Sep. 1990).

Catalan, C. and Vilar, E., "Approach for satellite slant path remote sensing," *Electronics Letters*, IEE, vol. 34, No. 12, pp. 1238-1240 (Jun. 11, 1998).

Chan, P. et al., "A Highly Linear 1-GHz CMOS Downconversion Mixer," *European Solid State Circuits Conference*, IEEE Communication Society, pp. 210-213 (Sep. 22-24, 1993).

Declaration of Michael J. Bultman filed in U.S. Appl. No. 09/176,022, which is directed to related subject matter, 2 pages.

Declaration of Robert W. Cook filed in U.S. Appl. No. 09/176,022, which is directed to related subject matter, 2 pages.

Declaration of Alex Holtz filed in U.S. Appl. No. 09/176,022, which is directed to related subject matter, 3 pages.

Declaration of Richard C. Looke filed in U.S. Appl. No. 09/176,022, which is directed to related subject matter, 2 pages.

Declaration of Charley D. Moses, Jr. filed in U.S. Appl. No. 09/176,022, which is directed to related subject matter, 2 pages.

Declaration of Jeffrey L. Parker and David F. Sorrells, with attachment Exhibit 1, filed in U.S. Appl. No. 09/176,022, which is directed to related subject matter, 130 pages.

Dewey, R.J. and Collier, C.J., "Multi-Mode Radio Receiver," *Electronics Division Colloquium on Digitally Implemented Radios*, IEE, pp. 3/1-3/5 (Oct. 18, 1985).

Dialog File 347 (JAPIO) English Language Patent Abstract for JP 2-276351, 1 page (Nov. 13, 1990—Date of publication of application).

Dialog File 347 (JAPIO) English Language Patent Abstract for JP 2-131629, 1 page (May 21, 1990—Date of publication of application).

Dialog File 347 (JAPIO) English Language Patent Abstract for JP 2-39632, 1 page (Feb. 8, 1990—Date of publication of application).

Dialog File 348 (European Patents) English Language Patent Abstract for EP 0 785 635 A1, 3 page (Dec. 26, 1996—Date of publication of application).

Dialog File 348 (European Patents) English Language Patent Abstract for EP 35166 A1, 2 page (Feb. 18, 1981—Date of publication of application).

"DSO takes sampling rate to 1 Ghz," *Electronic Engineering*, Morgan Grampian Publishers, vol. 59, No. 723, pp. 77 and 79 (Mar. 1987).

Erdi, G. and Henneuse, P.R., "A Precision FET-Less Sample-and-Hold with High Charge-to-Droop Current Ratio," *IEEE Journal of Solid-State Circuits*, IEEE, vol. SC-13, No. 6, pp. 864-873 (Dec. 1978).

Faulkner, N.D. and Vilar, E., "Subharmonic Sampling for the Measurement of Short Term Stability of Microwave Oscillators," *IEEE Transactions on Instrumentation and Measurement*, IEEE, vol. IM-32, No. 1, pp. 208-213 (Mar. 1983).

Faulkner, N.D. et al., "Sub-Harmonic Sampling for the Accurate Measurement of Frequency Stability of Microwave Oscillators," *CPEM 82 Digest: Conference on Precision Electromagnetic Measurements*, IEEE, pp. M-10 and M-11 (1982).

Faulkner, N.D. and Vilar, E., "Time Domain Analysis of Frequency Stability Using Non-Zero Dead-Time Counter Techniques," *CPEM 84 Digest Conference on Precision Electromagnetic Measurements*, IEEE, pp. 81-82 (1984).

Filip, M. and Vilar, E., "Optimum Utilization of the Channel Capacity of a Satellite Link in the Presence of Amplitude Scintillations and Rain Attenuation," *IEEE Transactions on Communications*, IEEE Communications Society, vol. 38, No. 11, pp. 1958-1965 (Nov. 1990).

Fukahori, K., "A CMOS Narrow-Band Signaling Filter with Q Reduction," *IEEE Journal of Solid-State Circuits*, IEEE, vol. SC-19, No. 6, pp. 926-932 (Dec. 1984).

Fukuchi, H. and Otsu, Y., "Available time statistics of rain attenuation on earth-space path," *IEE Proceedings-H: Microwaves, Antennas and Propagation*, IEE, vol. 135, Pt. H, No. 6, pp. 387-390 (Dec. 1988).

Gibbins, C.J. and Chadha, R., "Millimetre-wave propagation through hydrocarbon flame," *IEE Proceedings*, IEE, vol. 134, Pt. H, No. 2, pp. 169-173 (Apr. 1987).

Gilchrist, B. et al., "Sampling hikes performance of frequency synthesizers," *Microwaves & RF*, Hayden Publishing, vol. 23, No. 1, pp. 93-94 and 110 (Jan. 1984).

Gossard, E.E., "Clear weather meteorological effects on propagation at frequencies above 1 Ghz," *Radio Science*, American Geophysical Union, vol. 16, No. 5, pp. 589-608 (Sep.-Oct. 1981).

Gregorian, R. et al., "Switched-Capacitor Circuit Design," *Proceedings of the IEEE*, IEEE, vol. 71, No. 8, pp. 941-966 (Aug. 1983).

Groshong et al., "Undersampling Techniques Simplify Digital Radio," *Electronic Design*, Penton Publishing, pp. 67-68, 70, 73-75 and 78 (May 23, 1991).

Grove, W.M., "Sampling for Oscilloscopes and Other RF Systems: Dc through X-Band," *IEEE Transactions on Microwave Theory and Techniques*, IEEE, pp. 629-635 (Dec. 1966).

Haddon, J. et al., "Measurement of Microwave Scintillations on a Satellite Down-Link at X-Band," *Antennas and Propagation*, IEEE, pp. 113-117 (1981).

Haddon, J. and Vilar, E., "Scattering Induced Microwave Scintillations from Clean Air and Rain on Earth Space Paths and the Influence of Antenna Aperture," *IEE Transactions on Antennas and Propagation*, IEEE, vol. AP-34, No. 5, pp. 646-657 (May 1986).

Hafdallah, H. et al., "2-4 Ghz MESFET Sampler," Electronics Letters, IEE, vol. 24, No. 3, pp. 151-153 (Feb. 4, 1988).

Herben, M.H.A.J., "Amplitude and Phase Scintillation Measurements on 8-2 km Line-Of-Sight Path at 30 Ghz," *Electronics Letters*, IEE, vol. 18, No. 7, pp. 287-289 (Apr. 1, 1982).

Hewitt, A. et al., "An 18 Ghz Wideband LOS Multipath Experiment," *International Conference on Measurements for Telecommunication Transmission Systems—MTTS 85*, IEE, pp. 112-116 (Nov. 27-28, 1985).

Hewitt, A. et al., "An Autoregressive Approach to the Identification of Multipath Ray Parameters from Field Measurements," *IEEE Transactions on Communications*, IEEE Communications Society, vol. 37, No. 11, pp. 1136-1143 (Nov. 1989).

Hewitt, A. and Vilar, E., "Selective fading on LOS Microwave Links: Classical and Spread-Spectrum Measurement Techniques," *IEEE Transactions on Communications*, IEEE Communications Society, vol. 36, No. 7, pp. 789-796 (Jul. 1988).

Hospitalier, E., "Instruments for Recording and Observing Rapidly Varying Phenomena," *Science Absracts*, IEE, vol. VII, pp. 22-23 (1904).

Howard, I.M. and Swansson, N.S., "Demodulating High Frequency Resonance Signals for Bearing Fault Detection," *The Institution of Engineers Australia Vibration and Noise Conference*, Institution of Engineers, Australia, pp. 115-121 (Sep. 18-20, 1990).

Hu, X., *A Switched-Current Sample-and-Hold Amplifier for FM Demodulation*, Thesis for Master of Applied Science, Dept. of Electrical and Computer Engineering, University of Toronto, UMI Dissertation Services, pp. 1-64 (1995).

Hung, H-L. A. et al., "Characterization of Microwave Integrated Circuits Using An Optical Phase-Locking and Sampling System," *IEEE MTT-S Digest*, IEEE, pp. 507-510 (1991).

Hurst, P.J., "Shifting the Frequency Response of Switched-Capacitor Filters by Nonuniform Sampling," *IEEE Transactions on Circuits and Systems*, IEEE Circuits and Systems Society, vol. 38, No. 1, pp. 12-19 (Jan. 1991).

Itakura, T., "Effects of the sampling pulse width on the frequency characteristics of a sample-and-hold circuit," *IEE Proceedings Circuits, Devices and Systems*, IEE, vol. 141, No. 4, pp. 328-336 (Aug. 1994).

Janssen, J.M.L., "An Experimental 'Stroboscopic' Oscilloscope for Frequencies up to about 50 Mc/s: I. Fundamentals," *Philips Technical Review*, Philips Research Laboratories, vol. 12, No. 2, pp. 52-59 (Aug. 1950).

Janssen, J.M.L. and Michels, A.J., "An Experimental 'Stroboscopic' Oscilloscope for Frequencies up to about 50 Mc/s: II. Electrical Build-Up," *Philips Technical Review*, Philips Research Laboratories, vol. 12, No. 3, pp. 73-82 (Sep. 1950).

Jondral, V.F. et al., "Doppler Profiles for Communications Satellites," *Frequenz*, Herausberger, pp. 111-116 (May-Jun. 1996).

Kaleh, G.K., "A Frequency Diversity Spread Spectrum System for Communication in the Presence of In-band Interference," *1995 IEEE Globecom*, IEEE Communications Society, pp. 66-70 (1995).

Karasawa, Y. et al., "A New Prediction Method for Tropospheric Scintillation on Earth-Space Paths," *IEEE Transactions on Antennas and Propagation*, IEEE Antennas and Propagation Society, vol. 36, No. 11, pp. 1608-1614 (Nov. 1988).

Kirsten, J. and Fleming, J., "Undersampling reduces data-acquisition costs for select applications," *EDN*, Cahners Publishing, vol. 35, No. 13, pp. 217-222, 224, 226-228 (Jun. 21, 1990).

Lam, W.K. et al., "Measurement of the Phase Noise Characteristics of an Unlocked Communications Channel Identifier," *Proceedings Of the 1993 IEEE International Frequency Control Symposium*, IEEE, pp. 283-288 (Jun. 2-4, 1993).

Lam, W.K. et al., "Wideband sounding of 11.6 Ghz transhorizon channel," *Electronics Letters*, IEE, vol. 30, No. 9, pp. 738-739 (Apr. 28, 1994).

Larkin, K.G., "Efficient demodulator for bandpass sampled AM signals," *Electronics Letters*, IEE, vol. 32, No. 2, pp. 101-102 (Jan. 18, 1996).

Lau, W.H. et al., "Analysis of the Time Variant Structure of Microwave Line-of-sight Multipath Phenomena," *IEEE Global Telecommunications Conference & Exhibition*, IEEE, pp. 1707-1711 (Nov. 28-Dec. 1, 1988).

Lau, W.H. et al., "Improved Prony Algorithm to Identify Multipath Components," *Electronics Letters*, IEE, vol. 23, No. 20, pp. 1059-1060 (Sep. 24, 1987).

Lesage, P. and Audoin, C., "Effect of Dead-Time on the Estimation of the Two-Sample Variance," *IEEE Transactions on Instrumentation and Measurement*, IEEE Instrumentation and Measurement Society, vol. IM-28, No. 1, pp. 6-10 (Mar. 1979).

Liechti, C.A., "Performance of Dual-gate GaAs MESFET's as Gain-Controlled Low-Noise Amplifiers and High-Speed Modulators," *IEEE Transactions on Microwave Theory and Techniques*, IEEE Microwave Theory and Techniques Society, vol. MTT-23, No. 6, pp. 461-469 (Jun. 1975).

Linnenbrink, T.E. et al., "A One Gigasample Per Second Transient Recorder," *IEEE Transactions on Nuclear Science*, IEEE Nuclear and Plasma Sciences Society, vol. NS-26, No. 4, pp. 4443-4449 (Aug. 1979).

Liou, M.L., "A Tutorial on Computer-Aided Analysis of Switched-Capacitor Circuits," *Proceedings of the IEEE*, IEEE, vol. 71, No. 8, pp. 987-1005 (Aug. 1983).

Lo, P. et al., "Coherent Automatic Gain Control," *IEE Colloquium on Phase Locked Techniques*, IEE, pp. 2/1-2/6 (Mar. 26, 1980).

Lo, P. et al., "Computation of Rain Induced Scintillations on Satellite Down-Links at Microwave Frequencies," *Third International Conference on Antennas and Propagation (ICAP 83)*, pp. 127-131 (Apr. 12-15, 1983).

Lo, P.S.L.O. et al., "Observations of Amplitude Scintillations on a Low-Elevation Earth-Space Path," *Electronics Letters*, IEE, vol. 20, No. 7, pp. 307-308 (Mar. 29, 1984).

Madani, K. and Aithison, C.S., "A 20 Ghz Microwave Sampler," *IEEE Transactions on Microwave Theory and Techniques*, IEEE Microwave Theory and Techniques Society, vol. 40, No. 10, pp. 1960-1963 (Oct. 1992).

Marsland, R.A. et al., "130 Ghz GaAs monolithic integrated circuit sampling head," *Appl. Phys. Lett.*, American Institute of Physics, vol. 55, No. 6, pp. 592-594 (Aug. 7, 1989).

Martin, K. and Sedra, A.S., "Switched-Capacitor Building Blocks for Adaptive Systems," *IEEE Transactions on Circuits and Systems*, IEEE Circuits and Systems Society, vol. CAS-28, No. 6, pp. 576-584 (Jun. 1981).

Marzano, F.S. and d'Auria, G., "Model-based Prediction of Amplitude Scintillation variance due to Clear-Air Tropospheric Turbulence on Earth-Satellite Microwave Links," *IEEE Transactions on Antennas and Propagation*, IEEE Antennas and Propagation Society, vol. 46, No. 10, pp. 1506-1518 (Oct. 1998).

Matricciani, E., "Prediction of fade durations due to rain in satellite communication systems," *Radio Science*, American Geophysical Union, vol. 32, No. 3, pp. 935-941 (May-Jun. 1997).

McQueen, J.G., "The Monitoring of High-Speed Waveforms," *Electronic Engineering*, Morgan Brothers Limited, vol. XXIV, No. 296, pp. 436-441 (Oct. 1952).

Merkelo, J. and Hall, R.D., "Broad-Band Thin-Film Signal Sampler," *IEEE Journal of Solid-State Circuits*, IEEE, vol. SC-7, No. 1, pp. 50-54 (Feb. 1972).

Merlo, U. et al., "Amplitude Scintillation Cycles in a Sirio Satellite-Earth Link," *Electronics Letters*, IEE, vol. 21, No. 23, pp. 1094-1096 (Nov. 7, 1985).

Morris, D., "Radio-holographic reflector measurement of the 30-m millimeter radio telescope at 22 Ghz with a cosmic signal source," *Astronomy and Astrophysics*, Springer-Verlag, vol. 203, No. 2, pp. 399-406 (Sep.(II) 1988).

Moulsley, T.J. et al., "The efficient acquisition and processing of propagation statistics," *Journal of the Institution of Electronic and Radio Engineers*, IERE, vol. 55, No. 3, pp. 97-103 (Mar. 1985).

Ndzi, D. et al., "Wide-Band Statistical Characterization of an Over-the-Sea Experimental Transhorizon Link," *IEE Colloquium on Radio Communications at Microwave and Millimetre Wave Frequencies*, IEE, pp. 1/1-1/6 (Dec. 16, 1996).

Ndzi, D. et al., "Wideband Statistics of Signal Levels and Doppler Spread on an Over-The-Sea Transhorizon Link," *IEE Colloquium on Propagation Characteristics and Related System Techniques for Beyond Line-of-Sight Radio*, IEE, pp. 9/1-9/6 (Nov. 24, 1997).

"New zero IF chipset from Philips," *Electronic Engineering*, United News & Media, vol. 67, No. 825, p. 10 (Sep. 1995).

Ohara, H. et al., "First monolithic PCM filter cuts cost of telecomm systems," *Electronic Design*, Hayden Publishing Company, vol. 27, No. 8, pp. 130-135 (Apr. 12, 1979).

Oppenheim, A.V. et al., *Signals and Systems*, Prentice-Hall, pp. 527-531 and 561-562 (1983).

Ortgies, G., "Experimental Parameters Affecting Amplitude Scintillation Measurements on Satellite Links," *Electronics Letters*, IEE, vol. 21, No. 17, pp. 771-772 (Aug. 15, 1985).

Pärssinen et al., "A 2-GHz Subharmonic Sampler for Signal Downconversion," *IEEE Transactions on Microwave Theory and Techniques*, IEEE, vol. 45, No. 12, 7 pages (Dec. 1997).

Peeters, G. et al., "Evaluation of Statistical Models for Clear-Air Scintillation Prediction Using Olympus Satellite Measurements," *International Journal of Satellite Communications*, John Wiley and Sons, vol. 15, No. 2, pp. 73-88 (Mar.-Apr. 1997).

Perrey, A.G. and Schoenwetter, H.K., *NBS Technical Note 1121: A Schottky Diode Bridge Sampling Gate*, U.S. Dept. of Commerce, pp. 1-14 (May 1980).

Poulton, K. et al., "A 1-Ghz 6-bit ADC System," *IEEE Journal of Solid-State Circuits*, IEEE, vol. SC-22, No. 6, pp. 962-969 (Dec. 1987).

Press Release, "Parkervision, Inc. Announces Fiscal 1993 Results," Lippert/Heilshorn and Associates, 2 Pages (Apr. 6, 1994).

Press Release, "Parkervision, Inc. Announces the Appointment of Michael Baker to the New Position of National Sales Manager," Lippert/Heilshorn and Associates, 1 Page (Apr. 7, 1994).

Press Release, "Parkervision's Cameraman Well-Received By Distance Learning Market," Lippert/Heilshorn and Associates, 2 Pages (Apr. 8, 1994).

Press Release, "Parkervision, Inc. Announces First Quarter Financial Results," Lippert/Heilshorn and Associates, 2 Pages (Apr. 26, 1994).

Press Release, "Parkervision, Inc. Announces The Retirement of William H. Fletcher, Chief Financial Officer," Lippert/Heilshorn and Associates, 1 Page (May 11, 1994).

Press Release, "Parkervision, Inc. Announces New Cameraman System II™ At Infocomm Trade Show," Lippert/Heilshorn and Associates, 3 Pages (Jun. 9, 1994).

Press Release, "Parkervision, Inc. Announces Appointments to its National Sales Force," Lippert/Heilshorn and Associates, 2 Pages (Jun. 17, 1994).

Press Release, "Parkervision, Inc. Announces Second Quarter and Six Months Financial Results," Lippert/Heilshorn and Associates, 3 Pages (Aug. 9, 1994).

Press Release, "Parkervision, Inc. Announces Third Quarter and Nine Months Financial Results," Lippert/Heilshorn and Associates, 3 Pages (Oct. 28, 1994).

Press Release, "Parkervision, Inc. Announces First Significant Dealer Sale of Its *Cameraman®* System II," Lippert/Heilshorn and Associates, 2 Pages (Nov. 7, 1994).

Press Release, "Parkervision, Inc. Announces Fourth Quarter and Year End Results," Lippert/Heilshorn and Associates, 2 Pages (Mar. 1, 1995).

Press Release, "Parkervision, Inc. Announces Joint Product Developments With VTEL," Lippert/Heilshorn and Associates, 2 Pages (Mar. 21, 1995).

Press Release, "Parkervision, Inc. Announces First Quarter Financial Results," Lippert/Heilshorn and Associates, 3 Pages (Apr. 28, 1995).

Press Release, "Parkervision Wins Top 100 Product Districts' Choice Award," Parkervision Marketing and Manufacturing Headquarters, 1 Page (Jun. 29, 1995).

Press Release, "Parkervision National Sales Manager Next President of USDLA," Parkervision Marketing and Manufacturing Headquarters, 1 Page (Jul. 6, 1995).

Press Release, "Parkervision Granted New Patent," Parkervision Marketing and Manufacturing Headquarters, 1 Page (Jul. 21, 1995).

Press Release, "Parkervision, Inc. Announces Second Quarter and Six Months Financial Results," Parkervision Marketing and Manufacturing Headquarters, 2 Pages (Jul. 31, 1995).

Press Release, "Parkervision, Inc. Expands Its Cameraman System II Product Line," Parkervision Marketing and Manufacturing Headquarters, 2 Pages (Sep. 22, 1995).

Press Release, "Parkervision Announces New Camera Control Technology," Parkervision Marketing and Manufacturing Headquarters, 2 Pages (Oct. 25, 1995).

Press Release, "Parkervision, Inc. Announces Completion of VTEL/Parkervision Joint Product Line," Parkervision Marketing and Manufacturing Headquarters, 2 Pages (Oct. 30, 1995).

Press Release, "Parkervision, Inc. Announces Third Quarter and Nine Months Financial Results," Parkervision Marketing and Manufacturing Headquarters, 2 Pages (Oct. 30, 1995).

Press Release, "Parkervision's Cameraman Personal Locator Camera System Wins Telecon XV Award," Parkervision Marketing and Manufacturing Headquarters, 2 Pages (Nov. 1, 1995).

Press Release, "Parkervision, Inc. Announces Purchase Commitment From VTEL Corporation," Parkervision Marketing and Manufacturing Headquarters, 1 Page (Feb. 26, 1996).

Press Release, "ParkerVision, Inc. Announces Fourth Quarter and Year End Results," Parkervision Marketing and Manufacturing Headquarters, 2 Pages (Feb. 27, 1996).

Press Release, "ParkerVision, Inc. Expands its Product Line," Parkervision Marketing and Manufacturing Headquarters, 2 Pages (Mar. 7, 1996).

Press Release, "ParkerVision Files Patents for its Research of Wireless Technology," Parkervision Marketing and Manufacturing Headquarters, 1 Page (Mar. 28, 1996).

Press Release, "Parkervision, Inc. Announces First Significant Sale of Its Cameraman® Three-Chip System," Parkervision Marketing and Manufacturing Headquarters, 2 pages (Apr. 12, 1996).

Press Release, "Parkervision, Inc. Introduces New Product Line For Studio Production Market," Parkervision Marketing and Manufacturing Headquarters, 2 pages (Apr. 15, 1996).

Press Release, "Parkervision, Inc. Announces Private Placement of 800,000 Shares," Parkervision Marketing and Manufacturing Headquarters, 1 page (Apr. 15, 1996).

Press Release, "Parkervision, Inc. Announces First Quarter Financial Results," Parkervision Marketing and Manufacturing Headquarters, 3 pages (Apr. 30, 1996).

Press Release, "ParkerVision's New Studio Product Wins Award," Parkervision Marketing and Manufacturing Headquarters, 2 pages (Jun. 5, 1996).

Press Release, "Parkervision, Inc. Announces Second Quarter and Six Months Financial Results," Parkervision Marketing and Manufacturing Headquarters, 3 Pages (Aug. 1, 1996).

Press Release, "Parkervision, Inc. Announces Third Quarter and Nine Months Financial Results," Parkervision Marketing and Manufacturing Headquarters, 2 Pages (Oct. 29, 1996).

Press Release, "PictureTel and Parker Vision Sign Reseller Agreement," Parkervision Marketing and Manufacturing Headquarters, 2 Pages (Oct. 30, 1996).

Press Release, "CLI and ParkerVision Bring Enhanced Ease-of-Use to Videoconferencing," CLI/Parkervision, 2 Pages (Jan. 20, 1997).

Press Release, "Parkervision, Inc. Announces Fourth Quarter and Year End Results," Parkervision Marketing and Manufacturing Headquarters, 3 Pages (Feb. 27, 1997).

Press Release, "Parkervision, Inc. Announces First Quarter Financial Results," Parkervision Marketing and Manufacturing Headquarters, 3 Pages (Apr. 29, 1997).

Press Release, "NEC and Parkervision Make Distance Learning Closer," NEC American, 2 Pages (Jun. 18, 1997).

Press Release, "Parkervision Supplies JPL with Robotic Cameras, Cameraman Shot Director for Mars Mission," Parkervision Marketing and Manufacturing Headquarters, 2 Pages (Jul. 8, 1997).

Press Release, "ParkerVision and IBM Join Forces to Create Wireless Computer Peripherals," Parkervision Marketing and Manufacturing Headquarters, 2 Pages (Jul. 23, 1997).

Press Release, "ParkerVision, Inc. Announces Second Quarter and Six Months Financial Results," Parkervision Marketing and Manufacturing Headquarters, 3 Pages (Jul. 31, 1997).
Press Release, "Parkervision, Inc. Announces Private Placement of 990,000 Shares," Parkervision Marketing and Manufacturing Headquarters, 2 Pages (Sep. 8, 1997).
Press Release, "Wal-Mart Chooses Parkervision for Broadcast Production," Parkervision Marketing and Manufacturing Headquarters, 2 Pages (Oct. 24, 1997).
Press Release, "Parkervision, Inc. Announces Third Quarter Financial Results," Parkervision Marketing and Manufacturing Headquarters, 3 Pages (Oct. 30, 1997).
Press Release, "ParkerVision Announces Breakthrough in Wireless Radio Frequency Technology," Parkervision Marketing and Manufacturing Headquarters, 3 Pages (Dec. 10, 1997).
Press Release, "Parkervision, Inc. Announces the Appointment of Joseph F. Skovron to the Position of Vice President, Licensing—Wireless Technologies," Parkervision Marketing and Manufacturing Headquarters, 2 Pages (Jan. 9, 1998).
Press Release, "Parkervision Announces Existing Agreement with IBM Terminates—Company Continues with Strategic Focus Announced in December," Parkervision Marketing and Manufacturing Headquarters, 2 Pages (Jan. 27, 1998).
Press Release, "Laboratory Tests Verify Parkervision Wireless Technology," Parkervision Marketing and Manufacturing Headquarters, 2 Pages (Mar. 3, 1998).
Press Release, "Parkervision, Inc. Announces Fourth Quarter and Year End Financial Results," Parkervision Marketing and Manufacturing Headquarters, 3 Pages (Mar. 5, 1998).
Press Release, "Parkervision Awarded Editors' Pick of Show for NAB 98," Parkervision Marketing and Manufacturing Headquarters, 2 Pages (Apr. 15, 1998).
Press Release, "Parkervision Announces First Quarter Financial Results," Parkervision Marketing and Manufacturing Headquarters, 3 Pages (May 4, 1998).
Press Release, "Parkervision 'DIRECT2DATA' Introduced in Response to Market Demand," Parkervision Marketing and Manufacturing Headquarters, 3 Pages (Jul. 9, 1998).
Press Release, "Parkervision Expands Senior Management Team," Parkervision Marketing and Manufacturing Headquarters, 2 Pages (Jul. 29, 1998).
Press Release, "Parkervision Announces Second Quarter and Six Month Financial Results," Parkervision Marketing and Manufacturing Headquarters, 4 Pages (Jul. 30, 1998).
Press Release, "Parkervision Announces Third Quarter and Nine Month Financial Results," Parkervision Marketing and Manufacturing Headquarters, 3 Pages (Oct. 30, 1998).
Press Release, "Questar Infocomm, Inc. Invests $5 Million in Parkervision Common Stock," Parkervision Marketing and Manufacturing Headquarters, 3 Pages (Dec. 2, 1998).
Press Release, "Parkervision Adds Two New Directors," Parkervision Marketing and Manufacturing Headquarters, 2 Pages (Mar. 5, 1999).
Press Release, "Parkervision Announces Fourth Quarter and Year End Financial Results," Parkervision Marketing and Manufacturing Headquarters, 3 Pages (Mar. 5, 1999).
Press Release, "Joint Marketing Agreement Offers New Automated Production Solution," Parkervision Marketing and Manufacturing Headquarters, 2 Pages (Apr. 13, 1999).
"Project Cost 205: Scintillations in Earth-satellite links," *Alta Frequenza: Scientific Review in Electronics*, AEI, vol. LIV, No. 3, pp. 209-211 (May-Jun. 1985).
Razavi, B., *RF Microelectronics*, Prentice-Hall, pp. 147-149 (1998).
Reeves, R.J.D., "The Recording and Collocation of Waveforms (Part 1)," *Electronic Engineering*, Morgan Brothers Limited, vol. 31, No. 373, pp. 130-137 (Mar. 1959).
Reeves, R.J.D., "The Recording and Collocation of Waveforms (Part 2)," *Electronic Engineering*, Morgan Brothers Limited, vol. 31, No. 374, pp. 204-212 (Apr. 1959).
Rein, H.M. and Zahn, M., "Subnanosecond-Pulse Generator with Variable Pulsewidth Using Avalanche Transistors," *Electronics Letters*, IEE, vol. 11, No. 1, pp. 21-23 (Jan. 9, 1975).

Riad, S.M. and Nahman, N.S., "Modeling of the Feed-through Wideband (DC to 12.4 Ghz) Sampling-Head," *IEEE MTT-S International Microwave Symposium Digest*, IEEE, pp. 267-269 (Jun. 27-29, 1978).
Rizzoli, V. et al., "Computer-Aided Noise Analysis of MESFET and HEMT Mixers," *IEEE Transactions on Microwave Theory and Techniques*, IEEE, vol. 37, No. 9, pp. 1401-1410 (Sep. 1989).
Rowe, H.E., *Signals and Noise in Communications Systems*, D. Van Nostrand Company, Inc., Princeton, New Jersey, including, for example, Chapter V, Pulse Modulation Systems (1965).
Rücker, F. and Dintelmann, F., "Effect of Antenna Size on OTS Signal Scintillations and Their Seasonal Dependence," *Electronics Letters*, IEE, vol. 19, No. 24, pp. 1032-1034 (Nov. 24, 1983).
Russell, R. and Hoare, L., "Millimeter Wave Phase Locked Oscillators," *Military Microwaves '78 Conference Proceedings*, Microwave Exhibitions and Publishers, pp. 238-242 (Oct. 25-27, 1978).
Sabel, L.P., "A DSP Implementation of a Robust Flexible Receiver/Demultiplexer for Broadcast Data Satellite Communications," *The Institution of Engineers Australia Communications Conference*, Institution of Engineers, Australia, pp. 218-223 (Oct. 16-18, 1990).
Salous, S., "IF digital generation of FMCW waveforms for wideband channel characterization," *IEE Proceedings-I*, IEE, vol. 139, No. 3, pp. 281-288 (Jun. 1992).
"Sampling Loops Lock Sources to 23 Ghz," *Microwaves & RF*, Penton Publishing, p. 212, (Sep. 1990).
Sasikumar, M. et al., "Active Compensation in the Switched-Capacitor Biquad," *Proceedings of the IEEE*, IEEE, vol. 71, No. 8, pp. 1008-1009 (Aug. 1983).
Saul, P.H., "A GaAs MESFET Sample and Hold Switch," *Fifth European Solid State Circuits Conference-ESSCIRC 79*, IEE, pp. 5-7 (1979).
Shen, D.H. et al., "A 900-MHZ RF Front-End with Integrated Discrete-Time Filtering," *IEEE Journal of Solid-State Circuits*, IEEE Solid-State Circuits Council, vol. 31, No. 12, pp. 1945-1954 (Dec. 1996).
Shen, X.D. and Vilar, E., "Anomalous transhorizon propagation and meteorological processes of a multilink path," *Radio Science*, American Geophysical Union, vol. 30, No. 5, pp. 1467-1479 (Sep.-Oct. 1995).
Shen, X. and Tawfik, A.N., "Dynamic Behaviour of Radio Channels Due to Trans-Horizon Propagation Mechanisms," *Electronics Letters*, IEE, vol. 29, No. 17, pp. 1582-1583 (Aug. 19, 1993).
Shen, X. et al., "Modeling Enhanced Spherical Diffraction and Troposcattering on a Transhorizon Path with aid of the parabolic Equation and Ray Tracing Methods," *IEE Colloquium on Common modeling techniques for electromagnetic wave and acoustic wave propagation*, IEE, pp. 4/1-4/7 (Mar. 8, 1996).
Shen, X. and Vilar, E., "Path loss statistics and mechanisms of transhorizon propagation over a sea path," *Electronics Letters*, IEE, vol. 32, No. 3, pp. 259-261 (Feb. 1, 1996).
Shen, D. et al., "A 900 MHZ Integrated Discrete-Time Filtering RF Front-End," *IEEE International Solid State Circuits Conference*, IEEE, vol. 39, pp. 54-55 and 417 (Feb. 1996).
Spillard, C. et al., "X-Band Tropospheric Transhorizon Propagation Under Differing Meteorological Conditions," *Sixth International Conference on Antennas and Propagation (ICAP 89) Part 2: Propagation*, IEE, pp. 451-455 (Apr. 4-7, 1989).
Stafford, K.R. et al., "A Complete Monolithic Sample/Hold Amplifier," *IEEE Journal of Solid-State Circuits*, IEEE, vol. SC-9, No. 6, pp. 381-387 (Dec. 1974).
Staruk, W. Jr. et al., "Pushing HF Data Rates," *Defense Electronics*, EW Communications, vol. 17, No. 5, pp. 211, 213, 215, 217, 220 and 222 (May 1985).
Stephenson, A.G., "Digitizing multiple RF signals requires an optimum sampling rate," *Electronics*, McGraw-Hill, pp. 106-110 (Mar. 27, 1972).
Sugarman, R., "Sampling Oscilloscope for Statistically Varying Pulses," *The Review of Scientific Instruments*, American Institute of Physics, vol. 28, No. 11, pp. 933-938 (Nov. 1957).
Sylvain, M., "Experimental probing of multipath microwave channels," *Radio Science*, American Geophysical Union, vol. 24, No. 2, pp. 160-178 (Mar.-Apr. 1989).

Takano, T., "Novel GaAs Pet Phase Detector Operable To Ka Band," *IEEE MT-S Digest*, IEEE, pp. 381-383 (1984).
Tan, M.A., "Biquadratic Transconductance Switched-Capacitor Filters," *IEEE Transactions on Circuits and Systems- I: Fundamental Theory and Applications*, IEEE Circuits and Systems Society, vol. 40, No. 4, pp. 272-275 (Apr. 1993).
Tanaka, K. et al., "Single Chip Multisystem AM Stereo Decoder IC," *IEEE Transactions on Consumer Electronics*, IEEE Consumer Electronics Society, vol. CE-32, No. 3, pp. 482-496 (Aug. 1986).
Tawfik, A.N., "Amplitude, Duration and Predictability of Long Hop Trans-Horizon X-band Signals Over the Sea," *Electronics Letters*, IEE, vol. 28, No. 6, pp. 571-572 (Mar. 12, 1992).
Tawfik, A.N. and Vilar, E., "Correlation of Transhorizon Signal Level Strength with Localized Surface Meteorological Parameters," *Eighth International Conference on Antennas and Propagation*, Electronics Division of the IEE, pp. 335-339 (Mar. 30-Apr. 2, 1993).
Tawfik, A.N. and Vilar, E., "Dynamic Structure of a Transhorizon Signal at X-band Over a Sea Path," *Sixth International Conference on Antennas and Propagation (ICAP 89) Part 2: Propagation*, IEE, pp. 446-450 (Apr. 4-7, 1989).
Tawfik, A.N. and Vilar, E., "Statistics of Duration and Intensity of Path Loss in a Microwave Transhorizon Sea-Path," *Electronics Letters*, IEE, vol. 26, No. 7, pp. 474-476 (Mar. 29, 1990).
Tawfik, A.N. and Vilar, E., "X-Band Transhorizon Measurements of CW Transmissions Over the Sea- Part 1: Path Loss, Duration of Events, and Their Modeling," *IEEE Transactions on Antennas and Propagation*, IEEE Antennas and Propagation Society, vol. 41, No. 11, pp. 1491-1500 (Nov. 1993).
Temes, G.C. and Tsividis, T., "The Special Section on Switched-Capacitor Circuits," *Proceedings of the IEEE*, IEEE, vol. 71, No. 8, pp. 915-916 (Aug. 1983).
Thomas, G.B., *Calculus and Analytic Geometry*, Third Edition, Addison-Wesley Publishing, pp. 119-133 (1960).
Tomassetti, Q., "An Unusual Microwave Mixer," *16th European Microwave Conference*, Microwave Exhibitions and Publishers, pp. 754-759 (Sep. 8-12, 1986).
Tortoli, P. et al., "Bidirectional Doppler Signal Analysis Based on a Single RF Sampling Channel," *IEEE Transactions on Ultrasonics, Ferroelectrics, and Frequency Control*, IEEE Ultrasonics, Ferroelectrics, and Frequency Control Society, vol. 41, No. 1, pp. 1-3 (Jan. 1984).
Tsividis, Y. and Antognetti, P. (Ed.), *Design of MOS VLSI Circuits for Telecommunications*, Prentice-Hall, p. 304 (1985).
Tsividis, Y., "Principles of Operation and Analysis of Switched-Capacitor Circuits," *Proceedings of the IEEE*, IEEE, vol. 71, No. 8, pp. 926-940 (Aug. 1983).
Tsurumi, H. and Maeda, T., "Design Study on a Direct Conversion Receiver Front-End for 280 MHZ, 900 MHZ, and 2.6 Ghz Band Radio Communication Systems," *41st IEEE Vehicular Technology Conference*, IEEE Vehicular Technology Society, pp. 457-462 (May 19-22, 1991).
Valdmanis, J.A. et al., "Picosecond and Subpicosend Optoelectronics for Measurements of Future High Speed Electronic Devices," *IEDM Technical Digest*, IEEE, pp. 597-600 (Dec. 5-7, 1983).
van de Kamp, M.M.J.L., "Asymmetric signal level distribution due to tropospheric scintillation," *Electronics Letters*, IEE, vol. 34, No. 11, pp. 1145-1146 (May 28, 1998).
Vasseur, H. and Vanhoenacker, D., "Characterization of tropospheric turbulent layers from radiosonde data," *Electronics Letters*, IEE, vol. 34, No. 4, pp. 318-319 (Feb. 19, 1998).
Verdone, R., "Outage Probability Analysis for Short-Range Communication Systems at 60 Ghz in ATT Urban Environments," *IEEE Transactions on Vehicular Technology*, IEEE Vehicular Technology Society, vol. 46, No. 4, pp. 1027-1039 (Nov. 1997).
Vierira-Ribeiro, S.A., *Single-IF DECT Receiver Architecture using a Quadrature Sub-Sampling Band-Pass Sigma-Delta Modulator*, Thesis for Degree of Master's of Engineering, Carleton University, UMI Dissertation Services, pp. 1-180 (Apr. 1995).
Vilar, E. et al., "A Comprehensive/Selective MM-Wave Satellite Downlink Experiment on Fade Dynamics," *Tenth International Conference on Antennas and Propagation*, Electronics Division of the IEE, pp. 2.98-2.101 (Apr. 14-17, 1997).

Vilar, E. et al., "A System to Measure LOS Atmospheric Transmittance at 19 Ghz," *AGARD Conference Proceedings No. 346: Characteristics of the Lower Atmosphere Influencing Radio Wave Propagation*, AGARD, pp. 8-1-8-16 (Oct. 4-7, 1983).
Vilar, E. and Smith, H., "A Theoretical and Experimental Study of Angular Scintillations in Earth Space Paths," *IEEE Transactions on Antennas and Propagation*, IEEE, vol. AP-34, No. 1, pp. 2-10 (Jan. 1986).
Vilar, E. et al., "A Wide Band Transhorizon Experiment at 11.6 Ghz," *Eighth International Conference on Antennas and Propagation*, Electronics Division of the IEE, pp. 441-445 (Mar. 30-Apr. 2, 1993).
Vilar, E. and Matthews, P.A., "Amplitude Dependence of Frequency in Oscillators," *Electronics Letters*, IEE, vol. 8, No. 20, pp. 509-511 (Oct. 5, 1972).
Vilar, E. et al., "An experimental mm-wave receiver system for measuring phase noise due to atmospheric turbulence," *Proceedings of the 25th European Microwave Conference*, Nexus House, pp. 114-119 (1995).
Vilar, E. and Burgueño, A., "Analysis and Modeling of Time Intervals Between Rain Rate Exceedances in the Context of Fade Dynamics," *IEEE Transactions on Communications*, IEEE Communications Society, vol. 39, No. 9, pp. 1306-1312 (Sep. 1991).
Vilar, E. et al., "Angle of Arrival Fluctuations in High and Low Elevation Earth Space Paths," *Fourth International Conference on Antennas and Propagation (ICAP 85)*, Electronics Division of the IEE, pp. 83-88 (Apr. 16-19, 1985).
Vilar, E., "Antennas and Propagation: A Telecommunications Systems Subject," *Electronics Division Colloquium on Teaching Antennas and Propagation to Undergraduates*, IEE, pp. 7/1-7/6 (Mar. 8, 1988).
Vilar, E. et al., "CERS*. Millimetre-Wave Beacon Package and Related Payload Doppler Correction Strategies," *Electronics Division Colloquium on CERS- Communications Engineering Research Satellite*, IEE, pp. 10/1-10/10 (Apr. 10, 1984).
Vilar, E. and Moulsley, T.M., "Comment and Reply: Probability Density Function of Amplitude Scintillations," *Electronics Letters*, IEE, vol. 21, No. 14, pp. 620-622 (Jul. 4, 1985).
Vilar, E. et al., "Comparison of Rainfall Rate Duration Distributions for ILE-IFE and Barcelona," *Electronics Letters*, IEE, vol. 28, No. 20, pp. 1922-1924 (Sep. 24, 1992).
Vilar, E., "Depolarization and Field Transmittances in Indoor Communications," *Electronics Letters*, IEE, vol. 27, No. 9, pp. 732-733 (Apr. 25, 1991).
Vilar, E. and Larsen, J.R., "Elevation Dependence of Amplitude Scintillations on Low Elevation Earth Space Paths," *Sixth International Conference on Antennas and Propagation (ICAP 89) Part 2: Propagation*, IEE, pp. 150-154 (Apr. 4-7, 1989).
Vilar, E. et al., "Experimental System and Measurements of Transhorizon Signal Levels at 11 Ghz," *18th European Microwave Conference*, Microwave Exhibitions and Publishers Ltd., pp. 429-435 (Sep. 12-15, 1988).
Vilar, E. and Matthews, P.A., "Importance of Amplitude Scintillations in Millimetric Radio Links," *Proceedings of the 4th European Microwave Conference*, Microwave Exhibitions and Publishers, pp. 202-206 (Sep. 10-13, 1974).
Vilar, E. and Haddon, J., "Measurement and Modeling of Scintillation Intensity to Estimate Turbulence Parameters in an Earth-Space Path," *IEEE Transactions on Antennas and Propagation*, IEEE Antennas and Propagation Society, vol. AP-32, No. 4, pp. 340-346 (Apr. 1984).
Vilar, E. and Matthews, P.A., "Measurement of Phase Fluctuations on Millimetric Radiowave Propagation," *Electronics Letters*, IEE, vol. 7, No. 18, pp. 566-568 (Sep. 9, 1971).
Vilar, E. and Wan, K.W., "Narrow and Wide Band Estimates of Field Strength for Indoor Communications in the Millimetre Band," *Electronics Division Colloquium on Radiocommunications in the Range 30-60 Ghz*, IEE, pp. 5/1-5/8 (Jan. 17, 1991).
Vilar, E. and Faulkner, N.D., "Phase Noise and Frequency Stability Measurements. Numerical Techniques and Limitations," *Electronics Division Colloquium on Low Noise Oscillators and Synthesizer*, IEE, 5 pages (Jan. 23, 1986).

Vilar, E. and Senin, S., "Propagation phase noise identified using 40 Ghz satellite downlink," *Electronics Letters*, IEE, vol. 33, No. 22, pp. 1901-1902 (Oct. 23, 1997).

Vilar, E. et al., "Scattering and Extinction: Dependence Upon Raindrop Size Distribution in Temperate (Barcelona) and Tropical (Belem) Regions," *Tenth International Conference on Antennas and Propagation*, Electronics Division of the IEE, pp. 2.230-2.233 (Apr. 14-17, 1997).

Vilar, E. and Haddon, J., "Scintillation Modeling and Measurement—A Tool for Remote-Sensing Slant Paths," *Agard Conference Proceedings No. 332: Propagation Aspects of Frequency Sharing, Interference And Systems Diversity*, Agard, pp. 27-1-27-13 (Oct. 18-22, 1982).

Vilar, E., "Some Limitations on Digital Transmission Through Turbulent Atmosphere," *International Conference on Satellite Communication Systems Technology*, Electronics Division of the IEE, pp. 169-187 (Apr. 7-10, 1975).

Vilar, E. and Matthews, P.A., "Summary of Scintillation Observations in a 36 Ghz Link Across London," *International Conference on Antennas and Propagation Part 2: Propagation*, IEE, pp. 36-40 (Nov. 28-30, 1978).

Vilar, E. et al., "Wideband Characterization of Scattering Channels," *Tenth International Conference on Antennas and Propagation*, Electronics Division of the IEE, pp. 2.353-2.358 (Apr. 14-17, 1997).

Vollmer, A., "Complete GPS Receiver Fits on Two Chips," *Electronic Design*, Penton Publishing, pp. 50, 52, 54 and 56 (Jul. 6, 1998).

*Voltage and Time Resolution in Digitizing Oscilloscopes: Application Note 348*, Hewlett Packard, pp. 1-11 (Nov. 1986).

Wan, K.W. et al., "A Novel Approach to the Simultaneous Measurement of Phase and Amplitude Noises in Oscillator," *Proceedings of the 19th European Microwave Conference*, Microwave Exhibitions and Publishers Ltd., pp. 809-813 (Sep. 4-7, 1989).

Wan, K.W. et al., "Extended Variances and Autoregressive/Moving Average Algorithm for the Measurement and Synthesis of Oscillator Phase Noise," *Proceedings Of the 43rd Annual Symposium on Frequency Control*, IEEE, pp. 331-335 (1989).

Wan, K.W. et al., "Wideband Transhorizon Channel Sounder at 11 Ghz," *Electronics Division Colloquium on High Bit Rate UHF/SHF Channel Sounders—Technology and Measurement*, IEE, pp. 3/1-3/5 (Dec. 3, 1993).

Wang, H., "A 1-V Multigigahertz RF Mixer Core in 0.5—μm CMOS," *IEEE Journal of Solid-State Circuits*, IEEE Solid-State Circuits Society, vol. 33, No. 12, pp. 2265-2267 (Dec. 1998).

Watson, A.W.D. et al., "Digital Conversion and Signal Processing for High Performance Communications Receivers," *Digital Processing of Signals in Communications*, Institution of Electronic and Radio Engineers, pp. 367-373 (Apr. 22-26, 1985).

Weast, R.C. et al. (Ed.), *Handbook of Mathematical Tables*, Second Edition, The Chemical Rubber Co., pp. 480-485 (1964).

Wiley, R.G., "Approximate FM Demodulation Using Zero Crossings," *IEEE Transactions on Communications*, IEEE, vol. COM-29, No. 7, pp. 1061-1065 (Jul. 1981).

Worthman, W., "Convergence . . . Again," *RF Design*, Primedia, p. 102 (Mar. 1999).

Young, I.A. and Hodges, D.A., "MOS Switched-Capacitor Analog Sampled-Data Direct-Form Recursive Filters," *IEEE Journal of Solid-State Circuits*, IEEE, vol. SC-14, No. 6, pp. 1020-1033 (Dec. 1979).

Translation of Specification and Claims of FR Patent No. 2245130, 3 pages (Apr. 18, 1975- Date of publication of application).

Fest, Jean-Pierre, "Le Convertisseur A/N Revolutionne Le Recepteur Radio," *Electronique*, JMJ (Publisher), No. 54, pp. 40-42 (Dec. 1995).

Translation of DE Patent No. 35 41 031 A1, 22 pages (May 22, 1986- Date of publication of application).

Translation of EP Patent No. 0 732 803 A1, 9 pages (Sep. 18, 1996- Date of publication of application).

Fest, Jean-Pierre, "The A/D Converter Revolutionizes the Radio Receiver," *Electronique*, JMJ (Publisher), No. 54, 3 pages (Dec. 1995). (Translation of Doc. AQ50).

Translation of German Patent No. DE 197 35 798 C1, 8 pages (Jul. 16, 1998- Date of publication of application).

Miki, S. and Nagahama, R., *Modulation System II*, Common Edition 7, Kyoritsu Publishing Co., Ltd., pp. 146-154 (Apr. 30, 1956).

Miki, S. and Nagahama, R., *Modulation System II*, Common Edition 7, Kyoritsu Publishing Co., Ltd., pp. 146-149 (Apr. 30, 1956). (Partial Translation of Doc. AQ51).

Rabiner, L.R. and Gold, B., *Theory and Application Of Digital Signal Processing*, Prentice-Hall, Inc., pp. v-xii and 40-46 (1975).

English-language Abstract of Japanese Patent Publication No. 08-032556, from http://www1.ipdl.jpo.go.jp, 2 Pages (Feb. 2, 1996—Date of publication of application).

English-language Abstract of Japanese Patent Publication No. 08-139524, from http://www1.ipdl.jpo.go.jp, 2 Pages (May 31, 1996—Date of publication of application).

English-language Abstract of Japanese Patent Publication No. 59-144249, from http://www1.ipdl.jpo.go.jp, 2 Pages (Aug. 18, 1984—Date of publication of application).

English-language Abstract of Japanese Patent Publication No. 63-054002, from http://www1.ipdl.jpo.go.jp, 2 Pages (Mar. 8, 1988—Date of publication of application).

English-language Abstract of Japanese Patent Publication No. 06-237276, from http://www1.ipdl.jpo.go.jp, 2 Pages (Aug. 23, 1994—Date of publication of application).

English-language Abstract of Japanese Patent Publication No. 08-023359, from http://www1.ipdl.jpo.go.jp, 2 Pages (Jan. 23, 1996—Date of publication of application).

Translation of Japanese Patent Publication No. 47-2314, 7 pages (Feb. 4, 1972- Date of publication of application).

Partial Translation of Japanese Patent Publication No. 58-7903, 3 pages (Jan. 17, 1983- Date of publication of application).

English-language Abstract of Japanese Patent Publication No. 58-133004, from http://www1.ipdl.jpo.go.jp, 2 Pages (Aug. 8, 1993—Date of publication of application).

English-language Abstract of Japanese Patent Publication No. 60-058705, from http://www1.ipdl.jpo.go.jp, 2 Pages (Apr. 4, 1985—Date of publication of application).

English-language Abstract of Japanese Patent Publication No. 04-123614, from http://www1.ipdl.jpo.go.jp, 2 Pages (Apr. 23, 1992—Date of publication of application).

English-language Abstract of Japanese Patent Publication No. 04-127601, from http://www1.ipdl.jpo.go.jp, 2 Pages (Apr. 28, 1992—Date of publication of application).

English-language Abstract of Japanese Patent Publication No. 05-175730, from http://www1.ipdl.jpo.go.jp, 2 Pages (Jul. 13, 1993—Date of publication of application).

English-language Abstract of Japanese Patent Publication No. 05-175734, from http://www1.ipdl.jpo.go.jp, 2 Pages (Jul. 13, 1993—Date of publication of application).

English-language Abstract of Japanese Patent Publication No. 07-154344, from http://www1.ipdl.jpo.go.jp, 2 Pages (Jun. 16, 1995—Date of publication of application).

English-language Abstract of Japanese Patent Publication No. 07-307620, from http://www1.ipdl.jpo.go.jp, 2 Pages (Nov. 21, 1995—Date of publication of application).

Oppenheim, A.V. and Schafer, R.W., *Digital Signal Processing*, Prentice-Hall, pp. vii-x, 6-35, 45-78, 87-121 and 136-165 (1975).

English-language Abstract of Japanese Patent Publication No. 55-066057, from http://www1.ipdl.jpo.go.jp, 2 Pages (May 19, 1980—Date of publication of application).

English-language Abstract of Japanese Patent Publication No. 63-065587, from http://www1.ipdl.jpo.go.jp, 2 Pages (Mar. 24, 1988—Date of publication of application).

English-language Abstract of Japanese Patent Publication No. 63-153691, from http://www1.ipdl.jpo.go.jp, 2 Pages (Jun. 27, 1988—Date of publication of application).

Translation of Japanese Patent Publication No. 60-130203, 3 pages (Jul. 11, 1985- Date of publication of application).

Razavi, B., "A 900-MHz/1.8-Ghz CMOS Transmitter for Dual-Band Applications," *Symposium on VLSI Circuits Digest of Technical Papers*, IEEE, pp. 128-131 (1998).

Ritter, G.M., "SDA, A New Solution for Transceivers," *16th European Microwave Conference*, Microwave Exhibitions and Publishers, pp. 729-733 (Sep. 8, 1986).

Dialog File 351 (Derwent WPI) English Language Patent Abstract for FR 2 669 787, 1 page (May 29, 1992- Date of publication of application).

Akos, D.M. et al., "Direct Bandpass Sampling of Multiple Distinct RF Signals," *IEEE Transactions on Communications*, IEEE, vol. 47, No. 7, pp. 983-988 (Jul. 1999).

Patel, M. et al., "Bandpass Sampling for Software Radio Receivers, and the Effect of Oversampling on Aperture Jitter," *VTC 2002*, IEEE, pp. 1901-1905 (2002).

English-language Abstract of Japanese Patent Publication No. 61-030821, from http://www1.ipdl.jpo.go.jp, 2 Pages (Feb. 13, 1986- Date of publication of application).

English-language Abstract of Japanese Patent Publication No. 05-327356, from http://www1.ipdl.jpo.go.jp, 2 Pages (Dec. 10, 1993—Date of publication of application).

Tayloe, D., "A Low-noise, High-performance Zero IF Quadrature Detector/Preamplifier," *RF Design*, Primedia Business Magazines & Media, Inc., pp. 58, 60, 62 and 69 (Mar. 2003).

Dines, J.A.B., "Smart Pixel Optoelectronic Receiver Based on a Charge Sensitive Amplifier Design," *IEEE Journal of Selected Topics in Quantum Electronics*, IEEE, vol. 2, No. 1, pp. 117-120 (Apr. 1996).

Simoni, A. et al., "A Digital Camera for Machine Vision," *20th International Conference on Industrial Electronics, Control and Instrumentation*, IEEE, pp. 879-883 (Sep. 1994).

Stewart, R.W. and Pfann, E., "Oversampling and sigma-delta strategies for data conversion," *Electronics & Communication Engineering Journal*, IEEE, pp. 37-47 (Feb. 1998).

Rudell, J.C. et al., "A 1.9-Ghz Wide-Band IF Double Conversion CMOS Receiver for Cordless Telephone Applications," *IEEE Journal of Solid-State Circuits*, IEEE, vol. 32, No. 12, pp. 2071-2088 (Dec. 1997).

English-language Abstract of Japanese Patent Publication No. 09-036664, from http://www1.ipdl.jpo.go.jp, 2 Pages (Feb. 7, 1997—Date of publication of application).

Simoni, A. et al., "A Single-Chip Optical Sensor with Analog Memory for Motion Detection," *IEEE Journal of Solid-State Circtuits*, IEEE, vol. 30, No. 7, pp. 800-806 (Jul. 1995).

English Translation of German Patent Publication No. DE 196 48 915 A1, 10 pages.

Deboo, Gordon J., *Integrated Circuits and Semiconductor Devices*, 2nd Edition, McGraw-Hill, Inc., pp. 41-45 (1977).

Hellwarth, G.A. and Jones, G.D, "Automatic Conditioning of Speech Signals," *IEEE Transactions on Audio and Electroacoustics*, vol. AU-16, No. 2, pp. 169-179 (Jun. 1968).

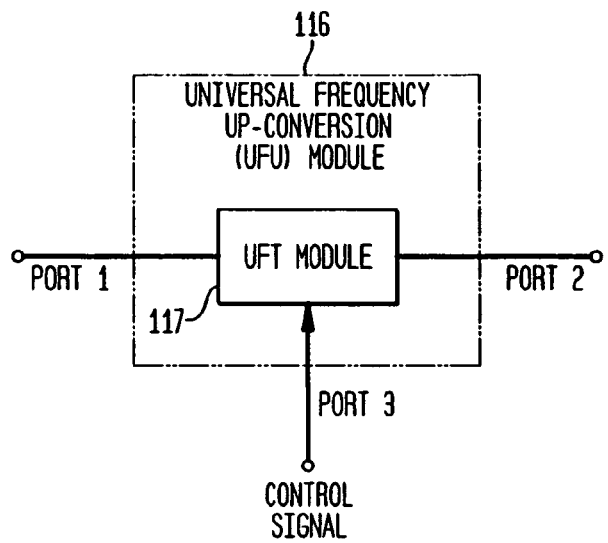
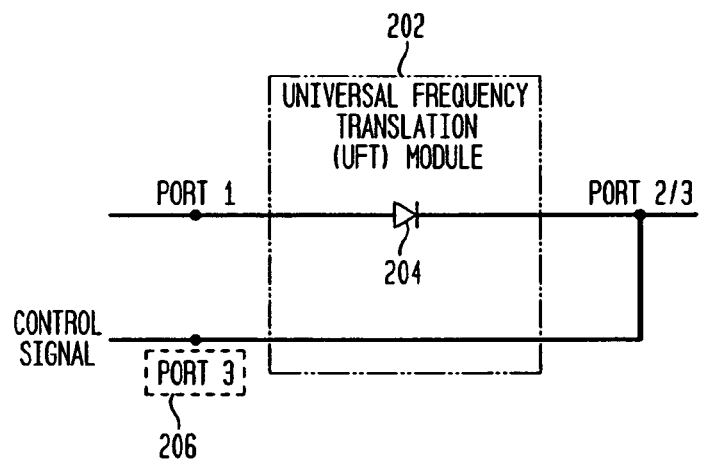
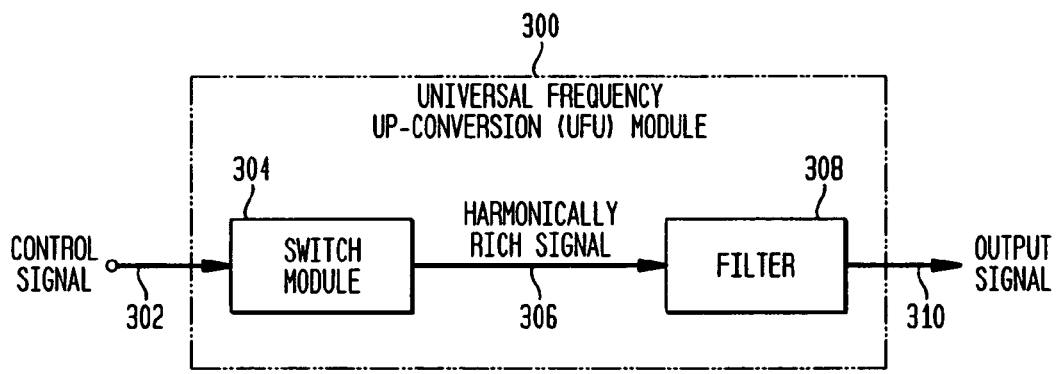

INFORMATION SIGNAL 602

OSCILLATING SIGNAL 604

FREQUENCY MODULATED INPUT SIGNAL 606

HARMONICALLY RICH SIGNAL (SHOWN AS SQUARE WAVE) 608

SEE FIG. 6E

EXPANDED VIEW OF HARMONICALLY RICH SIGNAL 608

610 SEE FIG 6F    612 SEE FIG 6G

HARMONICS OF SIGNAL 610 (SHOWN SEPARATELY)

FUNDAMENTAL FREQUENCY 610A    THIRD HARMONIC 610B    FIFTH HARMONIC 610C

HARMONICS OF SIGNAL 612 (SHOWN SEPARATELY)

FUNDAMENTAL FREQUENCY 612A    THIRD HARMONIC 612B    FIFTH HARMONIC 612C

HARMONICS OF
SIGNALS 610 AND 612
(SHOWN SIMULTANEOUSLY
BUT NOT SUMMED)

610    612

FILTERED
OUTPUT
SIGNAL
614

610C    612C

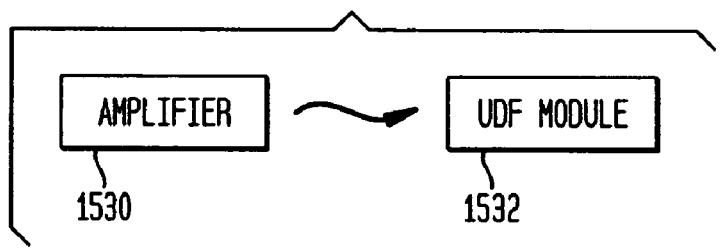
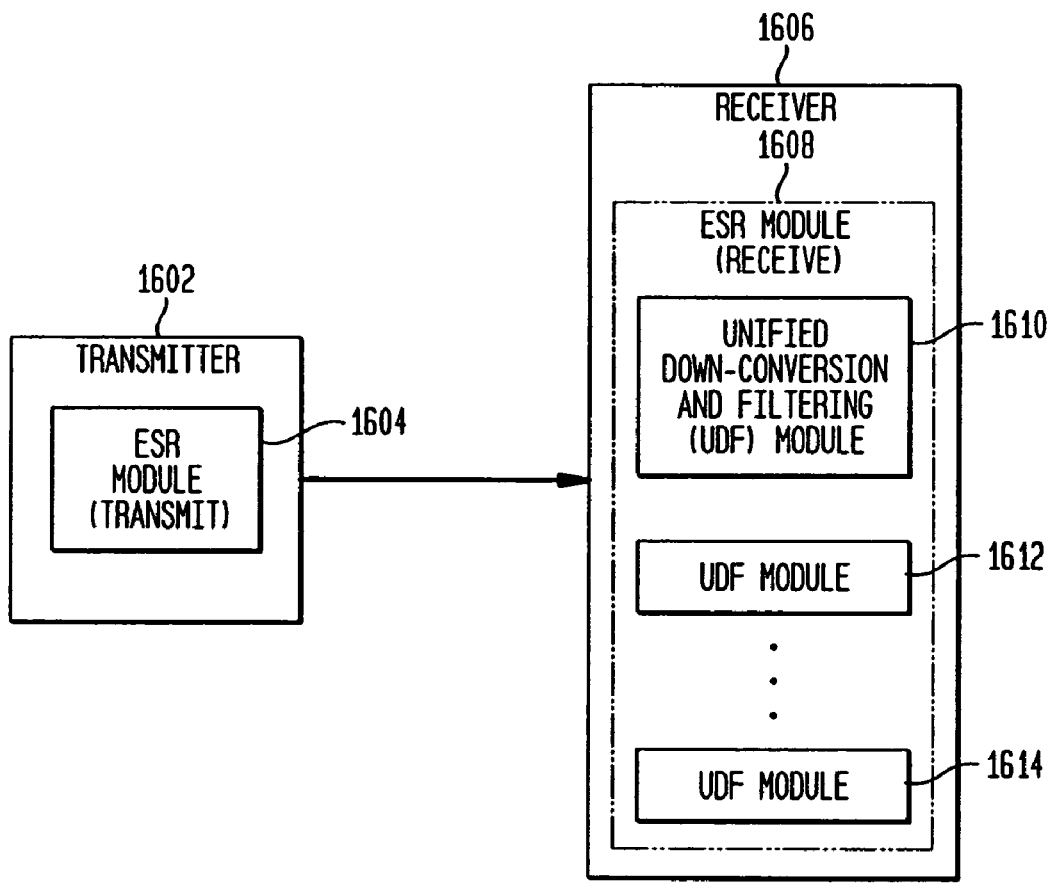

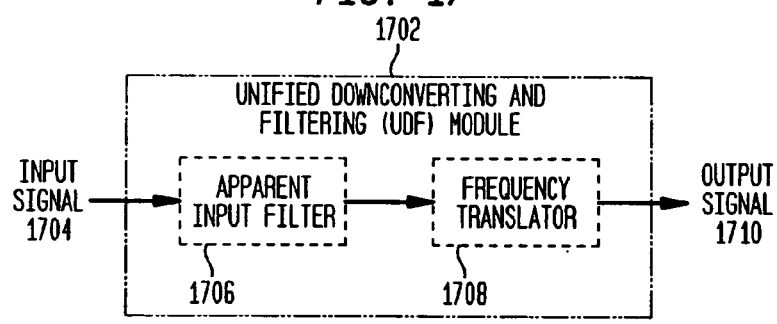
FIG. 17
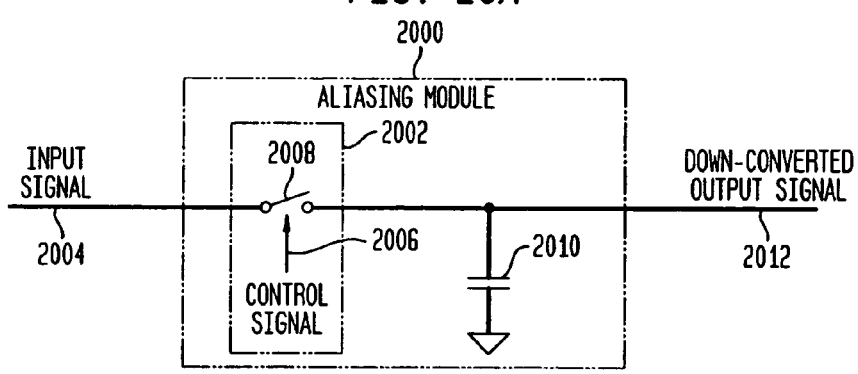
FIG. 18
| TIME<br>NODE | t-1<br>(RISING EDGE<br>OF $\phi_1$) | t-1<br>(RISING EDGE<br>OF $\phi_2$) | t<br>(RISING EDGE<br>OF $\phi_1$) | t<br>(RISING EDGE<br>OF $\phi_2$) | t+1<br>(RISING EDGE<br>OF $\phi_1$) |
|---|---|---|---|---|---|
| 1902 | $VI_{t-1}$   1804 | $VI_{t-1}$   1808 | $VI_t$   1816 | $VI_t$   1826 | $VI_{t+1}$   1838 |
| 1904 | — | $VI_{t-1}$   1810 | $VI_{t-1}$   1818 | $VI_t$   1828 | $VI_t$   1840 |
| 1906 | $VO_{t-1}$   1806 | $VO_{t-1}$   1812 | $VO_t$   1820 | $VO_t$   1830 | $VO_{t+1}$   1842 |
| 1908 | — | $VO_{t-1}$   1814 | $VO_{t-1}$   1822 | $VO_t$   1832 | $VO_t$   1844 |
| 1910 | —   1807 | — | $VO_{t-1}$   1824 | $VO_{t-1}$   1834 | $VO_t$   1846 |
| 1912 | — | —   1815 | — | $VO_{t-1}$   1836 | $VO_{t-1}$   1848 |
| 1918 | — | — | — | — | $VI_t -$   1850<br>$0.1 * VO_t -$<br>$0.8 * VO_{t-1}$ |
FIG. 20A

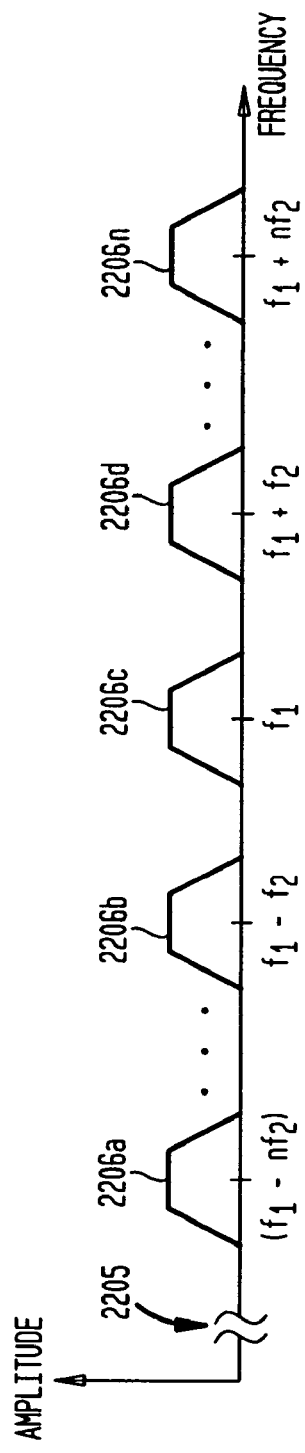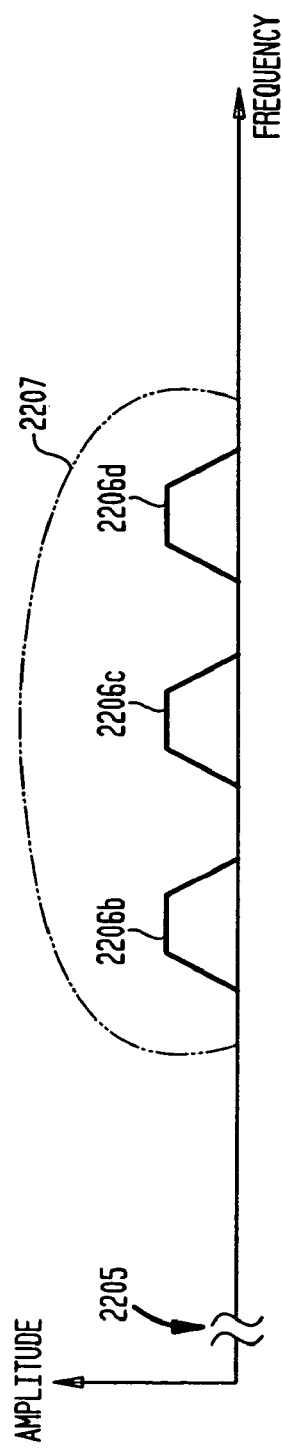

IQDEMOD SHOWING TIME RELATIONSHIP OF TX_I DATA

IQDEMOD SHOWING TIME RELATIONSHIP OF TX_Q DATA

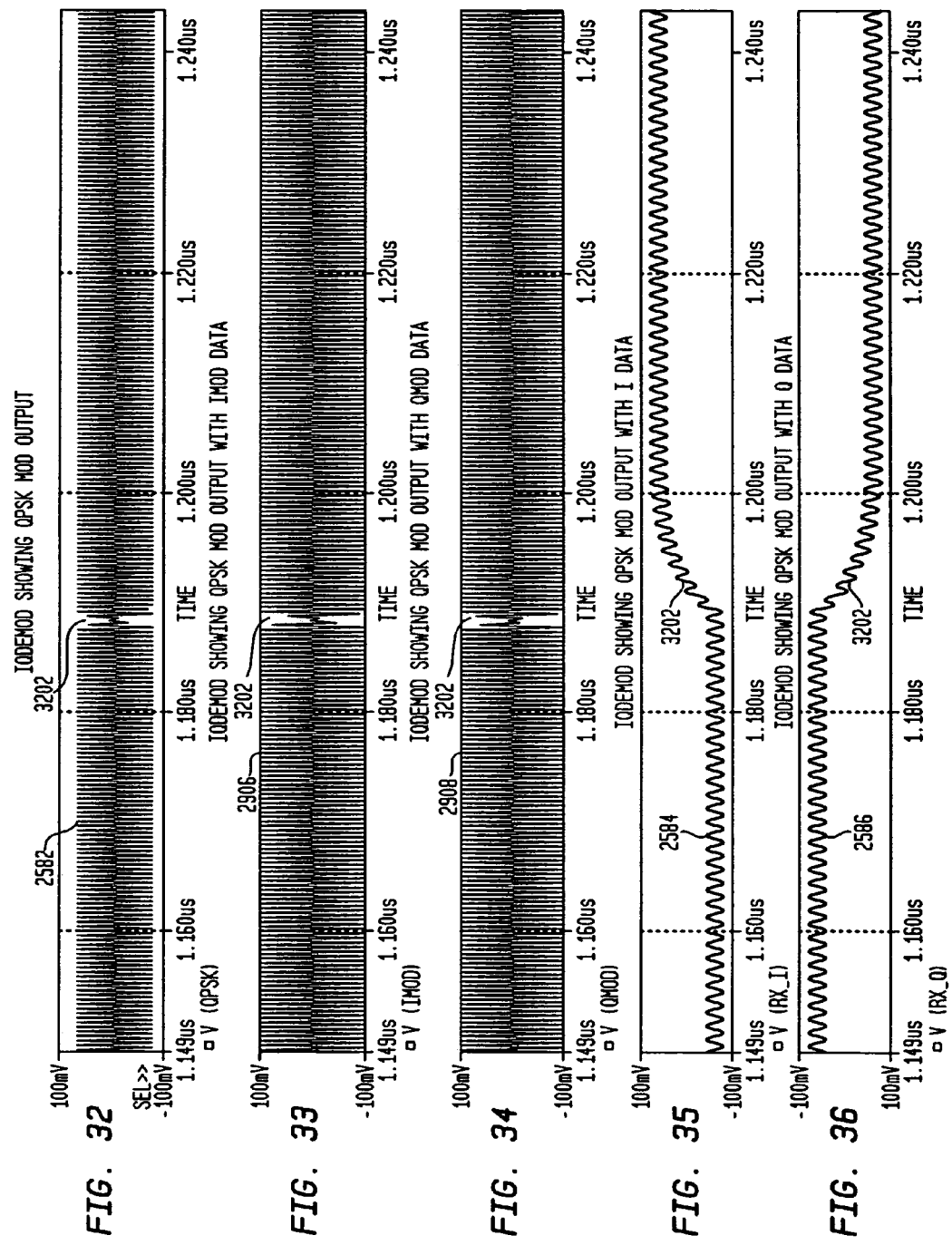

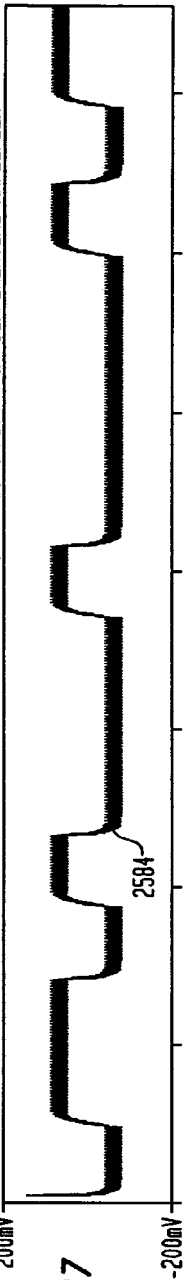
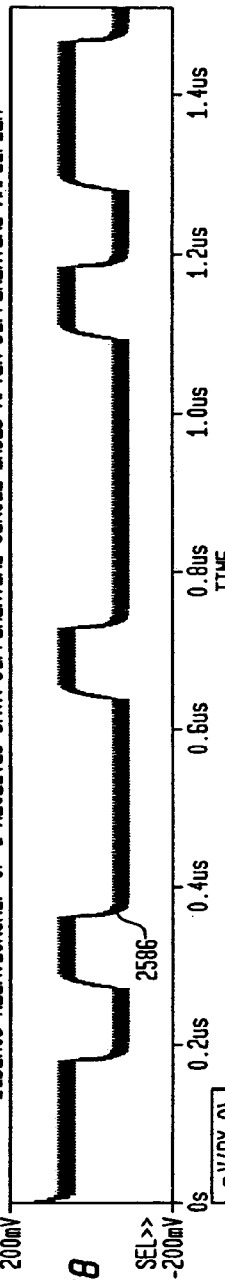
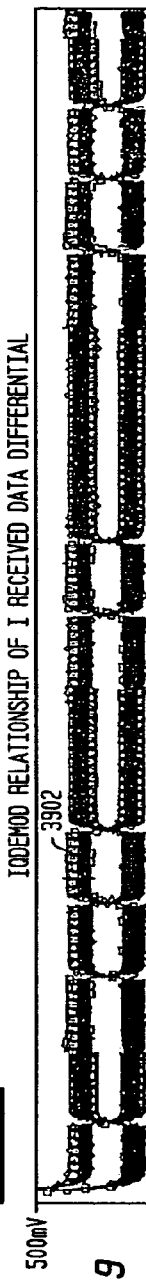
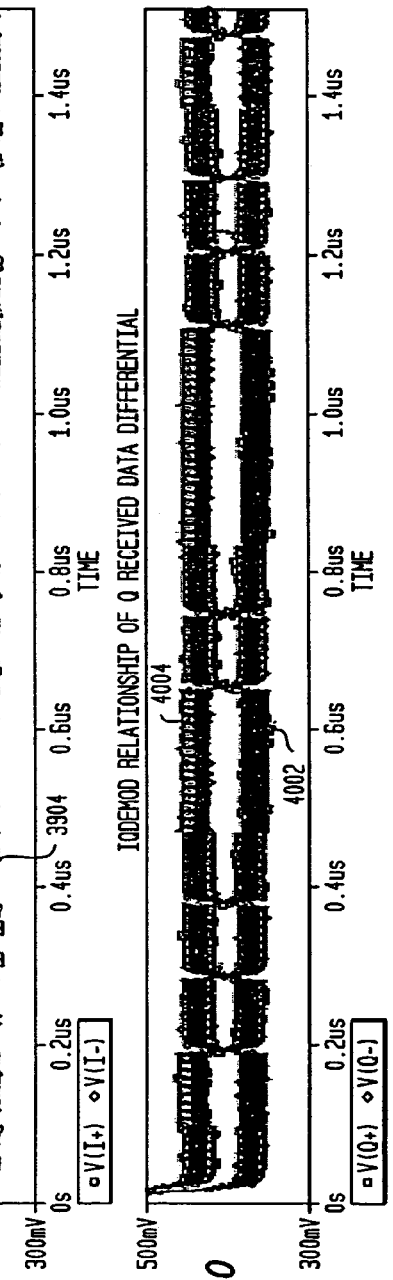
FIG. 37
FIG. 38
FIG. 39
FIG. 40

RISING EDGE PULSE GENERATOR

FALLING-EDGE PULSE GENERATOR

- SUBSTANTIAL EQUIVALENCE IN LOGIC ONLY IS NECESSARY
- u7 SHOWN FOR POLARITY CONSISTENCY WITH CKT EXAMPLES DESCRIBED ELSEWHERE

IMPEDANCE MATCHED ALIASING MODULE

ALIASING MODULE

ENERGY TRANSFER SIGNAL MODULE 4702

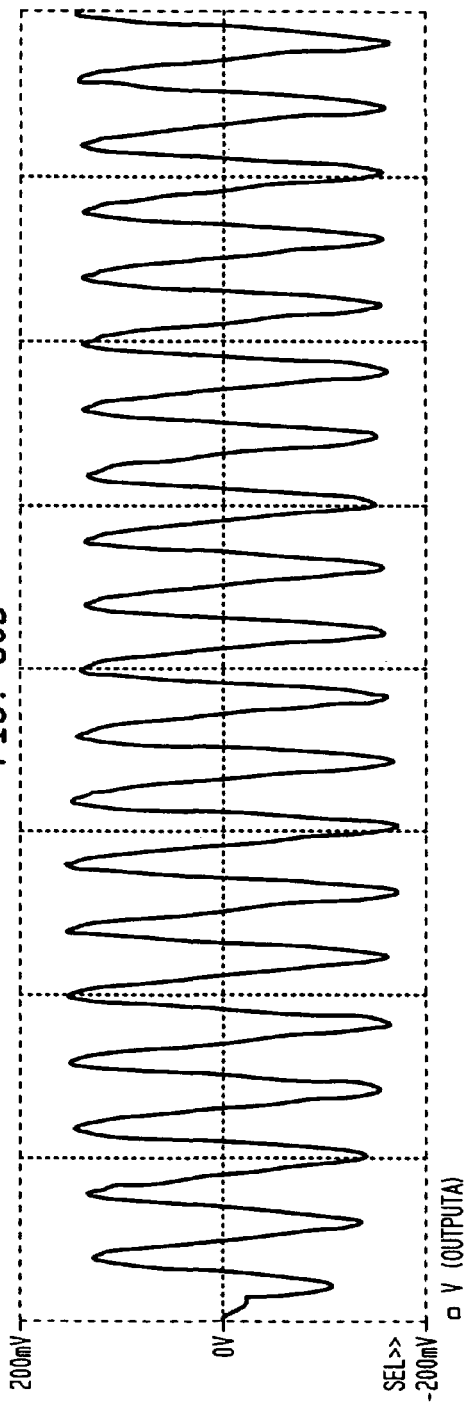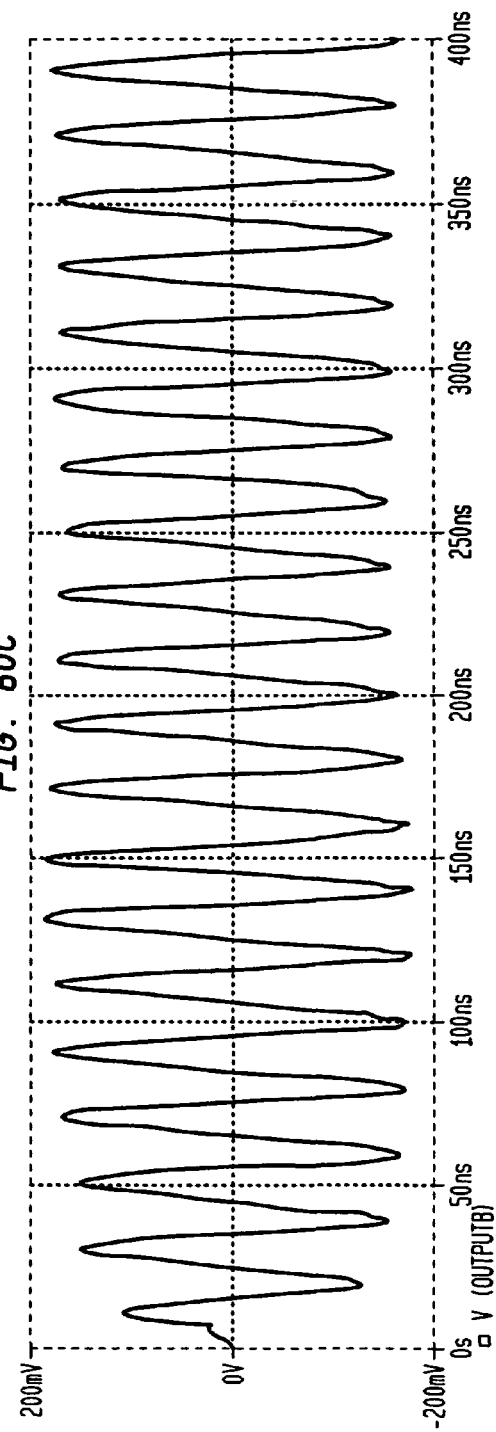

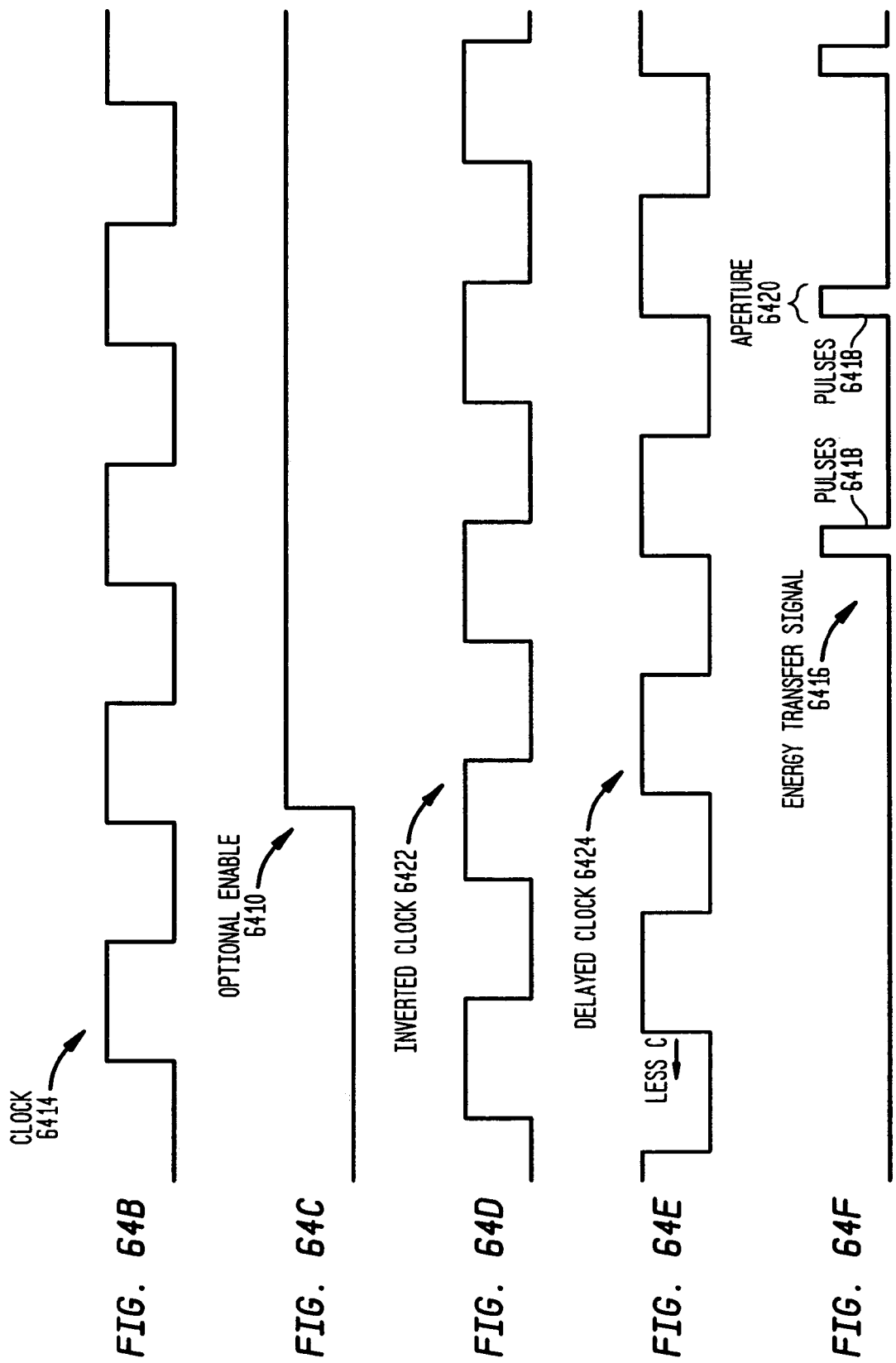

FIG. 71A

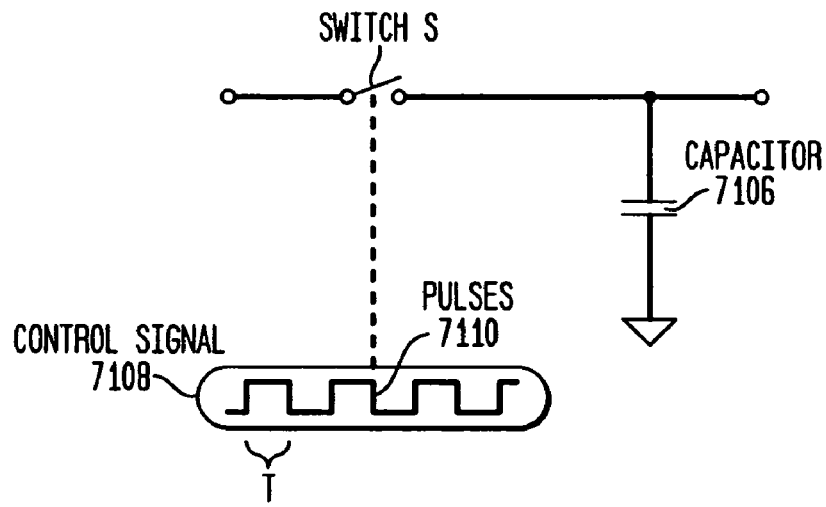

FIG. 71B

| | |
|---|---|
| $q = C \cdot V$ | EQ. 10 |
| $V = A \cdot \sin(t)$ | EQ. 11 |
| $q(t) = C \cdot A \cdot \sin(t)$ | EQ. 12 |
| $\Delta q(t) = C \cdot A \cdot \sin(t) - C \cdot A \cdot \sin(t-T)$ | EQ. 13 |
| $\Delta q(t) = C \cdot A \cdot (\sin(t) - \sin(t-T))$ | EQ. 14 |
| $\sin(\alpha) - \sin(\beta) = 2 \cdot \sin(\frac{\alpha - \beta}{2}) \cdot \cos(\frac{\alpha + \beta}{2})$ | EQ. 15 |
| $\Delta q(t) = 2 \cdot C \cdot A \cdot \sin[\frac{t-(t-T)}{2}] \cdot \cos[\frac{t+(t-T)}{2}]$ | EQ. 16 |
| $\Delta q(t) = 2 \cdot C \cdot A \cdot \sin(\frac{1}{2} \cdot T) \cdot \cos(t - \frac{1}{2} \cdot T)$ | EQ. 17 |
| $q(t) = \int C \cdot A \cdot (\sin(t) - \sin(t-T)) \, dt$ | EQ. 18 |
| $q(t) = -\cos(t) \cdot C \cdot A + \cos(t-T) \cdot C \cdot A$ | EQ. 19 |
| $q(t) = C \cdot A \cdot (\cos(t-T) - \cos(t))$ | EQ. 20 |

FIG. 71C
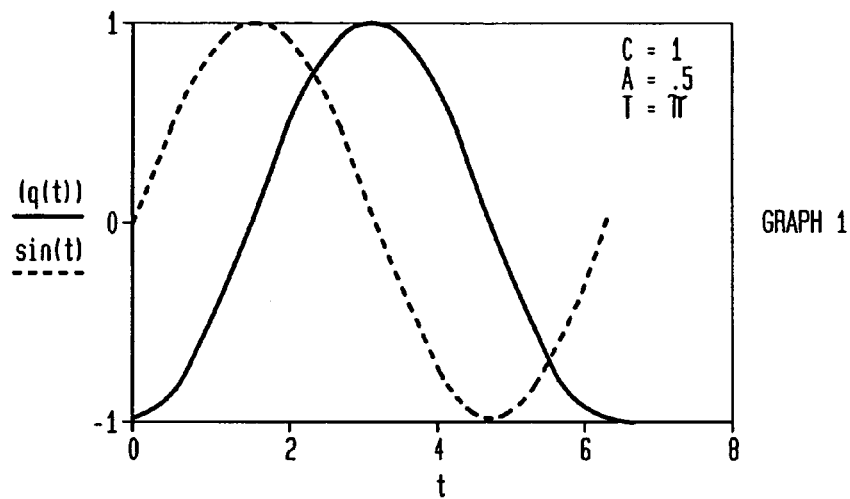
GRAPH 1
FIG. 71D
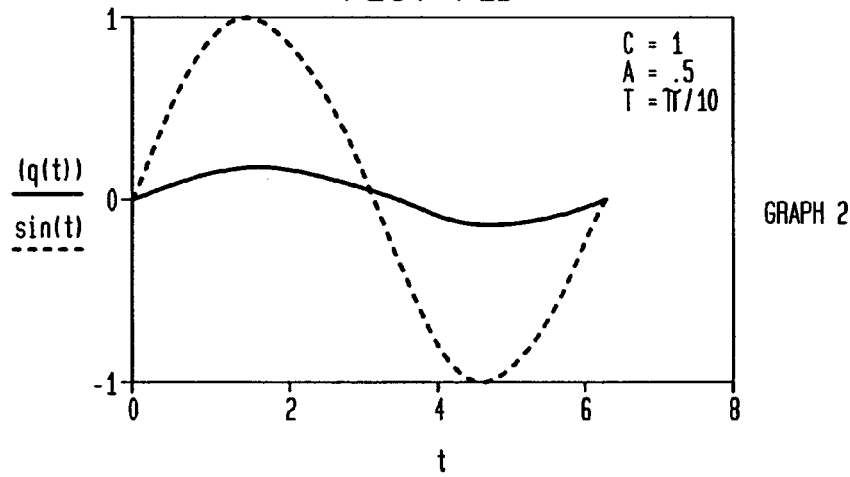
GRAPH 2
FIG. 71E
POWER-CHARGE RELATIONSHIP
| | |
|---|---|
| $q = C \cdot V$ | EQ. 21 |
| $V = q/C$ | EQ. 22 |
| $V = J/q$ | EQ. 23 |
| $J = q^2/C$ | EQ. 24 |
| $P = J/S$ | EQ. 25 |
| $P = q^2/(C \cdot S)$ | EQ. 26 |
FIG. 71F
INSERTION LOSS
INSERTION LOSS IN dB IS EXPRESSED BY:
$$IL dB = 10 \cdot \log\left(\frac{P_{in}}{P_{out}}\right) \quad \text{EQ. 27}$$
or
$$IL dB = 10 \cdot \log\left[\frac{\left(\frac{V_{in}^2}{R_{in}}\right)}{\left(\frac{V_{out}^2}{R_{out}}\right)}\right] \quad \text{EQ. 28}$$

*FIG. 86G*
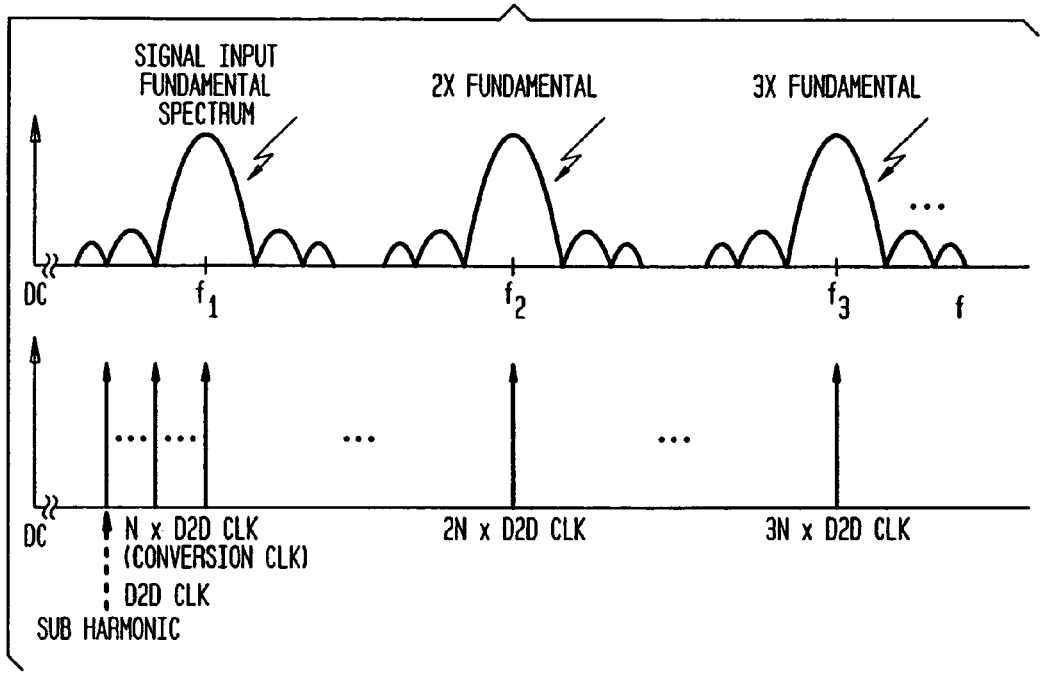
*FIG. 86H*
DESIRED TERM ⎤  ⎡ SQUARE LAW TERM
$$V_0 = k_1 V_i + k_2 V_i^2 + k_3 V_i^3$$
*FIG. 86I*
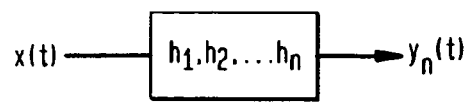

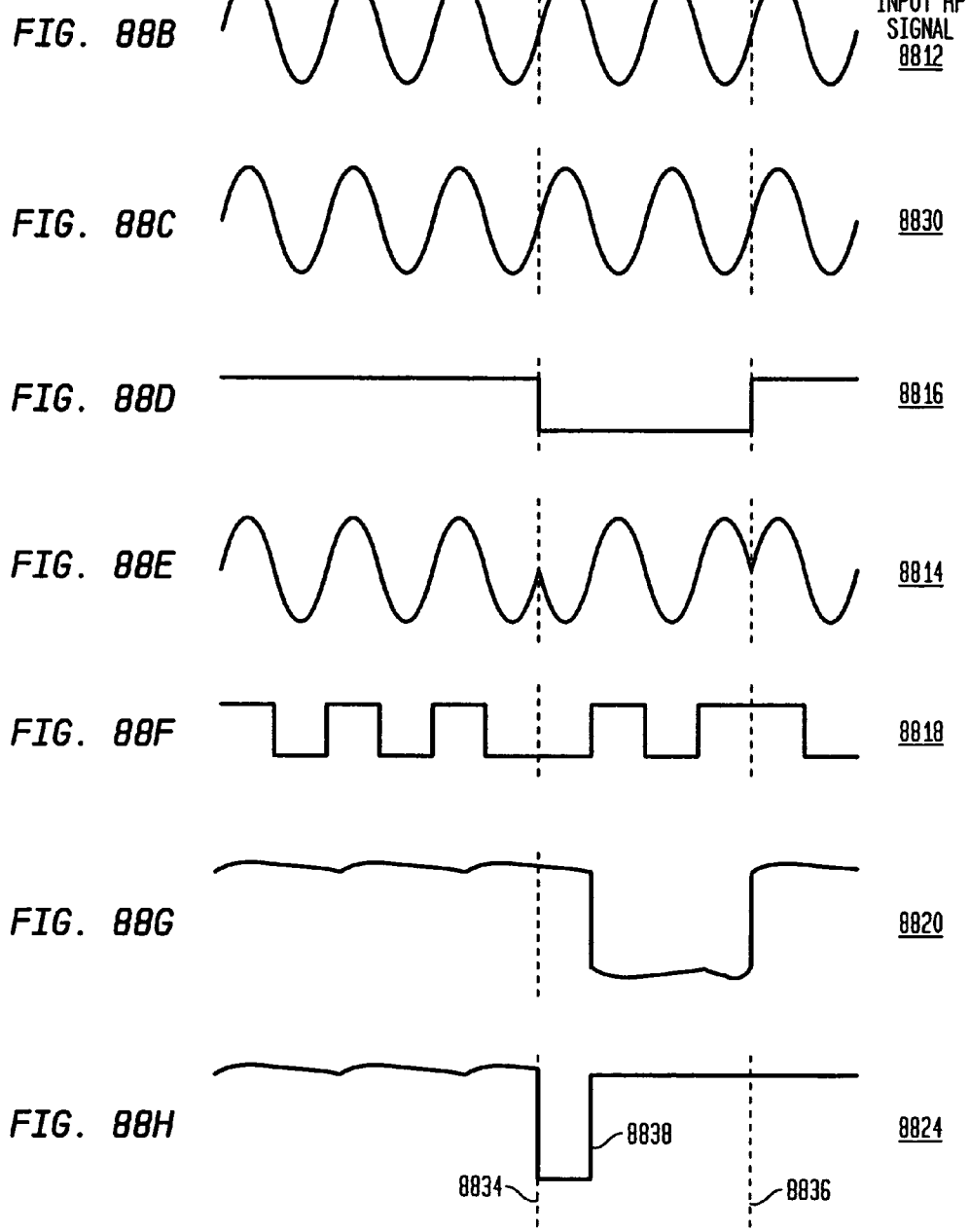

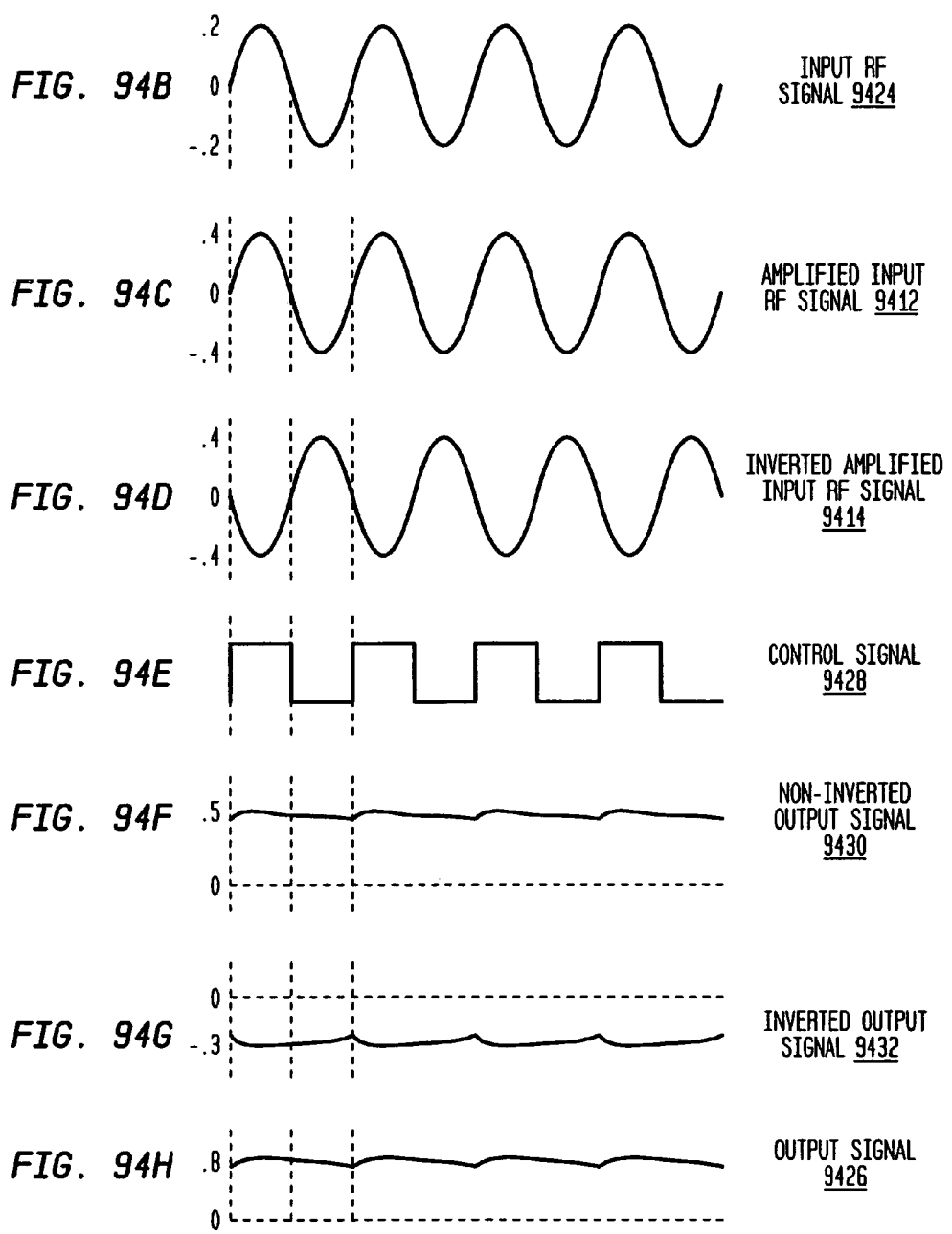

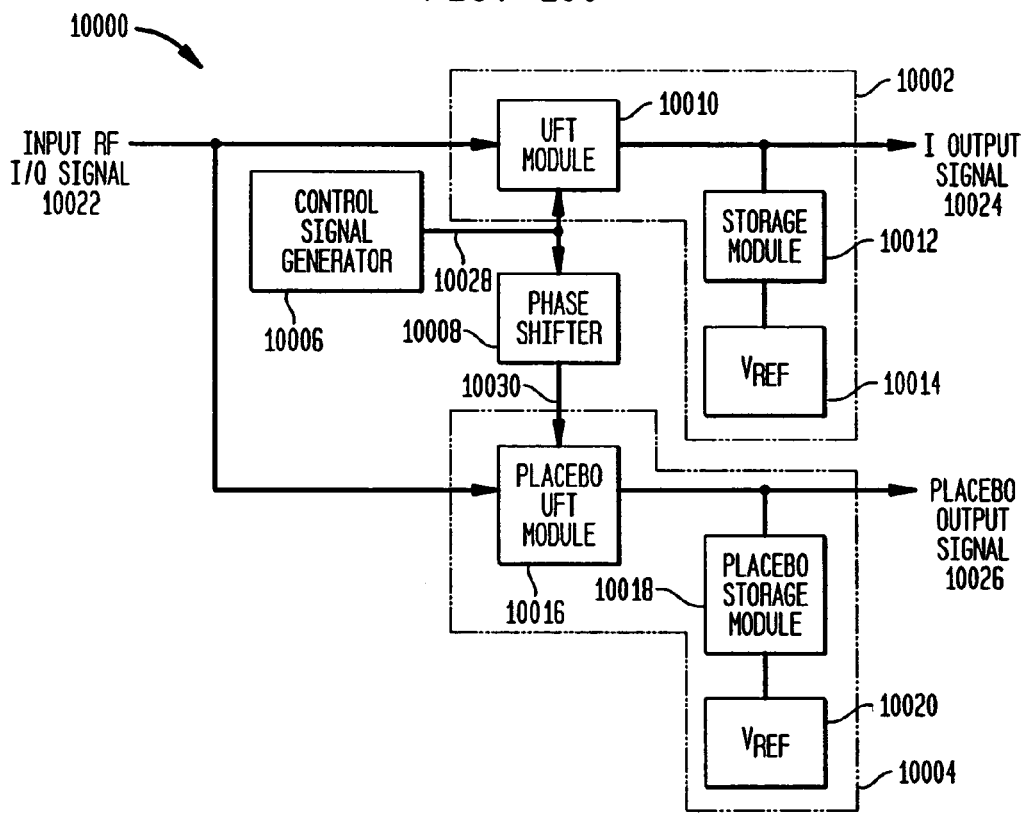
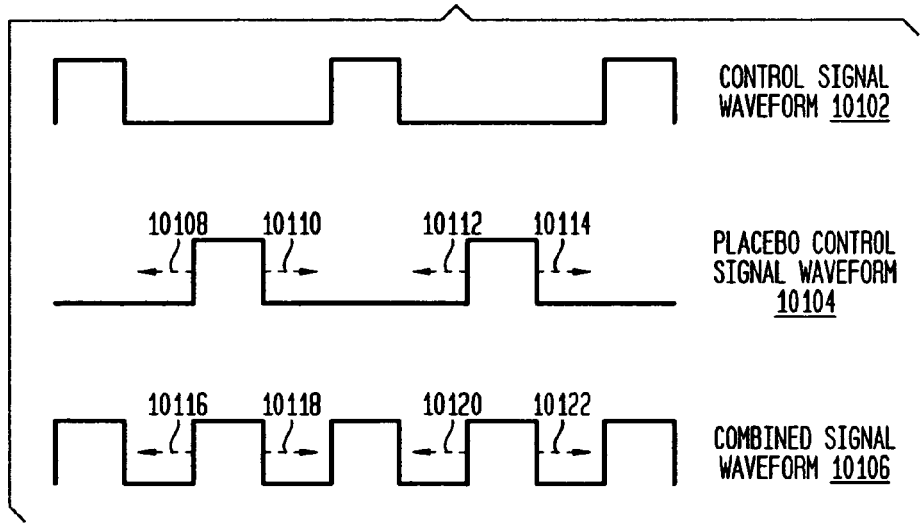

CONTROL SIGNAL
10548

INPUT RF
SIGNAL
10540

BIASED INPUT
RF SIGNAL
10544

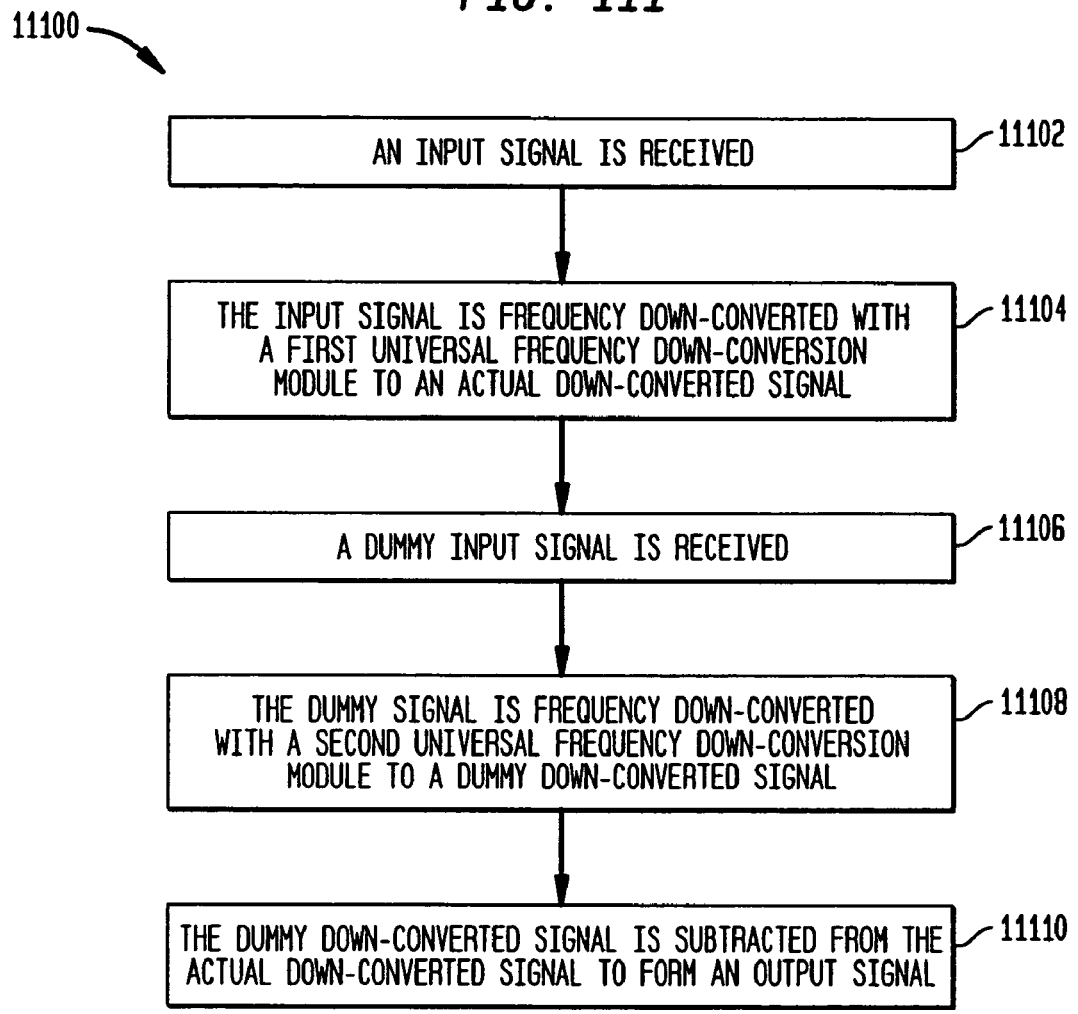

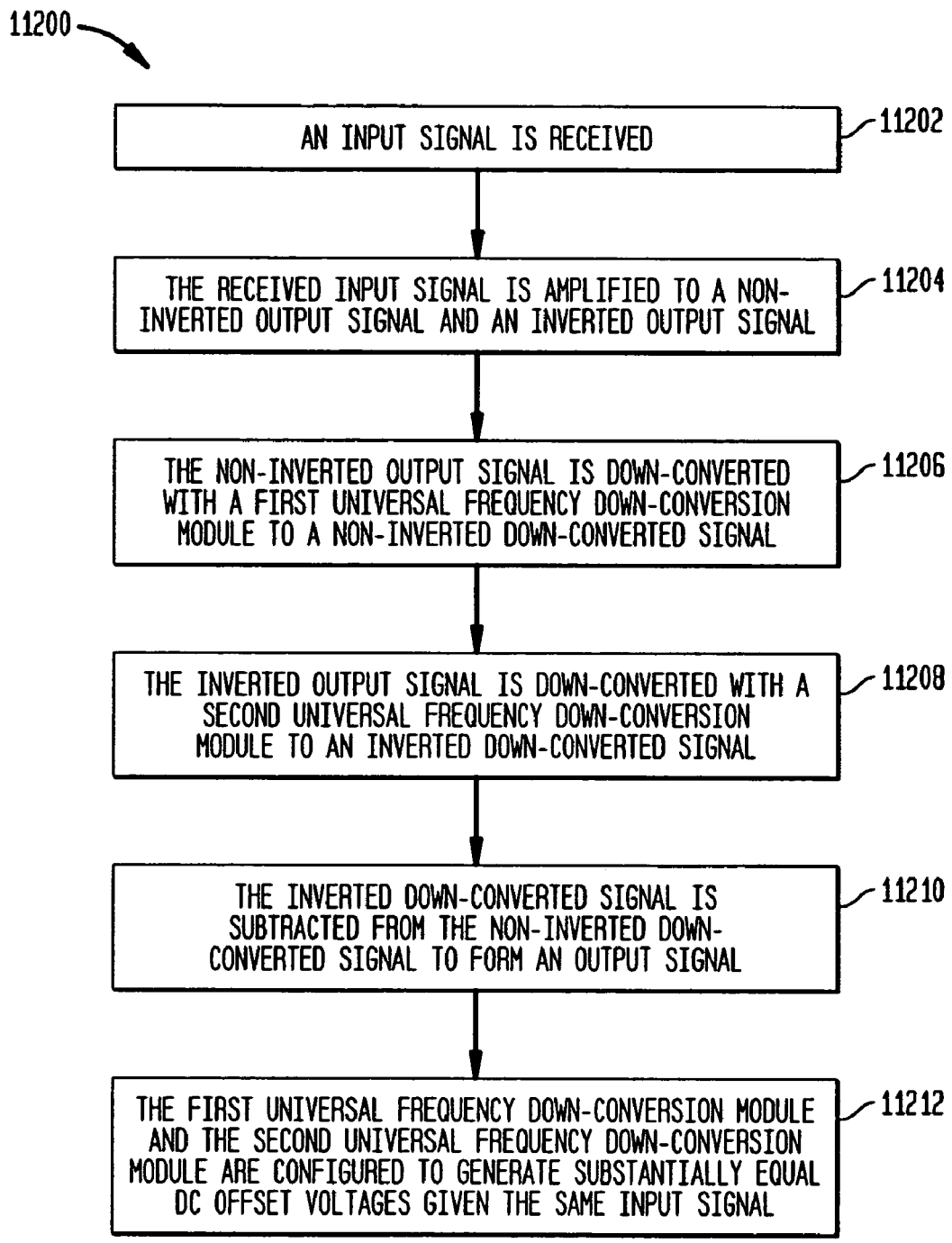

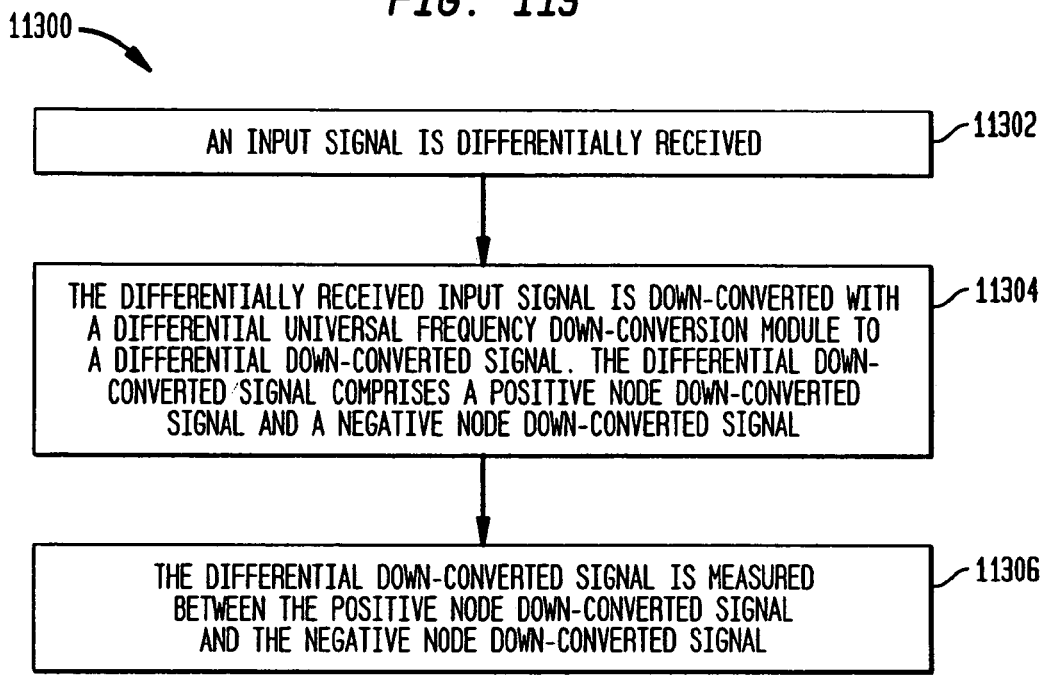
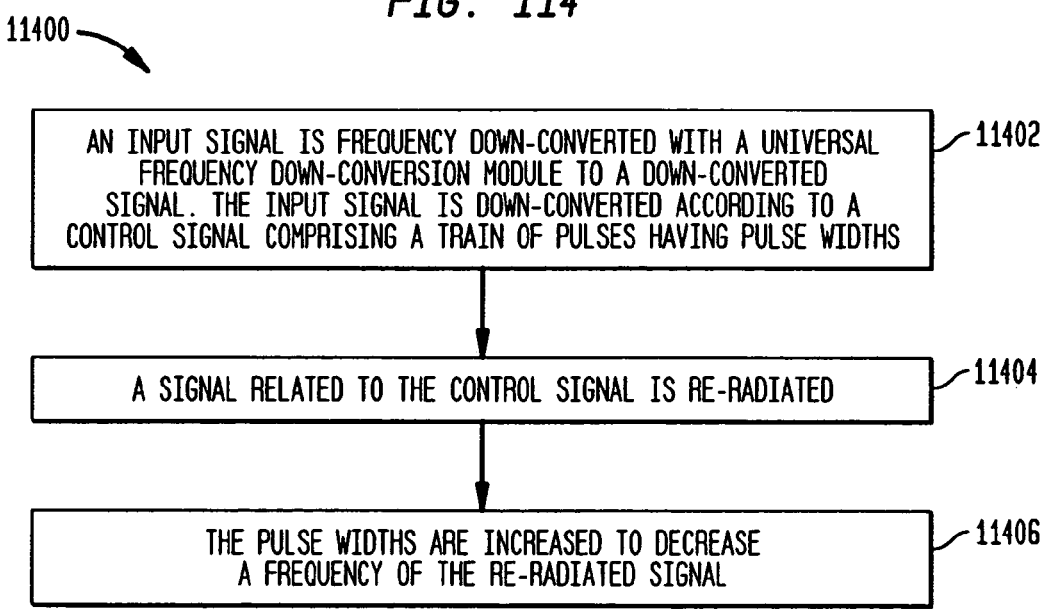

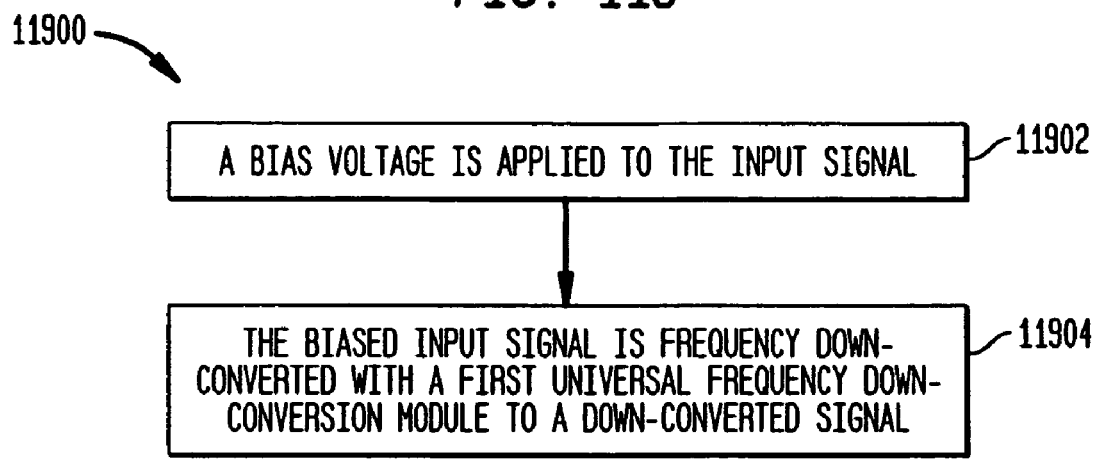

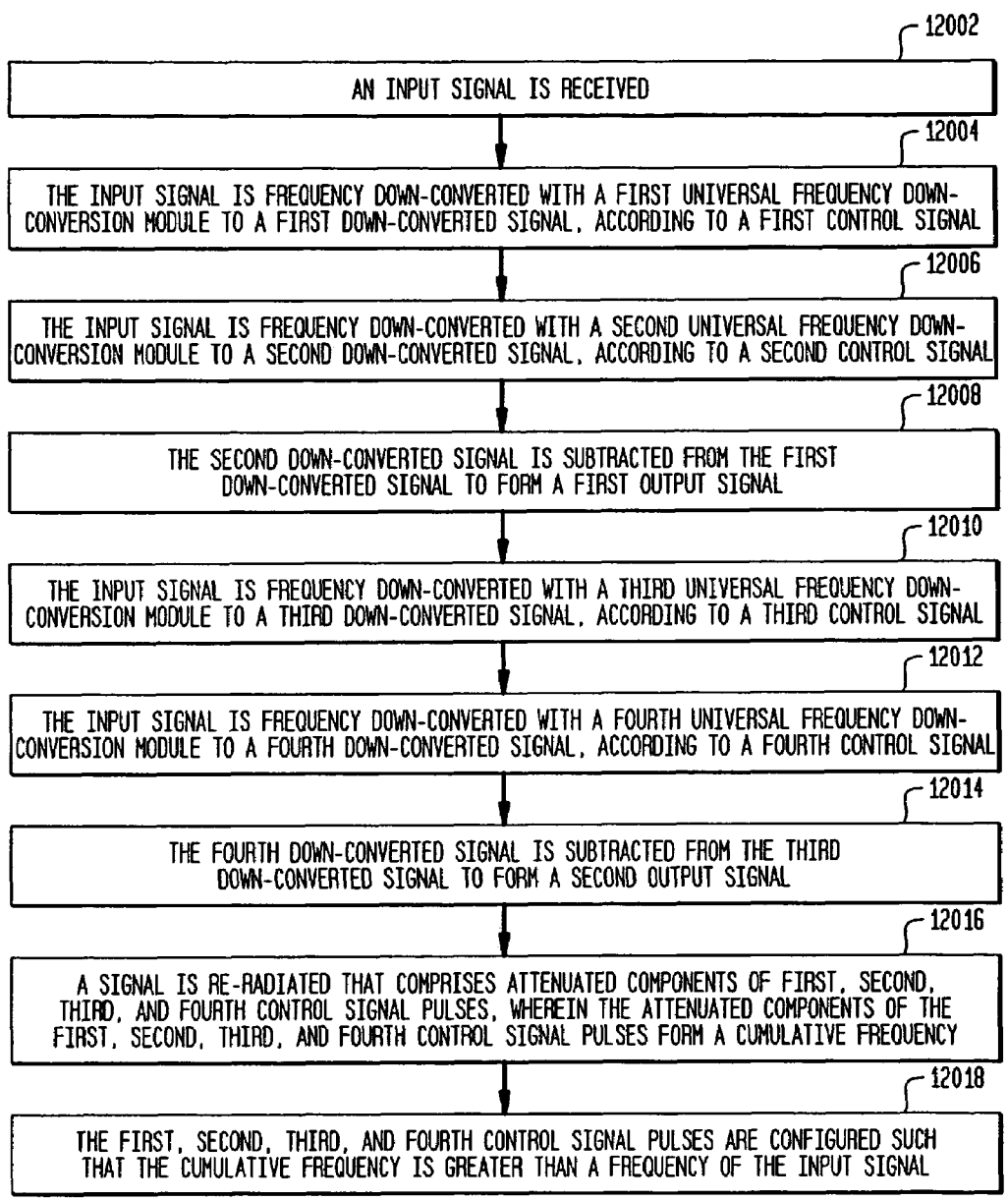

DC OFFSET, RE-RADIATION, AND I/Q SOLUTIONS USING UNIVERSAL FREQUENCY TRANSLATION TECHNOLOGY

This application is a continuation of U.S. application Ser. No. 09/526,041, filed Mar. 14, 2000, now allowed, which is incorporated herein by reference in its entirety, and which claims priority to the following: U.S. Provisional Application No. 60/171,502, filed Dec. 22, 1999; U.S. Provisional Application No. 60/177,705, filed on Jan. 24, 2000; U.S. Provisional Application No. 60/129,839, filed on Apr. 16, 1999; U.S. Provisional Application No. 60/158,047, filed on Oct. 7, 1999; U.S. Provisional Application No. 60/171,349, filed on Dec. 21, 1999; U.S. Provisional Application No. 60/177,702, filed on Jan. 24, 2000; U.S. Provisional Application No. 60/180,667, filed on Feb. 7, 2000; and U.S. Provisional Application No. 60/171,496, filed on Dec. 22, 1999, all of which are incorporated by reference herein in their entireties.

CROSS-REFERENCE TO OTHER APPLICATIONS

The following applications of common assignee are related to the present application, and are herein incorporated by reference in their entireties:

"Method and System for Down-Converting Electromagnetic Signals," Ser. No. 09/176,022, filed Oct. 21, 1998.

"Method and System for Frequency Up-Conversion," Ser. No. 09/176,154, filed Oct. 21, 1998.

"Method and System for Ensuring Reception of a Communications Signal," Ser. No. 09/176,415, filed Oct. 21, 1998.

"Integrated Frequency Translation And Selectivity," Ser. No. 09/175,966, filed Oct. 21, 1998.

"Applications of Universal Frequency Translation," Ser. No. 09/261,129, filed Mar. 3, 1999.

"Method and System for Down-Converting Electromagnetic Signals Having Optimized Switch Structures," Ser. No. 09/293,095, filed Apr. 16, 1999.

"Method and System for Down-Converting Electromagnetic Signals Including Resonant Structures for Enhanced Energy Transfer," Ser. No. 09/293,342, filed Apr. 16, 1999.

"Method and System for Frequency Up-Conversion with a Variety of Transmitter Configurations," Ser. No. 09/293,580, filed Apr. 16, 1999.

"Integrated Frequency Translation and Selectivity with a Variety of Filter Embodiments," Ser. No. 09/293,283, filed Apr. 16, 1999.

"Matched Filter Characterization and Implementation of universal Frequency Translation Method and Apparatus," Ser. No.(to be assigned), filed Mar. 9, 2000.

BACKGROUND OF THE INVENTION

1. Field of the Invention

The present invention relates to down-conversion and up-conversion of electromagnetic (EM) signals. More particularly, the present invention relates to reducing or eliminating DC offset voltages and re-radiation that occurs during down-conversion of EM signals to intermediate frequency or baseband signals.

2. Related Art

Electromagnetic (EM) information signals (baseband signals) include, but are not limited to, video baseband signals, voice baseband signals, computer baseband signals, etc. Baseband signals include analog baseband signals and digital baseband signals.

It is often beneficial to propagate EM signals at higher frequencies. This is generally true regardless of whether the propagation medium is wire, optic fiber, space, air, liquid, etc. To enhance efficiency and practicality, such as improved ability to radiate and added ability for multiple channels of baseband signals, up-conversion to a higher frequency is utilized. Conventional up-conversion processes modulate higher frequency carrier signals with baseband signals. Modulation refers to a variety of techniques for impressing information from the baseband signals onto the higher frequency carrier signals. The resultant signals are referred to herein as modulated carrier signals For example, the amplitude of an AM carrier signal varies in relation to changes in the baseband signal, the frequency of an FM carrier signal varies in relation to changes in the baseband signal, and the phase of a PM carrier signal vanes in relation to changes in the baseband signal.

In order to process the information that was in the baseband signal, the information must be extracted, or demodulated, from the modulated carrier signal. However, because conventional signal processing technology is limited in operational speed, conventional signal processing technology cannot easily demodulate a baseband signal from higher frequency modulated carrier signal directly. Instead, higher frequency modulated carrier signals must be down-converted to an intermediate frequency (IF), from where a conventional demodulator can demodulate the baseband signal.

Conventional down-converters include electrical components whose properties are frequency dependent As a result, conventional down-converters are designed around specific frequencies or frequency ranges and do not work well outside their designed frequency range.

Conventional down-converters generate unwanted image signals and thus must include filters for filtering the unwanted image signals. However, such filters reduce the power level of the modulated carrier signals. As a result, conventional down-converters include power amplifiers, which require external energy sources.

When a received modulated carrier signal is relatively weak, as in, for example, a radio receiver, conventional down-converters include additional power amplifiers, which require additional external energy.

SUMMARY OF THE INVENTION

Briefly stated, the present invention is directed to methods, systems, and apparatuses for down-converting an electromagnetic (EM) signal by aliasing the EM signal, and applications thereof. The present invention is further directed to reducing or eliminating DC offset voltages and re-radiation generated when down-converting an electromagnetic (EM) signal. The present invention is still further directed to improving receiver dynamic range.

Generally, the invention operates by receiving an EM signal. The invention also receives an aliasing signal having an aliasing rate. The invention aliases the EM signal according to the aliasing signal to down-convert the EM signal.

In an embodiment, the invention down-converts the EM signal to an intermediate frequency (IF) signal.

In another embodiment, the invention down-converts the EM signal to a demodulated baseband information signal.

In another embodiment, the EM signal is a frequency modulated (FM) signal, which is down-converted to a non-FM signal, such as a phase modulated (PM) signal or an amplitude modulated (AM) signal.

In another embodiment, the EM signal is an I/Q modulated signal, which is down-converted to an in-phase information signal and a quadrature-phase information signal.

The invention is applicable to any type of EM signal, including but not limited to, modulated carrier signals (the invention is applicable to any modulation scheme or combination thereof) and unmodulated carrier signals.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is generally indicated by the left-most digit(s) in the corresponding reference number.

BRIEF DESCRIPTION OF THE FIGURES

The invention shall be described with reference to the accompanying figures, wherein:

FIG. 1D illustrates a UFT module used in a universal frequency up-conversion (UFU) module according to an embodiment of the invention.

FIG. 2 is a block diagram of a universal frequency translation (UFT) module according to an alternative embodiment of the invention.

FIG. 3 is a block diagram of a universal frequency up-conversion (UFU) module according to an embodiment of the invention.

FIGS. 15A-15F illustrate example applications of the UDF module according to embodiments of the invention.

FIG. 16 illustrates an environment comprising a transmitter and a receiver, each of which may be implemented using enhanced signal reception (ESR) components of the invention, wherein the receiver may be further implemented using one or more UFD modules of the invention.

FIG. 17 illustrates a unified down-converting and filtering (UDF) module according to an embodiment of the invention.

FIG. 18 is a table of example values at nodes in the UDF module of FIG. 17.

FIGS. 20A and 20G are example aliasing modules according to embodiments of the invention.

FIGS. 23B and 23C are example waveforms used to further describe the enhanced signal reception system according to an embodiment of the invention.

FIGS. 30-40 illustrate example waveforms related to the receiver of FIG. 29.

FIGS. 60B-C illustrate example timing diagrams for the example system of FIG. 60A.

FIG. 64B illustrates a timing diagram of an example clock signal for real time aperture control, according to an embodiment of the invention.

FIG. 64C illustrates a tuning diagram of an example optional enable signal for real time aperture control, according to an embodiment of the invention.

FIG. 64D illustrates a timing diagram of an inverted clock signal for real time aperture control, according to an embodiment of the invention.

FIG. 64E illustrates a timing diagram of an example delayed clock signal for real time aperture control, according to an embodiment of the invention.

FIG. 64F illustrates a timing diagram of an example energy transfer including pulses having apertures that are controlled in real time, according to an embodiment of the invention.

FIG. 71A illustrates and example embodiment of the invention.

FIG. 71B illustrates example equations for determining charge transfer, in accordance with the present invention.

FIG. 71C illustrates relationships between capacitor charging and aperture, in accordance with an embodiment of the present invention.

FIG. 71D illustrates relationships between capacitor charging and aperture, in accordance with an embodiment of the present invention.

FIG. 71E illustrates power-charge relationship equations, in accordance with an embodiment of the present invention.

FIG. 71F illustrates insertion loss equations, in accordance with an embodiment of the present invention.

FIG. 86G illustrates an exemplary signal input harmonic spectrum and conversion clock harmonic spectrum.

FIG. 86H illustrates an exemplary power series.

FIG. 86I illustrates an exemplary system block diagram, according to an embodiment of the present invention.

FIGS. 88B-H show example waveforms related-to the system of FIG. 88A, according to an embodiment of the present invention.

FIGS. 94B-H illustrate example waveforms related to the circuit of FIG. 94A, according to an embodiment of the present invention.

FIG. 95 illustrates an exemplary differential receiver circuit, according to an embodiment of the present invention.

FIG. 96 illustrates an exemplary input RF signal and exemplary control signal waveforms, according to embodiments of the present invention.

FIG. 97 illustrates an exemplary I/Q modulation receiver circuit, according to an embodiment of the present invention.

FIGS. 98A-98I show an exemplary input RF I/Q signal, and several exemplary control signal waveforms.

FIG. 99 illustrates an exemplary buffered I/Q modulation receiver circuit, according to an embodiment of the present invention.

FIG. 100 illustrates an exemplary receiver with a placebo circuit, according to an embodiment of the present invention.

FIG. 101 shows an exemplary control signal waveform, and a corresponding exemplary placebo control signal waveform.

FIG. 102 illustrates a receiver with adjacent apertures circuit, according to an embodiment of the present invention.

FIG. 103 shows an exemplary control signal waveform, and a corresponding π-shifted control signal waveform.

FIG. 104 illustrates an exemplary receiver with adjacent apertures circuit, according to an embodiment of the present invention.

FIG. 105 illustrates an exemplary circuit for improving dynamic range, according to an embodiment of the present invention.

Figure 106A:
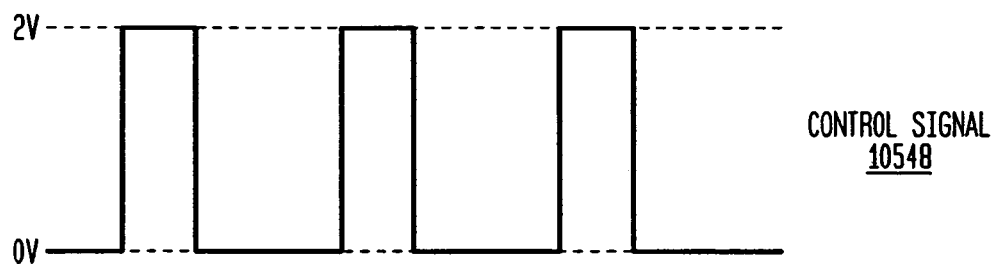
Figure 106B:
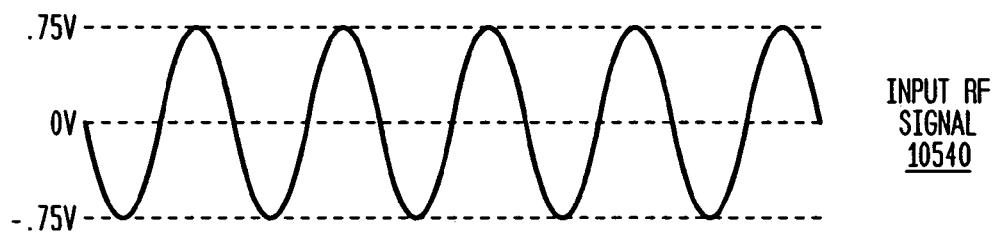
Figure 106C:
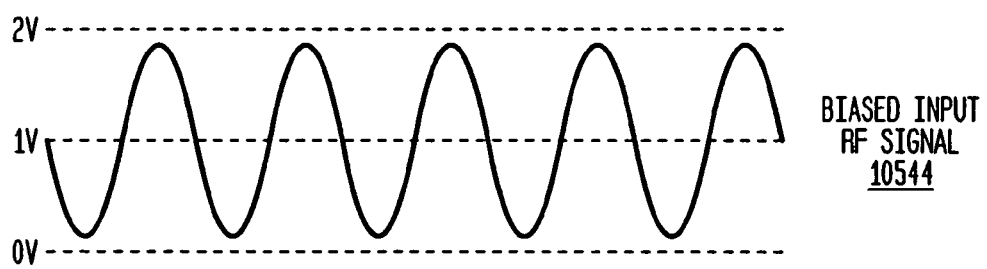

FIGS. 106A-C illustrate exemplary waveforms related to improving dynamic range.

Figure 107:
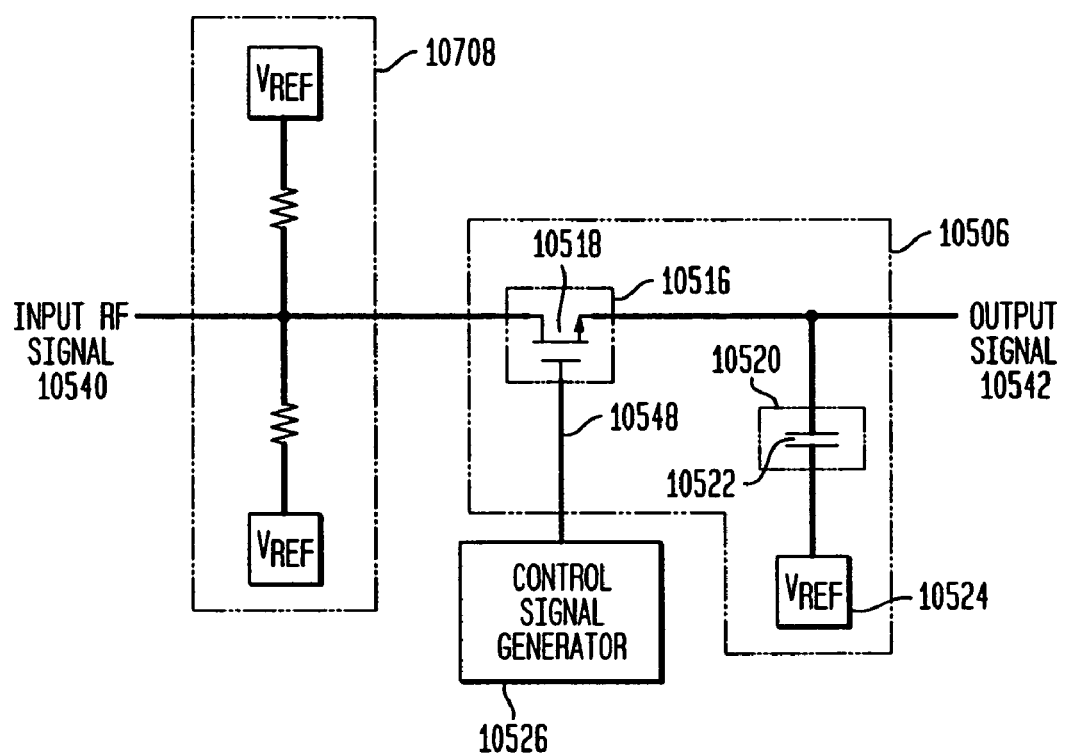

FIG. 107 illustrates an exemplary bias circuit, according to an embodiment of the present invention.

Figure 108:
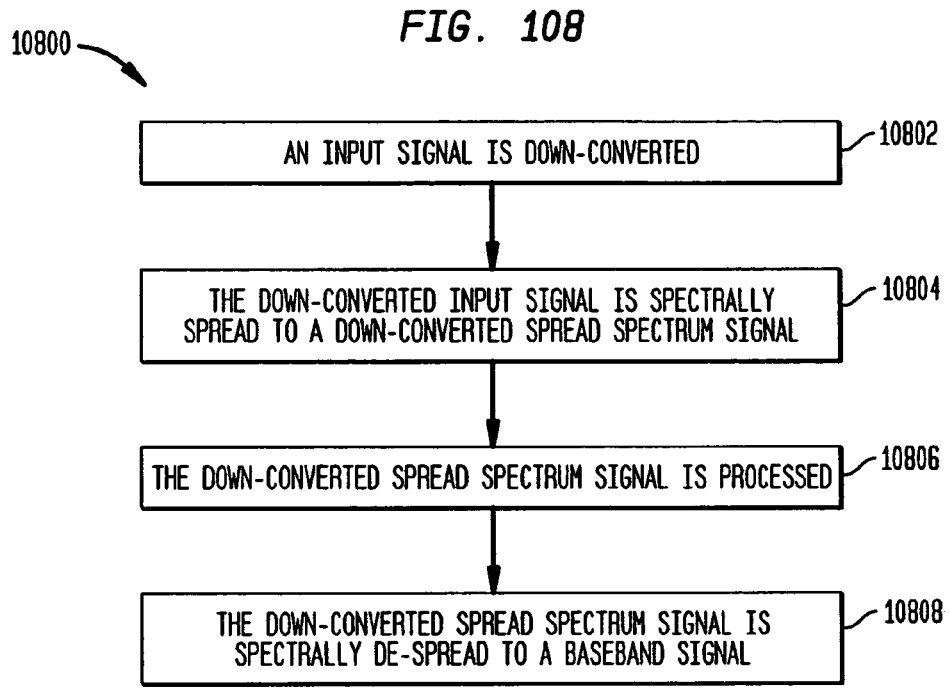

FIG. 108 depicts a flowchart that illustrates operational steps for down-converting and spectrally spreading an input signal, according to an embodiment of the present invention.

Figure 109:
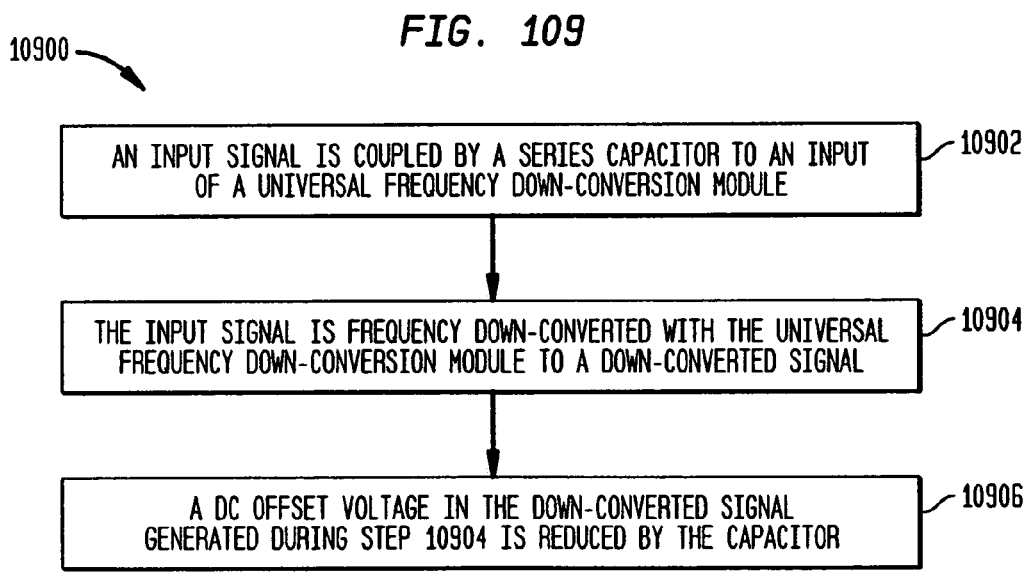

FIG. 109 depicts a flowchart that illustrates operational steps for down-converting an input signal and reducing a DC offset voltage, according to an embodiment of the present invention.

Figure 110:
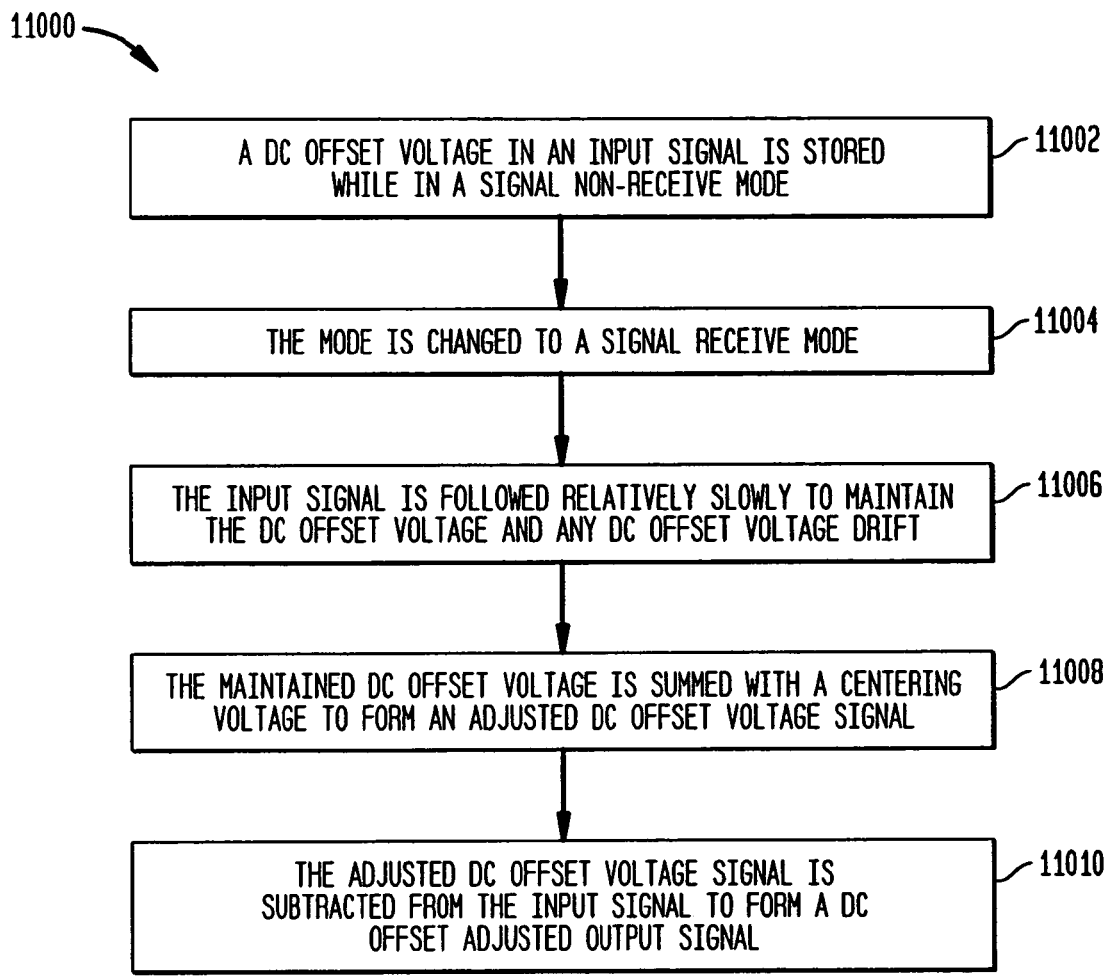

FIG. 110 depicts a flowchart that illustrates operational steps for reducing DC offset in a signal path, according to an embodiment of the present invention.

FIG. 111 depicts a flowchart that illustrates operational steps for down-converting an input signal and canceling DC offset voltages, according to an embodiment of the present invention.

FIG. 112 depicts a flowchart that illustrates operational steps for down-converting an input signal and canceling DC offset voltages, according to an embodiment of the present invention.

FIG. 113 depicts a flowchart that illustrates operational steps for differentially down-converting an input signal, according to an embodiment of the present invention.

FIG. 114 depicts a flowchart that illustrates operational steps for down-converting an input signal with a variety of control signal pulse widths, according to an embodiment of the present invention.

Figure 115:
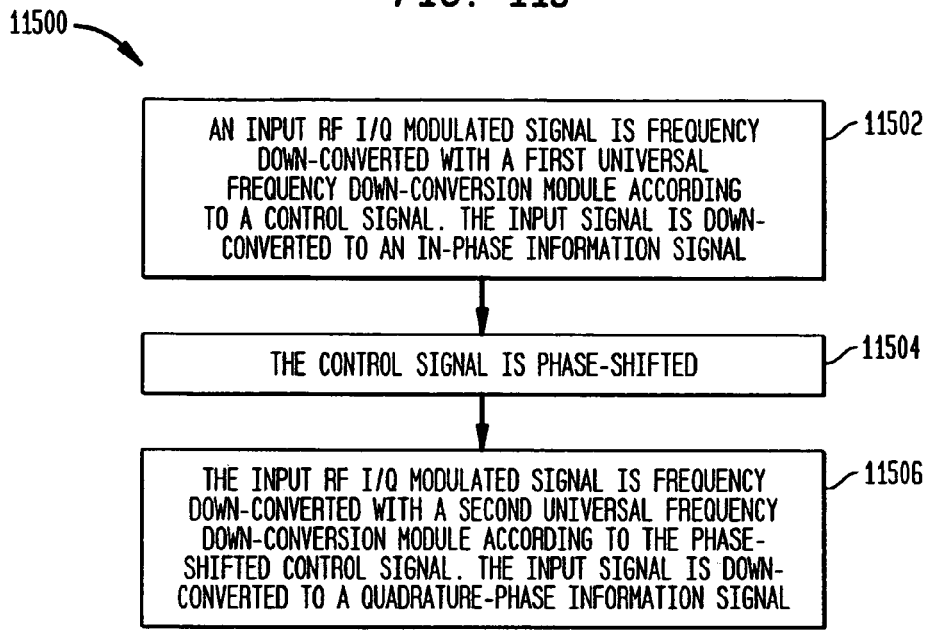

FIG. 115 depicts a flowchart that illustrates operational steps for down-converting an RF I/Q modulated input signal, according to an embodiment of the present invention.

Figure 116:
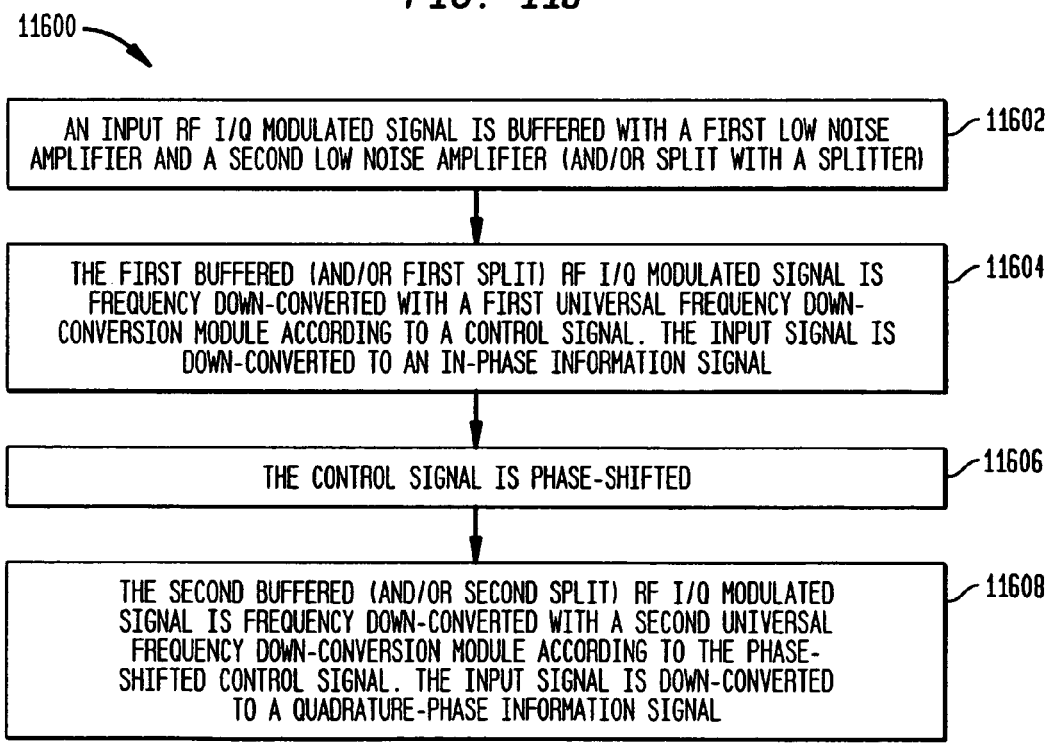

FIG. 116 depicts a flowchart that illustrates operational steps for down-converting an RF I/Q modulated input signal, according to an embodiment of the present invention.

Figure 117:
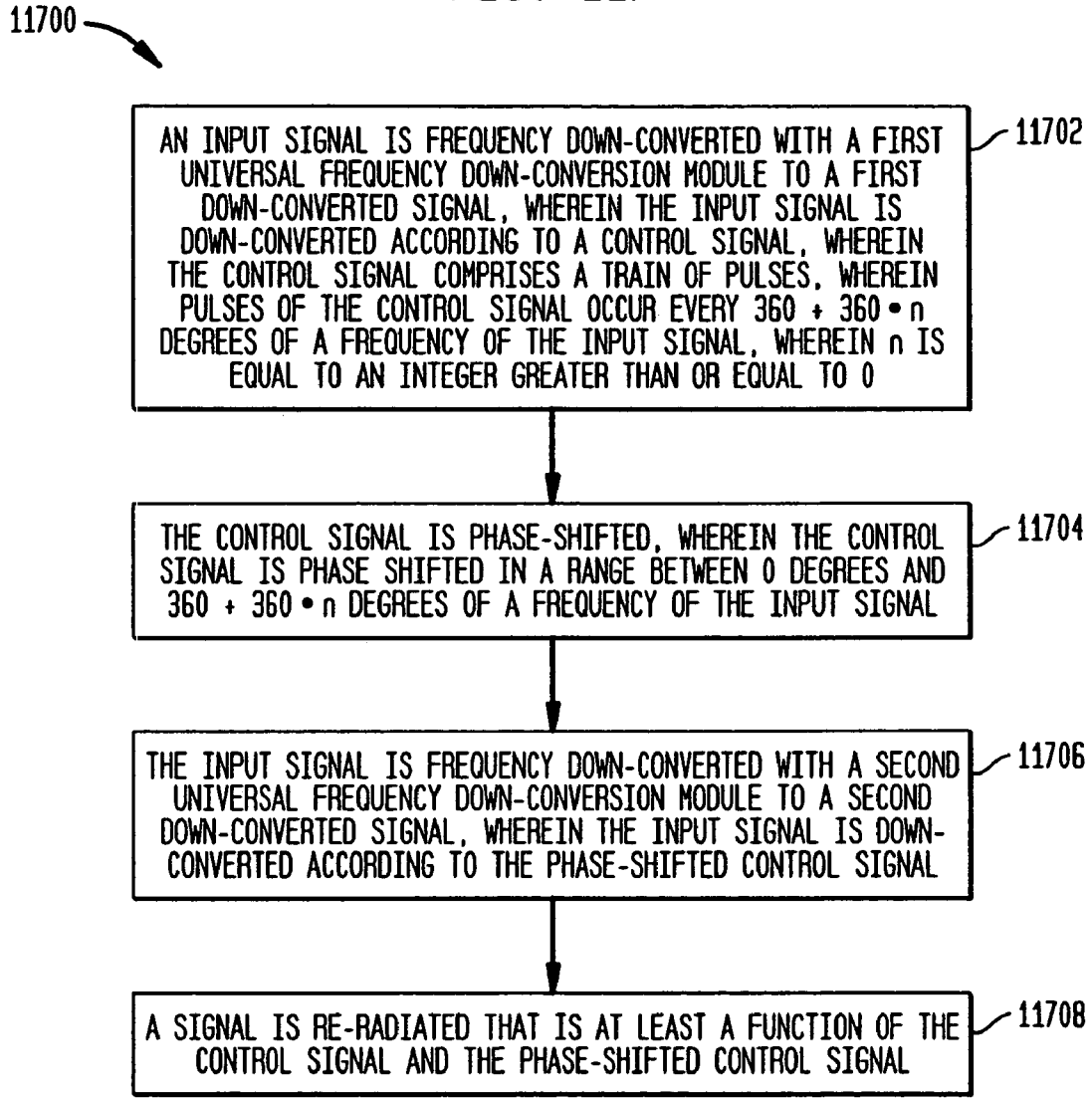

FIG. 117 depicts a flowchart that illustrates operational steps for down-converting an input signal and altering circuit re-radiation, according to an embodiment of the present invention.

Figure 118A:
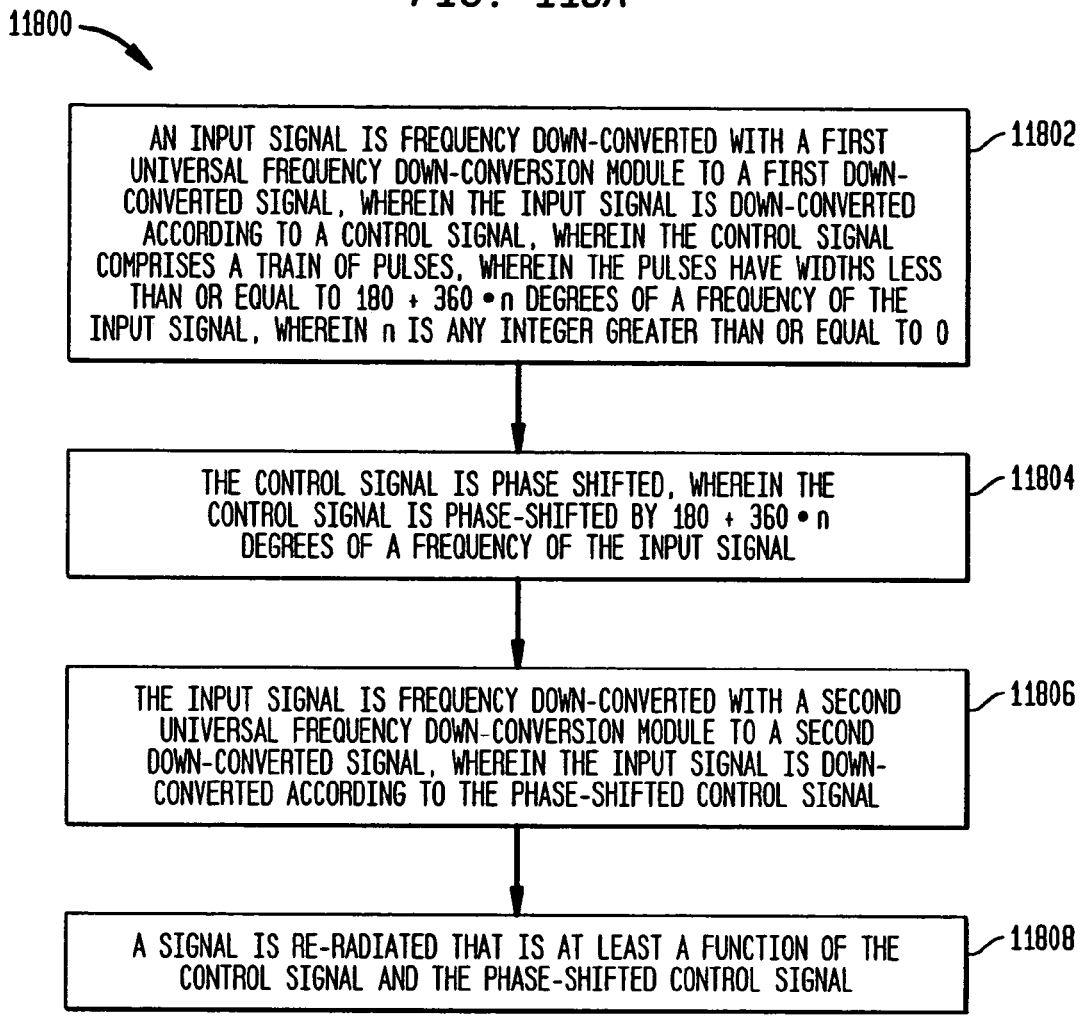
Figure 118B:
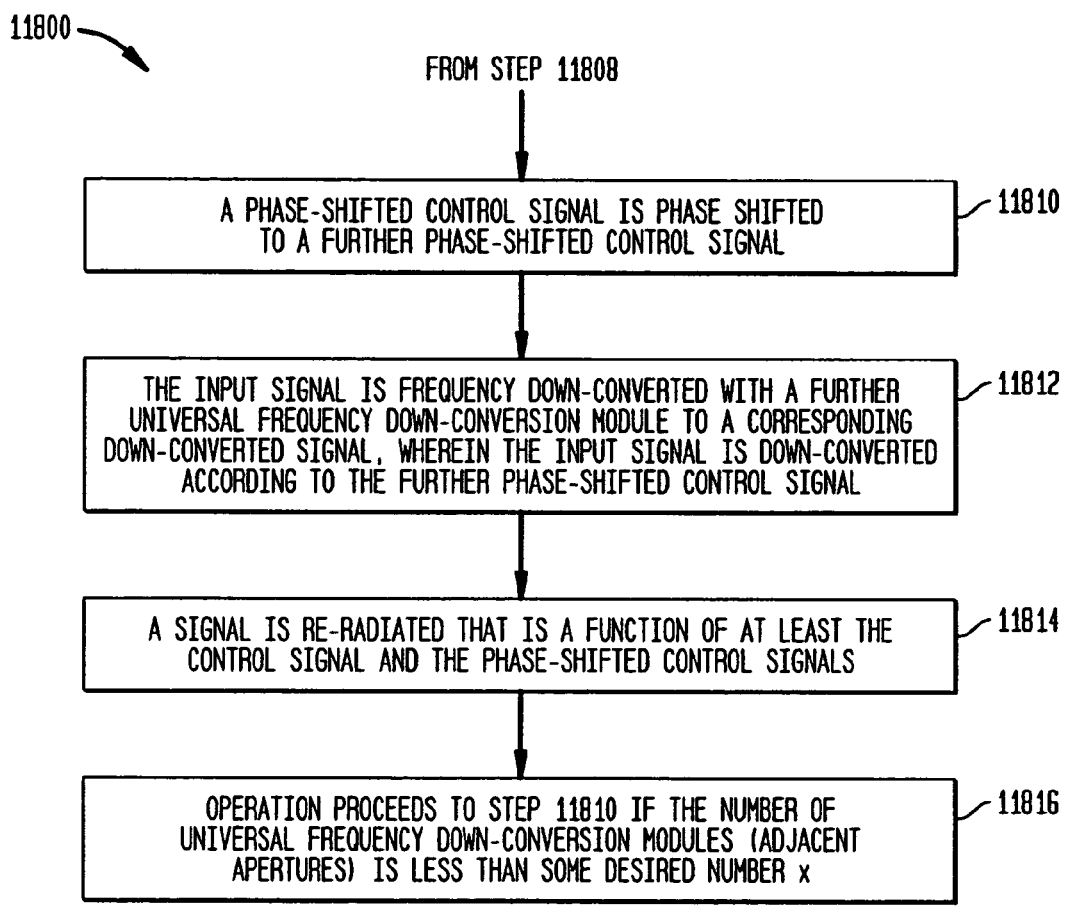

FIGS. 118A-B depict flowcharts that illustrate operational steps for down-converting an input signal and altering circuit re-radiation, according to an embodiment of the present invention.

FIG. 119 depicts a flowchart that illustrates operational steps for improving dynamic range, according to an embodiment of the present invention.

FIG. 120 depicts a flowchart that illustrates operational steps for down-converting a RF I/Q modulated signal and reducing DC offset voltages, according to an embodiment of the present invention.

DETAILED DESCRIPTION OF THE PREFERRED EMBODIMENTS

Table of Contents

1. Overview of the Invention
2. Universal Frequency Translation
3. Frequency Down-Conversion
   3.1 Optional Energy Transfer Signal Module
   3.2 Smoothing the Down-Converted Signal 3.3 Impedance Matching
3.4 Tanks and Resonant Structures
3.5 Charge and Power Transfer Concepts
3.6 Optimizing and Adjusting the Non-Negligible Aperture Width/Duration
   3.6.1 Varying Input and Output Impedances
   3.6.2 Real Time Aperture Control
3.7 Adding a Bypass Network
3.8 Modifying the Energy Transfer Signal Utilizing Feedback
3.9 Other Implementations
3.10 Example Energy Transfer Down-Converters
4. Frequency Up-Conversion
5. Enhanced Signal Reception
6. Unified Down-Conversion and Filtering
7. Example Application Embodiments of the Invention
7.0 DC Offset, Re-Radiation, and Dynamic Range Considerations and Corrections
   7.1 Overview of DC Offset and Re-Radiation
      7.1.1 Introduction
      7.1.2 A Basic DC Offset Model
      7.1.3 Clock Modulation via PN Code
         7.1.3.1 Interpretation of $R_{xx}(T)$ and Required Leakage
         7.1.3.2 Charge Injected DC Offset
         7.1.3.3 Clock Waveform Impact on CI Induced Offsets
         7.1.3.4 Bench Example
         7.1.3.5 Complementary Architecture
         7.1.3.6 Spreading Code Results
      7.1.4 UFD Module DC Offsets from Non-Linearities
   7.2 Example Embodiments to Address DC Offset and Re-Radiation Problems
      7.2.1 DC Offset
         7.2.1.1 Reducing DC Offset by Spectral Spreading and De-Spreading
            7.2.1.1.1 Conventional Wireless Communications Receiver
            7.2.1.1.2 Spread/De-Spread Receiver Embodiment of the Present Invention
         7.2.1.3 Charge Injection Reduction Embodiment
         7.2.1.4 Auto-Zero Compensation
         7.2.1.5 Reducing DC Offset with Differential Configurations
         7.2.1.6 Reducing DC Offset with Differential Outputs
      7.2.2 Re-Radiation
         7.2.2.1 Reducing Re-Radiation by Adjusting Control Signal Attributes
            7.2.2.1.1 I/Q Modulation Receiver Control Signal Considerations and Embodiments
                7.2.2.1.1.1 Non-Overlapping I/Q Control Signal Pulses Embodiments
                7.2.2.1.1.2 Buffered I/Q Modulation Receiver Embodiment
         7.2.2.2 Reducing Re-Radiation with Placebo Down-Conversion Modules
         7.2.2.3 Reducing Re-Radiation with Adjacent Apertures
      7.2.3 Additional DC Offset and Re-Radiation Reduction Embodiments
   7.3 Example Embodiments to Improve Dynamic Range
      7.3.1 Adjusting Down-Conversion Module Dynamic Range
   7.4 Example Receiver and Transmitter Embodiments for Addressing DC Offset and Re-Radiation
      7.4.1 Example I/Q Modulation Receiver Embodiments
         7.4.1.1 Example I/Q Modulation Control Signal Generator Embodiments
         7.4.1.2 Detailed Example I/Q Modulation Receiver Embodiment with Exemplary Waveforms
         7.4.1.3 Example Single Channel Receiver Embodiment
         7.4.1.4 Alternative Example I/Q Modulation Receiver Embodiment
         7.4.1.5 Example Transmitter Embodiment
8. Conclusion

1. Overview of the Invention

The present invention is directed to receivers implemented using universal frequency translation (UFT) modules. The UFT modules perform frequency translation operations. Embodiments of the present invention incorporating various applications of the UFT module are described below.

Receivers exhibit multiple advantages by using UFT modules. These advantages include, but are not limited to, lower power consumption, longer power source life, fewer parts, lower required package size, lower package weight, lower cost, less tuning, and more effective signal transmission and reception. The receivers of the present invention can receive and transmit signals across a broad frequency range. Furthermore, the DC offset voltages and re-radiation generated by receivers are the present invention are reduced or eliminated in embodiments. The structure and operation of embodiments of the UFT module, and various applications of the same, utilizing DC offset/re-radiation reduction, are described in detail in the following sections.

2. Universal Frequency Translation

The present invention is related to frequency translation, and applications of same. Such applications include, but are not limited to, frequency down-conversion, frequency up-conversion, enhanced signal reception, unified down-conversion and filtering, and combinations and applications of same.

Figure 1A:
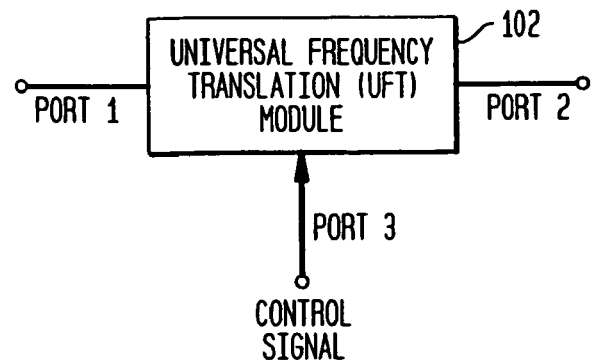
FIG. 1A is a block diagram of a universal frequency translation (UFT) module according to an embodiment of the invention.

FIG. 1A illustrates a universal frequency translation (UFT) module 102 according to embodiments of the invention. (The UFT module is also sometimes called a universal frequency translator, or a universal translator.)

As indicated by the example of FIG. 1A, some embodiments of the UFT module 102 include three ports (nodes), designated in FIG. 1A as Port 1, Port 2, and Port 3. Other UFT embodiments include other than three ports.

Generally, the UFT module 102 (perhaps in combination with other components) operates to generate an output signal from an input signal, where the frequency of the output signal differs from the frequency of the input signal. In other words, the UFT module 102 (and perhaps other components) operates to generate the output signal from the input signal by translating the frequency (and perhaps other characteristics) of the input signal to the frequency (and perhaps other characteristics) of the output signal.

Figure 1B:
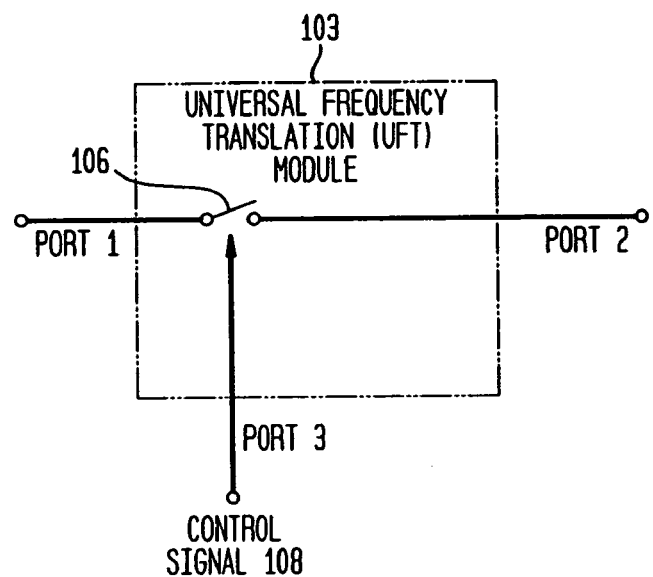
FIG. 1B is a more detailed diagram of a universal frequency translation (UFT) module according to an embodiment of the invention.

An example embodiment of the UFT module 103 is generally illustrated in FIG. 1B. Generally, the UFT module 103 includes a switch 106 controlled by a control signal 108. The switch 106 is said to be a controlled switch.

As noted above, some UFT embodiments include other than three ports. For example, and without limitation, FIG. 2 illustrates an example UFT module 202. The example UFT module 202 includes a diode 204 having two ports, designated as Port 1 and Port 2/3. This embodiment does not include a third port, as indicated by the dotted line around the "Port 3" label.

The UFT module is a very powerful and flexible device. Its flexibility is illustrated, in part, by the wide range of applications in which it can be used. Its power is illustrated, in part, by the usefulness and performance of such applications.

Figure 1C:
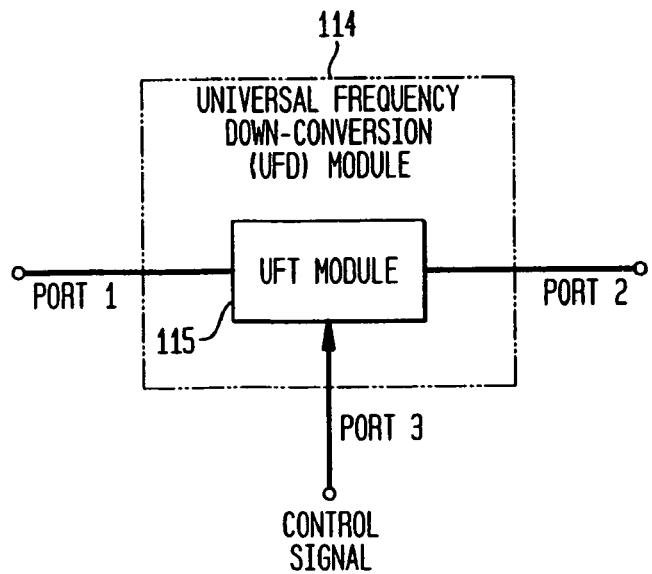
FIG. 1C illustrates a UFT module used in a universal frequency down-conversion (UFD) module according to an embodiment of the invention.

For example, a UFT module 115 can be used in a universal frequency down-conversion (UFD) module 114, an example of which is shown in FIG. 1C. In this capacity, the UFT module 115 frequency down-converts an input signal to an output signal.

As another example, as shown in FIG. 1D, a UFT module 117 can be used in a universal frequency up-conversion (UFU) module 116. In this capacity, the UFT module 117 frequency up-converts an input signal to an output signal.

These and other applications of the UFT module are described below. Additional applications of the UFT module will be apparent to persons skilled in the relevant art(s) based on the teachings contained herein. In some applications, the UFT module is a required component. In other applications, the UFT module is an optional component.

3. Frequency Down-conversion

The present invention is directed to systems and methods of universal frequency down-conversion, and applications of same.

In particular, the following discussion describes down-converting using a Universal Frequency Translation Module. The down-conversion of an EM signal by aliasing the EM signal at an aliasing rate is fully described in co-pending U.S. patent application entitled "Method and System for Down-Converting Electromagnetic Signals," Ser. No. 09/176,022, filed Oct. 21, 1998, the full disclosure of which is incorporated herein by reference. A relevant portion of the above mentioned patent application is summarized below to describe down-converting an input signal to produce a down-converted signal that exists at a lower frequency or a baseband signal.

Figure 20B:
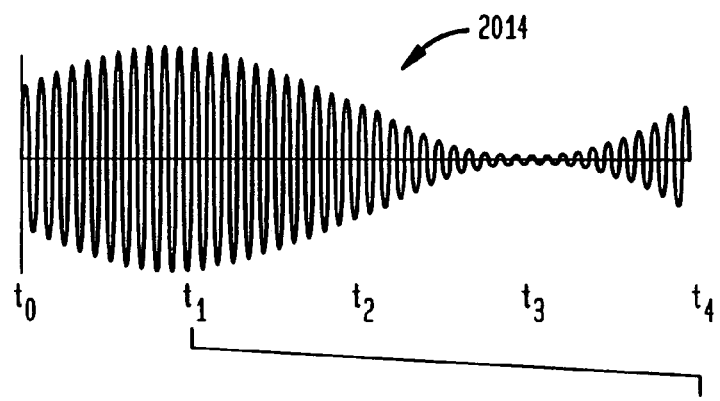
FIGS. 20B-20F are example waveforms used to describe the operation of the aliasing modules of FIGS. 20A and 20G.
Figure 20C:
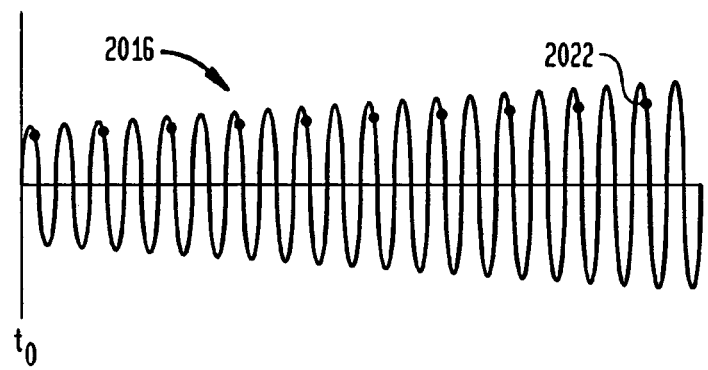

FIG. 20A illustrates an aliasing module 2000 for down-conversion using a universal frequency translation (UFT) module 2002 which down-converts an EM input signal 2004. In particular embodiments, aliasing module 2000 includes a switch 2008 and a capacitor 2010. The electronic alignment of the circuit components is flexible. That is, in one implementation, the switch 2008 is in series with input signal 2004 and capacitor 2010 is shunted to ground (although it may be other than ground in configurations such as differential mode). In a second implementation (see FIG. 20G), the capacitor 2010 is in series with the input signal 2004 and the switch 2008 is shunted to ground (although it may be other than ground in configurations such as differential mode). Aliasing module 2000 with UFT module 2002 can be easily tailored to down-convert a wide variety of electromagnetic signals using aliasing frequencies that are well below the frequencies of the EM input signal 2004.

In one implementation, aliasing module 2000 down-converts the input signal 2004 to an intermediate frequency (IF) signal. In another implementation, the aliasing module 2000 down-converts the input signal 2004 to a demodulated baseband signal. In yet another implementation, the input signal 2004 is a frequency modulated (FM) signal, and the aliasing module 2000 down-converts it to a non-FM signal, such as a phase modulated (PM) signal or an amplitude modulated (AM) signal. Each of the above implementations is described below.

In an embodiment, the control signal 2006 includes a train of pulses that repeat at an aliasing rate that is equal to, or less than, twice the frequency of the input signal 2004. In this embodiment, the control signal 2006 is referred to herein as an aliasing signal because it is below the Nyquist rate for the frequency of the input signal 2004. Preferably, the frequency of control signal 2006 is much less than the input signal 2004.

Figure 20D:
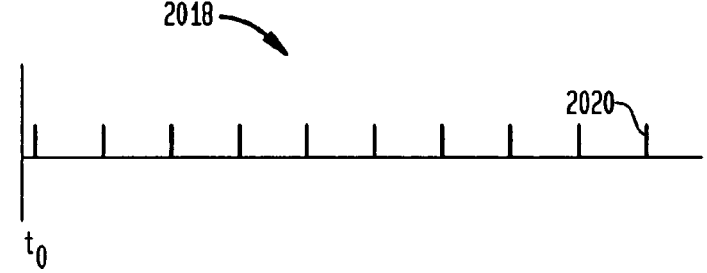
Figure 20E:
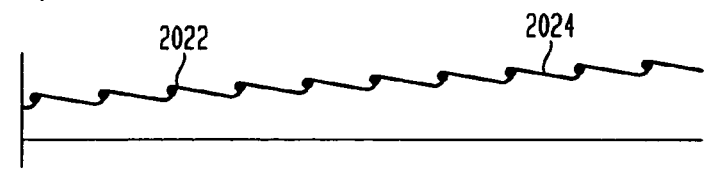

A train of pulses 2018 as shown in FIG. 20D controls the switch 2008 to alias the input signal 2004 with the control signal 2006 to generate a down-converted output signal 2012. More specifically, in an embodiment, switch 2008 closes on a first edge of each pulse 2020 of FIG. 20D and opens on a second edge of each pulse. When the switch 2008 is closed, the input signal 2004 is coupled to the capacitor 2010, and charge is transferred from the input signal to the capacitor 2010. The charge stored during successive pulses forms down-converted output signal 2012.

Exemplary waveforms are shown in FIGS. 20B-20F.

FIG. 20B illustrates an analog amplitude modulated (AM) carrier signal 2014 that is an example of input signal 2004. For illustrative purposes, in FIG. 20C, an analog AM carrier signal portion 2016 illustrates portion of the analog AM carrier signal 2014 on an expanded time scale. The analog AM carrier signal portion 2016 illustrates the analog AM carrier signal 2014 from time to $t_0$ time $t_1$.

FIG. 20D illustrates an exemplary aliasing signal 2018 that is an example of control signal 2006. Aliasing signal 2018 is on approximately the same time scale as the analog AM carrier signal portion 2016. In the example shown in FIG. 20D, the aliasing signal 2018 includes a train of pulses 2020 having negligible apertures that tend towards zero (the invention is not limited to this embodiment, as discussed below). The pulse aperture may also be referred to as the pulse width as will be understood by those skilled in the art(s). The pulses 2020 repeat at an aliasing rate, or pulse repetition rate of aliasing signal 2018. The aliasing rate is determined as described below, and further described in co-pending U.S. patent application entitled "Method and System for Down-converting Electromagnetic Signals," Ser. No. 09/176,022.

As noted above, the train of pulses 2020 (i.e., control signal 2006) control the switch 2008 to alias the analog AM carrier signal 2016 (i.e., input signal 2004) at the aliasing rate of the aliasing signal 2018. Specifically, in this embodiment, the switch 2008 closes on a first edge of each pulse and opens on a second edge of each pulse. When the switch 2008 is closed, input signal 2004 is coupled to the capacitor 2010, and charge is transferred from the input signal 2004 to the capacitor 2010. The charge transferred during a pulse is referred to herein as an under-sample.

Figure 20F:
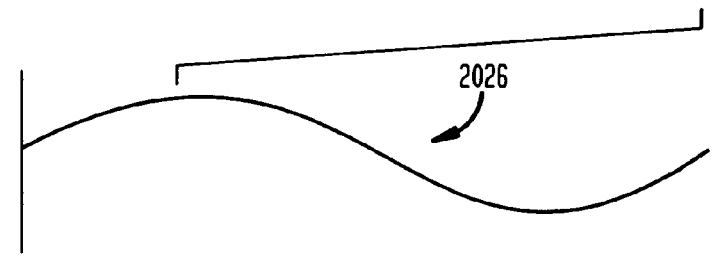
Figure 20G:
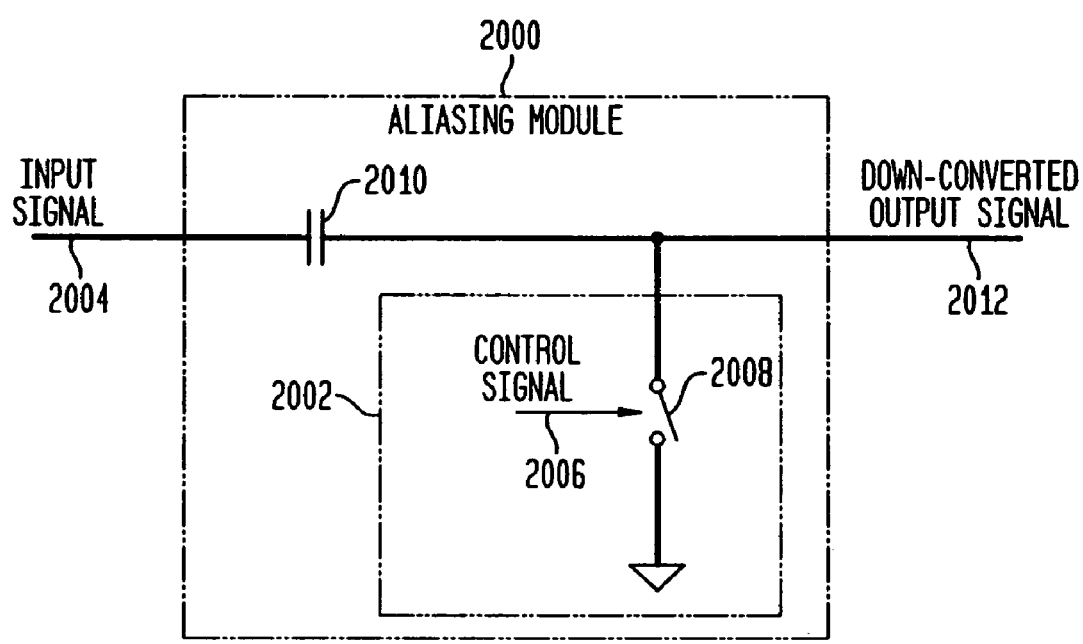

Exemplary under-samples 2022 form down-converted signal portion 2024 (FIG. 20E) that corresponds to the analog AM carrier signal portion 2016 (FIG. 20C) and the train of pulses 2020 (FIG. 20D). The charge stored during successive under-samples of AM carrier signal 2014 form the down-converted signal 2024 (FIG. 20E) that is an example of down-converted output signal 2012 (FIG. 20A). In FIG. 20F, a demodulated baseband signal 2026 represents the demodulated baseband signal 2024 after filtering on a compressed time scale. As illustrated, down-converted signal 2026 has substantially the same "amplitude envelope" as AM carrier signal 2014. Therefore, FIGS. 20B-20F illustrate down-conversion of AM carrier signal 2014.

The waveforms shown in FIGS. 20B-20F are discussed herein for illustrative purposes only, and are not limiting. Additional exemplary time domain and frequency domain drawings, and exemplary methods and systems of the invention relating thereto, are disclosed in co-pending U.S. patent application entitled "Method and System for Down-converting Electromagnetic Signals," Ser. No. 09/176,022.

The aliasing rate of control signal 2006 determines whether the input signal 2004 is down-converted to an IF signal, down-converted to a demodulated baseband signal, or down-converted from an FM signal to a PM or an AM signal. Generally, relationships between the input signal 2004, the aliasing rate of the control signal 2006, and the down-converted output signal 2012 are illustrated below:

(Freq. of input signal 2004)=$n$·(Freq. of control signal 2006)±(Freq. of down-converted output signal 2012)

For the examples contained herein, only the "+" condition will be discussed. The value of n represents a harmonic or sub-harmonic of input signal 2004 (e.g., n=0.5, 1, 2, 3, . . . ).

When the aliasing rate of control signal 2006 is off-set from the frequency of input signal 2004, or off-set from a harmonic or sub-harmonic thereof, input signal 2004 is down-converted to an IF signal. This is because the under-sampling pulses occur at different phases of subsequent cycles of input signal 2004. As a result, the under-samples form a lower frequency oscillating pattern. If the input signal 2004 includes lower frequency changes, such as amplitude, frequency, phase, etc., or any combination thereof, the charge stored during associated under-samples reflects the lower frequency changes, resulting in similar changes on the down-converted IF signal. For example, to down-convert a 901 MHZ input signal to a 1 MHZ IF signal, the frequency of the control signal 2006 would be calculated as follows:

(Freq$_{input}$−Freq$_{IF}$)/$n$=Freq$_{control}$(901 MHZ−1 MHZ)/$n$=900/$n$

For n=0.5, 1, 2, 3, 4, etc., the frequency of the control signal 2006 would be substantially equal to 1.8 GHz, 900 MHZ, 450 MHZ, 300 MHZ, 225 MHZ, etc.

Exemplary time domain and frequency domain drawings, illustrating down-conversion of analog and digital AM, PM and FM signals to IF signals, and exemplary methods and systems thereof, are disclosed in co-pending U.S. patent application entitled "Method and System for Down-converting Electromagnetic Signals," Ser. No. 09/176,022.

Alternatively, when the aliasing rate of the control signal 2006 is substantially equal to the frequency of the input signal 2004, or substantially equal to a harmonic or sub-harmonic thereof, input signal 2004 is directly down-converted to a demodulated baseband signal. This is because, without modulation, the under-sampling pulses occur at the same point of subsequent cycles of the input signal 2004. As a result, the under-samples form a constant output baseband signal. If the input signal 2004 includes lower frequency changes, such as amplitude, frequency, phase, etc., or any combination thereof, the charge stored during associated under-samples reflects the lower frequency changes, resulting in similar changes on the demodulated baseband signal. For example, to directly down-convert a 900 MHZ input signal to a demodulated baseband signal (i.e., zero IF), the frequency of the control signal 2006 would be calculated as follows:

(Freq$_{input}$−Freq$_{IF}$)/$n$=Freq$_{control}$(900 MHZ−0 MHZ)/$n$=900 MHZ/$n$ For n=0.5, 1, 2, 3, 4, etc., the frequency of the control signal 2006 should be substantially equal to 1.8 GHz, 900 MHZ, 450 MHZ, 300 MHZ 225 MHZ, etc.

Exemplary time domain and frequency domain drawings, illustrating direct down-conversion of analog and digital AM and PM signals to demodulated baseband signals, and exemplary methods and systems thereof, are disclosed in the co-pending U.S. patent application entitled "Method and System for Down-converting Electromagnetic Signals," Ser. No. 09/176,022.

Alternatively, to down-convert an input FM signal to a non-FM signal, a frequency within the FM bandwidth must be down-converted to baseband (i.e., zero IF). As an example, to down-convert a frequency shift keying (FSK) signal (a sub-set of FM) to a phase shift keying (PSK) signal (a subset of PM), the mid-point between a lower frequency $F_1$ and an upper frequency $F_2$ (that is, $[(F_1+F_2)\div 2]$) of the FSK signal is down-converted to zero IF. For example, to down-convert an FSK signal having $F_1$ equal to 899 MHZ and $F_2$ equal to 901 MHZ, to a PSK signal, the aliasing rate of the control signal 2006 would be calculated as follows:

$$\text{Frequency of the input} = (F_1 + F_2) \div 2$$
$$= (899 \text{ MHZ} + 901 \text{ MHZ}) \div 2$$
$$= 900 \text{ MHZ}$$

Frequency of the down-converted signal=0 (i.e., baseband)

(Freq$_{input}$−Freq$_{IF}$)/$n$=Freq$_{control}$(900 MHZ−0 MHZ)/$n$=900 MHZ/$n$ For n=0.5, 1, 2, 3, etc., the frequency of the control signal 2006 should be substantially equal to 1.8 GHz, 900 MHZ, 450 MHZ, 300 MHZ, 225 MHZ, etc. The frequency of the down-converted PSK signal is substantially equal to one half the difference between the lower frequency $F_1$ and the upper frequency $F_2$.

As another example, to down-convert a FSK signal to an amplitude shift keying (ASK) signal (a subset of AM), either the lower frequency $F_1$ or the upper frequency $F_2$ of the FSK signal is down-converted to zero IF. For example, to down-convert an FSK signal having $F_1$ equal to 900 MHZ and $F_2$ equal to 901 MHZ, to an ASK signal, the aliasing rate of the control signal 2006 should be substantially equal to:

(900 MHZ−0 MHZ)/$n$=900 MHZ/$n$, or (901 MHZ−0 MHZ)/$n$=901 MHZ/$n$.

For the former case of 900 MHZ/n, and for n=0.5, 1, 2, 3, 4, etc., the frequency of the control signal 2006 should be substantially equal to 1.8 GHz, 900 MHZ, 450 MHZ, 300 MHZ, 225 MHZ, etc. For the latter case of 901 MHZ/n, and for n=0.5, 1, 2, 3, 4, etc., the frequency of the control signal 2006 should be substantially equal to 1.802 GHz, 901 MHZ, 450.5 MHZ, 300.333 MHZ, 225.25 MHZ, etc. The frequency of the down-converted AM signal is substantially equal to the difference between the lower frequency $F_1$ and the upper frequency $F_2$ (i.e., 1 MHZ). Exemplary time domain and frequency domain drawings, illustrating down-conversion of FM signals to non-FM signals, and exemplary methods and systems thereof, are disclosed in the co-pending U.S. patent application entitled "Method and System for Down-converting Electromagnetic Signals," Ser. No. 09/176,022.

In an embodiment, the pulses of the control signal 2006 have negligible apertures that tend towards zero. This makes the UFT module 2002 a high input impedance device. This configuration is useful for situations where minimal disturbance of the input signal may be desired.

In another embodiment, the pulses of the control signal 2006 have non-negligible apertures that tend away from zero.

This makes the UFT module 2002 a lower input impedance device. This allows the lower input impedance of the UFT module 2002 to be substantially matched with a source impedance of the input signal 2004. This also improves the energy transfer from the input signal 2004 to the down-converted output signal 2012, and hence the efficiency and signal to noise (s/n) ratio of UFT module 2002.

Exemplary systems and methods for generating and optimizing the control signal 2006 and for otherwise improving energy transfer and s/n ratio, are disclosed in the co-pending U.S. patent application entitled "Method and System for Down-converting Electromagnetic Signals," Ser. No. 09/176,022.

When the pulses of the control signal 2006 have non-negligible apertures, the aliasing module 2000 is referred to interchangeably herein as an energy transfer module or a gated transfer module, and the control signal 2006 is referred to as an energy transfer signal. Exemplary systems and methods for generating and optimizing the control signal 2006 and for otherwise improving energy transfer and/or signal to noise ratio in an energy transfer module are described below.

3.1 Optional Energy Transfer Signal Module

Figure 47:
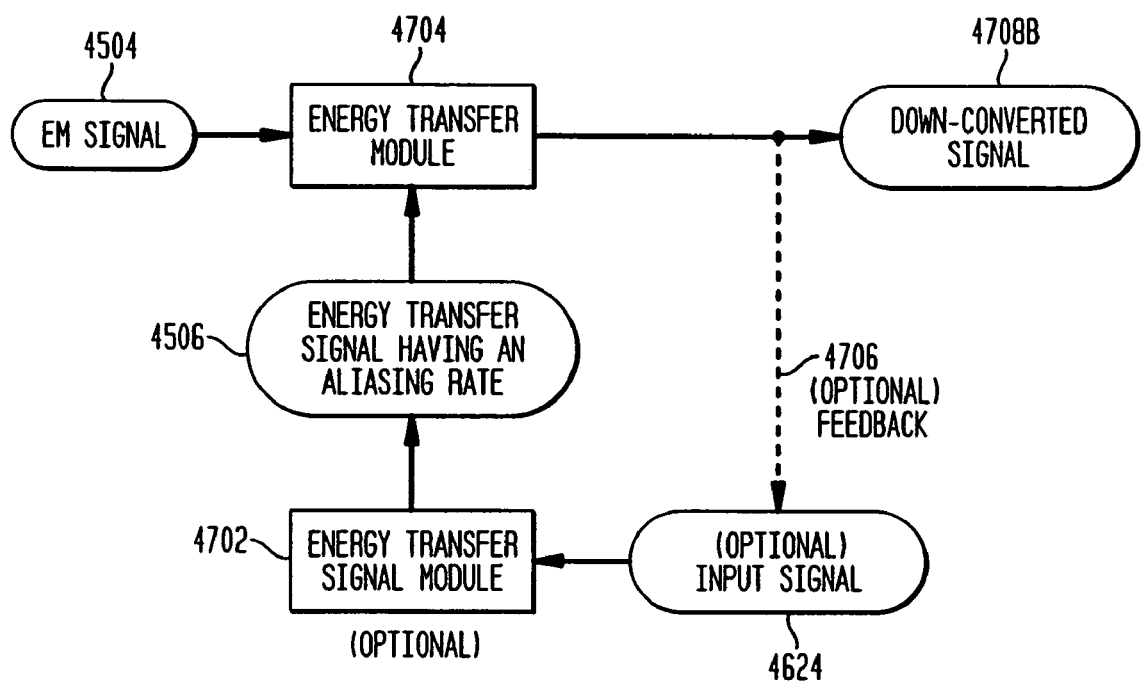
FIG. 47 illustrates an energy transfer system with an optional energy transfer signal module according to an embodiment of the invention.

FIG. 47 illustrates an energy transfer system 4701 that includes an optional energy transfer signal module 4702, which can perform any of a variety of functions or combinations of functions including, but not limited to, generating the energy transfer signal 4506.

Figure 46A:
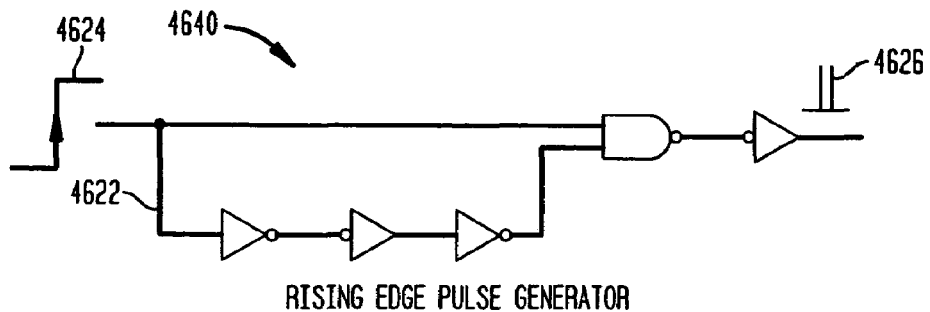
FIGS. 46A-D illustrate example aperture generators.
Figure 46B:
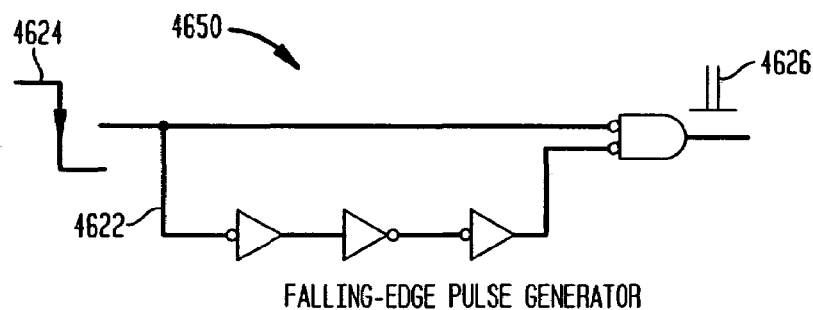
Figure 46C:
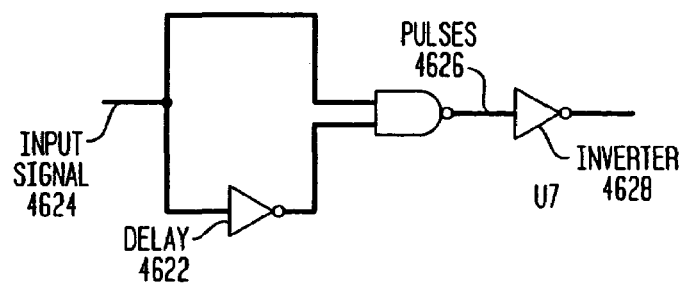

In an embodiment, the optional energy transfer signal module 4702 includes an aperture generator, an example of which is illustrated in FIG. 46C as an aperture generator 4620. The aperture generator 4620 generates non-negligible aperture pulses 4626 from an input signal 4624. The input signal 4624 can be any type of periodic signal, including, but not limited to, a sinusoid, a square wave, a sawtooth wave, etc. Systems for generating the input signal 4624 are described below.

The width or aperture of the pulses 4626 is determined by delay through the branch 4622 of the aperture generator 4620. Generally, as the desired pulse width increases, the difficulty in meeting the requirements of the aperture generator 4620 decrease. In other words, to generate non-negligible aperture pulses for a given EM input frequency, the components utilized in the example aperture generator 4620 do not require as fast reaction times as those that are required in an under-sampling system operating with the same EM input frequency.

The example logic and implementation shown in the aperture generator 4620 are provided for illustrative purposes only, and are not limiting. The actual logic employed can take many forms. The example aperture generator 4620 includes an optional inverter 4628, which is shown for polarity consistency with other examples provided herein.

Figure 46D:
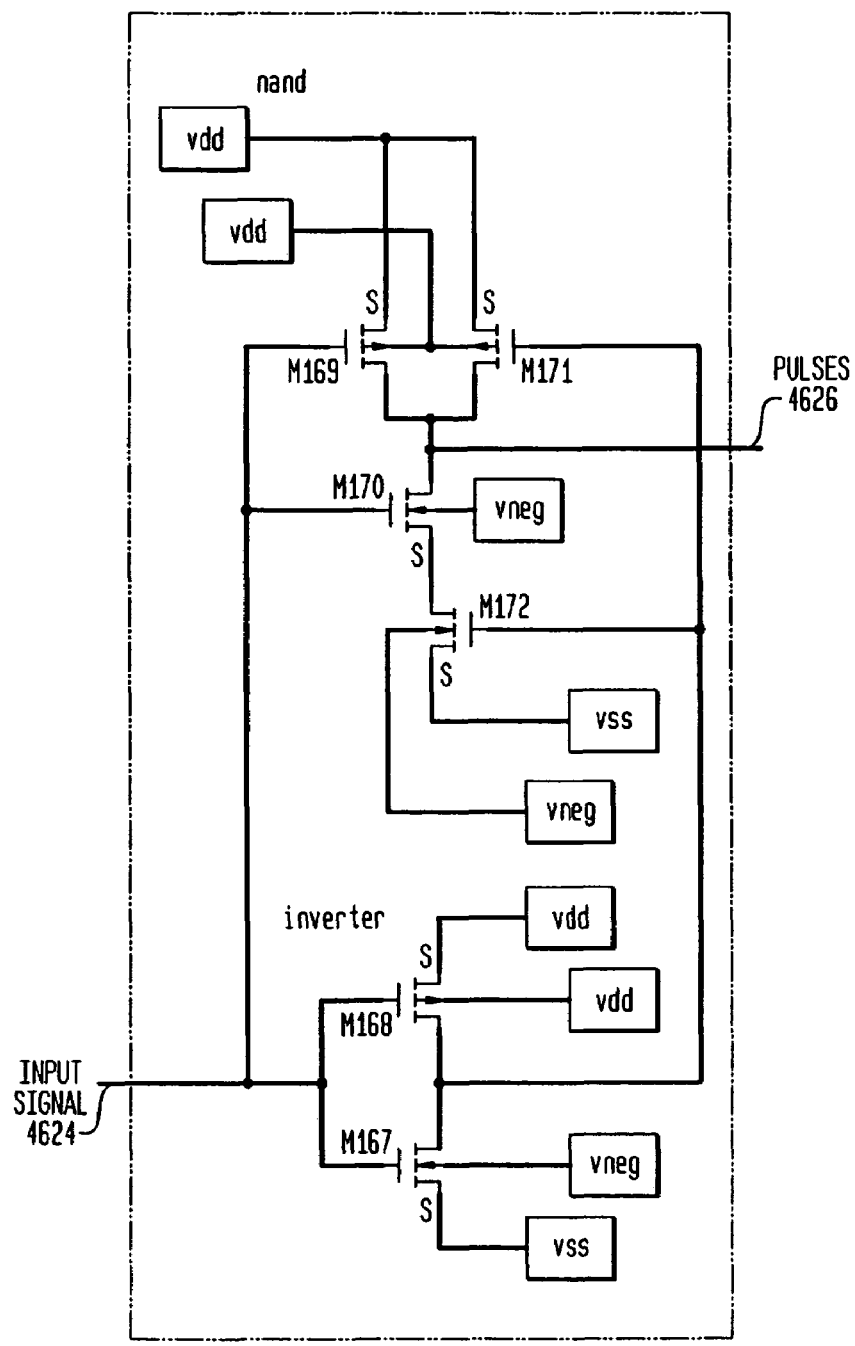

An example implementation of the aperture generator 4620 is illustrated in FIG. 46D. Additional examples of aperture generation logic are provided in FIGS. 46A and 46B. FIG. 46A illustrates a rising edge pulse generator 4640, which generates pulses 4626 on rising edges of the input signal 4624. FIG. 46B illustrates a falling edge pulse generator 4650, which generates pulses 4626 on falling edges of the input signal 4624.

Figure 46E:
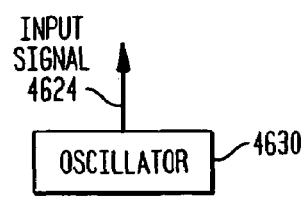
FIG. 46E illustrates an oscillator according to an embodiment of the present invention.

In an embodiment, the input signal 4624 is generated externally of the energy transfer signal module 4702, as illustrated in FIG. 47. Alternatively, the input signal 4724 is generated internally by the energy transfer signal module 4102. The input signal 4624 can be generated by an oscillator, as illustrated in FIG. 46E by an oscillator 4630. The oscillator 4630 can be internal to the energy transfer signal module 4702 or external to the energy transfer signal module 4702. The oscillator 4630 can be external to the energy transfer system 4701. The output of the oscillator 4630 may be any periodic waveform.

The type of down-conversion performed by the energy transfer system 4701 depends upon the aliasing rate of the energy transfer signal 4506, which is determined by the frequency of the pulses 4626. The frequency of the pulses 4626 is determined by the frequency of the input signal 4624. For example, when the frequency of the input signal. 4624 is substantially equal to a harmonic or sub-harmonic of the EM signal 4504, the EM signal 4504 is directly down-converted to baseband (e.g. when the EM signal is an AM signal or a PM signal), or converted from FM to a non-FM signal. When the frequency of the input signal 4624 is substantially equal to a harmonic or a sub-harmonic of a difference frequency, the EM signal 4504 is down-converted to an intermediate signal.

The optional energy transfer signal module 4702 can be implemented in hardware, software, firmware, or any combination thereof.

3.2 Smoothing the Down-Converted Signal

Referring back to FIG. 20A, the down-converted output signal 2012 may be smoothed by filtering as desired.

3.3. Impedance Matching

The energy transfer module 2000 has input and output impedances generally defined by (1) the duty cycle of the switch module (i.e., UFT 2002), and (2) the impedance of the storage module (e.g., capacitor 2010), at the frequencies of interest (e.g. at the EM input, and intermediate/baseband frequencies).

Starting with an aperture width of approximately ½ the period of the EM signal being down-converted as a preferred embodiment, this aperture width (e.g. the "closed time") can be decreased. As the aperture width is decreased, the characteristic impedance at the input and the output of the energy transfer module increases. Alternatively, as the aperture width increase from ½ the period of the EM signal being down-converted, the impedance of the energy transfer module decreases.

One of the steps in determining the characteristic input impedance of the energy transfer module could be to measure its value. In an embodiment, the energy transfer module's characteristic input impedance is 300 ohms. An impedance matching circuit can be utilized to efficiently couple an input EM signal that has a source impedance of, for example, 50 ohms, with the energy transfer module's impedance of, for example, 300 ohms. Matching these impedances can be accomplished in various manners, including providing the necessary impedance directly or the use of an impedance match circuit as described below.

Figure 48:
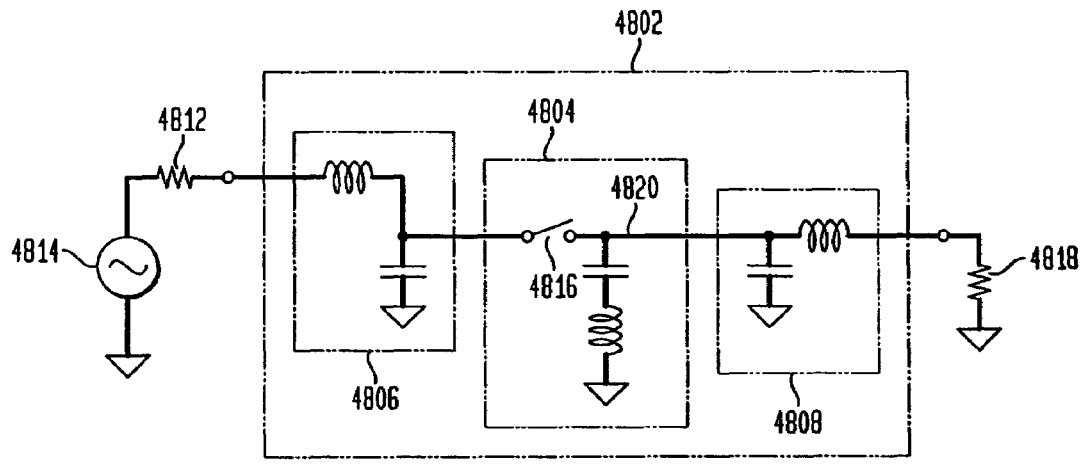
FIG. 48 illustrates an aliasing module with input and output impedance match according to an embodiment of the invention.
Figure 50:
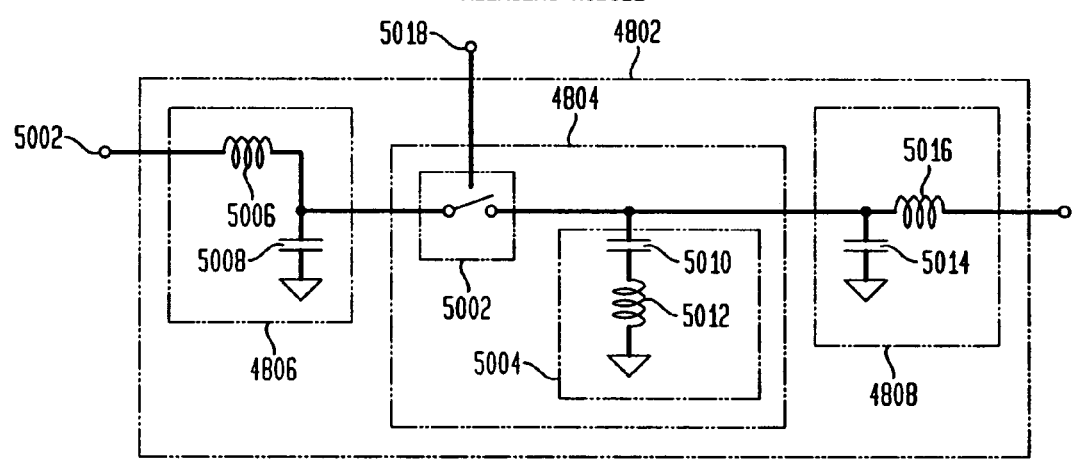
FIG. 50 illustrates an example energy transfer module with a switch module and a reactive storage module according to an embodiment of the invention.

Referring to FIG. 48, a specific embodiment using an RF signal as an input, assuming that the impedance 4812 is a relatively low impedance of approximately 50 Ohms, for example, and the input impedance 4816 is approximately 300 Ohms, an initial configuration for the input impedance match module 4806 can include an inductor 5006 and a capacitor 5008, configured as shown in FIG. 50. The configuration of the inductor 5006 and the capacitor 5008 is a possible configuration when going from a low impedance to a high impedance. Inductor 5006 and the capacitor 5008 constitute an L match, the calculation of the values which is well known to those skilled in the relevant arts.

The output characteristic impedance can be impedance matched to take into consideration the desired output frequencies. One of the steps in determining the characteristic output impedance of the energy transfer module could be to measure its value. Balancing the very low impedance of the storage module at the input EM frequency, the storage module should have an impedance at the desired output frequencies that is preferably greater than or equal to the load that is intended to be driven (for example, in an embodiment, storage module impedance at a desired 1 MHz output frequency is 2K ohm and the desired load to be driven is 50 ohms). An additional benefit of impedance matching is that filtering of unwanted signals can also be accomplished with the same components.

In an embodiment, the energy transfer module's characteristic output impedance is 2K ohms. An impedance matching circuit can be utilized to efficiently couple the down-converted signal with an output impedance of, for example, 2K ohms, to a load of, for example, 50 ohms. Matching these impedances can be accomplished in various manners, including providing the necessary load impedance directly or the use of an impedance match circuit as described below.

When matching from a high impedance to a low impedance, a capacitor 5014 and an inductor 5016 can be configured as shown in FIG. 50. The capacitor 5014 and the inductor 5016 constitute an L match, the calculation of the component values being well known to those skilled in the relevant arts.

The configuration of the input impedance match module 4806 and the output impedance match module 4808 are considered to be initial starting points for impedance matching, in accordance with the present invention. In some situations, the initial designs may be suitable without further optimization. In other situations, the initial designs can be optimized in accordance with other various design criteria and considerations.

As other optional optimizing structures and/or components are utilized, their affect on the characteristic impedance of the energy transfer module should be taken into account in the match along with their own original criteria

3.4 Tanks and Resonant Structures

Resonant tank and other resonant structures can be used to further optimize the energy transfer characteristics of the invention. For example, resonant structures, resonant about the input frequency, can be used to store energy from the input signal when the switch is open, a period during which one may conclude that the architecture would otherwise be limited in its maximum possible efficiency. Resonant tank and other resonant structures can include, but are not limited to, surface acoustic wave (SAW) filters, dielectric resonators, diplexers, capacitors, inductors, etc.

Figure 55:
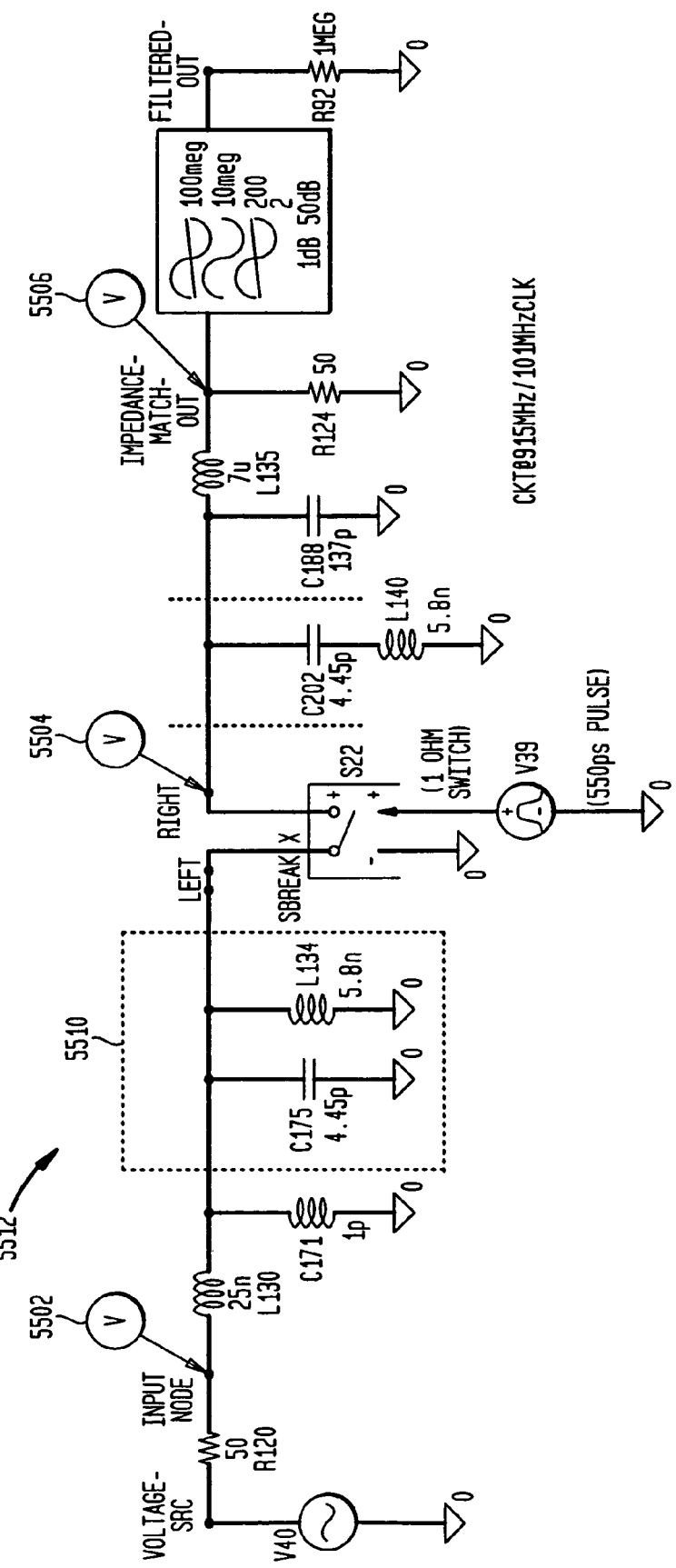
FIG. 55 is a schematic diagram of a circuit to down-convert a 915 MHZ signal to a 5 MHZ signal using a 101 MHZ clock according to an embodiment of the present invention.
Figure 60A:
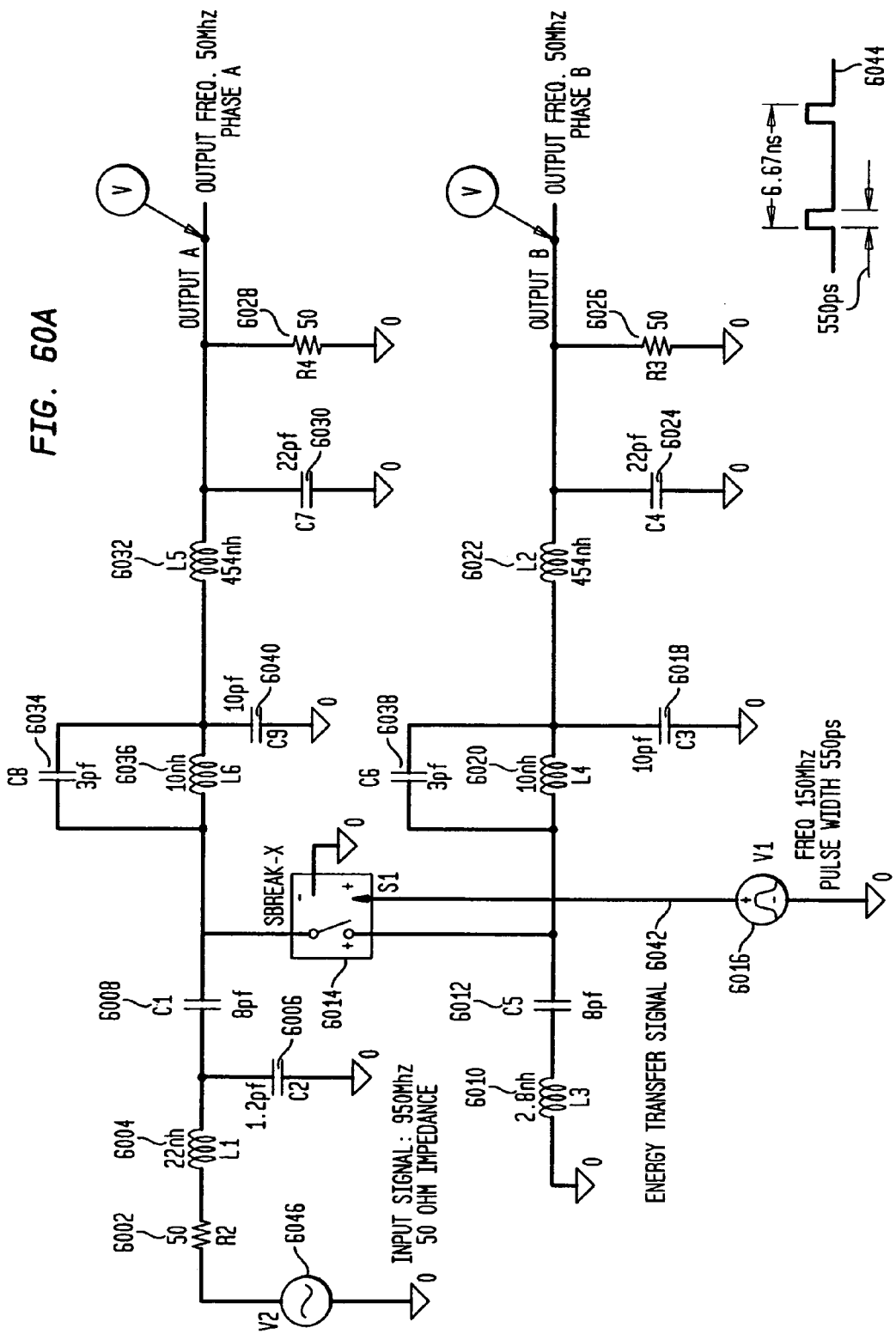
FIG. 60A illustrates an example energy transfer system according to an embodiment of the invention.
Figure 63:
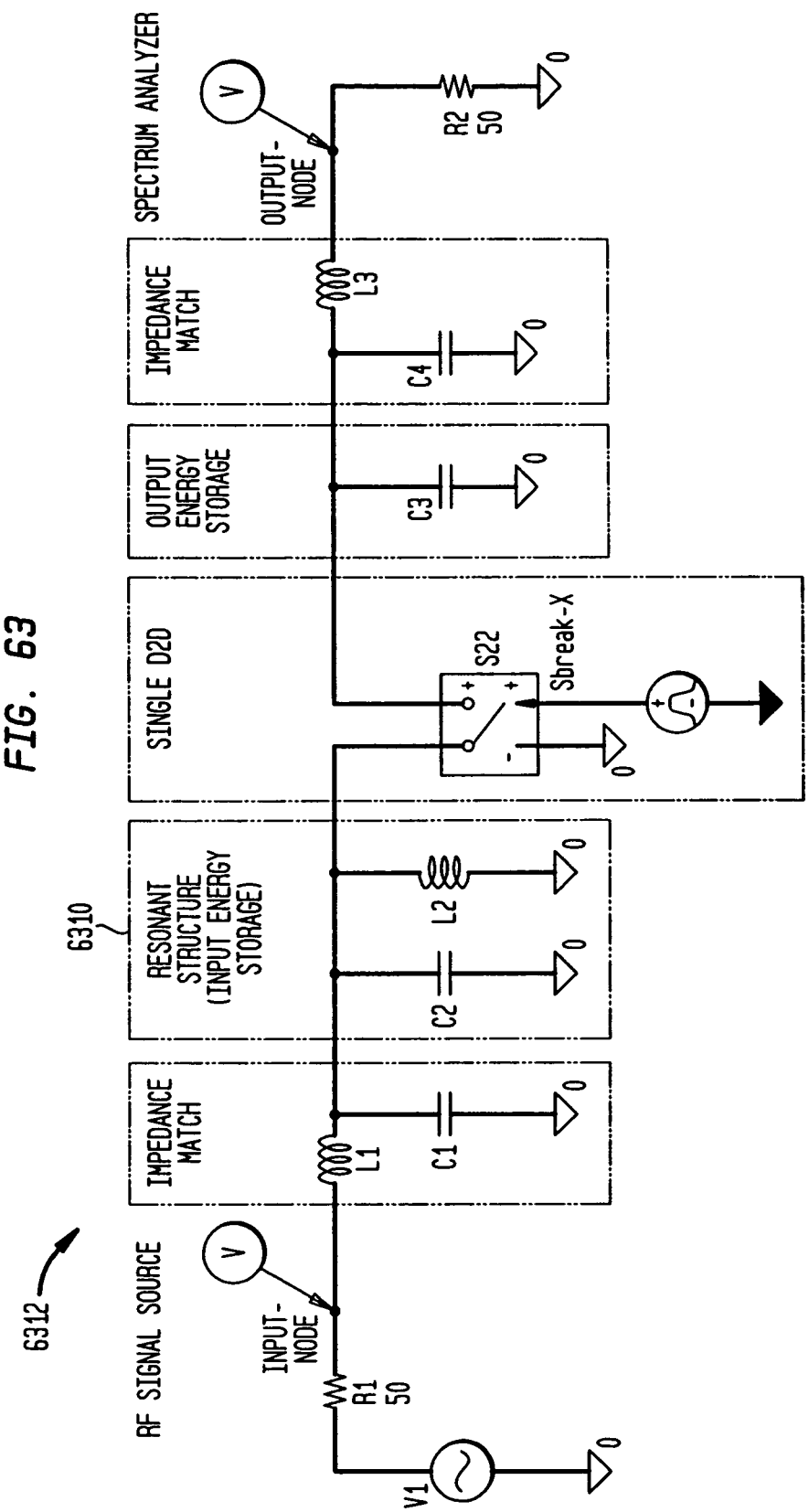
FIG. 63 illustrates an example embodiment of the invention.

An example embodiment is shown in FIG. 60A. Two additional embodiments are shown in FIG. 55 and FIG. 63. Alternate implementations will be apparent to persons skilled in the relevant art(s) based on the teachings contained herein. Alternate implementations fall within the scope and spirit of the present invention. These implementations take advantage of properties of series and parallel (tank) resonant circuits.

FIG. 60A illustrates parallel tank circuits in a differential implementation. A first parallel resonant or tank circuit consists of a capacitor 6038 and an inductor 6020 (tank1). A second tank circuit consists of a capacitor 6034 and an inductor 6036 (tank2).

As is apparent to one skilled in the relevant art(s), parallel tank circuits provide:

low impedance to frequencies below resonance;
low impedance to frequencies above resonance; and
high impedance to frequencies at and near resonance.

In the illustrated example of FIG. 60A, the first and second tank circuits resonate at approximately 920 MHz. At and near resonance, the impedance of these circuits is relatively high. Therefore, in the circuit configuration shown in FIG. 60A, both tank circuits appear as relatively high impedance to the input frequency of 950 MHz, while simultaneously appearing as relatively low impedance to frequencies in the desired output range of 50 MHz.

An energy transfer signal 6042 controls a switch 6014. When the energy transfer signal 6042 controls the switch 6014 to open and close, high frequency signal components are not allowed to pass through tank1 or tank2. However, the lower signal components (50 Mhz in this embodiment) generated by the system are allowed to pass through tank1 and tank2 with little attenuation. The effect of tank1 and tank2 is to further separate the input and output signals from the same node thereby producing a more stable input and output impedance. Capacitors 6018 and 6040 act to store the 50 MHz output signal energy between energy transfer pulses.

Further energy transfer optimization is provided by placing an inductor 6010 in series with a storage capacitor 6012 as shown. In the illustrated example, the series resonant frequency of this circuit arrangement is approximately 1 GHz. This circuit increases the energy transfer characteristic of the system. The ratio of the impedance of inductor 6010 and the impedance of the storage capacitor 6012 is preferably kept relatively small so that the majority of the energy available will be transferred to storage capacitor 6012 during operation. Exemplary output signals A and B are illustrated in FIGS. 60B and 60C, respectively.

In FIG. 60A, circuit components 6004 and 6006 form an input impedance match. Circuit components 6032 and 6030 form an output impedance match into a 50 ohm resistor 6028. Circuit components 6022 and 6024 form a second output impedance match into a 50 ohm resistor 6026. Capacitors 6008 and 6012 act as storage capacitors for the embodiment Voltage source 6046 and resistor 6002 generate a 950 MHz signal with a 50 ohm output impedance, which are used as the input to the circuit. Circuit element 6016 includes a 150 MHz oscillator and a pulse generator, which are used to generate the energy transfer signal 6042.

FIG. 55 illustrates a shunt tank circuit 5510 in a single-ended to-single-ended system 5512. Similarly, FIG. 63 illustrates a shunt tank circuit 6310 in a system 6312. The tank circuits 5510 and 6310 lower driving source impedance, which improves transient response. The tank circuits 5510 and 6310 are able store the energy from the input signal and provide a low driving source impedance to transfer that energy throughout the aperture of the closed switch. The transient nature of the switch aperture can be viewed as having a response that, in addition to including the input frequency, has large component frequencies above the input frequency, (i.e. higher frequencies than the input frequency are also able to effectively pass through the aperture). Resonant circuits or structures, for example resonant tanks 5510 or 6310, can take advantage of this by being able to transfer energy throughout the switch's transient frequency response (i.e. the capacitor in the resonant tank appears as a low driving source impedance during the transient period of the aperture).

The example tank and resonant structures described above are for illustrative purposes and are not limiting. Alternate configurations can be utilized. The various resonant tanks and structures discussed can be combined or utilized independently as is now apparent.

3.5 Charge and Power Transfer Concepts

Concepts of charge transfer are now described with reference to FIGS. 71A-F. FIG. 71A illustrates a circuit 7102, including a switch S and a capacitor 7106 having a capacitance C. The switch S is controlled by a control signal 7108, which includes pulses 19010 having apertures T.

In FIG. 71B, Equation 10 illustrates that the charge q on a capacitor having a capacitance C, such as the capacitor 7106, is proportional to the voltage V across the capacitor, where:
q=Charge in Coulombs
C=Capacitance in Farads
V=Voltage in Volts
A=Input Signal Amplitude Where the voltage V is represented by Equation 11, Equation 10 can be rewritten as Equation 12. The change in charge $\Delta q$ over time t is illustrated as in Equation 13 as $\Delta q(t)$, which can be rewritten as Equation 14. Using the sum-to-product trigonometric identity of Equation 15, Equation 14 can be rewritten as Equation 16, which can be rewritten as equation 17.

Note that the sin term in Equation 11 is a function of the aperture T only. Thus, $\Delta q(t)$ is at a maximum when T is equal to an odd multiple of $\pi$ (i.e., $\pi$, $3\pi$, $5\pi$, ... ). Therefore, the capacitor 7106 experiences the greatest change in charge when the aperture T has a value of $\pi$ or a time interval representative of 180 degrees of the input sinusoid. Conversely, when T is equal to $2\pi$, $4\pi$, $6\pi$, ..., minimal charge is transferred.

Equations 18, 19, and 20 solve for q(t) by integrating Equation 10, allowing the charge on the capacitor 7106 with respect to time to be graphed on the same axis as the input sinusoid sin(t), as illustrated in the graph of FIG. 71C. As the aperture T decreases in value or tends toward an impulse, the phase between the charge on the capacitor C or q(t) and sin(t) tend toward zero. This is illustrated in the graph of FIG. 71D, which indicates that the maximum impulse charge transfer occurs near the input voltage maxima. As this graph indicates, considerably less charge is transferred as the value of T decreases.

Power/charge relationships are illustrated in Equations 21-26 of FIG. 71E, where it is shown that power is proportional to charge, and transferred charge is inversely proportional to insertion loss.

Concepts of insertion loss are illustrated in FIG. 71F. Generally, the noise figure of a lossy passive device is numerically equal to the device insertion loss. Alternatively, the noise figure for any device cannot be less that its insertion loss. Insertion loss can be expressed by Equation 27 or 28. From the above discussion, it is observed that as the aperture T increases, more charge is transferred from the input to the capacitor 7106, which increases power transfer from the input to the output. It has been observed that it is not necessary to accurately reproduce the input voltage at the output because relative modulated amplitude and phase information is retained in the transferred power.

3.6 Optimizing and Adjusting the Non-Negligible Aperture Width/Duration

3.6.1 Varying Input and Output Impedances

In an embodiment of the invention, the energy transfer signal (i.e., control signal 2006 in FIG. 20A), is used to vary the input impedance seen by the EM Signal 2004 and to vary the output impedance driving a load. An example of this embodiment is described below using a gated transfer module 5101 shown in FIG. 51A. The method described below is not limited to the gated transfer module 5101.

Figure 51A:
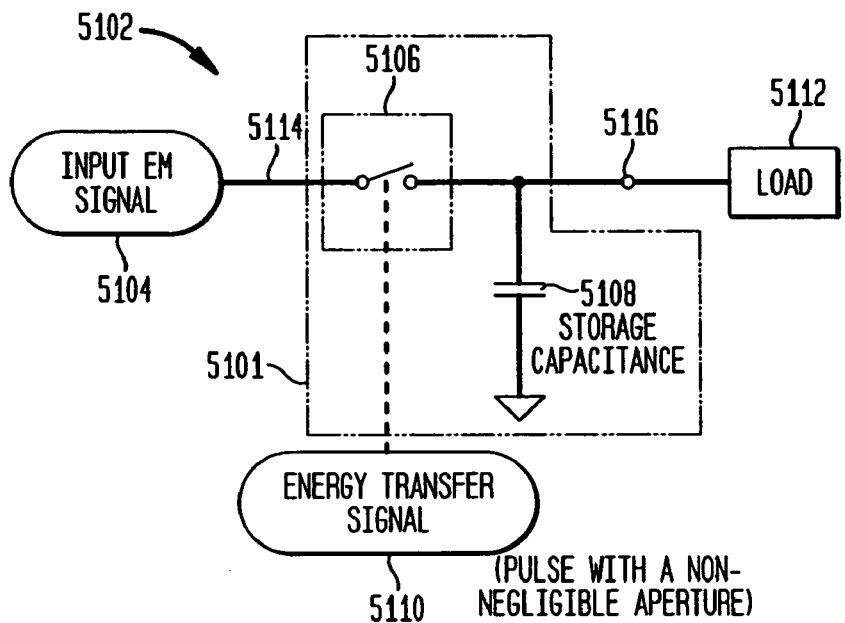
FIGS. 51A-B illustrate example energy transfer systems according to embodiments of the invention.
Figure 51B:
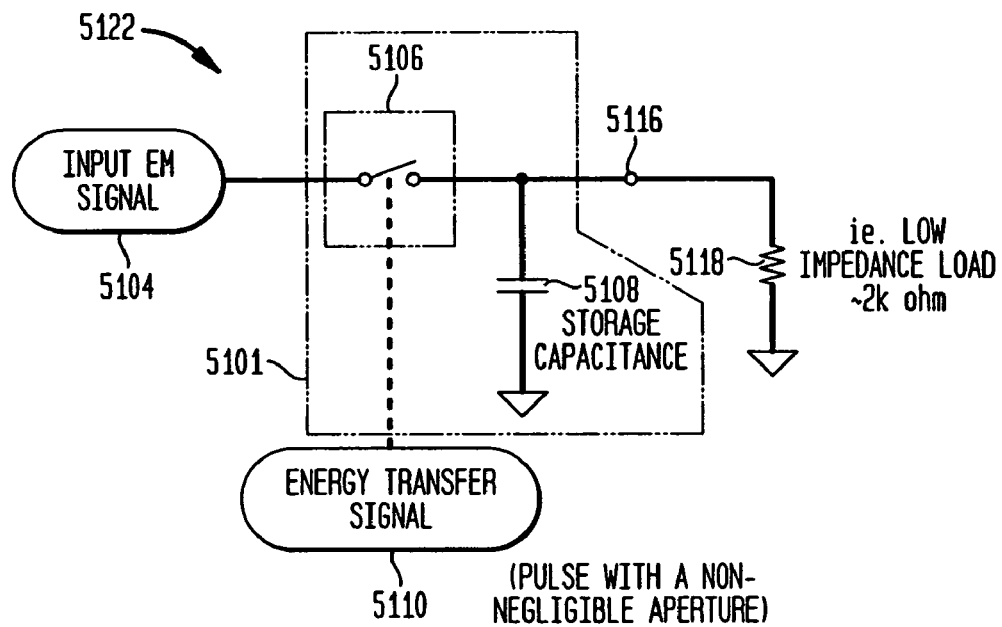

In FIG. 51A, when switch 5106 is closed, the impedance looking into circuit 5102 is substantially the impedance of a storage module, illustrated here as a storage capacitance 5108, in parallel with the impedance of a load 5112. When the switch 5106 is open, the impedance at point 5114 approaches infinity. It follows that the average impedance at point 5114 can be varied from the impedance of the storage module illustrated in parallel with the load 5112, to the highest obtainable impedance when switch 5106 is open, by varying the ratio of the time that switch 5106 is open to the time switch 5106 is closed. The switch 5106 is controlled by an energy transfer signal 5110. Thus the impedance at point 5114 can be varied by controlling the aperture width of the energy transfer signal in conjunction with the aliasing rate.

Figure 49A:
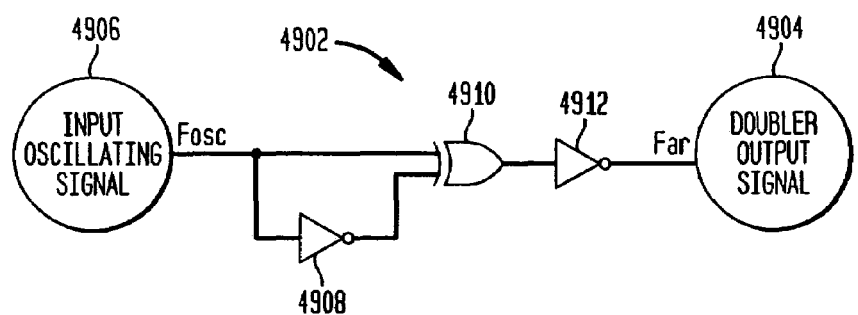
FIG. 49A illustrates an example pulse generator.
Figure 49B:
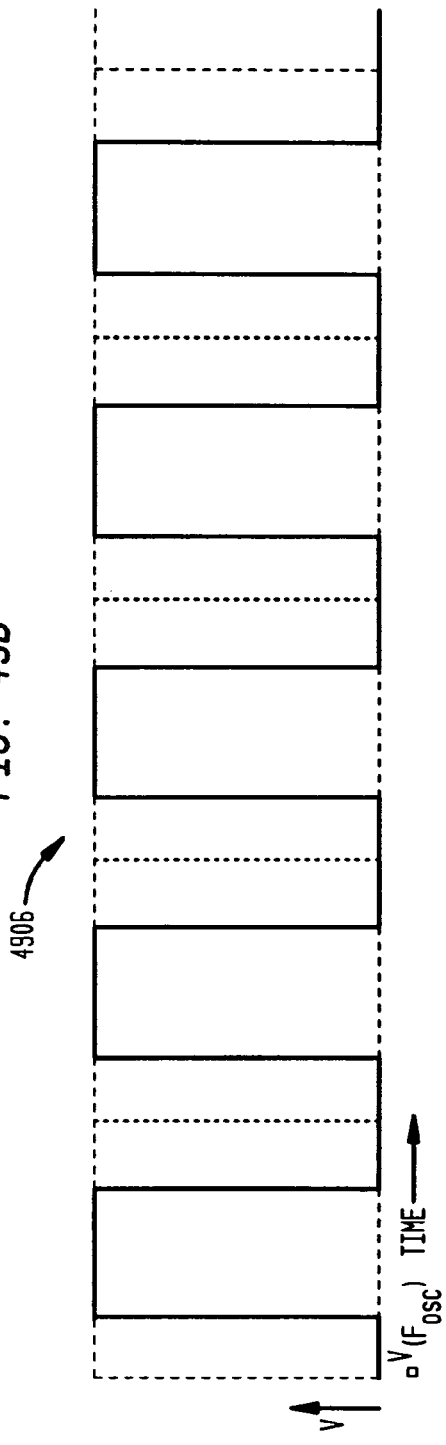
FIGS. 49B and C illustrate example waveforms related to the pulse generator of FIG. 49A.
Figure 49C:
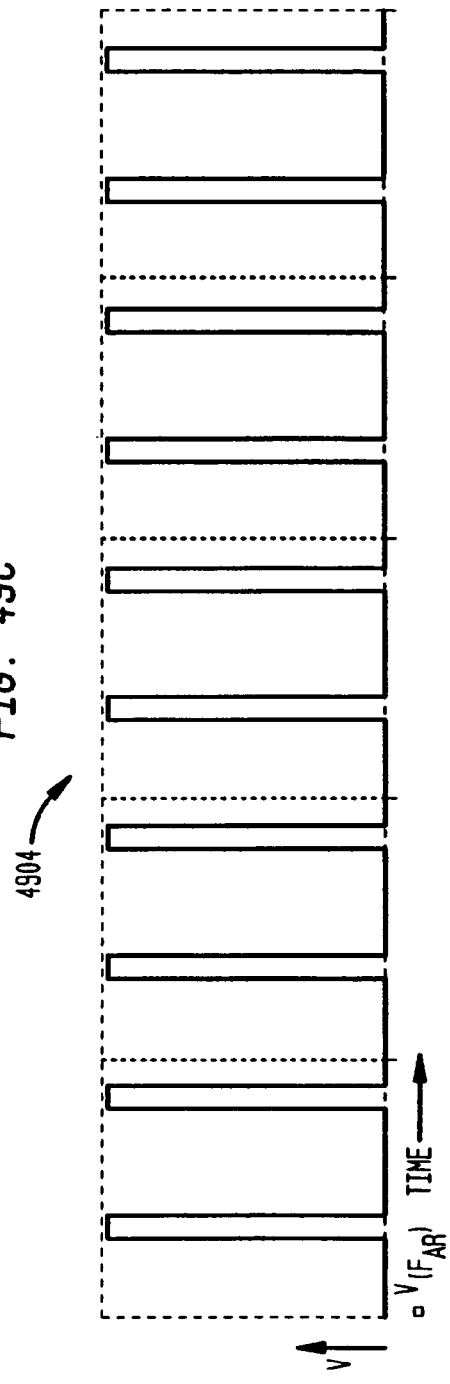

An example method of altering the energy transfer signal 5106 of FIG. 51A is now described with reference to FIG. 49A, where a circuit 4902 receives an input oscillating signal 4906 and outputs a pulse train shown as doubler output signal 4904. The circuit 4902 can be used to generate the energy transfer signal 5106. Example waveforms of 4904 are shown on FIG. 49C.

It can be shown that by varying the delay of the signal propagated by the inverter 4908, the width of the pulses in the doubler output signal 4904 can be varied. Increasing the delay of the signal propagated by inverter 4908, increases the width of the pulses. The signal propagated by inverter 4908 can be delayed by introducing a R/C low pass network in the output of inverter 4908. Other means of altering the delay of the signal propagated by inverter 4908 will be well known to those skilled in the art.

3.6.2 Real Time Aperture Control

In an embodiment, the aperture width/duration is adjusted in real time. For example, referring to the timing diagrams in FIGS. 64B-F, a clock signal 6414 (FIG. 64B) is utilized to generate an energy transfer signal 6416 (FIG. 64F), which includes energy transfer pluses 6418, having variable apertures 6420. In an embodiment, the clock signal 6414 is inverted as illustrated by inverted clock signal 6422 (FIG. 64D). The clock signal 6414 is also delayed, as illustrate by delayed clock signal 6424 (FIG. 64E). The inverted clock signal 6414 and the delayed clock signal 6424 are then ANDed together, generating an energy transfer signal 6416, which is active—energy transfer pulses 6418—when the delayed clock signal 6424 and the inverted clock signal 6422 are both active. The amount of delay imparted to the delayed clock signal 6424 substantially determines the width or duration of the apertures 6420. By varying the delay in real time, the apertures are adjusted in real time.

In an alternative implementation, the inverted clock signal 6422 is delayed relative to the original clock signal 6414, and then ANDed with the original clock signal 6414. Alternatively, the original clock signal 6414 is delayed then inverted, and the result ANDed with the original clock signal 6414.

Figure 64A:
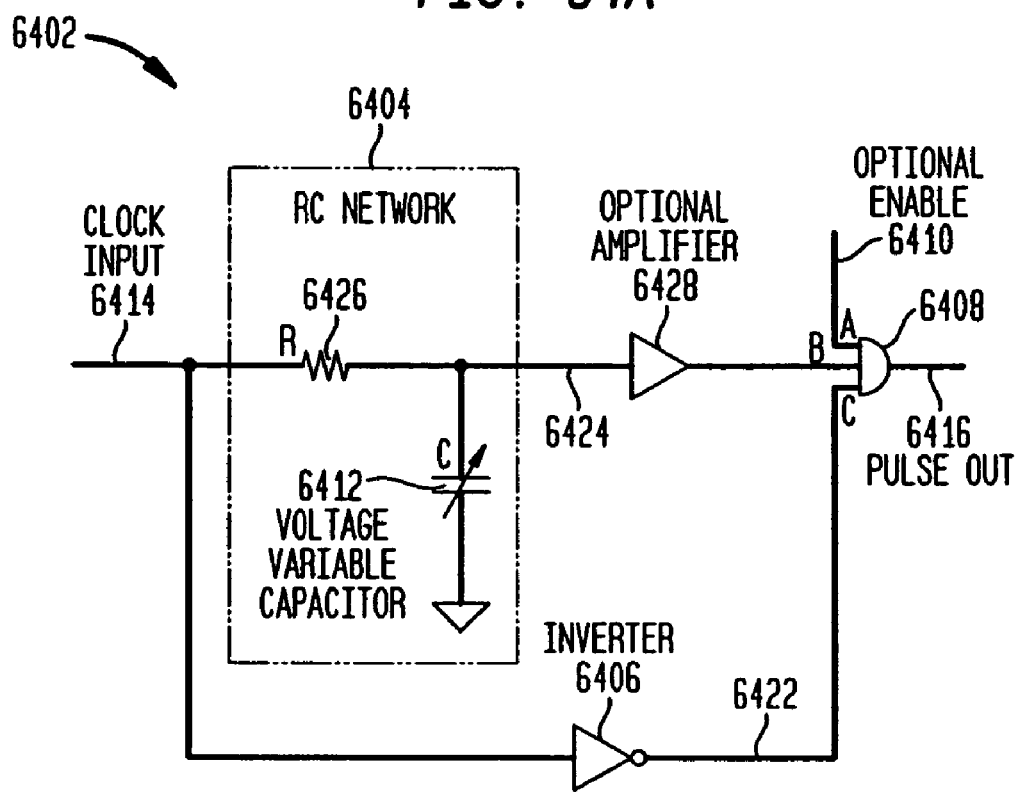
FIG. 64A illustrates an example real time aperture control circuit according to an embodiment of the invention.

FIG. 64A illustrates an exemplary real time aperture control system 6402 that can be utilized to adjust apertures in real time. The example real time aperture control system 6402 includes an RC circuit 6404, which includes a voltage variable capacitor 6412 and a resistor 6426. The real time aperture control system 6402 also includes an inverter 6406 and an AND gate 6408. The AND gate 6408 optionally includes an enable input 6410 for enabling/disabling the AND gate 6408. The RC circuit 6404. The real time aperture control system 6402 optionally includes an amplifier 6428.

Operation of the real time aperture control circuit is described with reference to the timing diagrams of FIGS. 64B-F. The real time control system 6402 receives the input clock signal 6414, which is provided to both the inverter 6406 and to the RC circuit 6404. The inverter 6406 outputs the inverted clock signal 6422 and presents it to the AND gate 6408. The RC circuit 6404 delays the clock signal 6414 and outputs the delayed clock signal 6424. The delay is determined primarily by the capacitance of the voltage variable capacitor 6412. Generally, as the capacitance decreases, the delay decreases.

The delayed clock signal 6424 is optionally amplified by the optional amplifier 6428, before being presented to the AND gate 6408. Amplification is desired, for example, where the RC constant of the RC circuit 6404 attenuates the signal below the threshold of the AND gate 6408.

The AND gate 6408 ANDs the delayed clock signal 6424, the inverted clock signal 6422, and the optional Enable signal 6410, to generate the energy transfer signal 6416. The apertures 6420 are adjusted in real time by varying the voltage to the voltage variable capacitor 6412.

In an embodiment, the apertures 6420 are controlled to optimize power transfer. For example, in an embodiment, the apertures 6420 are controlled to maximize power transfer. Alternatively, the apertures 6420 are controlled for variable gain control (e.g. automatic gain control—AGC). In this embodiment, power transfer is reduced by reducing the apertures 6420.

As can now be readily seen from this disclosure, many of the aperture circuits presented, and others, can be modified as in circuits illustrated in FIGS. 46H-K. Modification or selection of the can be done at the design level to remain a fixed value in the circuit, or in an alternative embodiment, may be dynamically adjusted to compensate for, or address, various design goals such as receiving RF signals with enhanced efficiency that are in distinctively different bands of operation, e.g. RF signals at 900 MHZ and 1.8 GHz.

3.7 Adding a Bypass Network

In an embodiment of the invention, a bypass network is added to improve the efficiency of the energy transfer module. Such a bypass network can be viewed as a means of synthetic aperture widening. Components for a bypass network are selected so that the bypass network appears substantially lower impedance to transients of the switch module (i.e., frequencies greater than the received EM signal) and appears as a moderate to high impedance to the input EM signal (e.g., greater that 100 Ohms at the RF frequency).

The time that the input signal is now connected to the opposite side of the switch module is lengthened due to the shaping caused by this network, which in simple realizations may be a capacitor or series resonant inductor-capacitor. A network that is series resonant above the input frequency would be a typical implementation. This shaping improves the conversion efficiency of an input signal that would otherwise, if one considered the aperture of the energy transfer signal only, be relatively low in frequency to be optimal.

Figure 57:
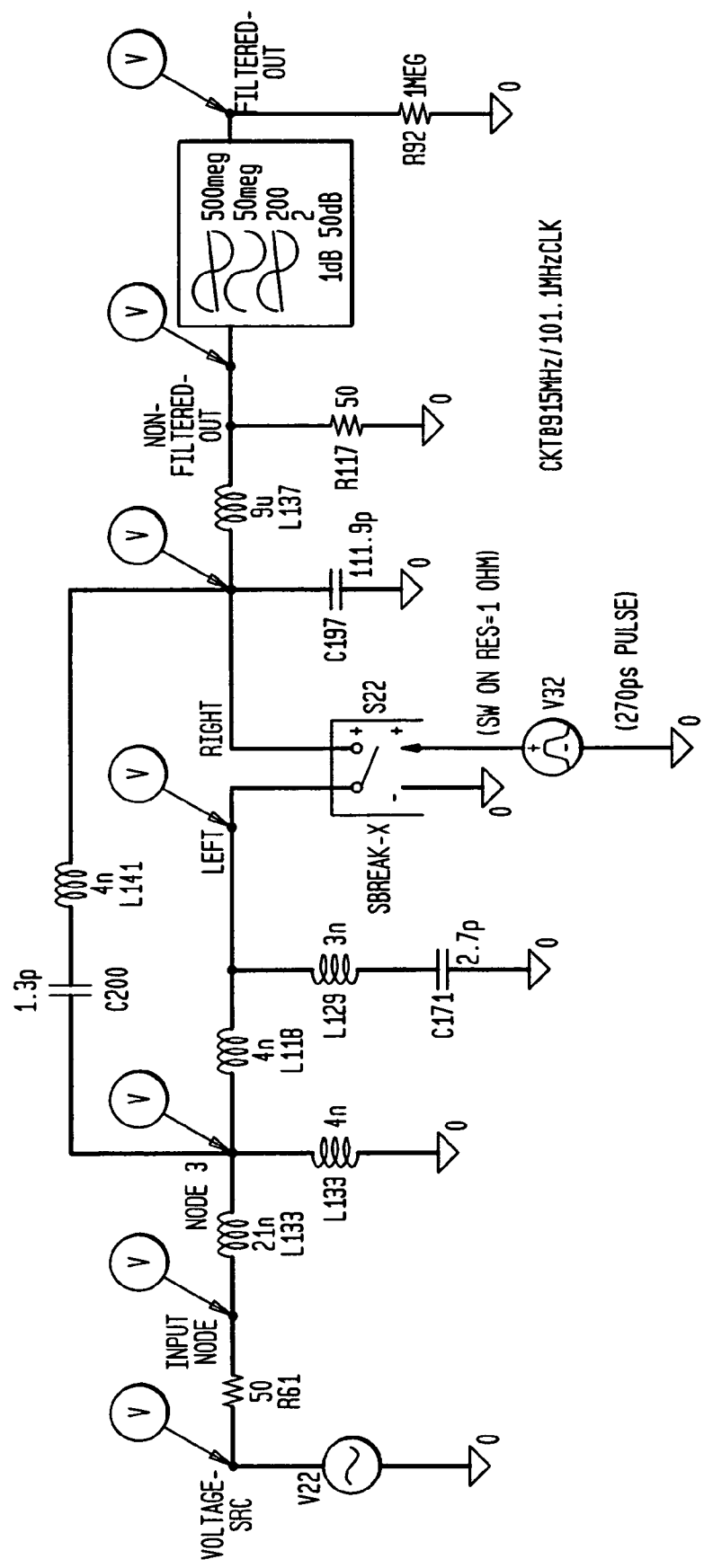
FIG. 57 is a schematic diagram of a circuit to down-convert a 915 MHZ signal to a 5 MHZ signal using a 101.1 MHZ clock according to an embodiment of the present invention.
Figure 61:
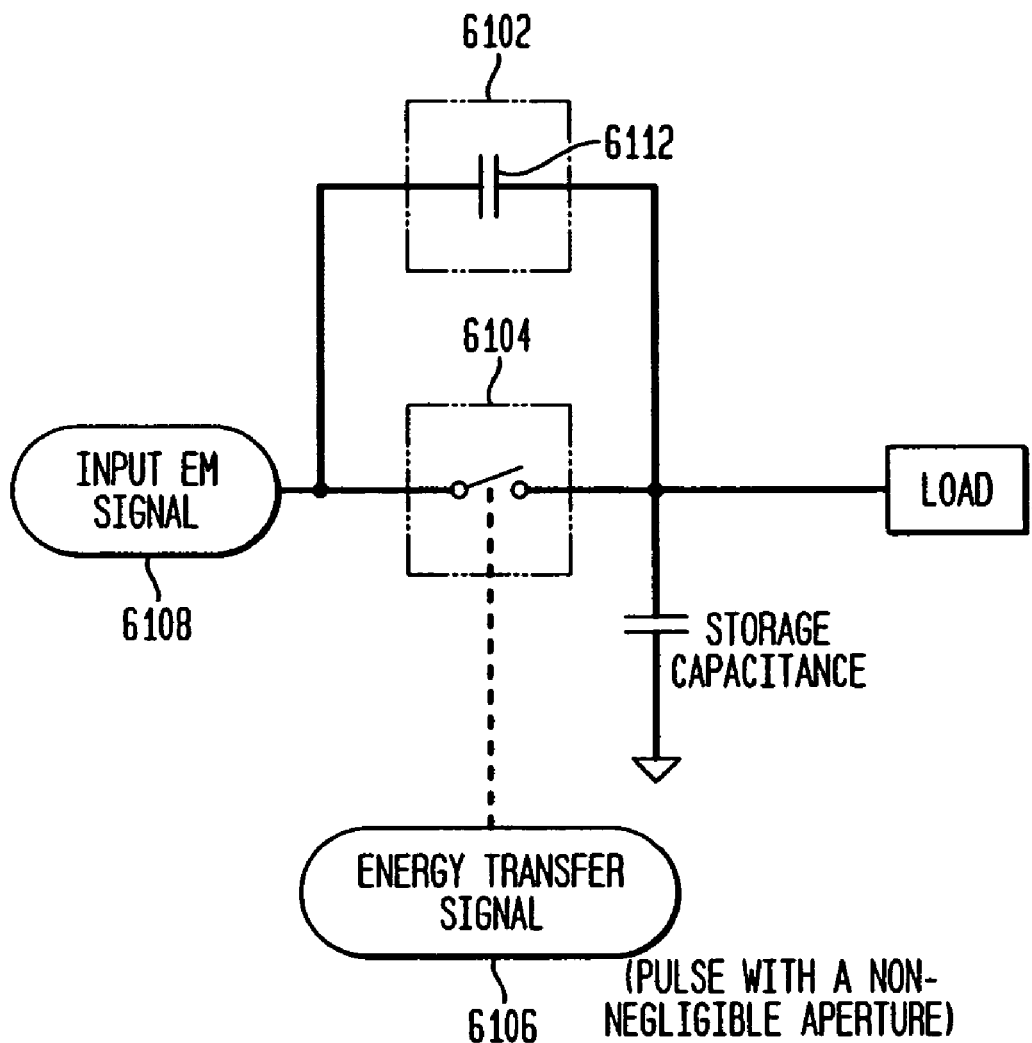
FIG. 61 illustrates an example bypass network according to an embodiment of the invention.
Figure 62:
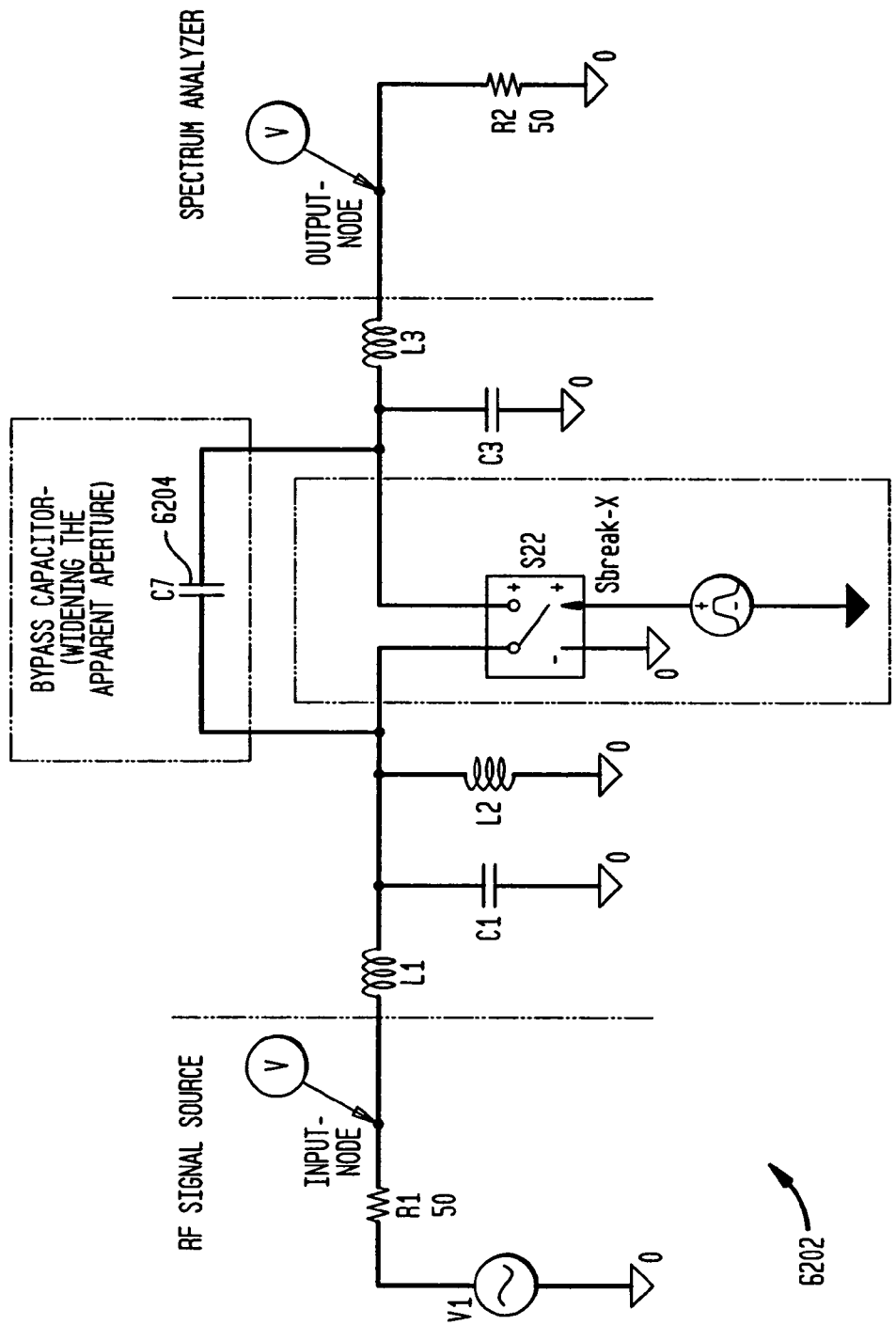
FIG. 62 illustrates an example bypass network according to an embodiment of the invention.

For example, referring to FIG. 61 a bypass network 6102 (shown in this instance as capacitor 6112), is shown bypassing switch module 6104. In this embodiment the bypass network increases the efficiency of the energy transfer module when, for example, less than optimal aperture widths were chosen for a given input frequency on the energy transfer signal 6106. The bypass-network 6102 could be of different configurations than shown in FIG. 61. Such an alternate is illustrated in FIG. 57. Similarly, FIG 62 illustrates another example bypass network 6202, including a capacitor 6204.

Figure 65:
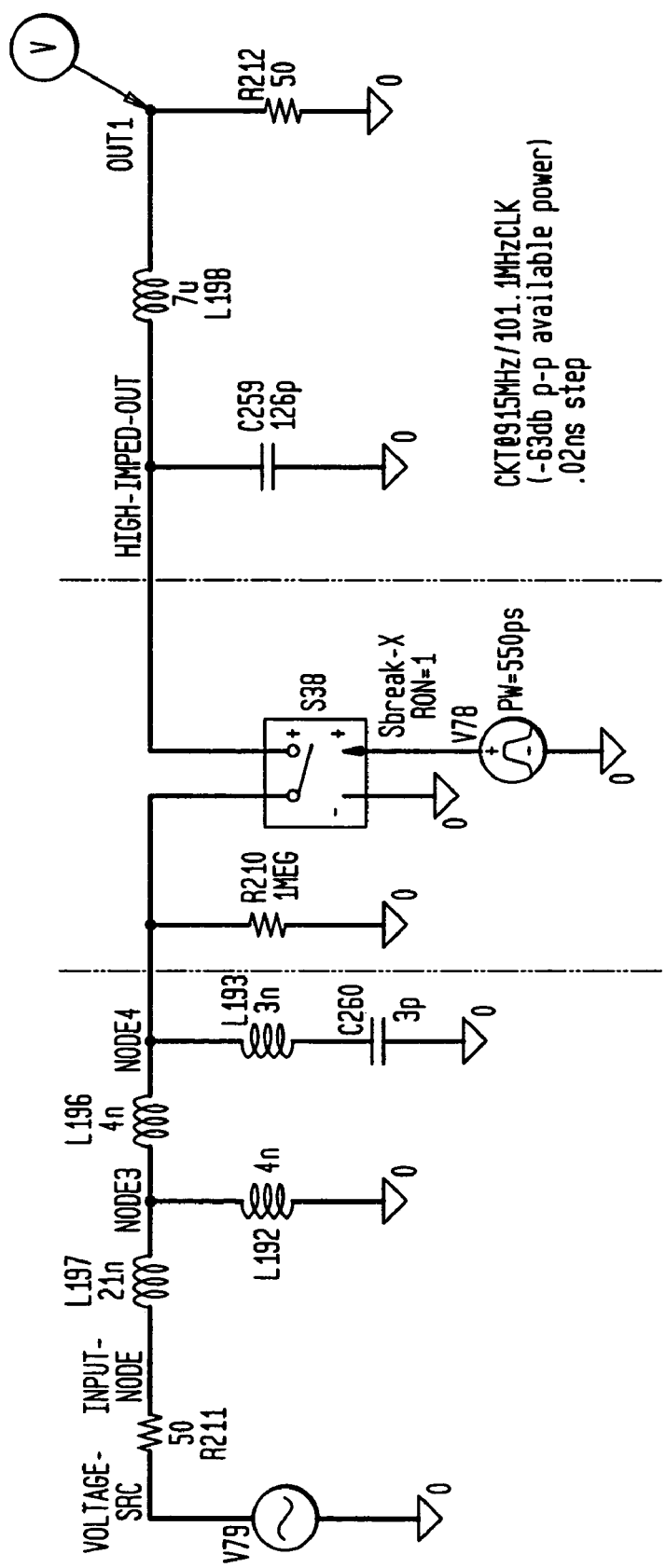
FIG. 65 illustrates an example embodiment of the invention.
Figure 66:
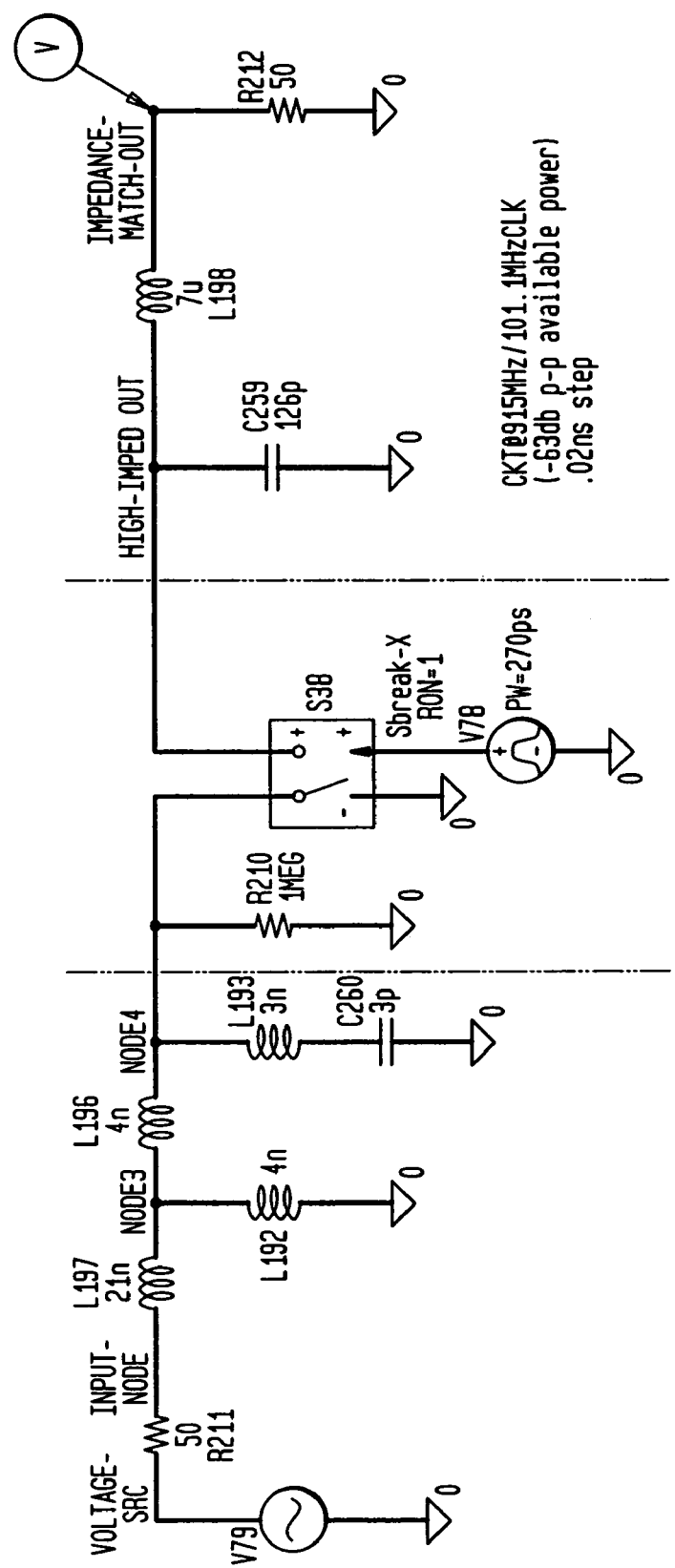
FIG. 66 illustrates an example embodiment of the invention.
Figure 67:
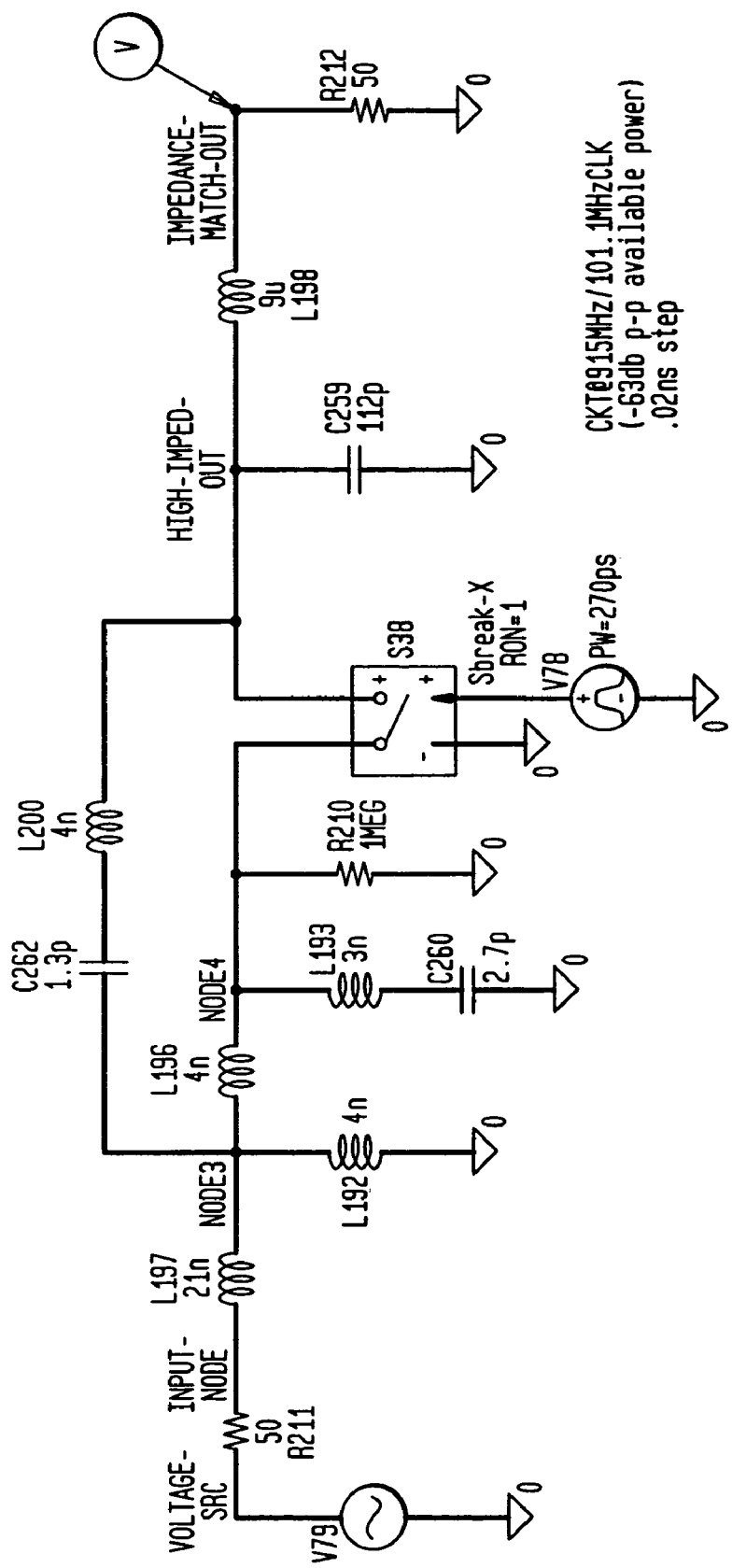
FIG. 67 illustrates an example embodiment of the invention.
Figure 68:
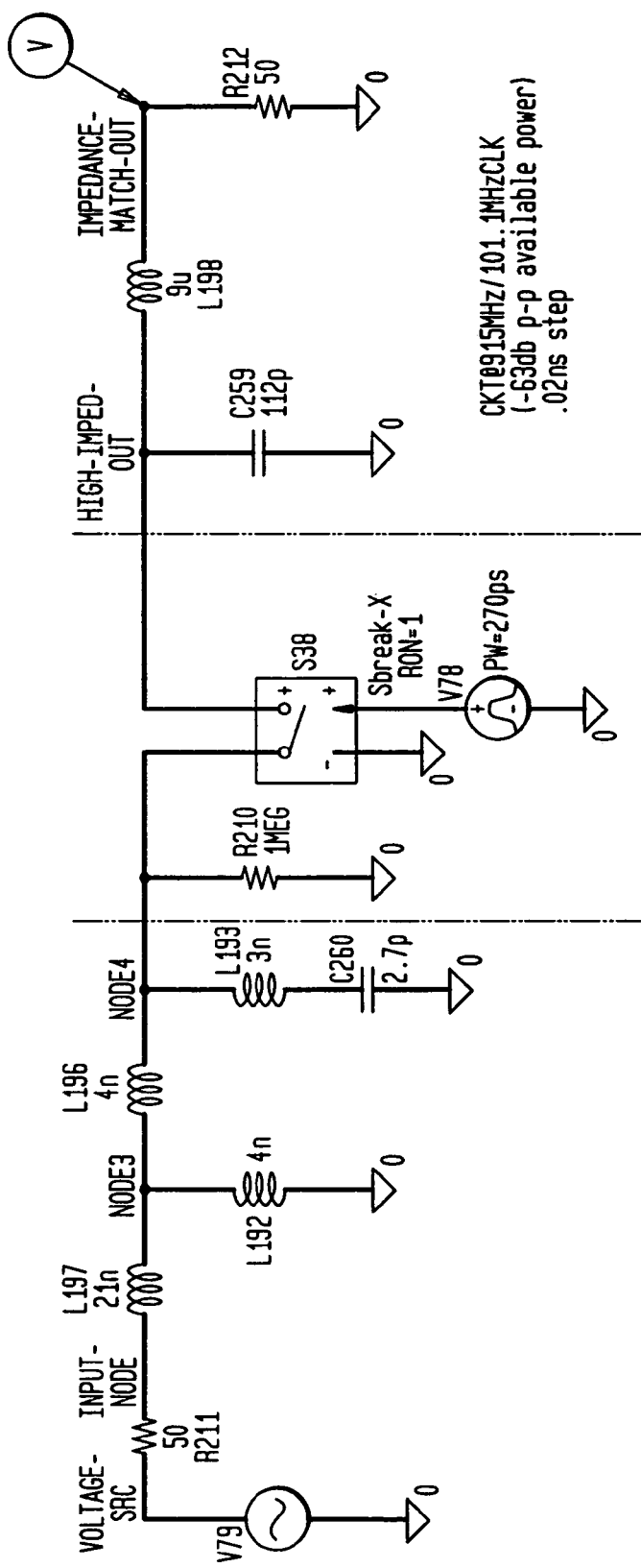
FIG. 68 illustrates an example embodiment of the invention.
Figure 69A:
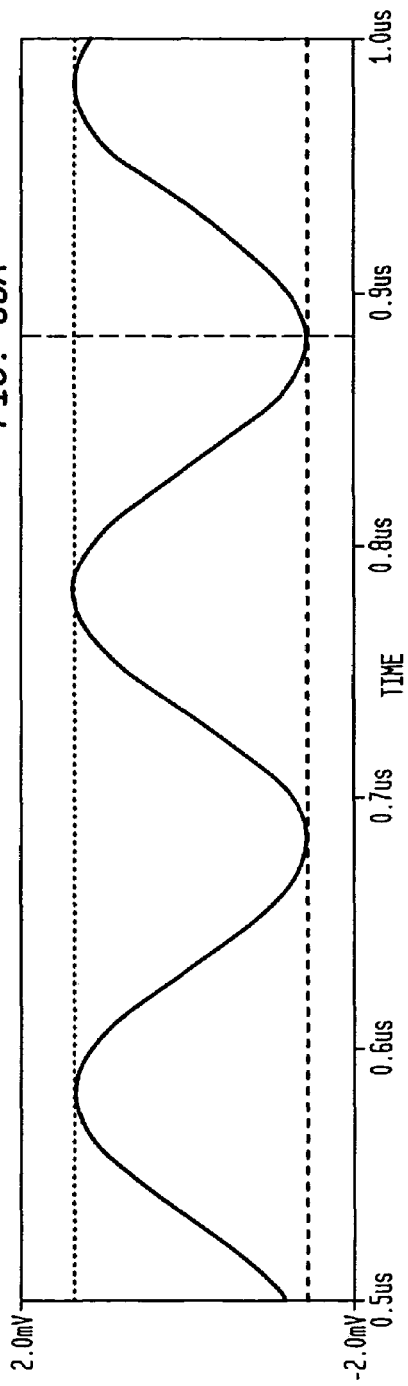
FIG. 69A is a timing diagram for the example embodiment of FIG. 65.
Figure 69B:
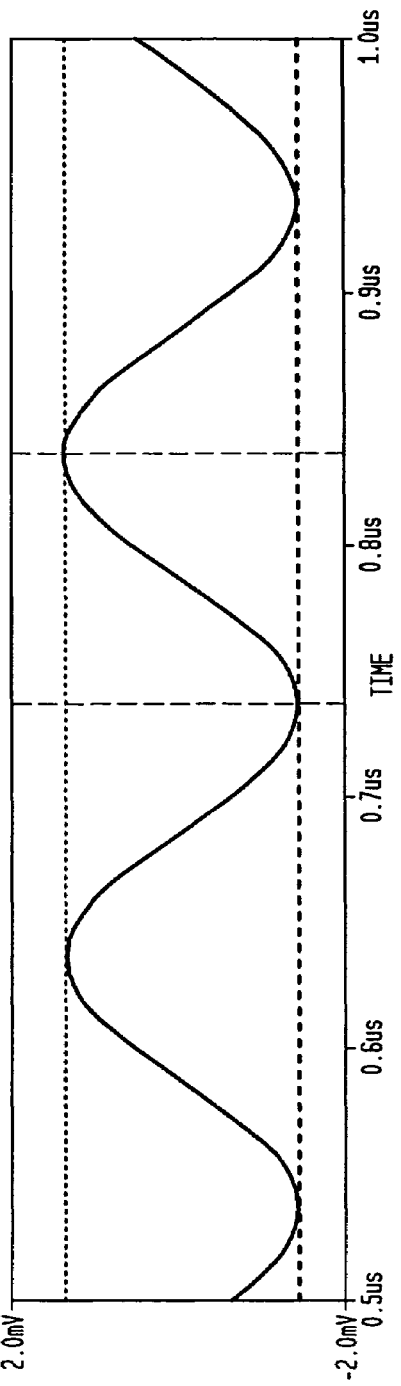
FIG. 69B is a timing diagram for the example embodiment of FIG. 66.
Figure 70A:
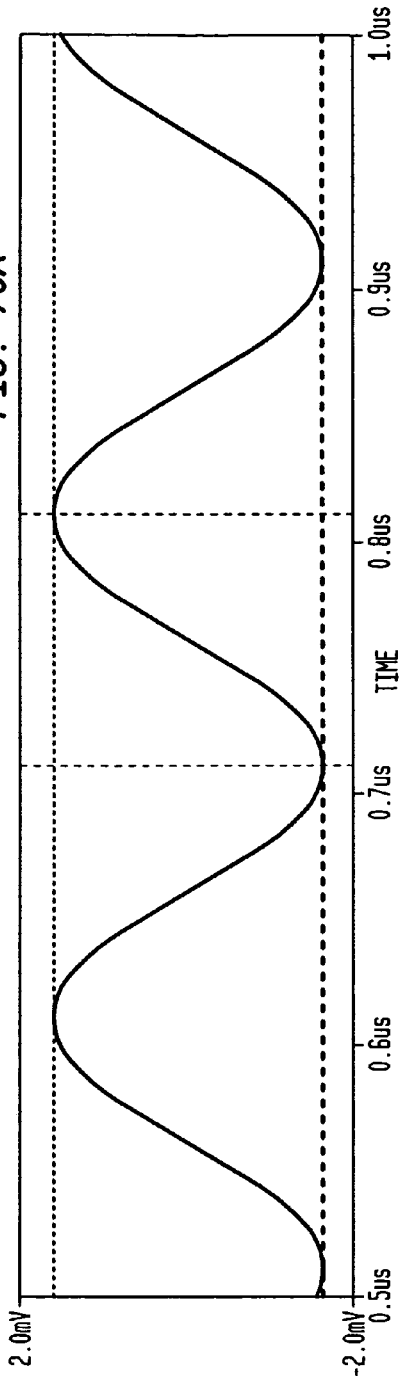
FIG. 70A is a timing diagram for the example embodiment of FIG. 67.
Figure 70B:
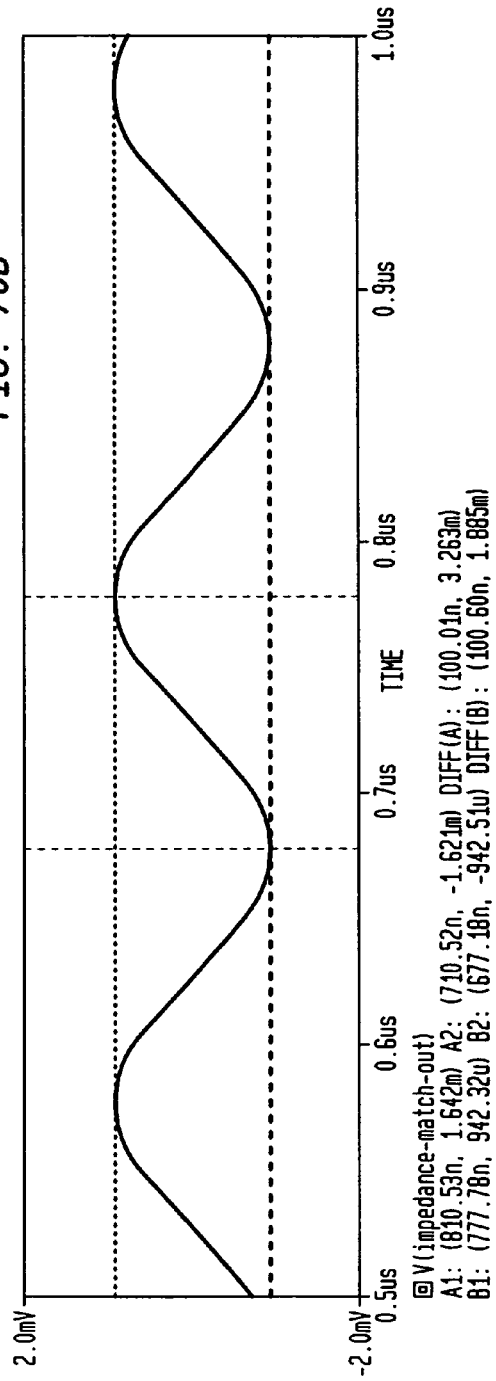
FIG. 70B is a timing diagram for the example embodiment of FIG. 68.

The following discussion will demonstrate the effects of a minimized aperture and the benefit provided by a bypassing network. Beginning with an initial circuit having a 550 ps aperture in FIG. 65, its output is seen to be 2.8 mVpp applied to a 50 ohm load in FIG. 69A. Changing the aperture to 270 ps as shown in FIG. 66 results in a diminished output of 2.5 Vpp applied to a 50 ohm load as shown in FIG. 69B. To compensate for this loss, a bypass network may be added, a specific implementation is provided in FIG. 67. The result of this addition is that 3.2 Vpp can now be applied to the 50 ohm load as shown in FIG. 70A. The circuit with the bypass network in FIG. 67 also had three values adjusted in the surrounding circuit to compensate for the impedance changes introduced by the bypass network and narrowed aperture. FIG. 68 verifies that those changes added to the circuit, but without the bypass network, did not themselves bring about the increased efficiency demonstrated by the embodiment in FIG. 67 with the bypass network. FIG. 70B shows the result of using the circuit in FIG. 68 in which only 1.88 Vpp was able to be applied to a 50 ohm load.

3.8 Modifying the Energy Transfer Signal Utilizing Feedback

FIG. 47 shows an embodiment of a system 4701 which uses down-converted Signal 4708B as feedback 4706 to control various characteristics of the energy transfer module 4704 to modify the down-converted signal 4708B.

Generally, the amplitude of the down-converted signal 4708B varies as a function of the frequency and phase differences between the EM signal 4504 and the energy transfer signal 4506. In an embodiment, the down-converted signal 4708B is used as the feedback 4706 to control the frequency and phase relationship between the EM signal 4504 and the energy transfer signal 4506. This can be accomplished using the example logic in FIG. 52A. The example, circuit in FIG. 52A can be included in the energy transfer signal module 4702. Alternate implementations will be apparent to persons skilled in the relevant art(s) based on the teachings contained herein. Alternate implementations fall within the scope and spirit of the present invention. In this embodiment a state-machine is used as an example.

Figure 52A:
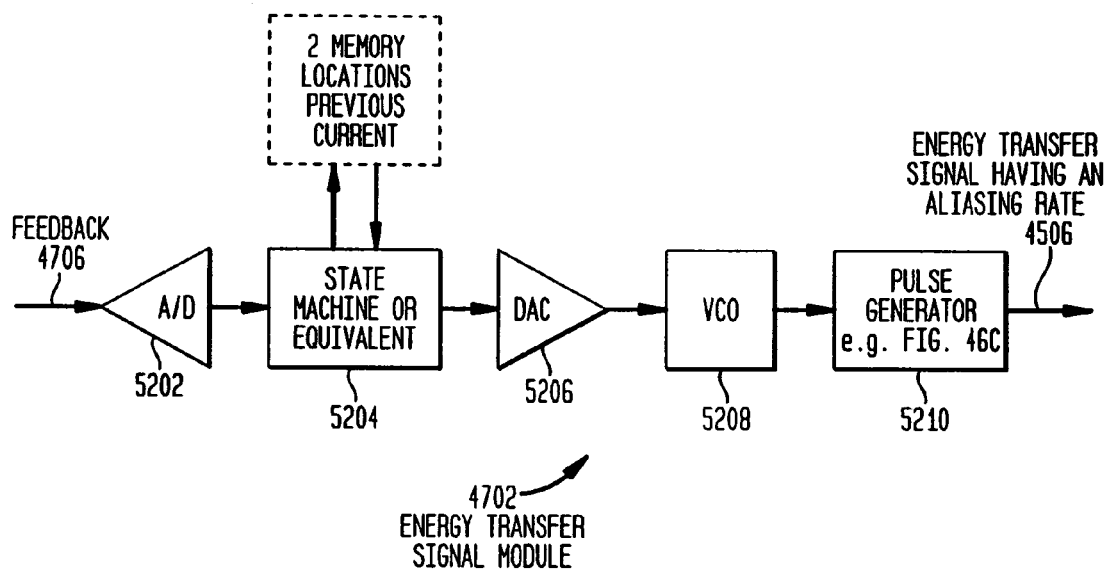
FIG. 52A illustrates an example energy transfer signal module according to an embodiment of the present invention.

In the example of FIG. 52A, a state Machine 5204 reads an analog to digital converter, A/D 5202, and controls a digital to analog converter, DAC 5206. In an embodiment, the state machine 5204 includes 2 memory locations, Previous and Current, to store and recall the results of reading A/D 5202. In an embodiment, the state machine 5204 utilizes at least one memory flag.

The DAC 5206 controls an input to a voltage controlled oscillator, VCO 5208. VCO 5208 controls a frequency input of a pulse generator 5210, which, in an embodiment, is substantially similar to the pulse generator shown in FIG. 46C. The pulse generator 5210 generates energy transfer signal 4506.

Figure 52B:
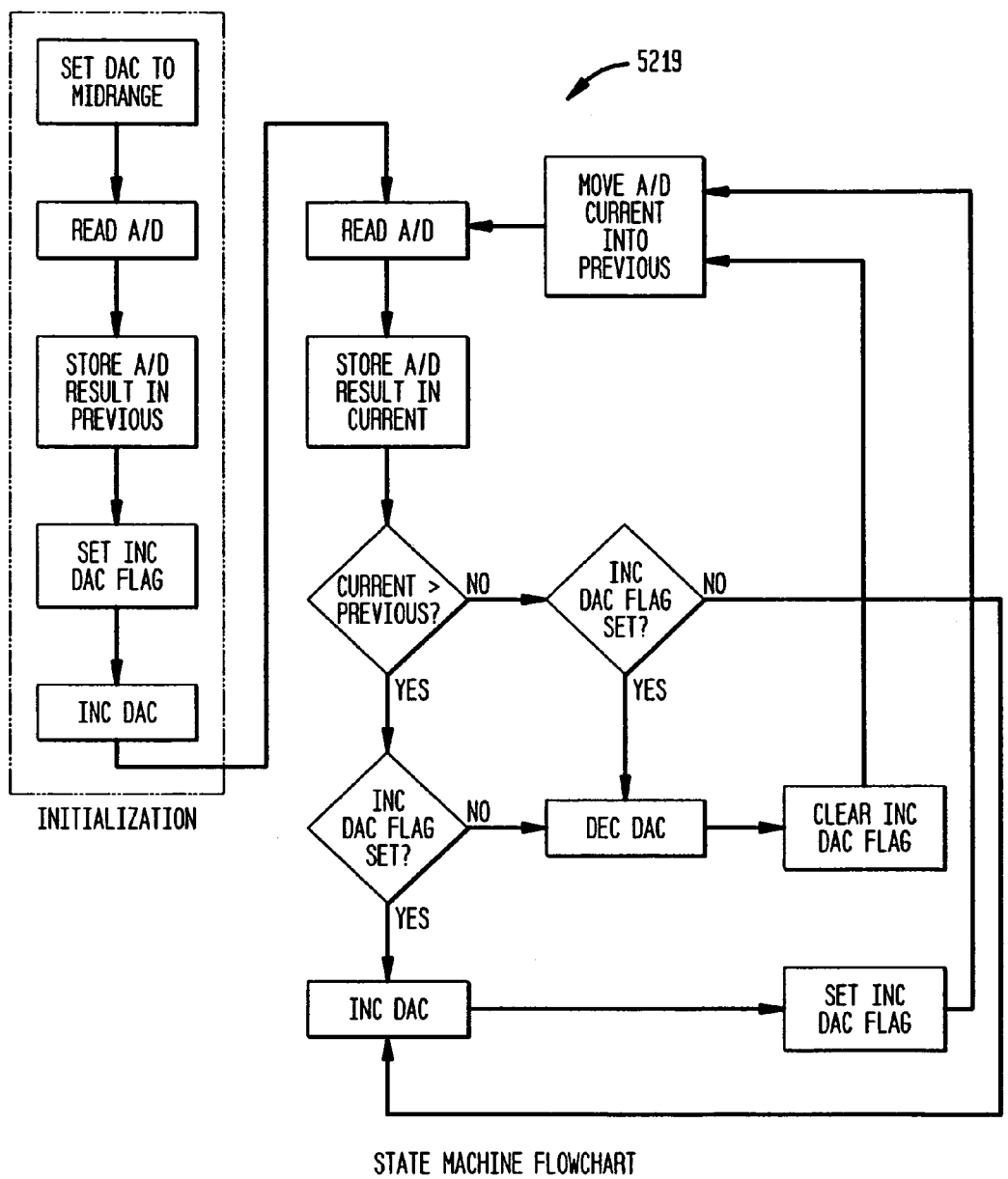
FIG. 52B illustrates a flowchart of state machine operation according to an embodiment of the present invention.

In an embodiment, the state machine 5204 operates in accordance with a state machine flowchart 5219 in FIG. 52B. The result of this operation is to modify the frequency and phase relationship between the energy transfer signal 4506 and the EM signal 4504, to substantially maintain the amplitude of the down-converted signal 4708B at an optimum level.

Figure 45A:
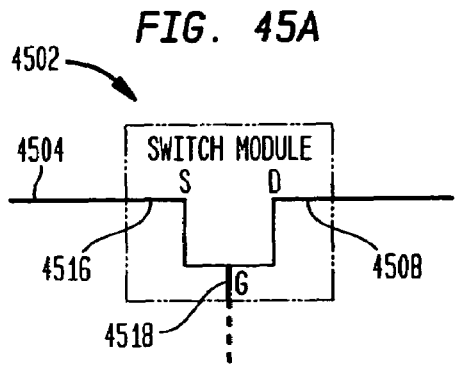
FIGS. 45A-D illustrate example implementations of a switch module according to embodiments of the invention.
Figure 45B:
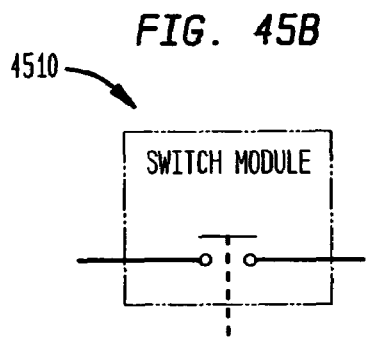
Figure 45C:
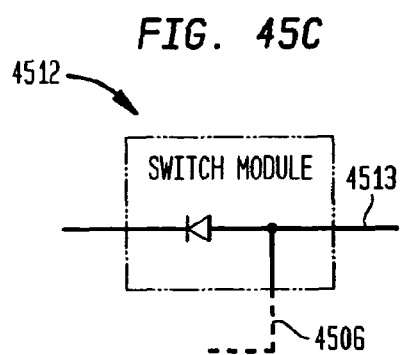
Figure 45D:
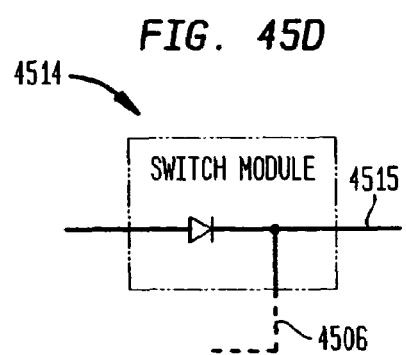
Figure 52C:
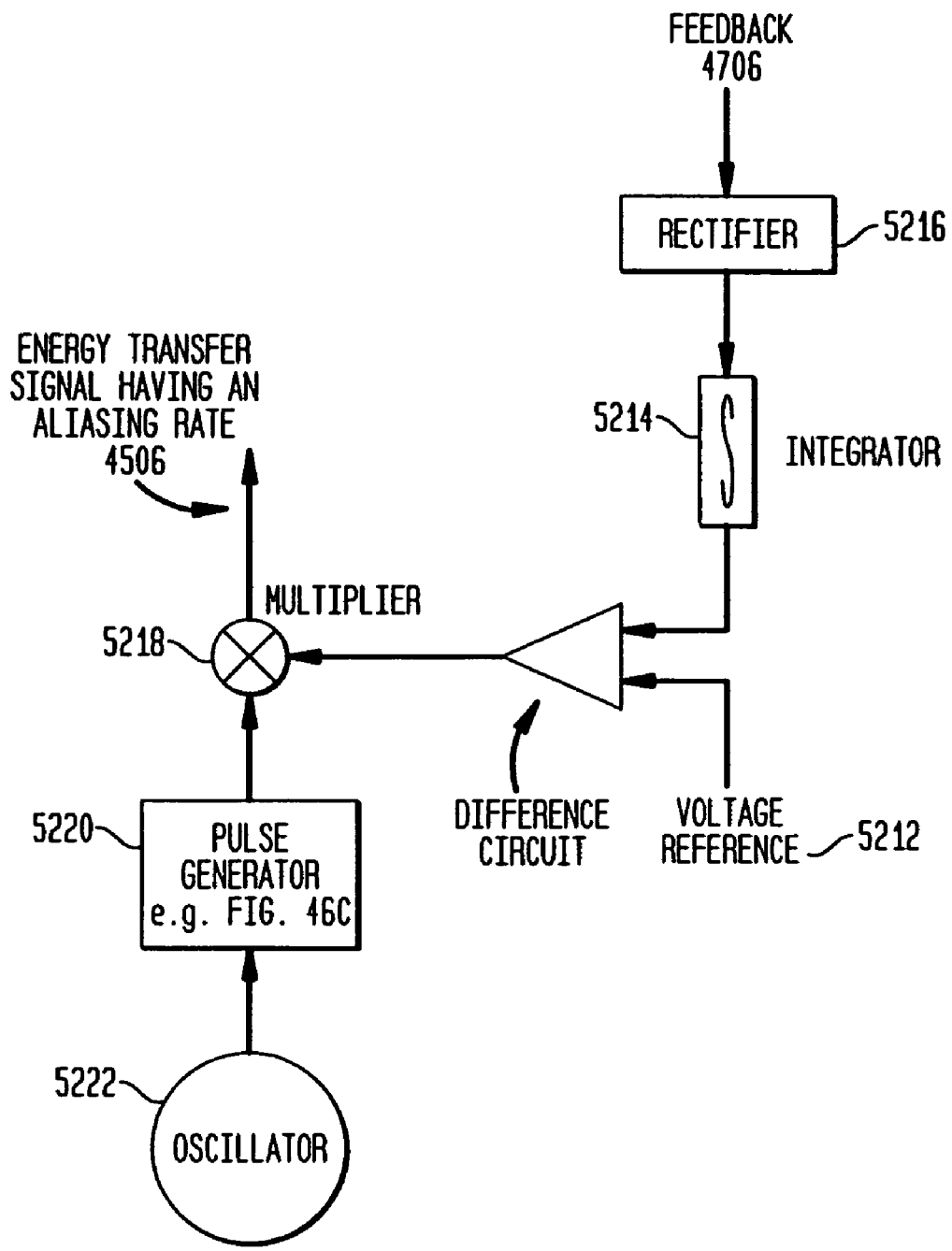
FIG. 52C is an example energy transfer signal module.

The amplitude of the down-converted signal 4708B can be made to vary with the amplitude of the energy transfer signal 4506. In an embodiment where the switch module 6502 is a FET as shown in FIG. 45A, wherein the gate 4518 receives the energy transfer signal 4506, the amplitude of the energy transfer signal 4506 can determine the "on" resistance of the FET, which affects the amplitude of the down-converted signal 4708B. The energy transfer signal module 4702, as shown in FIG. 52C, can be an analog circuit that enables an automatic gain control function. Alternate implementations will be apparent to persons skilled in the relevant art(s) based on the teachings contained herein. Alternate implementations fall within the scope and spirit of the present invention.

3.9 Other Implementations

The implementations described above are provided for purposes of illustration. These implementations are not intended to limit the invention. Alternate implementations, differing slightly or substantially from those described herein, will be apparent to persons skilled in the relevant art(s) based on the teachings contained herein. Such alternate implementations fall within the scope and spirit of the present invention.

3.10 Example Energy Transfer Down-Converters

Example implementations are described below for illustrative purposes. The invention is not limited to these examples.

Figure 53:
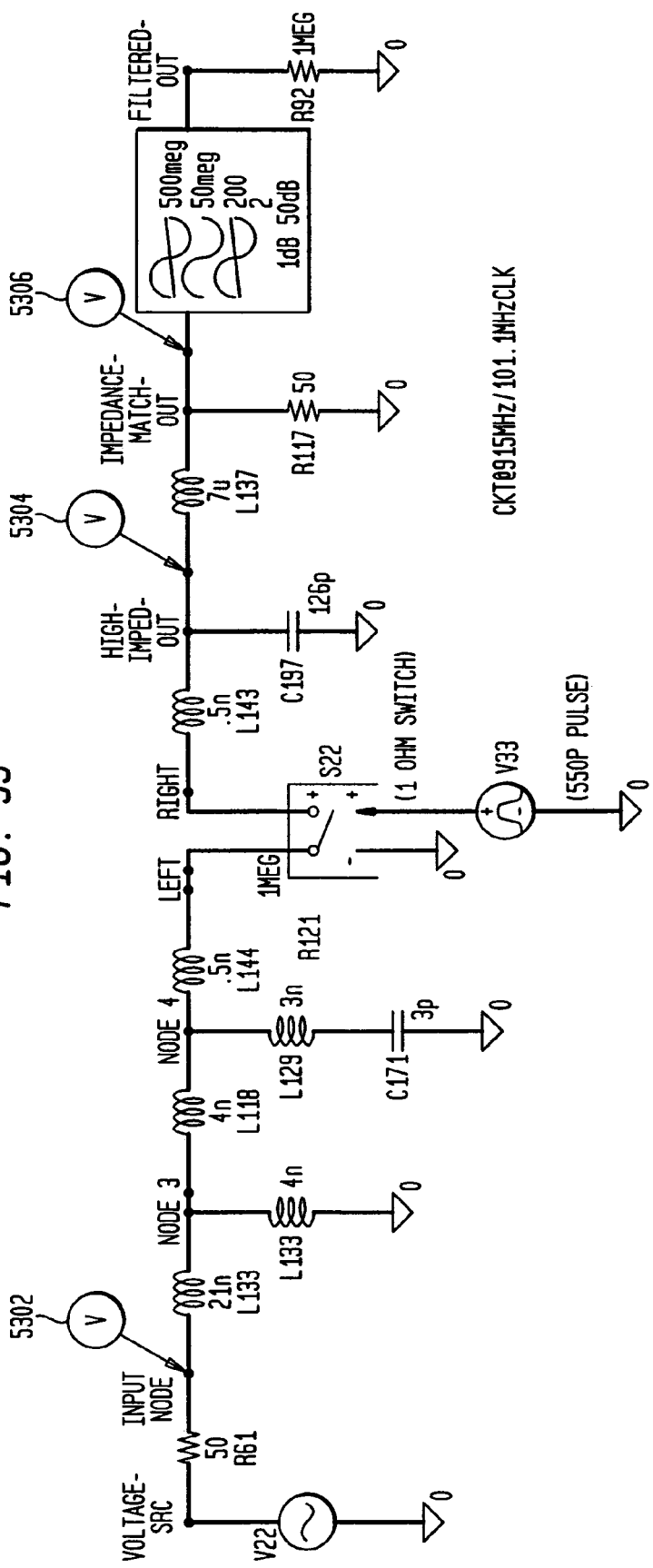
FIG. 53 is a schematic diagram of a circuit to down-convert a 915 MHZ signal to a 5 MHZ signal using a 101.1 MHZ clock according to an embodiment of the present invention.

FIG. 53 is a schematic diagram of an exemplary circuit to down-convert a 915 MHZ signal to a 5 MHZ signal using a 101.1 MHZ clock.

Figure 54:
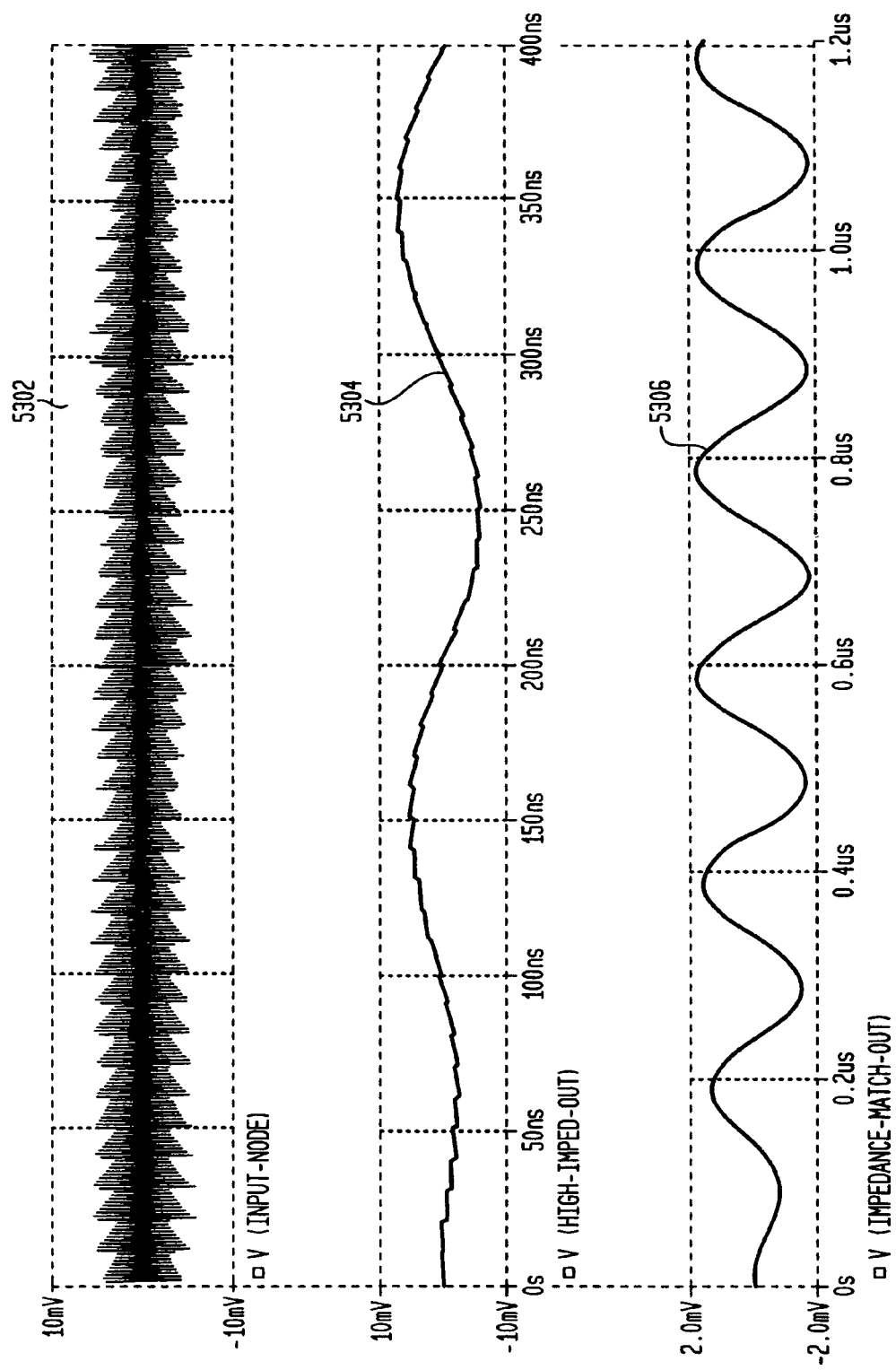
FIG. 54 shows example simulation waveforms for the circuit of FIG. 53 according to embodiments of the present invention.

FIG. 54 shows example simulation waveforms for the circuit of FIG. 53. Waveform 5302 is the input to the circuit showing the distortions caused by the switch closure. Waveform 5304 is the unfiltered output at the storage unit. Waveform 5306 is the impedance matched output of the down-converter on a different time scale.

FIG. 55 is a schematic diagram of an exemplary circuit to down-convert a 915 MHZ signal to a 5 MHZ signal using a 101.1 MHZ clock. The circuit has additional tank circuitry to improve conversion efficiency.

Figure 56:
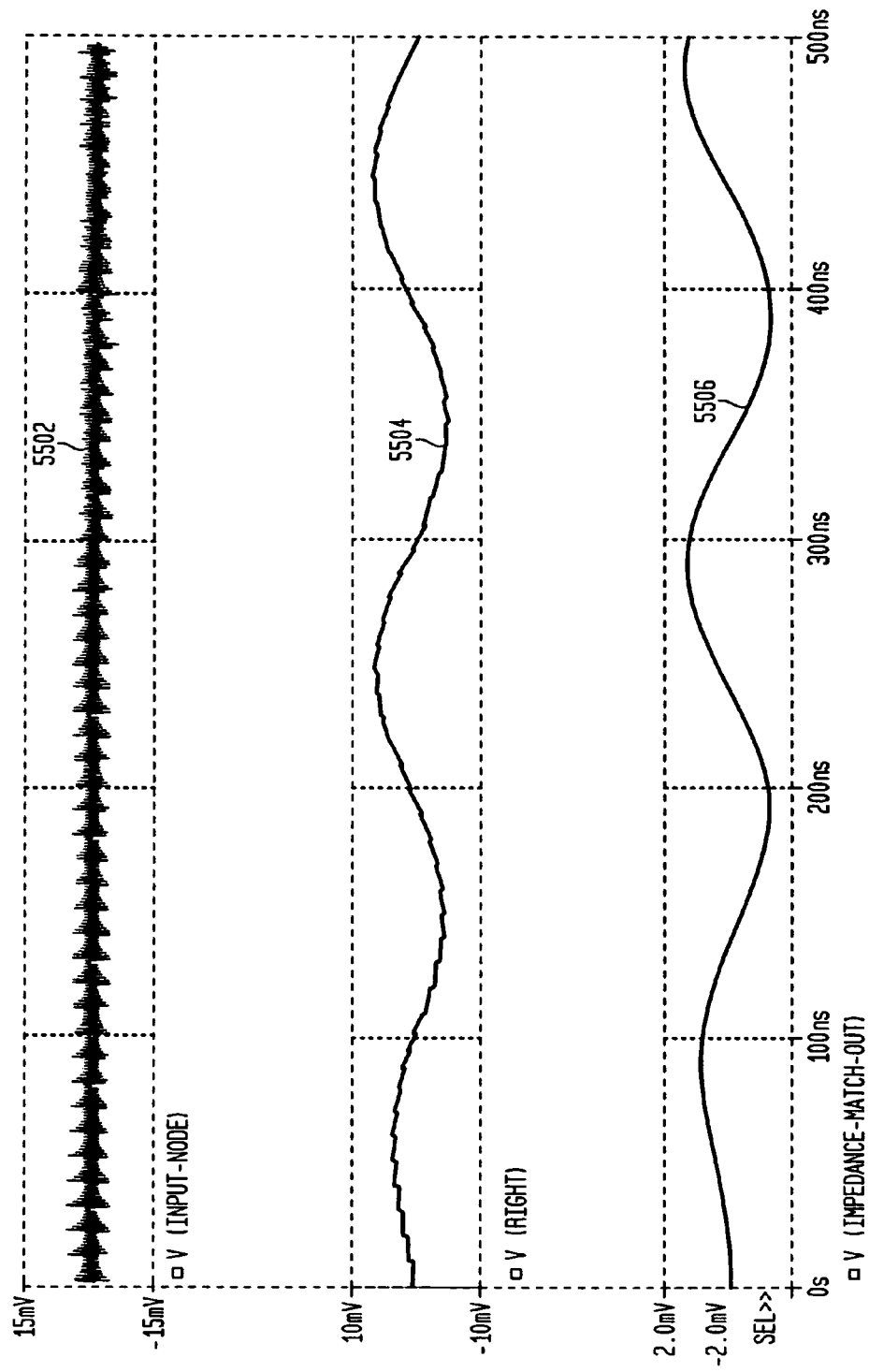
FIG. 56 shows example simulation waveforms for the circuit of FIG. 55 according to embodiments of the present invention.

FIG. 56 shows example simulation waveforms for the circuit of FIG. 55. Waveform 5502 is the input to the circuit showing the distortions caused by the switch closure. Waveform 5504 is the unfiltered output at the storage unit. Waveform 5506 is the output of the down-converter after the impedance match circuit.

FIG. 57 is a schematic diagram of an exemplary circuit to down-convert a 915 MHZ signal to a 5 MHZ signal using a 101.1 MHZ clock. The circuit has switch bypass circuitry to improve conversion efficiency.

Figure 58:
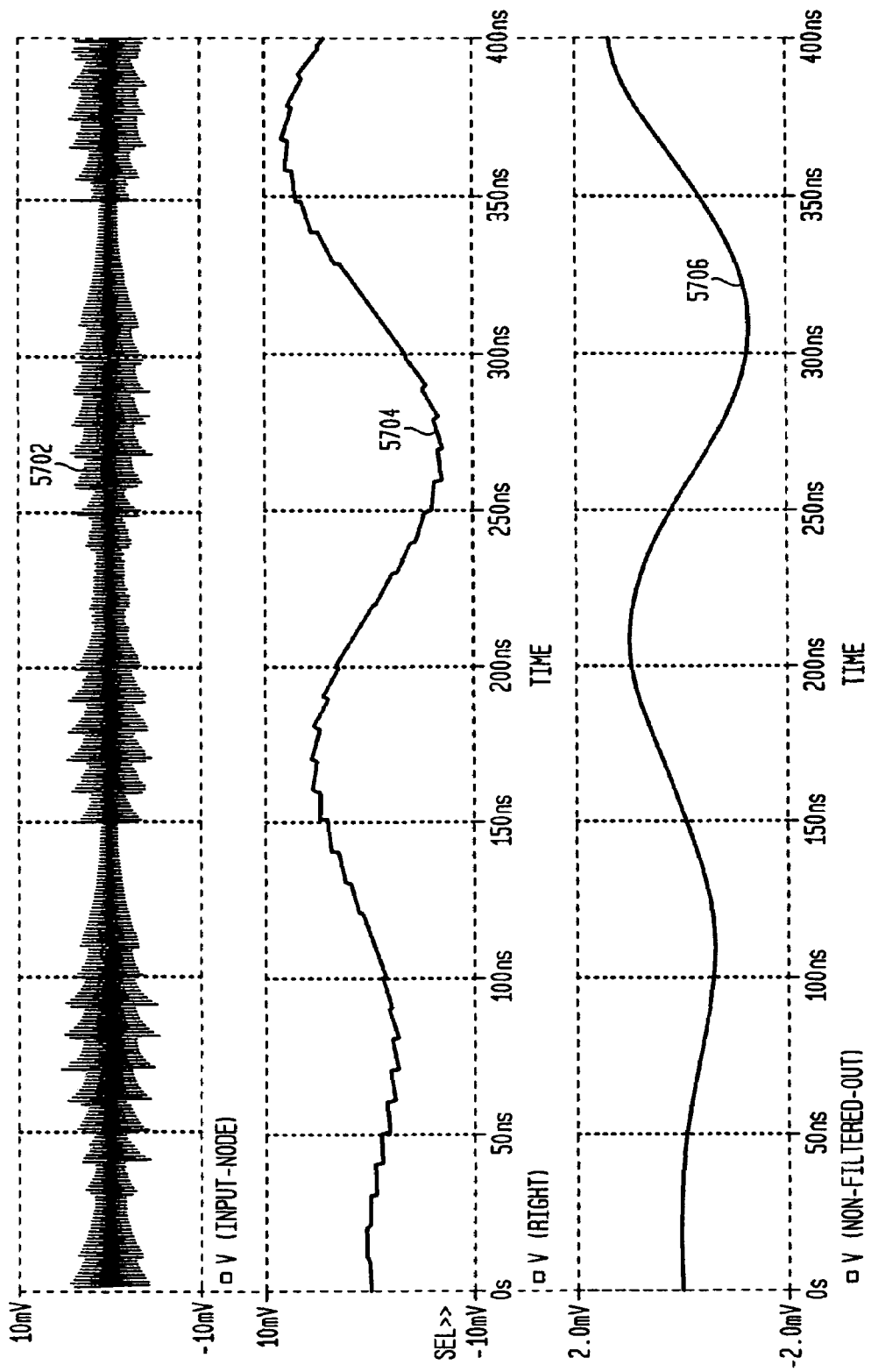
FIG. 58 shows example simulation waveforms for the circuit of FIG. 57 according to an embodiment of the present invention.

FIG. 58 shows example simulation waveforms for the circuit of FIG. 57. Waveform 5702 is the input to the circuit showing the distortions caused by the switch closure. Waveform 5704 is the unfiltered output at the storage unit. Waveform 5706 is the output of the down-converter after the impedance match circuit.

Figure 59:
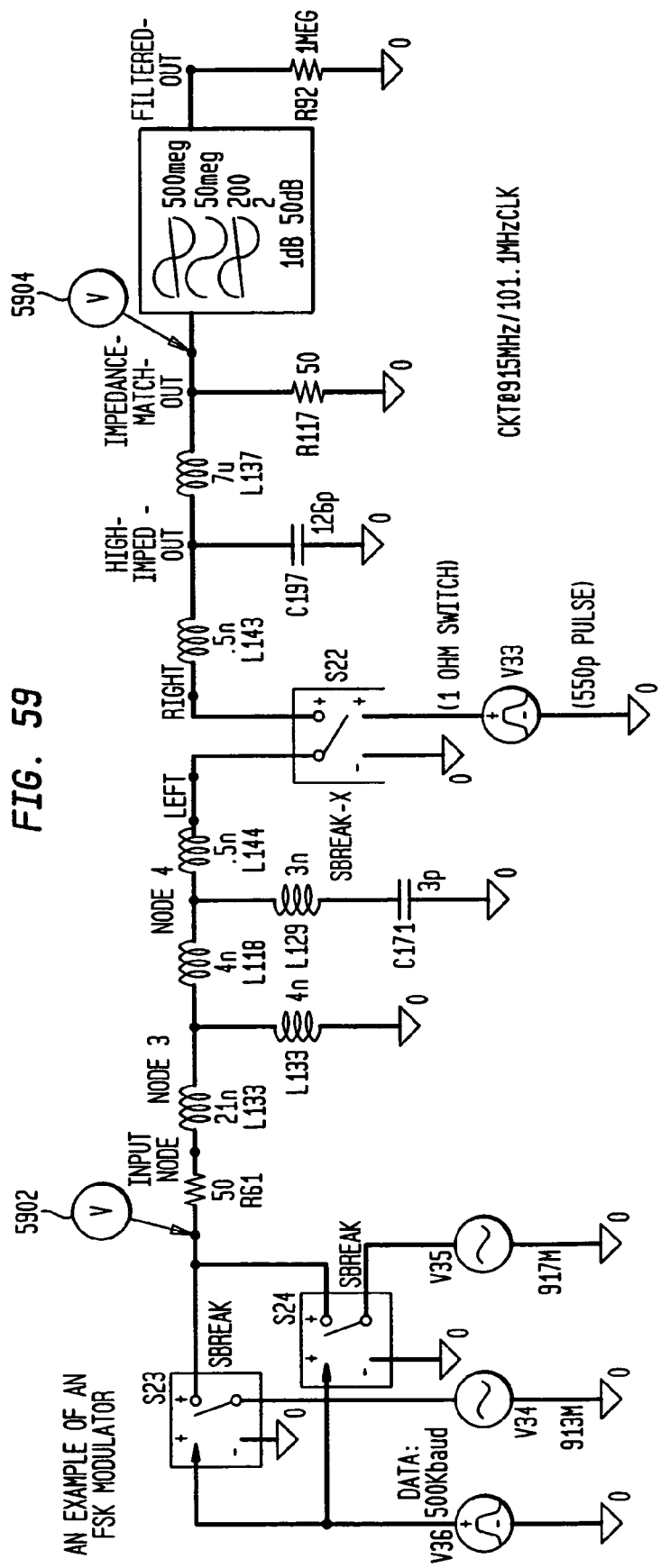
FIG. 59 shows a schematic of the circuit in FIG. 53 connected to an FSK source that alternates between 913 and 917 MHZ at a baud rate of 500 Kbaud according to an embodiment of the present invention.
Figure 72:
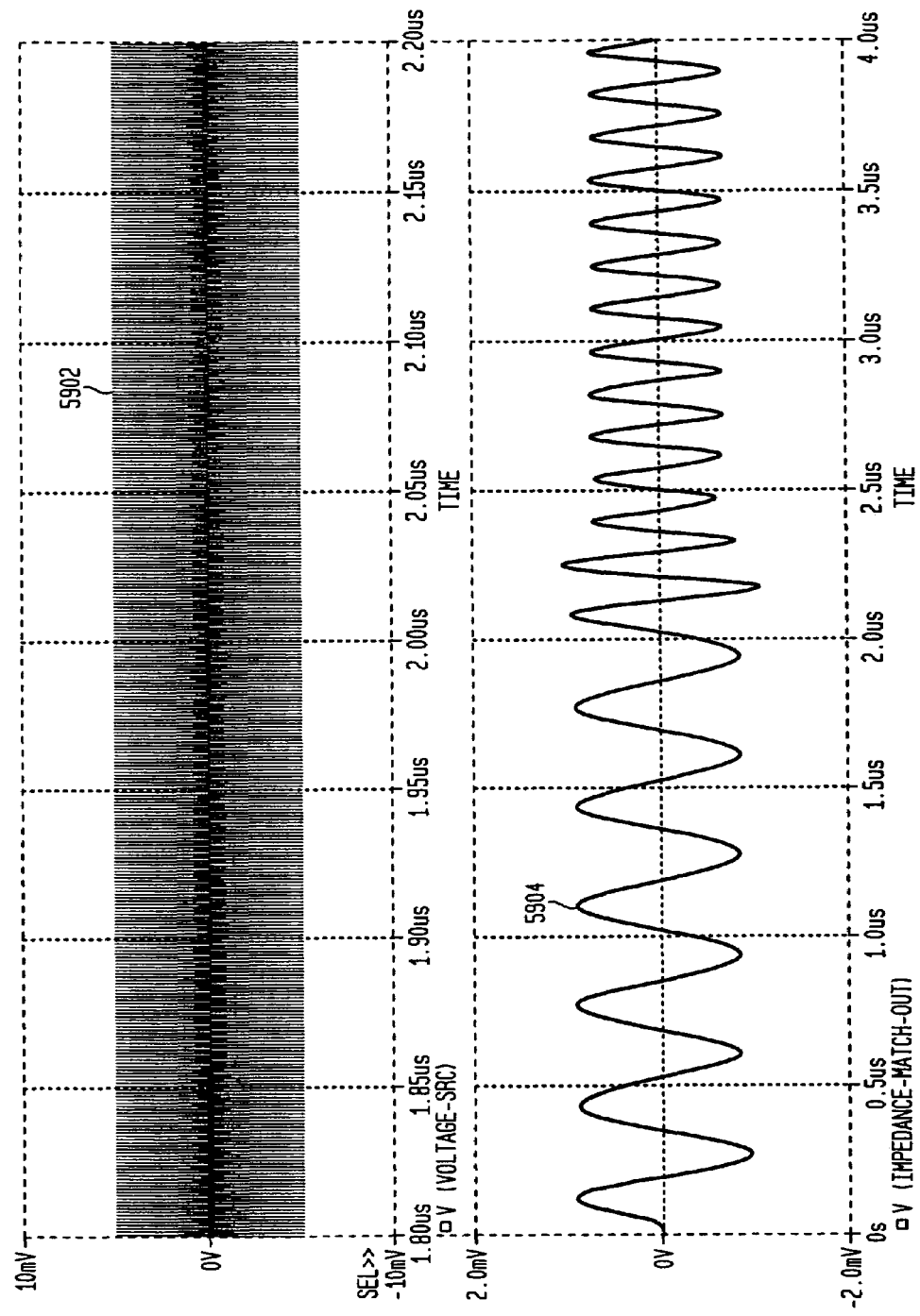
FIG. 72 shows the original FSK waveform 5902 and the down-converted waveform 5904.

FIG. 59 shows a schematic of the example circuit in FIG. 53 connected to an FSK source that alternates between 913 and 917 MHZ, at a baud rate of 500 Kbaud. FIG. 72 shows the original FSK waveform 5902 and the down-converted waveform 5904 at the output of the load impedance match circuit.

4. Frequency Up-conversion

The present invention is directed to systems and methods of frequency up-conversion, and applications of same.

An example frequency up-conversion system 300 is illustrated in FIG. 3. The frequency up-conversion system 300 is now described.

Figure 6A:
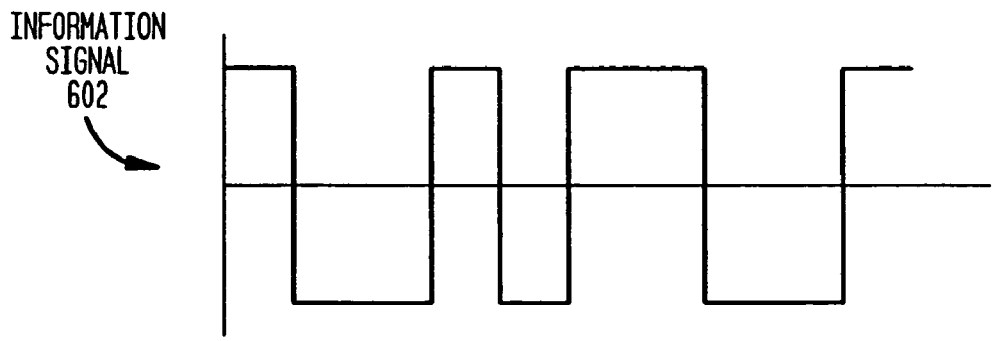
FIGS. 6A-6I illustrate example waveforms used to describe the operation of the UFU module.
Figure 6B:
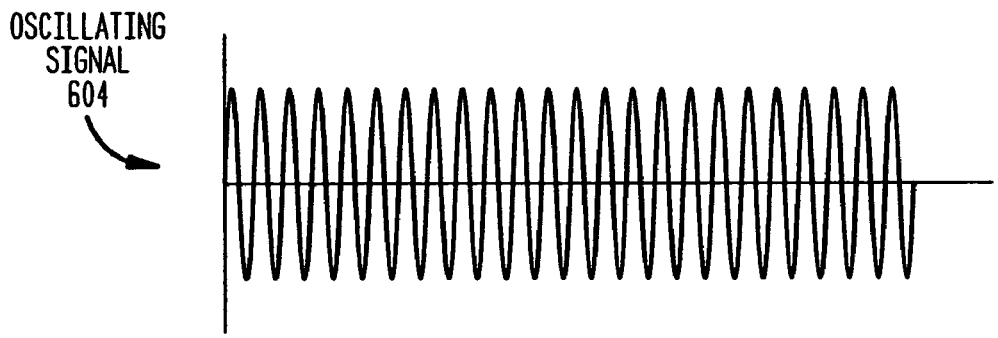
Figure 6C:
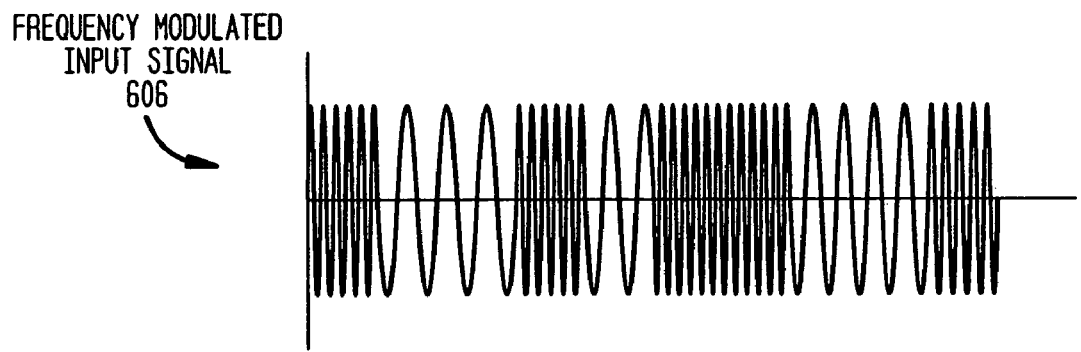

An input signal 302 (designated as "Control Signal" in FIG. 3) is accepted by a switch module 304. For purposes of example only, assume that the input signal 302 is a FM input signal 606, an example of which is shown in FIG. 6C. FM input signal 606 may have been generated by modulating information signal 602 onto oscillating signal 604 (FIGS. 6A and 6B). It should be understood that the invention is not limited to this embodiment. The information signal 602 can be analog, digital, or any combination thereof, and any modulation scheme can be used.

Figure 6D:
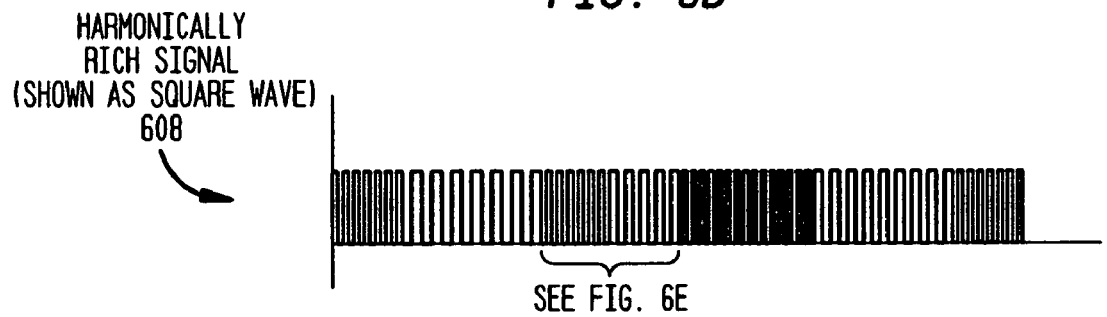

The output of switch module 304 is a harmonically rich signal 306, shown for example in FIG. 6D as a harmonically rich sign 1608. The harmonically rich signal 608 has a continuous and periodic waveform.

Figure 6E:
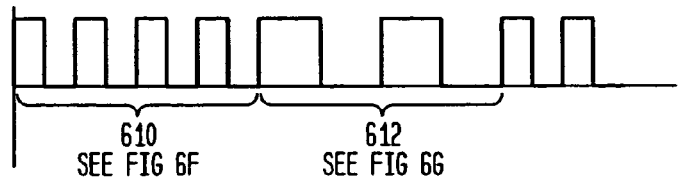

FIG. 6E is an expanded view of two sections of harmonically rich signal 608, section 610 and section 612. The harmonically rich signal 608 may be a rectangular wave, such as a square wave or a pulse (although, the invention is not limited to this embodiment). For ease of discussion, the term "rectangular waveform" is used to refer to waveforms that are substantially rectangular. In a similar manner, the term "square wave" refers to those waveforms that are substantially square and it is not the intent of the present invention that a perfect square wave be generated or needed.

Figure 6F:
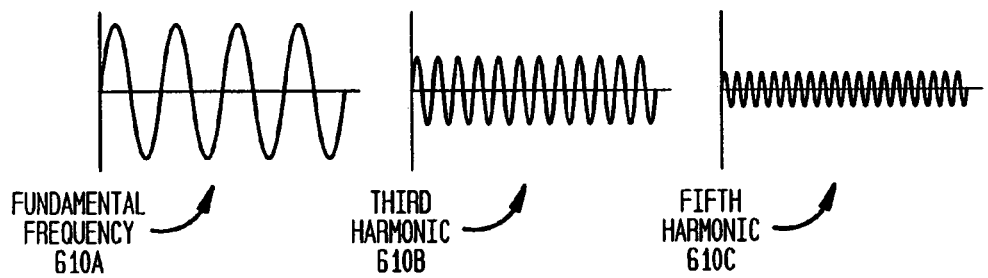
Figure 6G:
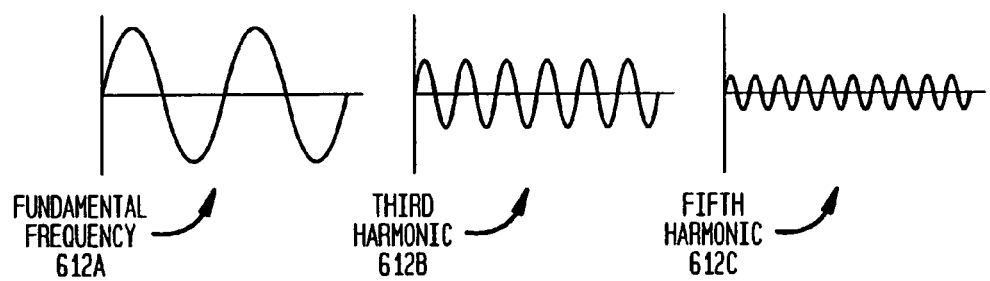
Figure 6H:
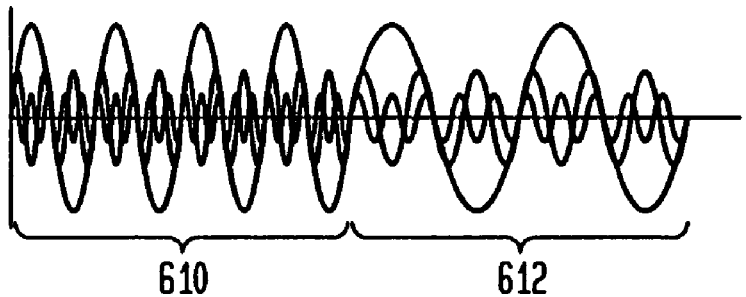

Harmonically rich signal 608 is comprised of a plurality of sinusoidal waves whose frequencies are integer multiples of the fundamental frequency of the waveform of the harmonically rich signal 608. These sinusoidal waves are referred to as the harmonics of the underlying waveform, and the fundamental frequency is referred to as the first harmonic. FIG. 6F and FIG. 6G show separately the sinusoidal components making up the first, third, and fifth harmonics of section 610 and section 612. (Note that in theory there may be an infinite number of harmonics; in this example, because harmonically rich signal 608 is shown as a square wave, there are only odd harmonics). Three harmonics are shown simultaneously (but not summed) in FIG. 6H.

The relative amplitudes of the harmonics are generally a function of the relative widths of the pulses of harmonically rich signal 306 and the period of the fundamental frequency, and can be determined by doing a Fourier analysis of harmonically rich signal 306. According to an embodiment of the invention, the input signal 606 may be shaped to ensure that the amplitude of the desired harmonic is sufficient for its intended use (e.g., transmission).

Figure 6I:
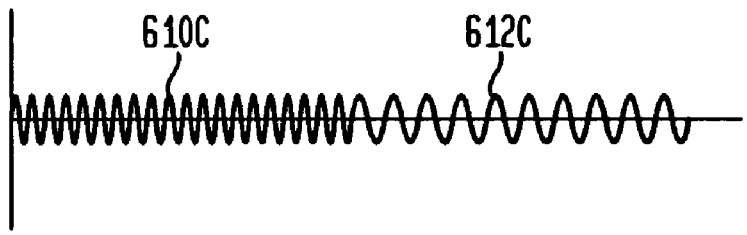

A filter 308 filters out any undesired frequencies (harmonics), and outputs an electromagnetic (EM) signal at the desired harmonic frequency or frequencies as an output signal 310, shown for example as a filtered output signal 614 in FIG. 6I.

Figure 4:
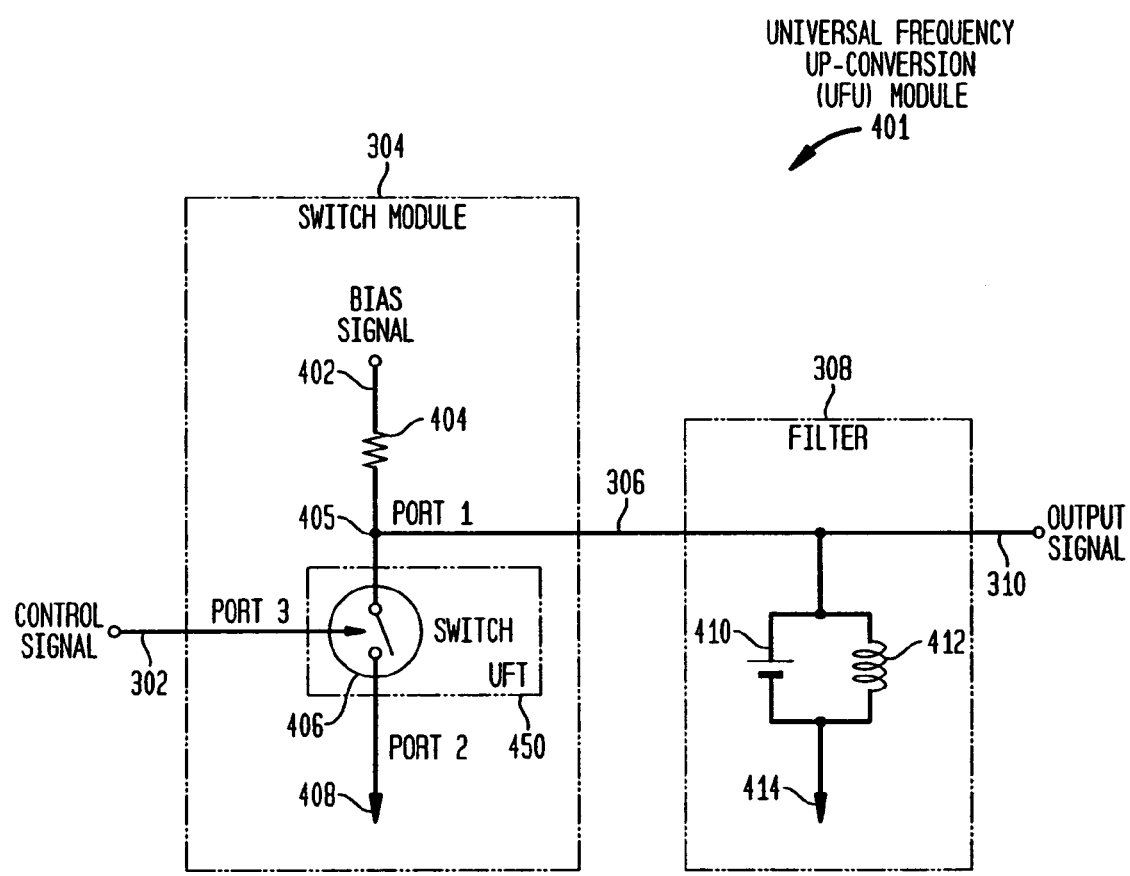
FIG. 4 is a more detailed diagram of a universal frequency up-conversion (UFU) module according to an embodiment of the invention.

FIG. 4 illustrates an example universal frequency up-conversion (UFU) module 401. The UFU module 401 includes an example switch module 304, which comprises a bias signal 402, a resistor or impedance 404, a universal frequency translator (UFT) 450, and a ground 408. The UFT 450 includes a switch 406. The input signal 302 (designated as "Control Signal" in FIG. 4) controls the switch 406 in the UFT 450, and causes it to close and open. Harmonically rich signal 306 is generated at a node 405 located between the resistor or impedance 404 and the switch 406.

Also in FIG. 4, it can be seen that an example filter 308 is comprised of a capacitor 410 and an inductor 412 shunted to a ground 414. The filter is designed to filter out the undesired harmonics of harmonically rich signal 306.

The invention is not limited to the UFU embodiment shown in FIG. 4.

Figure 5:
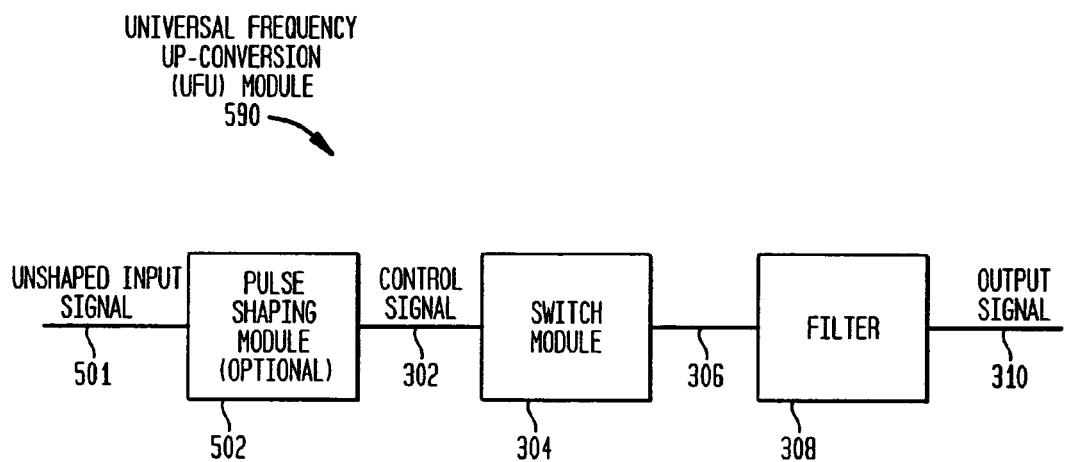
FIG. 5 is a block diagram of a universal frequency up-conversion (UFU) module according to an alternative embodiment of the invention.

For example, in an alternate embodiment shown in FIG. 5, an unshaped input signal 501 is routed to a pulse shaping module 502. The pulse shaping module 502 modifies the unshaped input signal 501 to generate a (modified) input signal 302 (designated as the "Control Signal" in FIG. 5). The input signal 302 is routed to the switch module 304, which operates in the manner described above. Also, the filter 308 of FIG. 5 operates in the manner described above.

The purpose of the pulse shaping module 502 is to define the pulse width of the input signal 302. Recall that the input signal 302 controls the opening and closing of the switch 406 in switch module 304. During such operation, the pulse width of the input signal 302 establishes the pulse width of the harmonically rich signal 306. As stated above, the relative amplitudes of the harmonics of the harmonically rich signal 306 are a function of at least the pulse width of the harmonically rich signal 306. As such, the pulse width of the input signal 302 contributes to setting the relative split of the harmonics of harmonically rich signal 306.

Further details of up-conversion as described in this section are presented in pending U.S. application "Method and System for Frequency Up-Conversion," Ser. No. 09/176,154, filed Oct. 21, 1998, incorporated herein by reference in its entirety.

5. Enhanced Signal Reception

The present invention is directed to systems and methods of enhanced signal reception (ESR), and applications of same.

Figure 21:
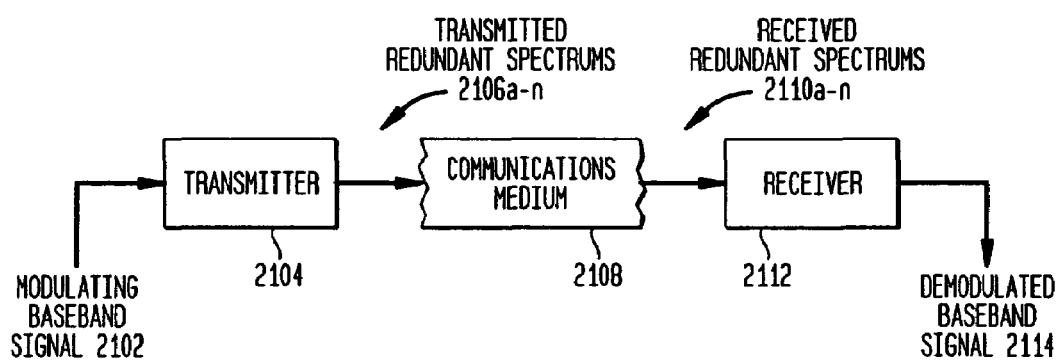
FIG. 21 illustrates an enhanced signal reception system according to an embodiment of the invention.

Referring to FIG. 21, transmitter 2104 accepts a modulating baseband signal 2102 and generates (transmitted) redundant spectrums 2106a-n, which are sent over communications medium 2108. Receiver 2112 recovers a demodulated baseband signal 2114 from (received) redundant spectrums 2110a-n. Demodulated baseband signal 2114 is representative of the modulating baseband signal 2102, where the level of similarity between the modulating baseband signal 2114 and the modulating baseband signal 2102 is application dependent.

Figure 22A:
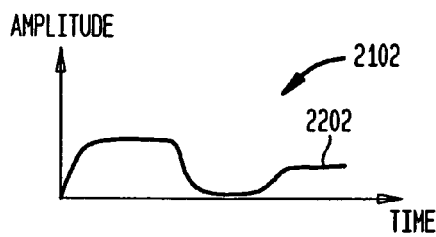
FIGS. 22A-22F are example waveforms used to describe the system of FIG. 21.
Figure 22B:
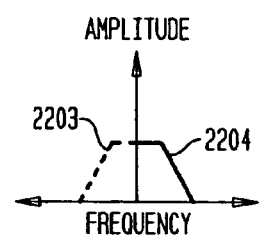

Modulating baseband signal 2102 is preferably any information signal desired for transmission and/or reception. An example modulating baseband signal 2202 is illustrated in FIG. 22A, and has an associated modulating baseband spectrum 2204 and image spectrum 2203 that are illustrated in FIG. 22B. Modulating baseband signal 2202 is illustrated as an analog signal in FIG. 22a, but could also be a digital signal, or combination thereof. Modulating baseband signal 2202 could be a voltage (or current) characterization of any number of real world occurrences, including for example and without limitation, the voltage (or current) representation for a voice signal.

Each transmitted redundant spectrum 2106a-n contains the necessary information to substantially reconstruct the modulating baseband signal 2102. In other words, each redundant spectrum 2106a-n contains the necessary amplitude, phase, and frequency information to reconstruct the modulating baseband signal 2102.

Figure 22C:
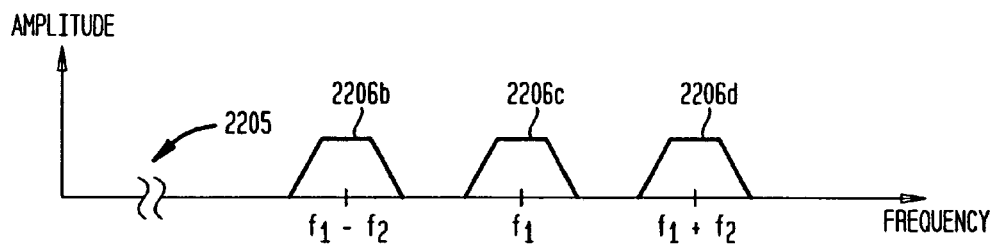

FIG. 22C illustrates example transmitted redundant spectrums 2206b-d. Transmitted redundant spectrums 2206b-d are illustrated to contain three redundant spectrums for illustration purposes only. Any number of redundant spectrums could be generated and transmitted as will be explained in following discussions.

Figure 22D:
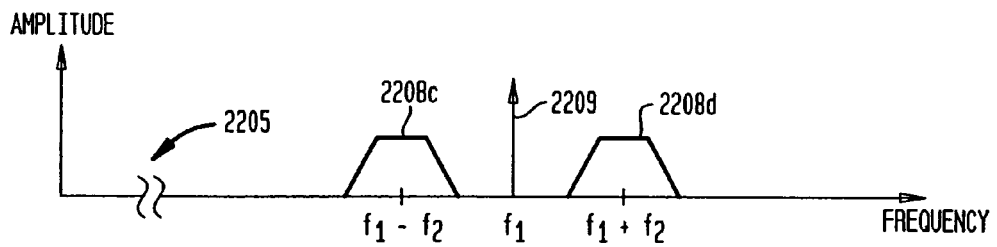

Transmitted redundant spectrums 2206b-d are centered at $f_1$, with a frequency spacing $f_2$ between adjacent spectrums. Frequencies $f_1$ and $f_2$ are dynamically adjustable in real-time as will be shown below. FIG. 22D illustrates an alternate embodiment, where redundant spectrums 2208c,d are centered on unmodulated oscillating signal 2209 at $f_1$ (Hz). Oscillating signal 2209 may be suppressed if desired using, for example, phasing techniques or filtering techniques. Transmitted redundant spectrums are preferably above baseband frequencies as is represented by break 2205 in the frequency axis of FIGS. 22C and 22D.

Figure 22E:
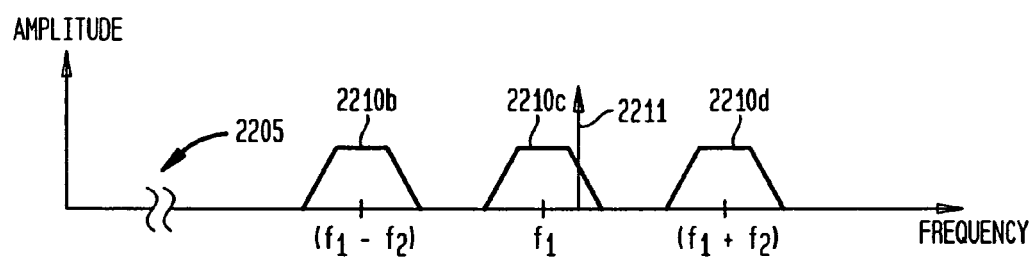

Received redundant spectrums 2110a-n are substantially similar to transmitted redundant spectrums 2106a-n, except for the changes introduced by the communications medium 2108. Such changes can include but are not limited to signal attenuation, and signal interference. FIG. 22E illustrates example received redundant spectrums 2210b-d. Received redundant spectrums 2210b-d are substantially similar to transmitted redundant spectrums 2206b-d, except that redundant spectrum 2210c includes an undesired jamming signal spectrum 2211 in order to illustrate some advantages of the present invention. Jamming signal spectrum 2211 is a frequency spectrum associated with a jamming signal. For purposes of this invention, a "jamming signal" refers to any unwanted signal, regardless of origin, that may interfere with the proper reception and reconstruction of an intended signal. Furthermore, the jamming signal is not limited to tones as depicted by spectrum 2211, and can have any spectral shape, as will be understood by those skilled in the art(s).

Figure 22F:
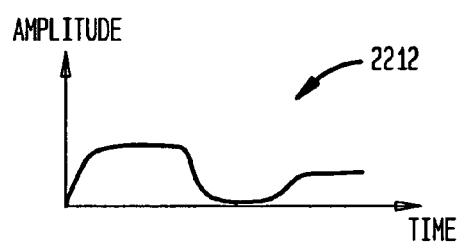

As stated above, demodulated baseband signal 2114 is extracted from one or more of received redundant spectrums 2210b-d. FIG. 22F illustrates example demodulated baseband sign 2212 that is, in this example, substantially similar to modulating baseband signal 2202 (FIG. 22A); where in practice, the degree of similarity is application dependent.

An advantage of the present invention should now be apparent. The recovery of modulating baseband signal 2202 can be accomplished by receiver 2112 in spite of the fact that high strength jamming signal(s) (e.g. jamming signal spectrum 2211) exist on the communications medium. The intended baseband signal can be recovered because multiple redundant spectrums are transmitted, where each redundant spectrum carries the necessary information to reconstruct the baseband signal. At the destination, the redundant spectrums are isolated from each other so that the baseband signal can be recovered even if one or more of the redundant spectrums are corrupted by a jamming signal.

Figure 23A:
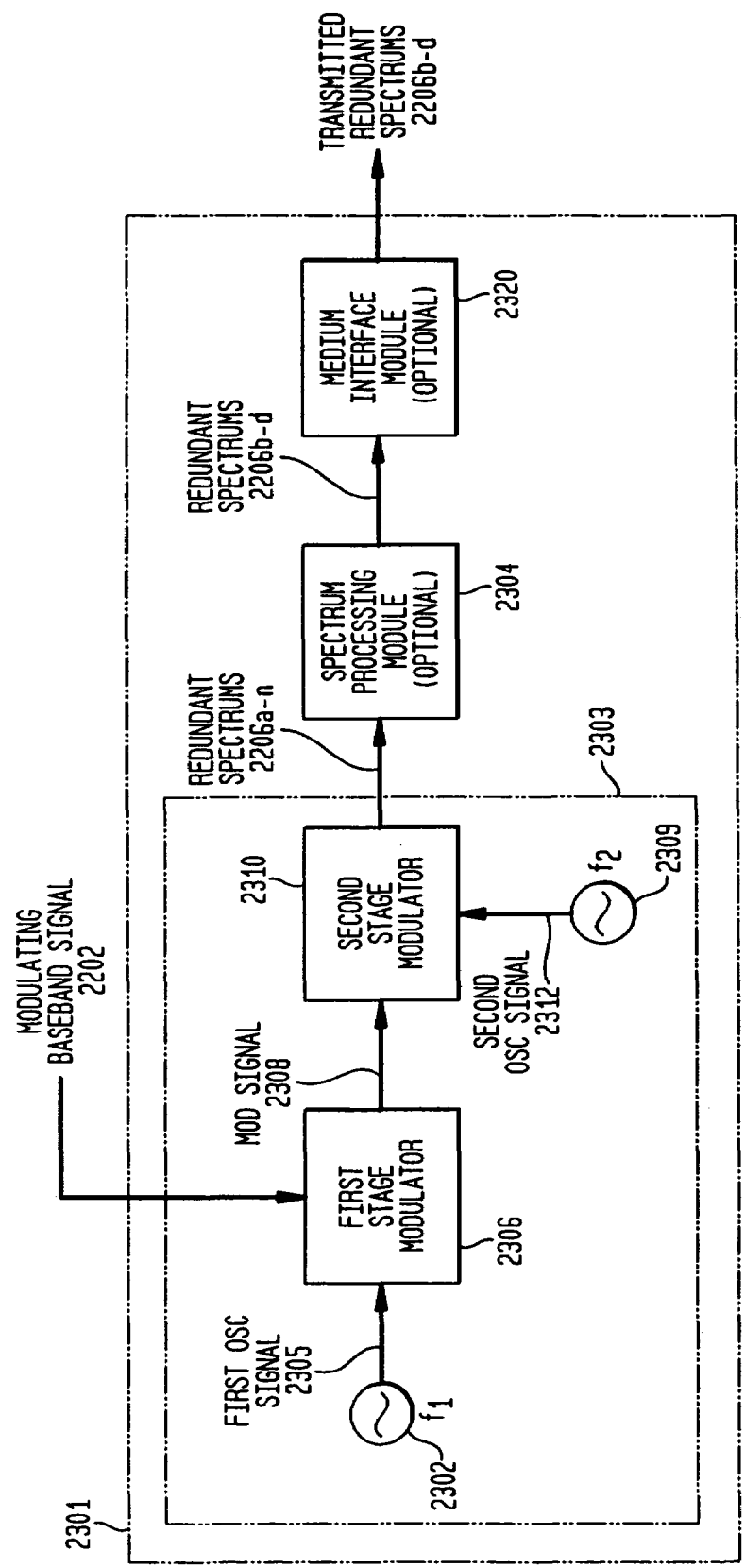
FIG. 23A illustrates an example transmitter in an enhanced signal reception system according to an embodiment of the invention.

Transmitter 2104 will now be explored in greater detail. FIG. 23A illustrates transmitter 2301, which is one embodiment of transmitter 2104 that generates redundant spectrums configured similar to redundant spectrums 2206b-c. Transmitter 2301 includes generator 2303, optional spectrum processing module 2304, and optional medium interface module 2320. Generator 2303 includes: first oscillator 2302, second oscillator 2309, first stage modulator 2306, and second stage modulator 2310.

Transmitter 2301 operates as follows. First oscillator 2302 and second oscillator 2309 generate a first oscillating signal 2305 and second oscillating signal 2312, respectively. First stage modulator 2306 modulates first oscillating signal 2305 with modulating baseband signal 2202, resulting in modulated signal 2308. First stage modulator 2306 may implement any type of modulation including but not limited to: amplitude modulation, modulation, phase modulation, combinations thereof, or any other type of modulation. Second stage modulator 2310 modulates modulated signal 2308 with second oscillating signal 2312, resulting in multiple redundant spectrums 2206a-n shown in FIG. 23B. Second stage modulator 2310 is preferably a phase modulator, or a frequency modulator, although other types of modulation may be implemented including but not limited to amplitude modulation. Each redundant spectrum 2206a-n contains the necessary amplitude, phase, and frequency information to substantially reconstruct the modulating baseband signal 2202.

Redundant spectrums 2206a-n are substantially centered around $f_1$, which is the characteristic frequency of first oscillating signal 2305. Also, each redundant spectrum 2206a-n (except for 2206c) is offset from $f_1$ by approximately a multiple of $f_2$ (Hz), where $f_2$ is the frequency of the second oscillating signal 2312. Thus, each redundant spectrum 2206a-n is offset from an adjacent redundant spectrum by $f_2$ (Hz). This allows the spacing between adjacent redundant spectrums to be adjusted (or tuned) by changing $f_2$ that is associated with second oscillator 2309. Adjusting the spacing between adjacent redundant spectrums allows for dynamic real-time tuning of the bandwidth occupied by redundant spectrums 2206a-n.

In one embodiment, the number of redundant spectrums 2206a-n generated by transmitter 2301 is arbitrary and may be unlimited as indicated by the "a-n" designation for redundant spectrums 2206a-n. However, a typical communications medium will have a physical and/or administrative limitations (i.e. FCC regulations) that restrict the number of redundant spectrums that can be practically transmitted over the communications medium. Also, there may be other reasons to limit the number of redundant spectrums transmitted. Therefore, preferably, the transmitter 2301 will include an optional spectrum processing module 2304 to process the redundant spectrums 2206a-n prior to transmission over communications medium 2108.

In one embodiment, spectrum processing module 2304 includes a filter with a passband 2207 (FIG. 23C) to select redundant spectrums 2206b-d for transmission. This will substantially limit the frequency bandwidth occupied by the redundant spectrums to the passband 2207. In one embodiment, spectrum processing module 2304 also up converts redundant spectrums and/or amplifies redundant spectrums prior to transmission over the communications medium 2108. Finally, medium interface module 2320 transmits redundant spectrums over the communications medium 2108. In one embodiment, communications medium 2108 is an over-the-air link and medium interface module 2320 is an antenna. Other embodiments for communications medium 2108 and medium interface module 2320 will be understood based on the teachings contained herein.

Figure 23D:
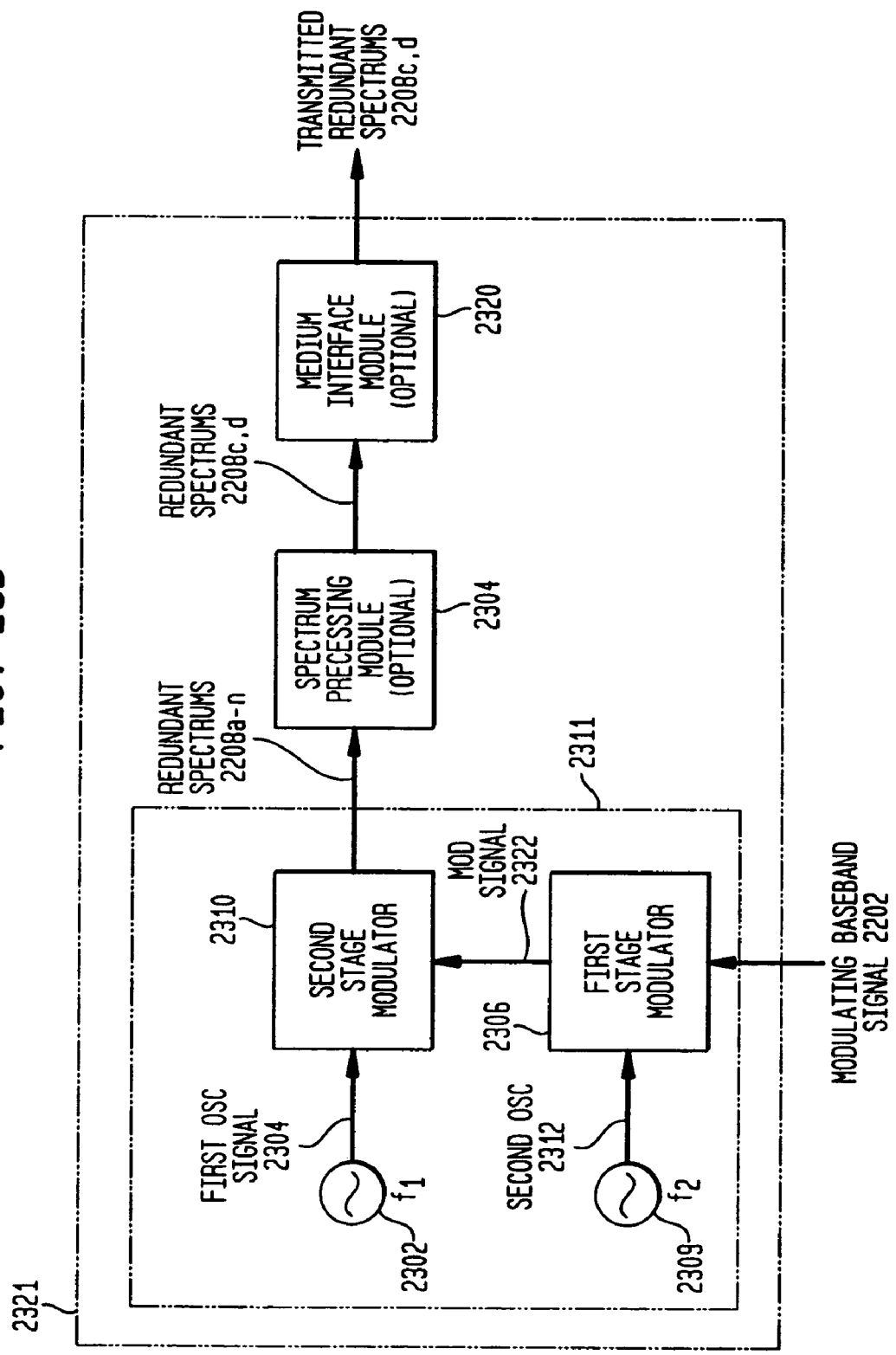
FIG. 23D illustrates another example transmitter in an enhanced signal reception system according to an embodiment of the invention.

FIG. 23D illustrates transmitter 2321, which is one embodiment of transmitter 2104 that generates redundant spectrums configured similar to redundant spectrums 2208c-d and unmodulated spectrum 2209. Transmitter 2321 includes generator 2311, spectrum processing module 2304, and (optional) medium interface module 2320. Generator 2311 includes: first oscillator 2302, second oscillator 2309, first stage modulator 2306, and second stage modulator 2310.

Figure 23E:
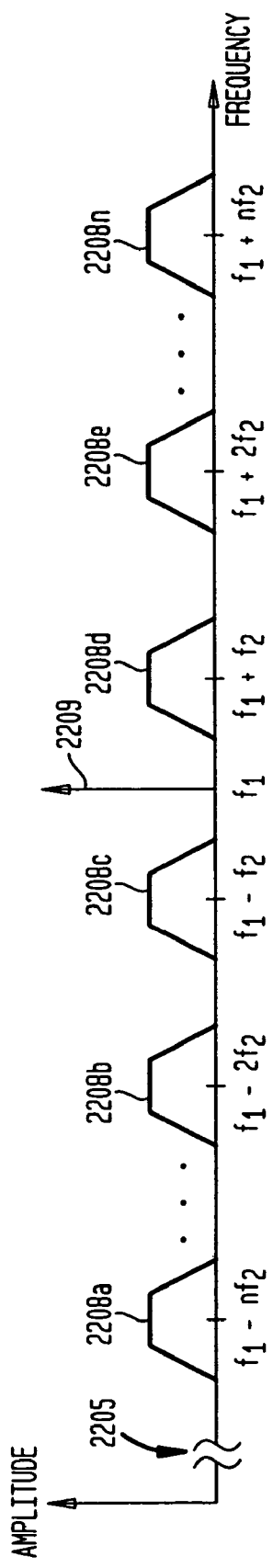
FIGS. 23E and 23F are example waveforms used to further describe the enhanced signal reception system according to an embodiment of the invention.
Figure 23F:
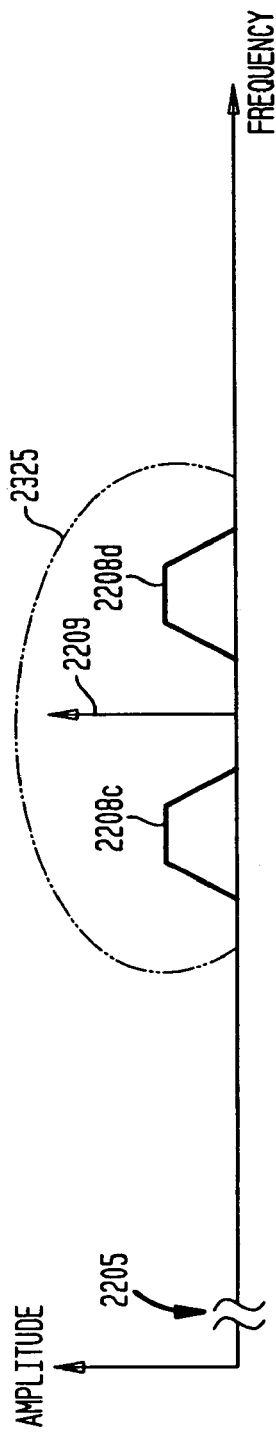

As shown in FIG. 23D, many of the components in transmitter 2321 are similar to those in transmitter 2301. However, in this embodiment, modulating baseband signal 2202 modulates second oscillating signal 2312. Transmitter 2321 operates as follows. First stage modulator 2306 modulates second oscillating signal 2312 with modulating baseband signal 2202, resulting in modulated signal 2322. As described earlier, first stage modulator 2306 can effect any type of modulation including but not limited to amplitude modulation frequency modulation, combinations thereof, or any other type of modulation second stage modulator 2310 modulates first oscillating signal 2304 with modulated signal 2322, resulting in redundant spectrums 2208a-n, as shown in FIG. 23E. Second stage modulator 2310 is preferably a phase or frequency modulator, although other modulators could used including but not limited to an amplitude modulator.

Redundant spectrums 2208a-n are centered on unmodulated spectrum 2209 (at $f_1$ Hz), and adjacent spectrums are separated by $f_2$ Hz. The number of redundant spectrums 2208a-n generated by generator 2311 is arbitrary and unlimited, similar to spectrums 2206a-n discussed above. Therefore, optional spectrum processing module 2304 may also include a filter with passband 2325 to select, for example, spectrums 2208c,d for transmission over communications medium 2108. In addition, optional spectrum processing module 2304 may also include a filter (such as a bands top filter) to attenuate unmodulated spectrum 2209. Alternatively, unmodulated spectrum 2209 may be attenuated by using phasing techniques during redundant spectrum generation. Finally, (optional) medium interface module 2320 transmits redundant spectrums 2208c,d over communications medium 2108.

Figure 24A:
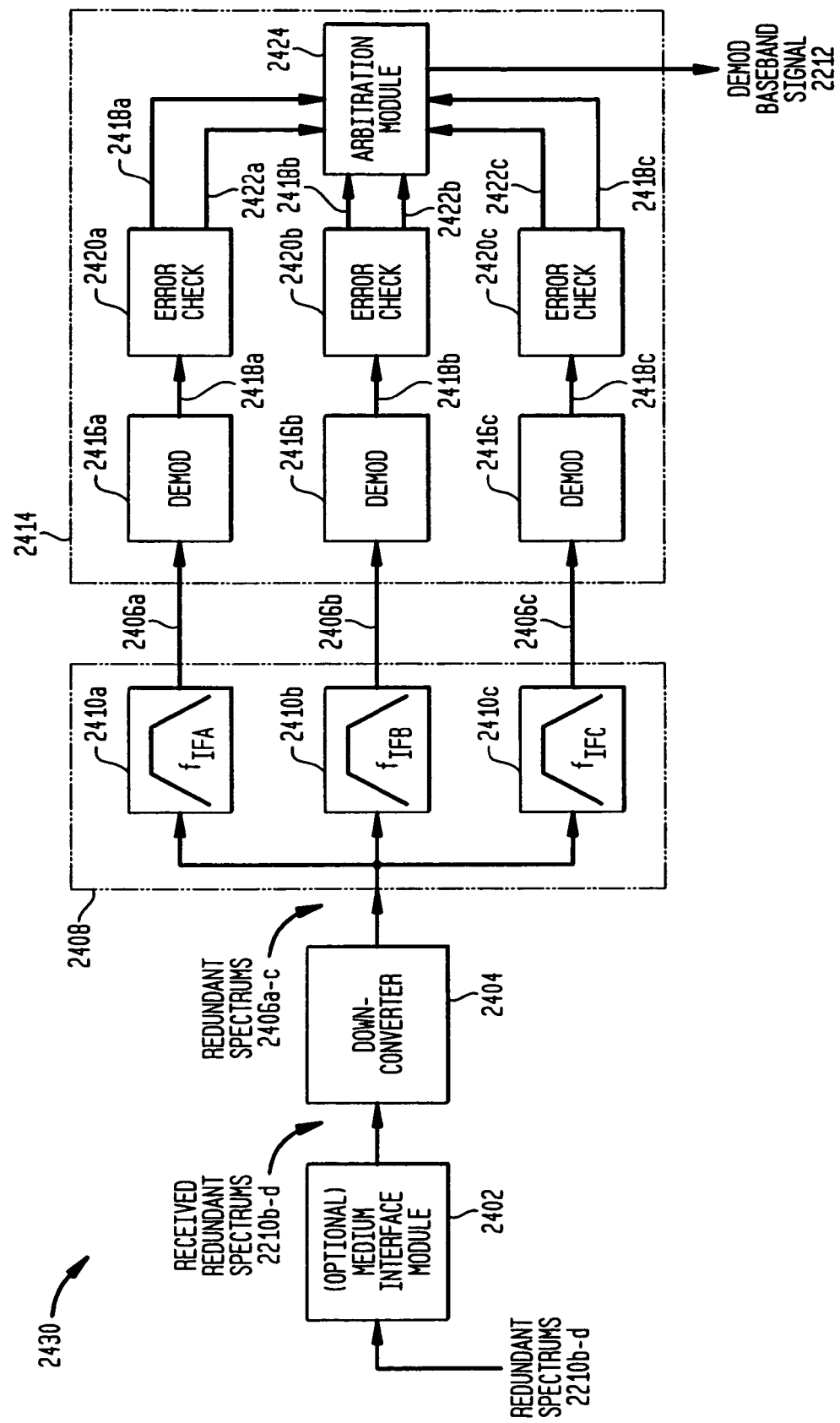
FIG. 24A illustrates an example receiver in an enhanced signal reception system according to an embodiment of the invention.

Receiver 2112 will now be explored in greater detail to illustrate recovery of a demodulated baseband signal from received redundant spectrums. FIG. 24A illustrates receiver 2430, which is one embodiment of receiver 2112. Receiver 2430 includes optional medium interface module 2402, down-converter 2404, spectrum isolation module 2408, and data extraction module 2414. Spectrum isolation module 2408 includes filters 2410a-c. Data extraction module 2414 includes demodulators 2416a-c, error check modules 2420a-c, and arbitration module 2424. Receiver 2430 will be discussed in relation to the signal diagrams in FIGS. 24B-24J.

Figure 24B:
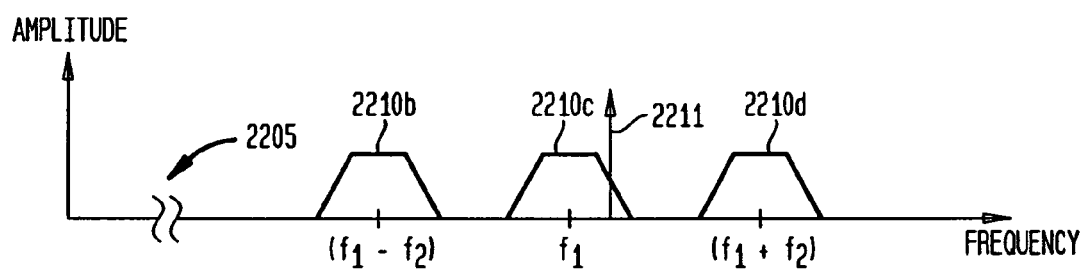
FIGS. 24B-24J are example waveforms used to further describe the enhanced signal reception system according to an embodiment of the invention.
Figure 24C:
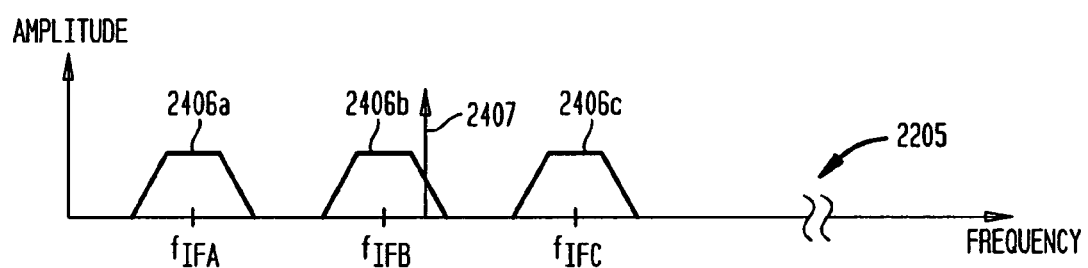
Figure 24D:
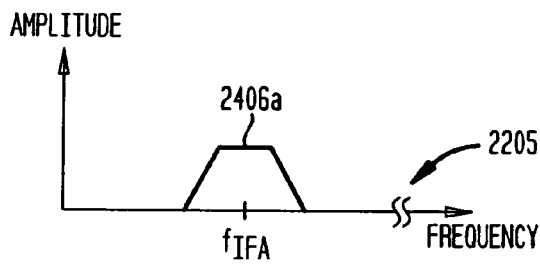
Figure 24G:
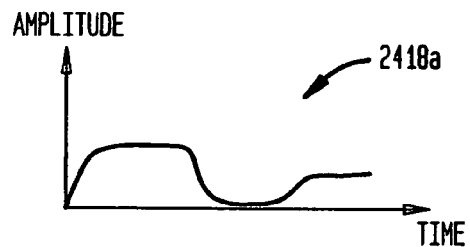
Figure 24E:
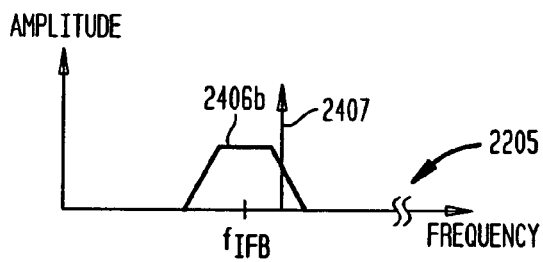
Figure 24H:
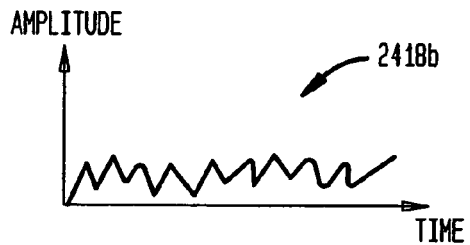
Figure 24F:
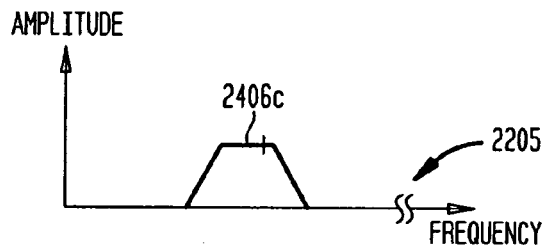
Figure 24I:
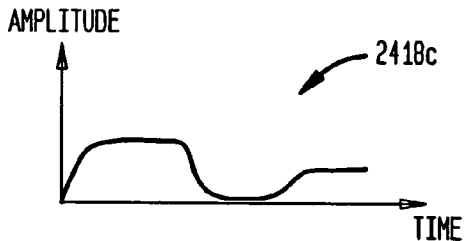
Figure 24J:
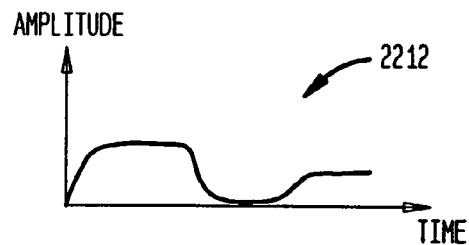

In one embodiment, optional medium interface module 2402 receives redundant spectrums 2210b-d (FIG. 22E, and FIG. 24B). Each redundant spectrum 2210b-d includes the necessary amplitude, phase, and frequency information to substantially reconstruct the modulating baseband signal used to generated the redundant spectrums. However, in the present example, spectrum 2210c also contains jamming signal 2211, which may interfere with the recovery of a baseband signal from spectrum 2210c. Down-converter 2404 down-converts received redundant spectrums 2210b-d to lower intermediate frequencies, resulting in redundant spectrums 2406a-c (FIG. 24C). Jamming signal 2211 is also down-converted to jamming signal 2407, as it is contained within redundant spectrum 2406b. Spectrum isolation module 2408 includes filters 2410a-c that isolate redundant spectrums 2406a-c from each other (FIGS. 24D-24F, respectively). Demodulators 2416a-c independently demodulate spectrums 2406a-c, resulting in demodulated baseband signals 2418a-c, respectively (FIGS. 24G-24I). Error check modules 2420a-c analyze demodulate baseband signal 2418a-c to detect any errors. In one embodiment, each error check module 2420a-c sets an error flag 2422a-c whenever an error is detected in a demodulated baseband signal. Arbitration module 2424 accepts the demodulated baseband signals and associated error flags, and selects a substantially error-free demodulated baseband signal (FIG. 24J). In one embodiment, the substantially error-free demodulated baseband signal will be substantially similar to the modulating baseband signal used to generate the received redundant spectrums, where the degree of similarity is application dependent.

Referring to FIGS. 24G-I, arbitration module 2424 will select either demodulated baseband signal 2418a or 2418c, because error check module 2420b will set the error flag 2422b that is associated with demodulated baseband signal 2418b.

The error detection schemes implemented by the error detection modules include but are not limited to: cyclic redundancy check (CAC) and parity check for digital signals, and various error detections schemes for analog signal.

Further details of enhanced signal reception as described in this section are presented in pending U.S. application "Method and System for Ensuring Reception of a Communications Signal," Ser. No. 09/176,415, filed Oct. 21, 1998, incorporated herein by reference in its entirety.

6. Unified Down-conversion and Filtering

The present invention is directed to systems and mods of unified down-conversion and filtering (UDF), and applications of same.

In particular, the present invention includes a unified down-converting and filtering (UDF) module that performs frequency selectivity and frequency translation in a unified (i.e., integrated) manner. By operating in this manner, the invention achieves high frequency selectivity prior to frequency translation (the invention is not limited to this embodiment). The invention achieves high frequency selectivity at substantially any frequency, including but not limited to RF (radio frequency) and greater frequencies. It should be understood that the invention is not limited to this example of RF and greater frequencies. The invention is intended, adapted, and capable of working with lower than radio frequencies.

FIG. 17 is a conceptual block diagram of a UDF module 1702 according to an embodiment of the present invention. The UDF module 1702 performs at least frequency translation and frequency selectivity.

The effect achieved by the UDF module 1702 is to perform the frequency selectivity operation prior to the performance of the frequency translation operation. Thus, the UDF module 1702 effectively performs input filtering.

According to embodiments of the present invention, such input filtering involves a relatively narrow bandwidth. For example, such input filtering may represent channel select filtering, where the filter bandwidth may be, for example, 50 KHz to 150 KHz. It should be understood, however, that the invention is not limited to these frequencies. The invention is intended, adapted, and capable of achieving filter bandwidths of less than and greater than these values.

In embodiments of the invention, input signals 1704 received by the UDF module 1702 are at radio frequencies. The UDF module 1702 effectively operates to input filter these RF input signals 1704. Specifically, in these embodiments, the UDF module 1702 effectively performs input, channel select filtering of the RF input signal 1704. Accordingly, the invention achieves high selectivity at high frequencies.

The UDF module 1702 effectively performs various types of filtering, including but not limited to bandpass filtering, low pass filtering, high pass filtering, notch filtering, all pass filtering, band stop filtering, etc., and combinations thereof.

Conceptually, the UDF module 1702 includes a frequency translator 1708. The frequency translator 1708 conceptually represents that portion of the UDF module 1702 that performs frequency translation (down-conversion).

The UDF module 1702 also conceptually includes an apparent input filter 1706 (also sometimes called an input filtering emulator). Conceptually, the apparent input filter 1706 represents that portion of the UDF module 1702 that performs input filtering.

In practice, the input filtering operation performed by the UDF module 1702 is integrated with the frequency translation operation. The input filtering operation can be viewed as being performed concurrently with the frequency translation operation. This is a reason why the input filter 1706 is herein referred to as an "apparent" input filter 1706.

The UDF module 1702 of the present invention includes a number of advantages. For example, high selectivity at high frequencies is realizable using the UDF module 1702. This feature of the invention is evident by the high Q factors that are attainable. For example, and without limitation, the UDF module 1702 can be designed with a filter center frequency $f_C$ on the order of 900 MHZ, and a filter bandwidth on the order of 50 KHz. This represents a Q of 18,000 (Q is equal to the center frequency divided by the bandwidth).

It should be understood that the invention is not limited to filters with high Q factors. The filters contemplated by the present invention may have lesser or greater Qs, depending on the application, design, and/or implementation. Also, the scope of the invention includes filters where Q factor as discussed herein is not applicable.

The invention exhibits additional advantages. For example, the filtering center frequency $f_C$ of the UDF module 1702 can be electrically adjusted, either statically or dynamically.

Also, the UDF module 1702 can be designed to amplify input signals.

Further, the UDF module 1702 can be implemented without large resistors, capacitors, or inductors. Also, the UDF module 1702 does not require that tight tolerances be maintained on the values of its individual components, i.e., its resistors, capacitors, inductors, etc. As a result, the architecture of the UDF module 1702 is friendly to integrated circuit design techniques and processes.

The features and advantages exhibited by the UDF module 1702 are achieved at least in part by adopting a new technological paradigm with respect to frequency selectivity and translation. Specifically, according to the present invention, the UDF module 1702 performs the frequency selectivity operation and the frequency translation operation as a single, unified (integrated) operation. According to the invention, operations relating to frequency translation also contribute to the performance of frequency selectivity, and vice versa.

According to embodiments of the present invention, the UDF module generates an output signal from an input signal using samples/instances of the input signal and samples/instances of the output signal.

More particularly, first, the input signal is under-sampled. This input sample includes information (such as amplitude, phase, etc.) representative of the input signal existing at the time the sample was taken.

As described further below, the effect of repetitively performing this step is to translate the frequency (that is, down-convert) of the input signal to a desired lower frequency, such as an intermediate frequency (IF) or baseband.

Next, the input sample is held (that is, delayed).

Then, one or more delayed input samples (some of which may have been scaled) are combined with one or more delayed instances of the output signal (some of which may have been scaled) to generate a current instance of the output signal.

Thus, according to a preferred embodiment of the invention, the output signal is generated from prior samples/instances of the input signal and/or the output signal. (It is noted that, in some embodiments of the invention, current samples/instances of the input signal and/or the output signal may be used to generate current instances of the output signal.). By operating in this manner, the UDF module preferably performs input filtering and frequency down-conversion in a unified manner.

Figure 19A:
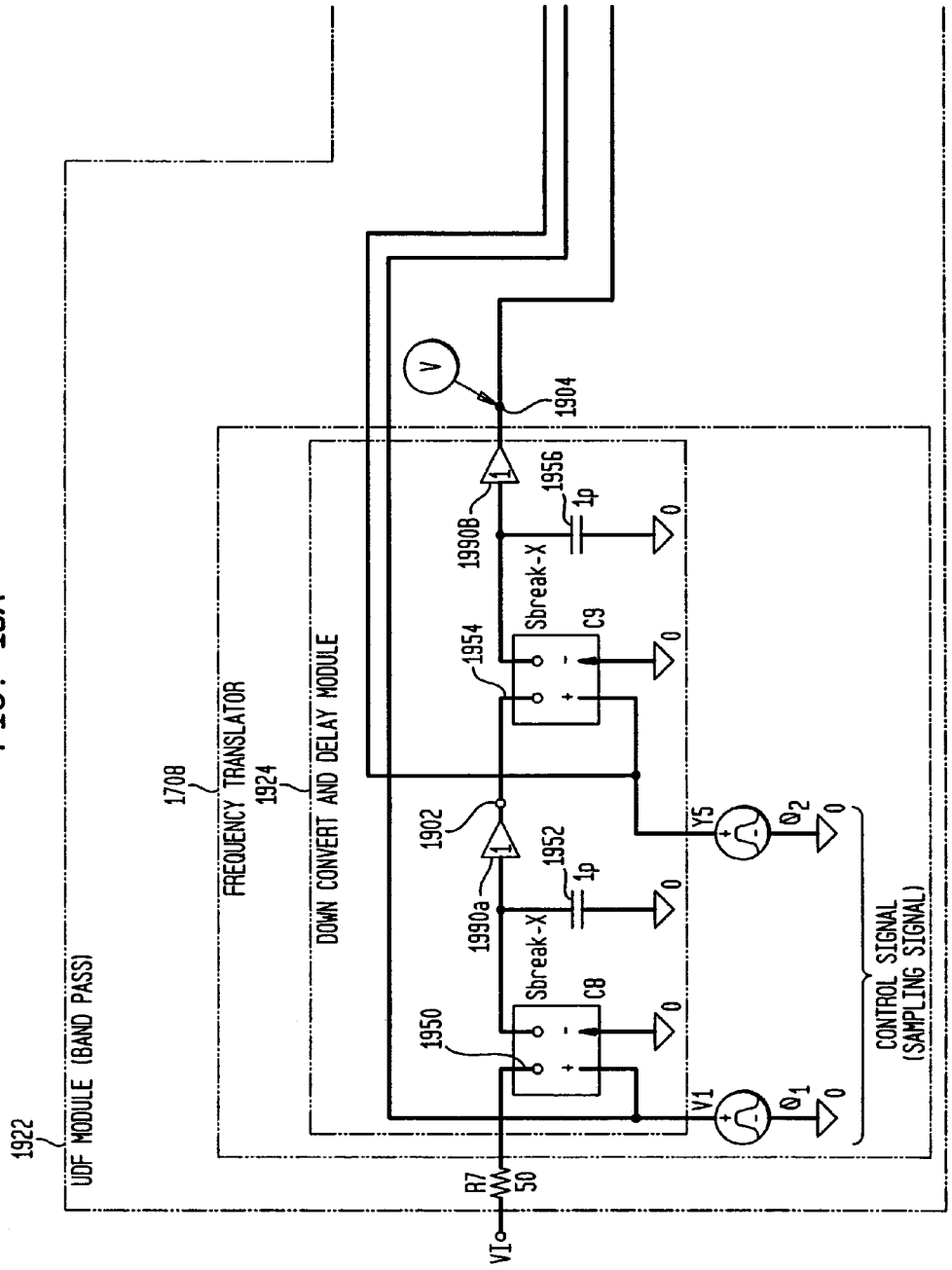
FIGS. 19A and 19B together provide a detailed diagram of an example UDF module according to an embodiment of the invention.
Figure 19B:
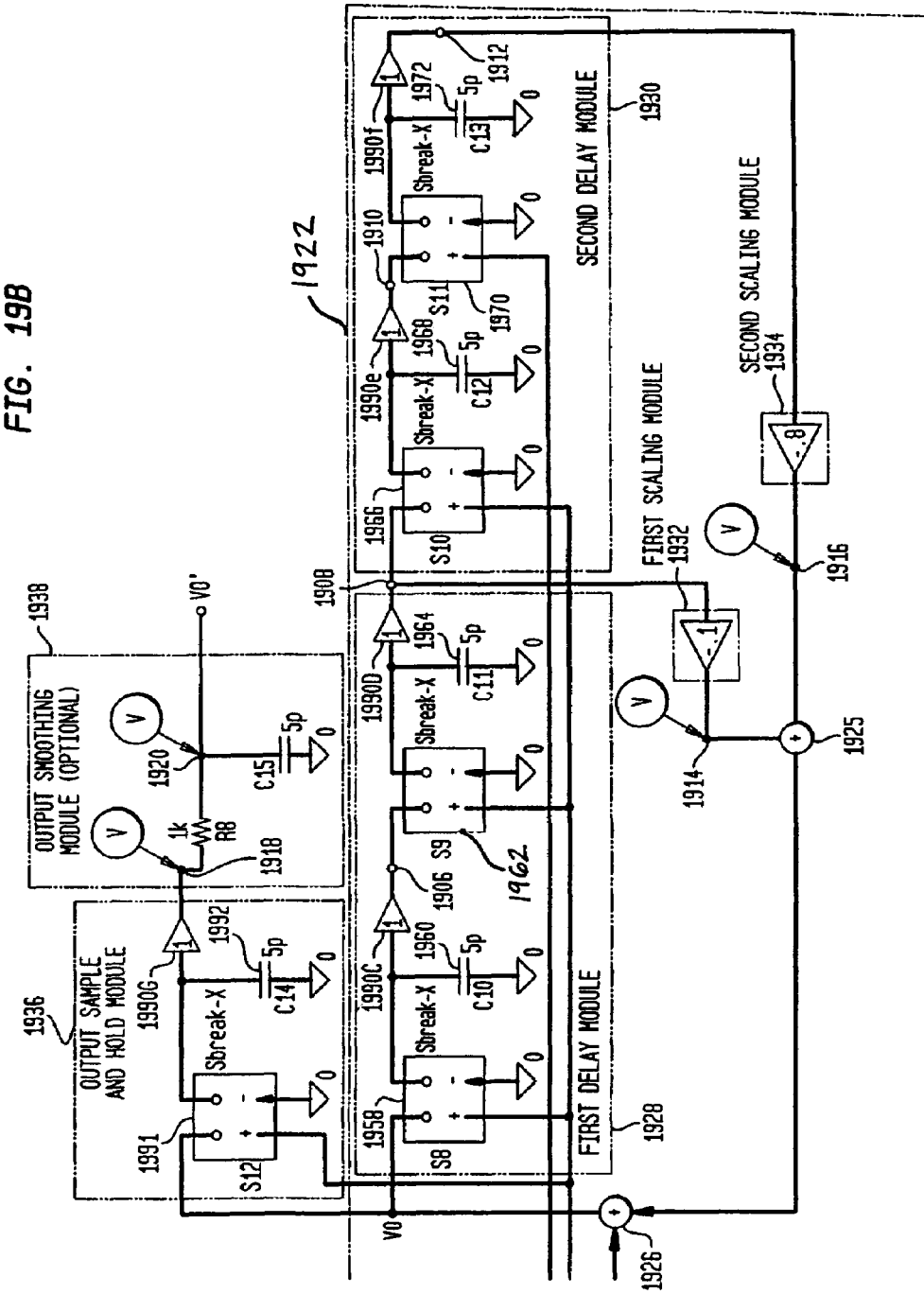

FIGs. 19A and 19B together illustrate an example implementation of the unified down-converting and filtering (UDF)

module 1922. The UDF module 1922 performs the frequency translation operation and the frequency selectivity operation in an integrated, unified manner as described above, and as further described below.

In the example provided by FIGS. 19A and 19B, the frequency selectivity operation performed by the UDF module 1922 comprises a band-pass filtering operation according to EQ. 1, below, which is an example representation of a band-pass filtering transfer function.

$$VO = \alpha_1 z^{-1} VI - \beta_1 z^{-1} VO - \beta_0 z^{-2} VO \qquad \text{EQ. 1}$$

It should be noted, however, that the invention is not limited to band-pass filtering. Instead, the invention effectively performs various types of filtering, including but not limited to bandpass filtering, low pass filtering, high pass filtering, notch filtering, all pass filtering, band stop filtering, etc., and combinations thereof. As will be appreciated, there are many representations of any given filter type. The invention is applicable to these filter representations. Thus, EQ. 1 is referred to herein for illustrative purposes only, and is not limiting.

The UDF module 1922 (shown in FIG. 19A and 19B) includes a down-convert and delay module 1924 (shown in FIG. 19A), first and second delay modules 1928 and 1930 (both shown in FIG. 19B), first and second scaling modules 1932 and 1934 (both shown in FIG. 19B), an output sample and hold module 1936 (shown in FIG. 19B), and an (optional) output smoothing module 1938 (shown in FIG. 19B). The down-convert and delay module 1924 and the control signal (sampling signal) together form a frequency translator 1708. Other embodiments of the UDF module will have these components in different configurations, and/or a subset of these components, and/or additional components. For example, and without limitation, in the configuration shown in FIG. 19B, the output smoothing module 1938 is optional.

As further described below, in the example provided by FIGS. 19A and 19B, the down-convert and delay module 1924 and the first and second delay modules 1928 and 1930 include switches that are controlled by a clock having two phases, $\phi_1$ and $\phi_2$. $\phi_1$ and $\phi_2$ preferably have the same frequency, and are non-overlapping (alternatively, a plurality such as two clock signals having these characteristics could be used). As used herein, the term "non-overlapping" is defined as two or more signals where only one of the signals is active at any given time. In some embodiments, signals are "active" when they are high. In other embodiments, signals are active when they are low.

Preferably, each of these switches closes on a rising edge of $\phi_1$ or $\phi_2$, and opens on the next corresponding falling edge of $\phi_1$ or $\phi_2$. However, the invention is not limited to this example. As will be apparent to persons skilled in the relevant art(s), other clock conventions can be used to control the switches.

In the example provided by FIGS. 19A and 19B, it is assumed that $\alpha_1$ is equal to one. Thus, the output of the down-convert and delay module 1924 is not scaled. As evident from the embodiments described above, however, the invention is not limited to this example.

The example UDF module 1922 has a filter center frequency of 900.2 MHZ and a filter bandwidth of 570 KHz. The pass band of the UDF module 1922 is on the order of 899.915 MHZ to 900.485 MHZ. The Q factor of the UDF module 1922 is approximately 1879 (i.e., 900.2 MHZ divided by 570 KHz).

The operation of the UDF module 1922 shall now be described with reference to a Table 1802 (FIG. 18) that indicates example values at nodes in the UDF module 1922 at a number of consecutive time increments. It is assumed in Table 1802 that the UDF module 1922 begins operating at time t−1. As indicated below, the UDF module 1922 reaches steady state a few time units after operation begins. The number of time units necessary for a given UDF module to reach steady state depends on the configuration of the UDF module, and will be apparent to persons skilled in the relevant art(s) based on the teachings contained herein.

At the rising edge of $\phi_1$ at time t−1, a switch 1950 (shown in FIG. 19A) in the down-convert and delay module 1924 closes. This allows a capacitor 1952 (shown in FIG. 19A) to charge to the current value of an input signal, $VI_{t-1}$, such that node 1902 (shown in FIG. 19A) is at $VI_{t-1}$. This is indicated by cell 1804 in FIG. 18. In effect, the combination of the switch 1950 and the capacitor 1952 in the down-convert and delay module 1924 operates to translate the frequency of the input signal VI to a desired lower frequency, such as IF or baseband. Thus, the value stored in the capacitor 1952 represents an instance of a down-converted image of the input signal VI.

The manner in which the down-convert and delay module 1924 performs frequency down-conversion is further described elsewhere in this application, and is additionally described in pending U.S. application "Method and System for Down-Converting Electromagnetic Signals," Ser. No. 09/176,022, filed Oct. 21, 1998, which is herein incorporated by reference in its entirety.

Also at the rising edge of $\phi_1$ at time t−1, a switch 1958 (shown in FIG. 19B) in the first delay module 1928 closes, allowing a capacitor 1960 (shown in FIG. 19B) to charge to $VO_{t-1}$, such that node 1906 (shown in FIG. 19B) is at $VO_{t-1}$. This is indicated by cell 1806 in Table 1802. (In practice, $VO_{t-1}$ is undefined at this point. However, for ease of understanding, $VO_{t-1}$ shall continue to be used for purposes of explanation.)

Also at the rising edge of $\phi_1$ at time t−1, a switch 1966 (shown in FIG. 19B) in the second delay module 1930 closes, allowing a capacitor 1968 (shown in FIG. 19B) to charge to a value stored in a capacitor 1964 (shown in FIG. 19B). At this time, however, the value in capacitor 1964 is undefined, so the value in capacitor 1968 is undefined. This is indicated by cell 1807 in table 1802.

At the rising edge of $\phi_2$ at time t−1, a switch 1954 (shown in FIG. 19A) in the down-convert and delay module 1924 closes, allowing a capacitor 1956 (shown in FIG. 19A) to charge to the level of the capacitor 1952. Accordingly, the capacitor 1956 charges to $VI_{t-1}$, such that node 1904 (shown in FIG. 19A) is at $VI_{t-1}$. This is indicated by cell 1810 in Table 1802.

The UDF module 1922 may optionally include a unity gain module 1990A (shown in FIG. 19A) between capacitors 1952 and 1956. The unity gain module 1990A operates as a current source to enable capacitor 1956 to charge without draining the charge from capacitor 1952. For a similar reason, the UDF module 1922 may include other unity gain modules 1990B (shown in FIG. 19A) through 1990G (1990C-1990G shown in FIG. 19B). It should be understood that, for many embodiments and applications of the invention, these unity gain modules 1990A-1990G are optional. The structure and operation of the unity gain modules 1990 will be apparent to persons skilled in the relevant art(s).

Also at the rising edge of $\phi_2$ at time t−1, a switch 1962 (shown in FIG. 19B) in the first delay module 1928 closes, allowing a capacitor 1964 to charge to the level of the capacitor 1960. Accordingly, the capacitor 1964 charges to $VO_{t-1}$, such that node 1908 (shown in FIG. 19B) is at $VO_{t-1}$. This is indicated by cell 1814 in Table 1802.

Also at the rising edge of $\phi_2$ at time t−1, a switch 1970 (shown in FIG. 19B) in the second delay module 1930 closes, allowing a capacitor 1972 (shown in FIG. 19B) to charge to a value stored in a capacitor 1968. At this time, however, the value in capacitor 1968 is undefined, so the value in capacitor 1972 is undefined. This is indicated by cell 1815 in table 1802.

At time t, at the rising edge of $\phi_1$, the switch 1950 in the down-convert and delay module 1924 closes. This allows the capacitor 1952 to charge to $VI_t$, such that node 1902 is at $VI_t$. This is indicated in cell 1816 of Table 1802.

Also at the rising edge of $\phi_1$ at time t, the switch 1958 in the first delay module 1928 closes, thereby allowing the capacitor 1960 to charge to $VO_t$. Accordingly, node 1906 is at $VO_t$. This is indicated in cell 1820 in Table 1802.

Further at the rising edge of $\phi_1$ at time t, the switch 1966 in the second delay module 1930 closes, allowing a capacitor 1968 to charge to the level of the capacitor 1964. Therefore, the capacitor 1968 charges to $VO_{t-1}$, such that node 1910 (shown in FIG. 19B) is at $VO_{t-1}$. This is indicated by cell 1824 in Table 1802.

At the rising edge of $\phi_2$ at time t, the switch 1954 in the down-convert and delay module 1924 closes, allowing the capacitor 1956 to charge to the level of the capacitor 1952. Accordingly, the capacitor 1956 charges to $VI_t$, such that node 1904 is at $VI_t$. This is indicated by cell 1828 in Table 1802.

Also at the rising edge of $\phi_2$ at time t, the switch 1962 in the first delay module 1928 closes, allowing the capacitor 1964 to charge to the level in the capacitor 1960. Therefore, the capacitor 1964 charges to $VO_t$, such that node 1908 is at $VO_t$. This is indicated by cell 1832 in Table 1802.

Further at the rising edge of $\phi_2$ time t, the switch 1970 in the second delay module 1930 closes, allowing the capacitor 1972 in the second delay module 1930 to charge to the level of the capacitor 1968 in the second delay module 1930. Therefore, the capacitor 1972 charges to $VO_{t-1}$, such that node 1912 (shown in 19B) is at $VO_{t-1}$. This is indicated in cell 1836 of FIG. 18.

At time t+1, at the rising edge of $\phi_1$, the switch 1950 in the down-convert and delay module 1924 closes, allowing the capacitor 1952 to charge to $VI_{t+1}$. Therefore, node 1902 is at $VI_{t+1}$, as indicated by cell 1838 of Table 1802.

Also at the rising edge of $\phi_1$ at time t+1, the switch 1958 in the first delay module 1928 closes, allowing the capacitor 1960 to charge to $VO_{t+1}$. Accordingly, node 1906 is at $VO_{t+1}$, as indicated by cell 1842 in Table 1802.

Further at the rising edge of $\phi_1$ at time t+1, the switch 1966 in the second delay module 1930 closes, allowing the capacitor 1968 to charge to the level of the capacitor 1964. Accordingly, the capacitor 1968 charges to $VO_t$, as indicated by cell 1846 of Table 1802.

In the example provided by FIGS. 19A and 19B, the first scaling module 1932 scales the value at node 1908 (i.e., the output of the first delay module 1928) by a scaling factor of −0.1. Accordingly, the value present at node 1914 (shown in FIG. 19B) at time t+1 is $-0.1*VO_t$. Similarly, the second scaling module 1934 scales the value present at node 1912 (i.e., the output of the second scaling module 1930) by a scaling factor of −0.8. Accordingly, the value present at node 1916 (shown in FIG. 19B) is $-0.8*VO_{t-1}$ at time t+1.

At time t+1, the values at the inputs of the summer 1926 (shown in FIG. 19B) are $VI_t$ at node 1904, $-0.1*VO_t$ at node 1914, and $-0.8*VO_{t-1}$ at node 1916 (in the example provided by FIGS. 19A and 19B, the values at nodes 1914 and 1916 are summed by a second summer 1925 (shown in FIG. 19B), and this sum is presented to the summer 1926). Accordingly, at time t+1, the summer 1926 generates a signal equal to $VI_t - 0.1*VO_t - 0.8*VO_{t-1}$.

At the rising edge of $\phi_1$ at time t+1, a switch 1991 (shown in FIG. 19B) in the output sample and hold module 1936 closes, thereby allowing a capacitor 1992 (shown in FIG. 19B) to charge to $VO_{t+1}$. Accordingly, the capacitor 1992 charges to $VO_{t+1}$, which is equal to the sum generated by the adder 1926. As just noted, this value is equal to $VI_t - 0.1*VO_t - 0.8*VO_{t-1}$. This is indicated in cell 1850 of Table 1802. This value is presented to the optional output smoothing module 1938, which smoothes the signal to thereby generate the instance of the output signal $VO_{t+1}$. That is, the output signal at node 1920 is a low pass filtered version of the value at node 1918. It is apparent from inspection that this value of $VO_{t+1}$ is consistent with the band pass filter transfer function of EQ. 1.

Further details of unified down-conversion and filtering as described in this section are presented in pending U.S. application "Integrated Frequency Translation And Selectivity," Ser. No. 09/175,966, filed Oct. 21, 1998, incorporated herein by reference in its entirety.

7. Example Application Embodiments of the Invention

As noted above, the UFT module of the present invention is a very powerful and flexible device. Its flexibility is illustrated, in part, by the wide range of applications in which it can be used. Its power is illustrated in part, by the usefulness and performance of such applications.

Example applications of the UFT module were described above. In particular, frequency down-conversion, frequency up-conversion, enhanced signal reception, and unified down-conversion and filtering applications of the UFT module were summarized above, and are further described below. These applications of the UFT module are discussed herein for illustrative purposes. The invention is not limited to these example applications. Additional applications of the UFT module will be apparent to persons skilled in the relevant art(s), based on the teachings contained herein.

Figure 7:
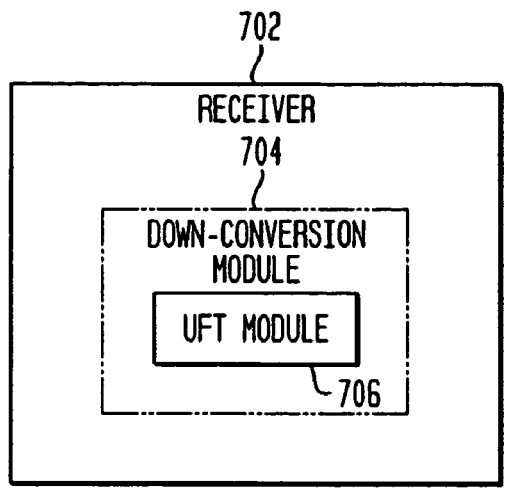
FIG. 7 illustrates a UFT module used in a receiver according to an embodiment of the invention.

For example, the present invention can be used in applications that involve frequency down-conversion. This is shown in FIG. 1C, for example, where an example UFT module 115 is used in a down-conversion module 114. In this capacity, the UFT module 115 frequency down-converts an input signal to an output signal. This is also shown in FIG. 7, for example, where an example UFT module 706 is part of a down-conversion module 704, which is part of a receiver 702.

Figure 8:
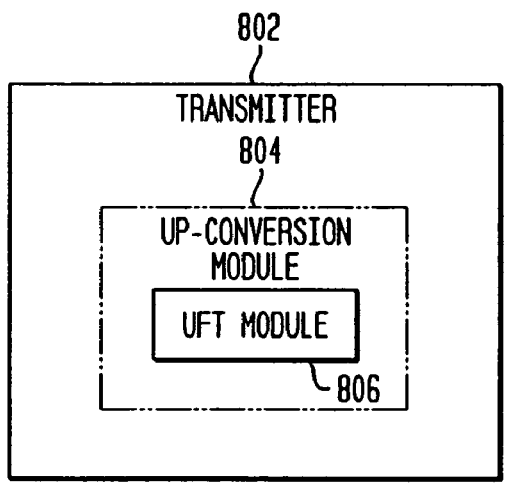
FIG. 8 illustrates a UFT module used in a transmitter according to an embodiment of the invention.

The present invention can be used in applications that involve frequency up-conversion. This is shown in FIG. 1D, for example, where an example UFT module 117 is used in a frequency up-conversion module 116. In this capacity, the UFT module 117 frequency up-converts an input signal to an output signal. This is also shown in FIG. 8, for example, where an example UFT module 806 is part of up-conversion module 804, which is part of a transmitter 802.

Figure 9:
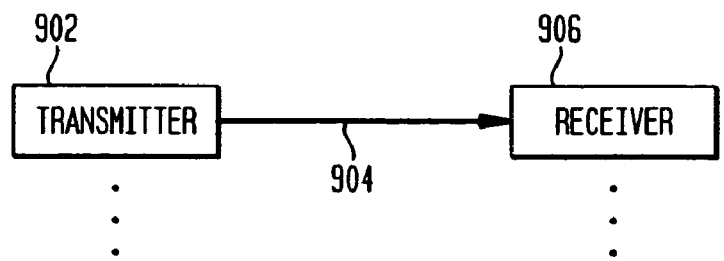
FIG. 9 illustrates an environment comprising a transmitter and a receiver, each of which may be implemented using a UFT module of the invention.

The present invention can be used in environments having one or more transmitters 902 and one or more receivers 906, as illustrated in FIG. 9. In such environments, one or more of the transmitters 902 may be implemented using a UFT module, as shown for example in FIG. 8. Also, one or more of the receivers 906 may be implemented using a UFT module, as shown for example in FIG. 7.

Figure 10:
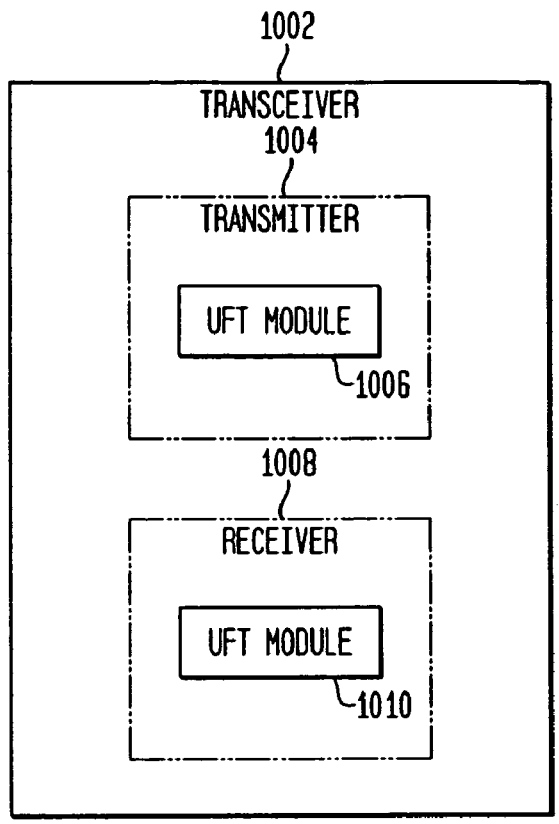
FIG. 10 illustrates a transceiver according to an embodiment of the invention.

The invention can be used to implement a transceiver. An example transceiver 1002 is illustrated in FIG. 10. The transceiver 1002 includes a transmitter 1004 and a receiver 1008. Either the transmitter 1004 or the receiver 1008 can be implemented using a UFT module. Alternatively, the transmitter 1004 can be implemented using a UFT module 1006, and the receiver 1008 can be implemented using a UFT module 1010. This embodiment is shown in FIG. 10.

Figure 11:
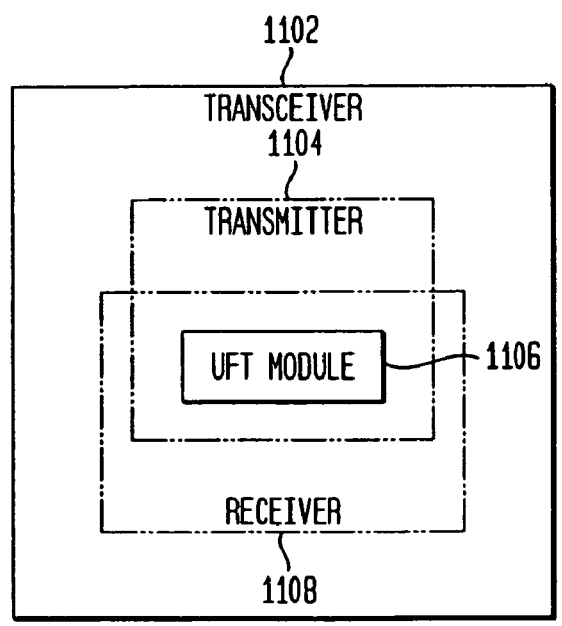
FIG. 11 illustrates a transceiver according to an alternative embodiment of the invention.

Another transceiver embodiment according to the invention is shown in FIG. 11. In this transceiver 1102, the transmitter 1104 and the receiver 1108 are implemented using a single UFT module 1106. In other words, the transmitter 1104 and the receiver 1108 share a UFT module 1106.

Figure 12:
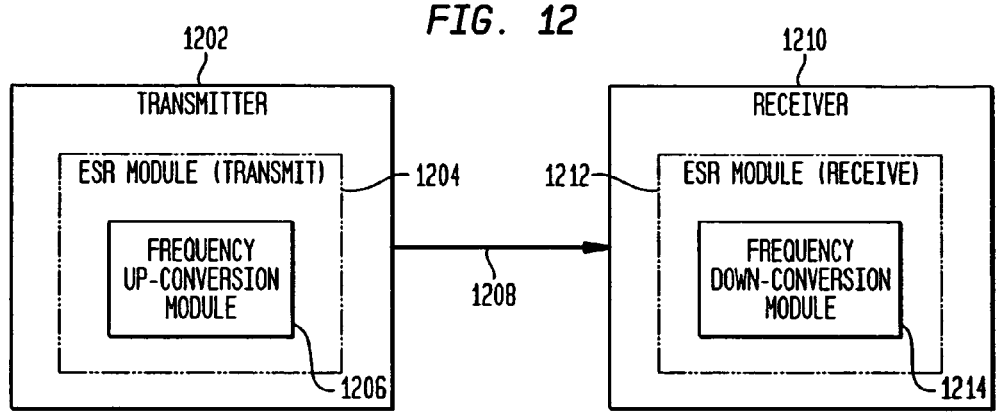
FIG. 12 illustrates an environment comprising a transmitter and a receiver, each of which may be implemented using enhanced signal reception (ESR) components of the invention.

As described elsewhere in this application, the invention is directed to methods and systems for enhanced signal reception (ESR). Various ESR embodiments include an ESR module (transmit) in a transmitter 1202, and an ESR module (receive) in a receiver 1210. An example ESR embodiment configured in this manner is illustrated in FIG. 12.

The ESR module (transmit) 1204 includes a frequency up-conversion module 1206. Some embodiments of this frequency up-conversion module 1206 may be implemented using a UFT module, such as that shown in FIG. 1D.

The ESR module (receive) 1212 includes a frequency down-conversion module 1214. Some embodiments of this frequency down-conversion module 1214 may be implemented using a UFT module, such as that shown in FIG. 1C.

Figure 13:
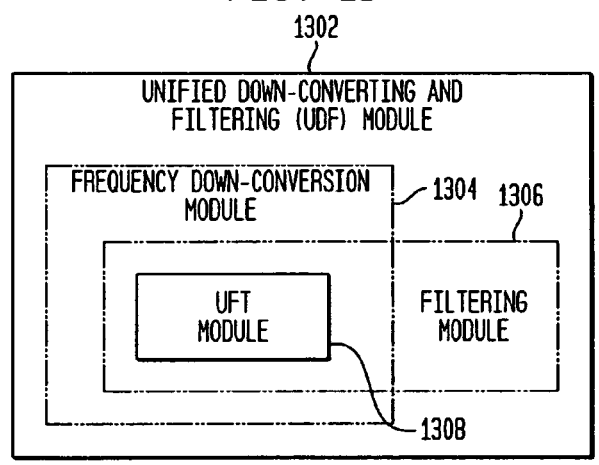
FIG. 13 illustrates a UFT module used in a unified down-conversion and filtering (UDF) module according to an embodiment of the invention.

As described elsewhere in this application, the invention is directed to methods and systems for unified down-conversion and filtering (UDF). An example unified down-conversion and filtering module 1302 is illustrated in FIG. 13. The unified down-conversion and filtering module 1302 includes a frequency down-conversion module 1304 and a filtering module 1306. According to the invention, the frequency down-conversion module 1304 and the filtering module 1306 are implemented using a UFT module 1308, as indicated in FIG. 13.

Figure 15A:
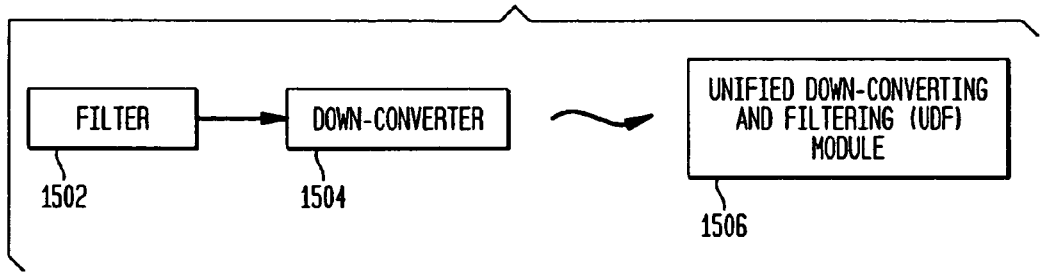
Figure 15B:
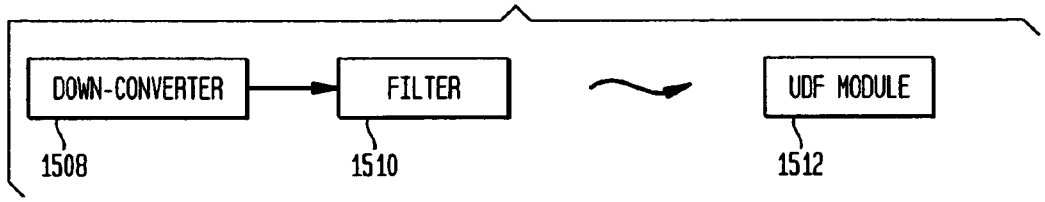
Figure 15C:
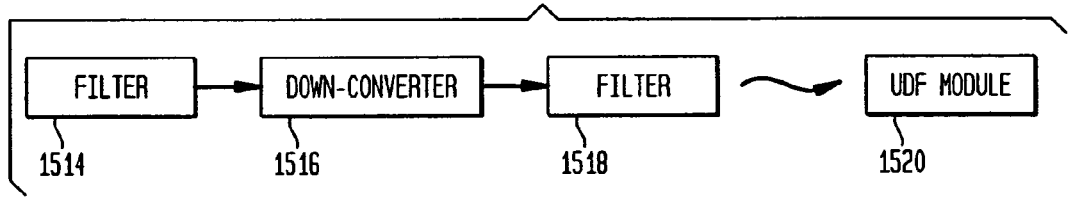
Figure 15D:
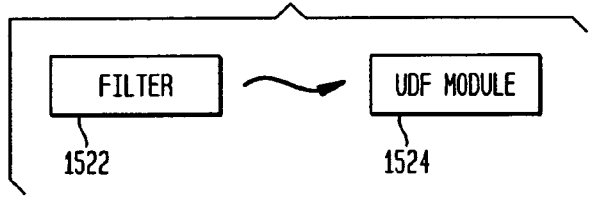
Figure 15E:
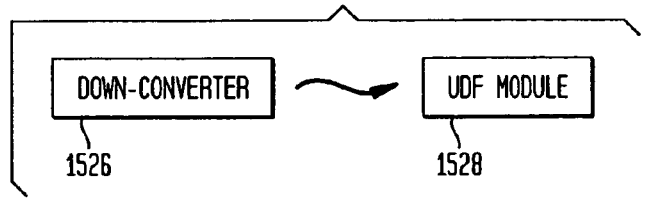

Unified down-conversion and filtering according to the invention is useful in applications involving filtering and/or frequency down-conversion. This is depicted, for example, in FIGS. 15A-15F. FIGS. 15A-15C indicate that unified down-conversion and filtering according to the invention is useful in applications where filtering precedes, follows, or both precedes and follows frequency down-conversion. FIG. 15D indicates that a unified down-conversion and filtering module 1524 according to the invention can be utilized as a filter 1522 (i.e., where the extent of frequency down-conversion by the down-converter in the unified down-conversion and filtering module 1524 is minimized). FIG. 15E indicates that a unified down-conversion and filtering module 1528 according to the invention can be utilized as a down-converter 1526 (i.e., where the filter in the unified down-conversion and filtering module 1528 passes substantially all frequencies). FIG. 15F illustrates that the unified down-conversion and filtering module 1532 can be used as an amplifier. It is noted that one or more UDF modules can be used in applications that involve at least one or more of filtering, frequency translation, and amplification.

Figure 14:
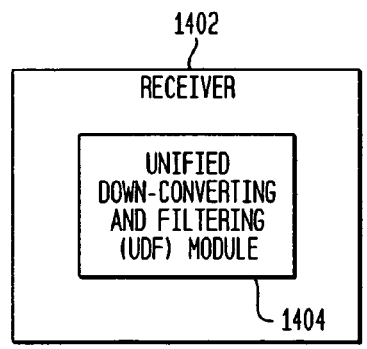
FIG. 14 illustrates an example receiver implemented using a UDF module according to an embodiment of the invention.

For example, receivers, which typically perform filtering, down-conversion, and filtering operations, can be implemented using one or more unified down-conversion and filtering modules. This is illustrated, for example, in FIG. 14.

The methods and systems of unified down-conversion and filtering of the invention have many other applications. For example, as discussed herein, the enhanced signal reception (ESR) module (receive) operates to down-convert a signal containing a plurality of spectrums. The ESR module (receive) also operates to isolate the spectrums in the down-converted signal, where such isolation is implemented via filtering in some embodiments. According to embodiments of the invention, the ESR module (receive) is implemented using one or more unified down-conversion and filtering (UDF) modules. This is illustrated, for example, in FIG. 16. In the example of FIG. 16, one or more of the UDF modules 1610, 1612, 1614 operates to down-convert a received signal. The UDF modules 1610, 1612, 1614 also operate to filter the down-converted signal so as to isolate the spectrum(s) contained therein. As noted above, the UDF modules 1610, 1612, 1614 are implemented using the universal frequency translation (UFT) modules of the invention.

The invention is not limited to the applications of the UFT module described above. For example, and without limitation, subsets of the applications (methods and/or structures) described herein (and others that would be apparent to persons skilled in the relevant art(s) based on the herein teachings) can be associated to form useful combinations.

For example, transmitters and receivers are two applications of the UFT module. FIG. 10 illustrates a transceiver 1002 that is formed by combining these two applications of the UFT module, i.e., by combining a transmitter 1004 with a receiver 1008.

Also, ESR (enhanced signal reception) and unified down-conversion and filtering are two other applications of the UFT module. FIG. 16 illustrates an example where ESR and unified down-conversion and filtering are combined to form a modified enhanced signal reception system.

The invention is not limited to the example applications of the UFT module discussed herein. Also, the invention is not limited to the example combinations of applications of the UFT module discussed herein. These examples were provided for illustrative purposes only, and are not limiting. Other applications and combinations of such applications will be apparent to persons skilled in the relevant art(s) based on the teachings contained herein. Such applications and combinations include, for example and without limitation, applications/combinations comprising and/or involving one or more of: (1) frequency translation; (2) frequency down-conversion; (3) frequency up-conversion; (4) receiving; (5) transmitting; (6) filtering; and/or (7) signal transmission and reception in environments containing potentially jamming signals.

Additional examples are set forth below describing applications of the UFT module with circuits that reduce or eliminate unwanted DC offset and re-radiation, and improve dynamic range.

7.0 DC Offset, Re-radiation, and Dynamic Range Considerations and Corrections Various embodiments related to the method(s) and structure(s) described herein are presented in this section (and its subsections). Problems related to DC offset, re-radiation, and dynamic range are described below. Applications of the UFT module are provided in relation to circuits used to reduce or eliminate problems of DC offset and re-radiation, and to improve dynamic range.

These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

7.1 Overview of DC Offset and Re-radiation

Receivers, and other electronic circuits, may suffer from problems of DC offset and re-radiation. Generally, "DC offset" refers to a DC voltage level that is added to a signal of interest by related circuitry. The related circuitry creates the DC offset voltage through a variety of mechanisms that are well known. Some of these mechanisms are discussed in further detail below. If a DC offset voltage value is significant, it can degrade the quality of the signal of interest. In a receiver, for example, the signal of interest may be a down-converted signal. Unless reduced or eliminated, the added DC offset voltage level may undesirably change the voltage value of the down-converted signal. As a result, the actual voltage value of the down-converted signal may be difficult to ascertain by down-stream processing.

Generally, "re-radiation" is an undesired phenomenon where a signal comprising one or more frequency components generated by receiving circuitry is transmitted by an antenna. For example, the frequency components may be generated by a local oscillator of the receiving circuitry. When transmitted, these frequency components may undesirably interfere with nearby receivers, or may be received back by the same antenna that transmitted them. When the frequency components are received back by the same antenna that transmitted them, this may be referred to "re-radiation recapture". The phenomenon of re-radiation recapture may further impair signals that are down-converted, and/or may cause undesirable DC offset voltages that may impair the down-converted signals. For instance, the re-radiated and recaptured signal may appear to the receiver as unwanted noise, within or without the frequency band(s) of interest, or may combine with local signals to create an undesired DC offset voltage. The phenomenon of creating a DC offset voltage by re-radiation recapture is described further below. Solutions provided herein, for eliminating unwanted DC offset voltages apply to eliminating DC offset voltages produced from re-radiation recapture.

Furthermore, signals in a receiver circuit may travel or radiate to other receiver circuit sections, causing problems similar to those of re-radiation recapture described above, including problems of noise and DC offset voltages. For instance, local oscillator signals may undesirably transmit through the circuit substrate, through the air, or through other paths, to other receiver circuit sections, causing unwanted noise problems and problems with unwanted DC offset voltages being generated. Circuits provided herein for solving problems with DC offsets, re-radiation, and re-radiation recapture also apply to solving problems of noise and unwanted DC offset voltages caused by this phenomenon.

The concepts of DC offset and re-radiation are further described in the following sub sections. Furthermore, example methods and systems are provided in subsequent sections below for reducing or eliminating unwanted DC offset and re-radiation. Such methods and systems can be used alone, or in combination with each other, to address offset issues.

7.1.1 Introduction

Embodiments of the UFT module may be used in many communications applications. For some of these applications, the signal space may include waveforms with near DC content. Such waveforms exist, for example, in signals transmitted at radio frequencies. Hence, it may be advantageous to limit the amount of artificial DC insertion or DC offsets contributed by the UFT module or its complimentary demodulation architecture.

This section presents an overview of DC offset contributions of the UFT module, and related circuitry, relevant for zero IF implementation. In addition, embodiments of the present invention are presented for reducing the adverse impacts of the DC offsets.

7.1.2 DC Offset Model Overview

Figure 73:
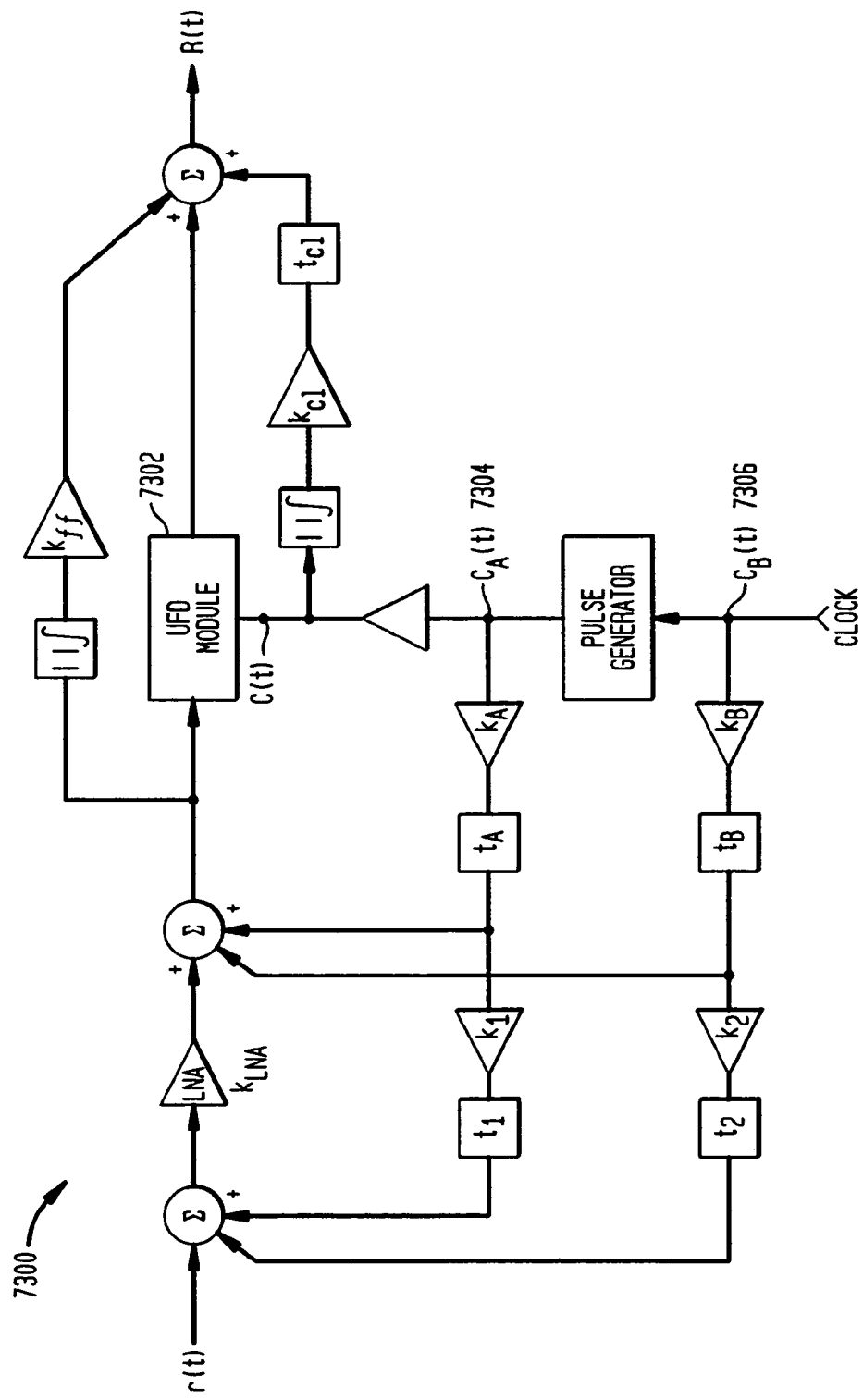
FIG. 73 illustrates a down-converter according to an embodiment of the present invention, showing some DC offset contributions.

FIG. 73 illustrates a down-conversion circuit 7300 according to an embodiment of the present invention. The down-conversion circuit 7300 of FIG. 73 provides a model that indicates possible DC offset contributions. Down-conversion circuit 7300 comprises a UFD module 7302. UFD module 7302 comprises a UFT module (not shown).

There are at least three significant categories of offsets.
1. Clock Excitation or Charge Injected
2. Re-Radiation Offsets
3. Intermodulation Distortion Each category possesses its own mechanisms.

The following definitions in Table 1 set the backdrop for analysis and understanding of the offset phenomena from a high level model. At least some of the phenomena relevant to the discussion in terms of device physics may be lumped into one or more of the following model parameters.

$$R(t)=[r(t)+k_1k_2C_A(t'_A)+k_2k_BC_B(t'_B))+k_{LNA}+k_AC_A(t'_A)+ \\ k_BC_B(t'B)C(t)+<|C(t)|>k_{c\lambda}\qquad\text{Eq. 29}$$

TABLE 1

| | |
|---|---|
| $r(t) = s(t) + n(t);$ | $r(t)$ is the received signal of interest which consists of a modulated carrier $s(t)$ and a noise component $n(t)$. |
| $k_1k_AC(t'_{A1})$ or $k_AC(t'_A)$ | This signal is a conditioned clock 7304 or transient waveform, which leaks to the core input of UFD module 7302 across free-space, substrate, etc. $t'_{A1}$ is a delayed time variable. $t_{A1} = t - t_A - t_1$ where $t_A$ is the delay of the specific (A) path, and $t_1$ is the additional delay through the (1) path. |
| $k_2k_BC_B(t'_{B2})$ or $k_BC_B(t'_B)$ | This signal is similar to the one described above except that the leakage paths and delays are different and the leakage signal is a raw clock 7306 rather than a conditioned clock 7304. |
| $<|C(t)|>k_{c\lambda}$ | This is a signal which is self-generating at UFD 7302 module, and is derived from the charge injection phenomena at UFD 7302 module when the conditioned clock 7304 or control is active. Essentially, the conditioned clock $C(t)$ is modified by a nonlinear operation (in this case an abs function) averaged or integrated over some interval and scaled by a gain constant $k_{c\lambda}$ and delayed by $t_{c\lambda}$. When $C(t)$ is not active, then $<|C(t)|> \cdot k_{c\lambda} \to 0$. This offset term is summed effectively at the output of UFD module 7302. $<>$ denotes the expectation operation. |
| *$k_{ff}$ | Gain constant associated with feed forward charge injection path. This path is typically of interest when interferences are present. Usually, offsets will not be significant unless the S/I (Signal to Interference power) is very low and I is very large. |

(*The charge injection path associated with $k_{ff}$ has been ignored in Eq. 29. This component will be addressed separately in a subsequent section.)

There may be additional leakage terms, which are not illustrated in the model.

7.1.3 Clock Modulation via PN Code

Figure 74:
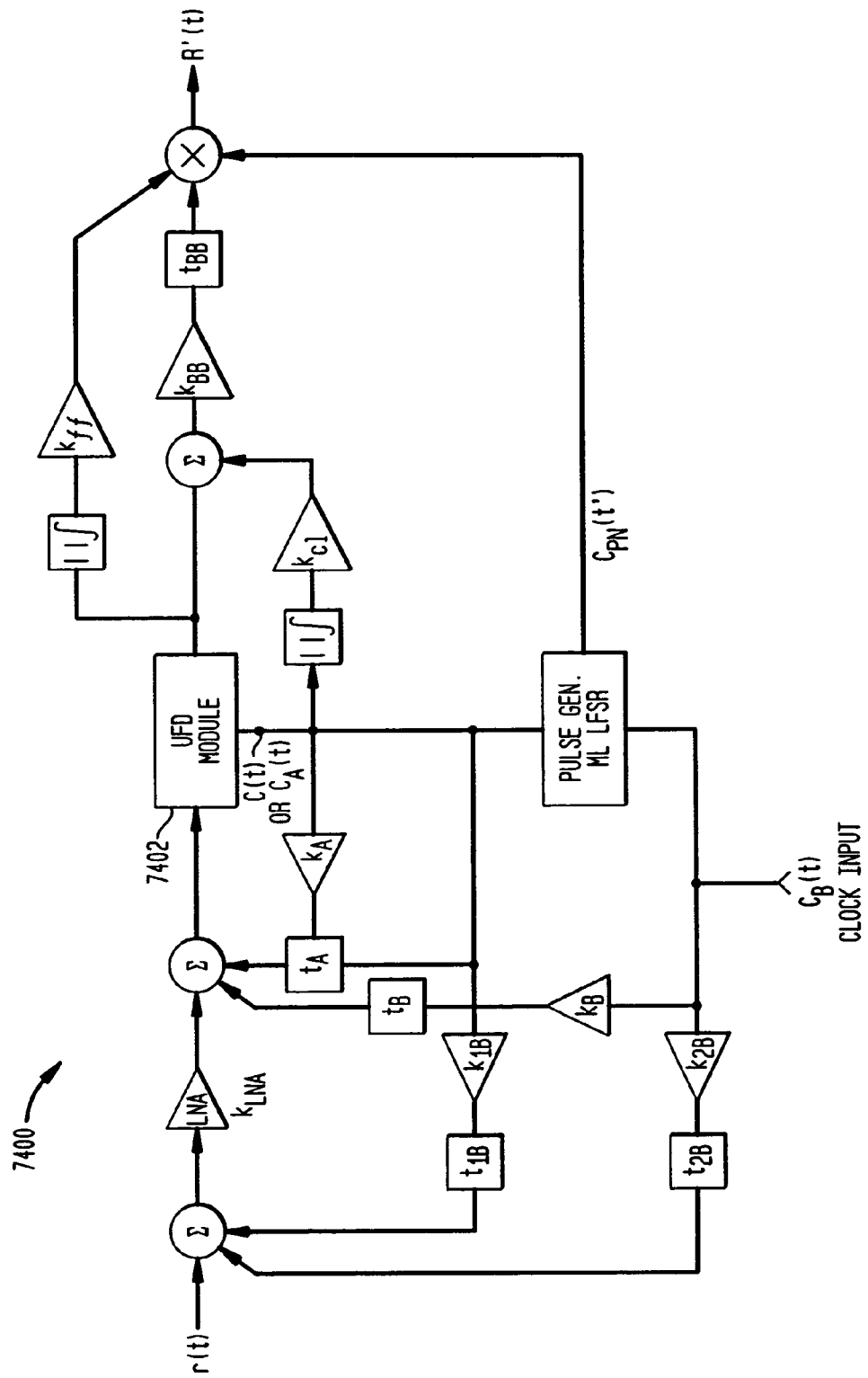
FIG. 74 illustrates a down-converter according to an embodiment of the present invention, that removes at least some DC offset contributions.

A system and method for addressing DC offset, according to an embodiment of the present invention, involves modifying the LO (local oscillator) in such a manner that the offsets are randomized and spectrally spread. After some amount of amplification the randomized signal may be de-spread coherently. At least some of the offset, particularly that offset which is due to LO re-radiation, may be removed. FIG. 74 illustrates a down-conversion circuit 7400, according to an embodiment of the present invention, that removes at least some offset. Down-conversion circuit 7400 comprises a UFD module 7402. UFD module 7402 comprises a UFT module (not shown).

Although only a single down-conversion channel is illustrated in FIG. 74, in alternative embodiments the architecture may be extended to include both I and Q, especially if two uncorrelated PN (Pseudo-random Noise) sequences are utilized. Other dual or multiple channel embodiments are also within the scope and spirit of the present invention. In an embodiment, the PN code or similar sequence is formed by a maximal length linear feed back shift register (or other logic) and is modulated onto the clock and pulse conditioned to form C(t). $C_{PN}(t')$ is the baseband PN sequence waveform. $C_{PN}(t')$ is virtually identical to $C_{PN}(t)$ except for a very small time shift. R'(t) may be given by:

$$R'(t) = k_{BB} R(t-t_{BB})(C_{PN}(t'))  \quad \text{Eq. 30}$$

Which may be expanded to:

$$R'(t) k_{BB}[(r(t-t_{BB})C(t') + \\ Z(t-t_{BB}))k_{LNA} + X(t-t_{BB})]C_{PN}(t) + \\ (<|C(t-t_{BB})|>k_{c\lambda}k_{BB})C_{PN}(t') \quad \text{Eq. 31}$$

where:

$$Z(t) = (k_1 k_A C(t'_{1A}) + k_2 k_B C_B(t'_{2B}))C(t) \ X(t) = (k_A C(t'_A) + \\ k_B C_B(t'_B))C(t) \ t'\underline{\Delta}(t-t_X) \ C(t) \cong C_A(t') \quad \text{Eq. 32}$$

It will be apparent to persons skilled in the relevant art(s) from the teaching herein that examination of these equations combined with the knowledge that C(t) can be a pseudo random sequence, will reveal interesting cross correlations for the math provided above.

For the moment, delays on the order of sub-carrier cycle times and carrier cycle times may be ignored, thereby considering many of the delay terms to be zero. While this may not actually be the case, this does provide a substantially worst case bounding view of cross-correlation properties of the described signal in one dimension. The general result would apply to the I/Q complex signal representation. However, the first step for a single dimension is instructive and therefore provided. The cross-correlation $R_{XX}$ is calculated as follows:

$$R_{XX}(t) \underline{\Delta} <k_{BB}R(t)C_{PN}(t)> \approx <k_{BB}R(t-t_{BB})C_{PN}(t')> \quad \text{Eq. 33}$$

The result is:

$$R_{XX}(t) \cong <[k_{BB}k_{LNA}r(t) + k_{1A}k_{LNA}k_{BB}C(t)C_A(t)C_{PN}(t') + \\ k_{2B}k_{LNA}k_{BB}C(t)C_B(t)C_{PN}(t') + k_{BB}k_A C_A(t')C(t) + \\ k_{BB}k_B C_B(t)C_{PN}(t') + <|C(t)|>k_{c\lambda} \cdot k_{BB}C_{PN}(t')[> \quad \text{Eq. 34}$$

$C_{PN}(t)$, $C_A(t)$, $r(t)$, and $C_B(t)$ average to zero over a long term, if $C_{PN}(t)$ is augmented. Even if $r(t)$ does not average to zero, $r(t)$ is not considered because it is the signal of interest (NOTE: An "augmented" sequence refers to the process of chip stuffing as required to provide ideal code balance.)

It will be known to persons skilled in the relevant art(s) that C(t) and $C_B(t)$ are uncorrelated. It is also known that $|C(t)|$ and $C_{PN}(t)$ are uncorrelated when $C_{PN}(t)$ is bipolar. If the cross-correlations indicated above are in fact indicative of the process, then $R_{XX}(t)$ would approximately reduce to:

$$R_{XX}(t) \approx \to 0 \quad \text{Eq. 35}$$

$R_{XX}(t)$ represents the DC offset that exists due to LO re-radiation leaking into the front end of UFD module 7402 by some ancillary path, such that it is converted into band at the output of UFD module 7402 for the case where the leakage is synchronous in part or whole to the UFD module transform, plus charge injected offset. This synchronicity is actually rare for cases where $k_{1A}$ or $k_A$ is large. Typically those gains would be much less than 1.

What the above equation reveals is that little or no DC offset effects remain if $C_{PN}(t)$ and C(t) are balanced, bipolar sequences.

In this case, a spreading sequence, spreading rate, and sequence length are selected. This selection typically requires careful examination of the signaling scheme, data rate, etc. Also, the C1 path involving $k_{ff}$ has not been accounted for in this analysis.

7.1.3.1 Interpretation of $R_{xx}(t)$ and Required Leakage

It may be desirable that $R_{xx}(t)$ be $3.16 \times 10^{-6}$ volts peak in a 50Ω system for a number of applications. For a system design where the UFD module possesses an output impedance of 1KΩ, a signal level of 63.2 µV peak may be tolerated (−100 dBm).

In embodiments, clock port or control port signals may swing as much as 2V peak internal to the UFD module. If 2 volts must be reduced to 63.2 µV at the UFD module output, then:

$$2V \cdot k_{c\lambda} < 63.2 \times 10^{-6} V_{peak} \therefore k_{c\lambda} < \frac{63.2 \times 10^{-6}}{2} \quad \text{Eq. 36}$$

Hence:

$$k_{c\lambda} < 31.6 \times 10^{-6} \tilde{<} -90 \text{ dB(power)} \quad \text{Eq. 37}$$

Eq. 37 implies that the effective isolation from charge injected DC must be on the order of 90 dB (power) or greater at the UFD module in various embodiments.

In embodiments, it is unlikely that 90 dB of chip isolation would be achieved in a system-on-a-chip design. It may be more difficult to maintain isolations over temperature and production lots. In an embodiment, the suppression is such that the LO re-radiation in band @2450 MHZ for a n=5 system is −20 dBm.

A similar calculation for the aggregate LO re-radiation components reveals the requirement of approximately 100 dB suppression, effectively.

7.1.3.2 Charge Injected DC Offset

The charge injected DC offset phenomena may be modeled as some rectification of the clock or control port energy weighted by some gain constant, $k_{c\lambda}$. The amount of DC offset introduced at the output of the UFD module may be given as:

$$CI_{UFD\,DC} \underline{\Delta} (<|C(t)|>)k_{c\lambda} \quad \text{Eq. 38}$$

Figure 75:
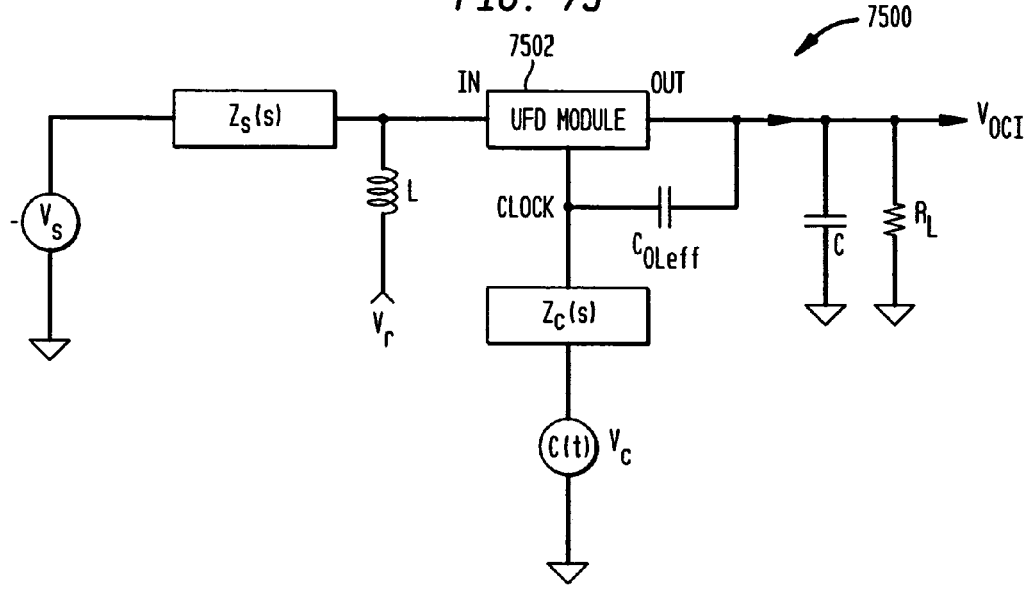
FIGS. 75 and 76 illustrate circuit diagrams according to embodiments of the present invention.

However, it may also be of value to construct a picture more closely associated with how this term arises. Consider a down-conversion circuit 7500 shown in FIG. 75, configured according to an embodiment of the present invention. Down-conversion circuit 7500 comprises a UFD module 7502. UFD module 7502 comprises a UFT module (not shown). An equation can be written to describe the voltage at the output due to C(t). The complex domain equation is:

$$V_{OCI}(s) = V_C(s) \left( \frac{Z_L \cdot Z'_s C_{OLeff} \cdot s}{Z_L Z_C + Z'_S Z_C + Z_L \cdot Z'_S) C_{OLeff} \cdot S + (Z_L + Z'_S)} \right) \quad \text{Eq. 39}$$

-continued $\mathcal{Z}_L \triangleq$  Complex Load Impedance $\left(\dfrac{R_L}{R_L C \cdot S + 1}\right)$ $\mathcal{Z}'_S \triangleq$  Complex Source Impedance $\left(\mathcal{Z}_{D2D} + \dfrac{L \cdot S \mathcal{Z}_S(s)}{LS + \mathcal{Z}_S(s)}\right)$ $V_C(s) \triangleq$  Complex Clock Signal driving the UFD module $V_{OCI} \triangleq$  The Complex Output Signal arising from clock activity at UFD module 7502. This component is considered as a voltage resulting from charge injection due to the parasitic $C_{OLeff}$ There are some high level considerations which reveal important aspects of the phenomena. The equation shows the following;

When $V_C(s)$ is a pure DC waveform, $V_{OCI}$ is zero. However, $V_C(t)$ does possess both a transient and DC offset component. If the DC offset component is zero then $V_C(t)$ would also be zero.

As the frequency content of the transients in $V_C(s)$ are lower, then so too $V_{OCI}$ will typically become lower. However, this perceived monotonic correspondence of $V_{OCI}$ frequency components $V_C(s)$ may not always hold because of resonances in the complex impedances surrounding UFD module 7502. The DC offset performance of UFD module 7502 is a strong function of the Fourier signature for $V_C(t)$, as is further described below. When $C_{OLeff} \rightarrow$ zero, then $V_{OCI} \rightarrow$ zero.

The lower the source impedance and the lower the load impedance, the lower $V_{OCI}$ becomes.

$\mathcal{Z}_{UFD\ module}$ tends to provide some isolation from input impedances over the frequency ranges where the real $[\mathcal{Z}_{UFD\ module}]$ series component dominates. When real $[\mathcal{Z}_{UFD\ module}]$ is significant, $\mathcal{Z}_L$ becomes a consideration concerning $V_{OCI}$.

$C_{OLeff}$ is a parasitic which is well known and understood in conventional receiver systems. There are processes available which can reduce this parameter by a factor approaching 100. A value in one embodiment of UFD module 7502 would be on the order of:

$$C_{OLeff} \approx 120 \text{ pf} \quad \text{Eq. 40}$$

Hence, this could be reduced to 1-2 pf.

The amount of charge injected DC voltage variation at the output of UFD module 7502 is related to one or more of at least the following factors:

$Z_s(s)$: The Input Source Impedance, which is typically complex.

L: This is a typically used bias inductor. Other arrangements are possible. This one is selected simply for illustration purposes.

$Z_C(s)$: The Output Impedance of the Clock Source (C(t)).

C, $R_L$: Components utilized to load UFD module 7502.

$C_{OLeff}$: This capacitance is a process parasitic and is shown as an effective capacitor formed from several physical capacitors, which usually dominates in terms of charge injection path. Although shown on the output node it may be actually split between output and input of UFD module 7502. In fact, the input typically provides a significant LO re-radiation path.

$\mathcal{Z}_{UFD\ module}$: Internal Impedance of UFD module 7502.

Because $\mathcal{Z}'_S$, $\mathcal{Z}_L$, and $\mathcal{Z}_C$ are all complex impedances, there is always the chance that resonance's may occur for certain $C_{OLeff}$, such that $V_{OCI}$ could possess local maxima even as $C_{OLeff}$ decreases. In the case where $\mathcal{Z}_{UFD\ module}$, $\mathcal{Z}_L$, $\mathcal{Z}'_S$, and $\mathcal{Z}_C$ are dominated by real parts, the injection attenuation gains in dropping $C_{OLeff}$ from 120 pf to 2 pf are enormous. These attenuation gains may be roughly 35 dB in power, and half that in voltage. Hence, DC offset due to charge injection may be significantly attenuated by process control. An example of process control may be related to moving from CMOS (Complementary Metal Oxide Semiconductor) to DMOS (Double Diffused Metal Oxide Semiconductor). There are processes available which may include both CMOS and DMOS on the same substrate, possibly providing important performance options, particularly in the domain of gate overlap capacitance control. The effective gate overlap capacitance $C_{OLeff}$ is a chief offender, which results from process oxide capacitance in conjunction with overlap parsitics related to transistor geometries.

Another method of artificially decreasing $C_{OLeff}$ is by changing $\mathcal{Z}_C$ to incorporate a series capacitor, which is much lower than $C_{OLeff}$. However, this must be done carefully to avoid negative substrate transients. A further useful circuit model allows $$\mathcal{Z}'_S \rightarrow 0, \mathcal{Z}_C \rightarrow 0, \mathcal{Z}_{D2D} \rightarrow 0, Z_L \rightarrow \dfrac{1}{sC}.$$

Figure 76:
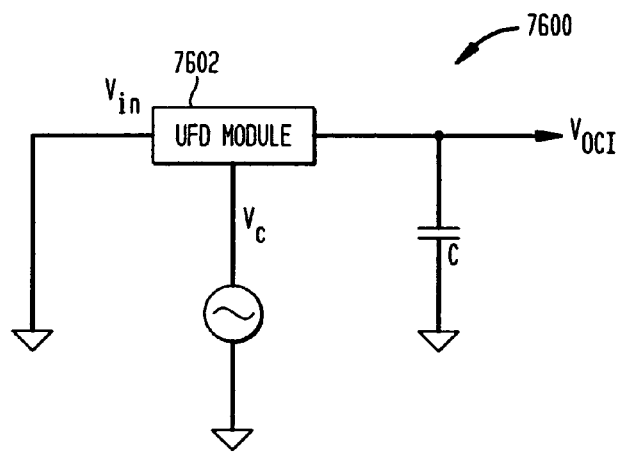

An embodiment of this circuit is shown in FIG. 76, as down-conversion circuit 7600. Down-conversion circuit 7600 comprises a UFD module 7602. UFD module 7602 comprises a UFT module (not shown). Under these conditions:

$$V_{OCI} \approx -\left(\dfrac{C_{OX}}{2C}\right)(W \cdot L)(V_{cp} - V_T - V_{in}) \quad \text{Eq. 41}$$

where:

$C_{OX} \triangleq$  Oxide Capacitance, Function of Process.

$W, L \triangleq$  Fundamental Geometries related to the UFD module, which affect parasitic overlap capacitances.

$V_{cp} \triangleq$  Conditioned Clock Peak Excursion (unfiltered).

$V_T \triangleq$  Threshold Voltage related to the Process.

Eq. 41 relates directly to the device physics of the UFD module. $C_{OLeff}$ relates to $C_{OX}$ and the parasitics formed due to W and L.

This model has some practical application because it can be used to predict compromises in the charge injection DC offset due to UFD module 7602 process parameters and the output capacitor C. For example, the model can predict, to a reasonable approximation, the results of a corresponding simulation. In the situations where $\mathcal{Z}'_S$, $\mathcal{Z}_C$, and $\mathcal{Z}_{UFD\ module}$ may not be precisely known, a circuit designer may at least select approximate specifications for UFD module 7602 designs using the simple model, and add more accurate impedances as they become known. Furthermore, to the degree $C_{OX}$, W, L, $V_T$, and $V_{cp}$ can be manipulated, the more $V_{OCI}$ can be reduced.

7.1.3.3 Clock Waveform Impact on CI Induced Offsets

The previous section illustrated that the clock waveform can impact the efficiency of CI DC offset build up. This is an important concept because clock design is integral to the UFD module theory. The following formulation provides a Fourier series representation for a general clock pulse, and provides some insight into the frequency content of the excitation clock. The DC introduced by charge injection is a strong function of complex impedances around the UFD module. Signals which stimulate the UFD module may also play a role in the DC offset, depending on the clock signal's Fourier signature.

Clock pulse train $V_C(t)$ may be represented by a Fourier series as follows:

$$V_C(t) = \frac{V_{cp}T_A}{4} + \sum_{n=1}^{\infty} 2V_{cp}\left(\frac{\sin(n\pi T_A/2)}{n\pi}\right)\left(\cos\left(\frac{2n\pi t}{T_S}\right)\right) \quad \text{Eq. 42}$$

Figure 77A:
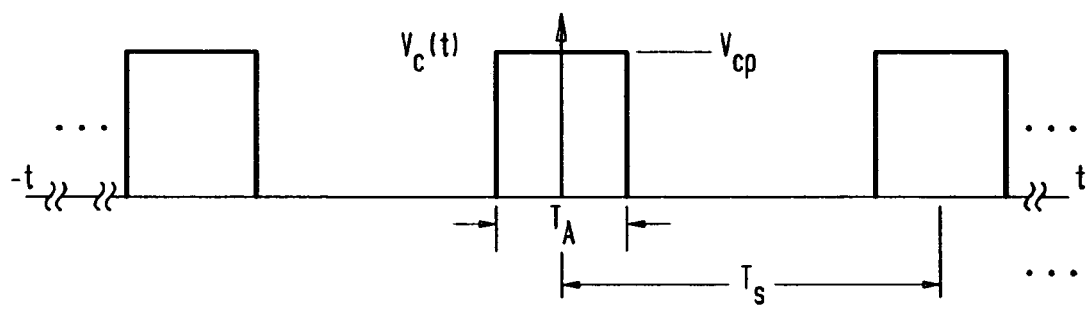
FIG. 77A illustrates an example clock pulse train.

An ideal rectangular clock pulse is illustrated in FIG. 77A, with zero rise and fall time. This may be considered to be a worst case scenario. In reality the clock waveform will consist of a repeating pulse train with a basic pulse shape possessing finite, non-zero, rise, and fall times.

The calculated Fourier series for $V_C(t)$ is a well known result for sampling devices. AS $T_A$ decreases, the Fourier spectrum extends ever greater in the frequency domain with significant harmonics.

Figure 77B:
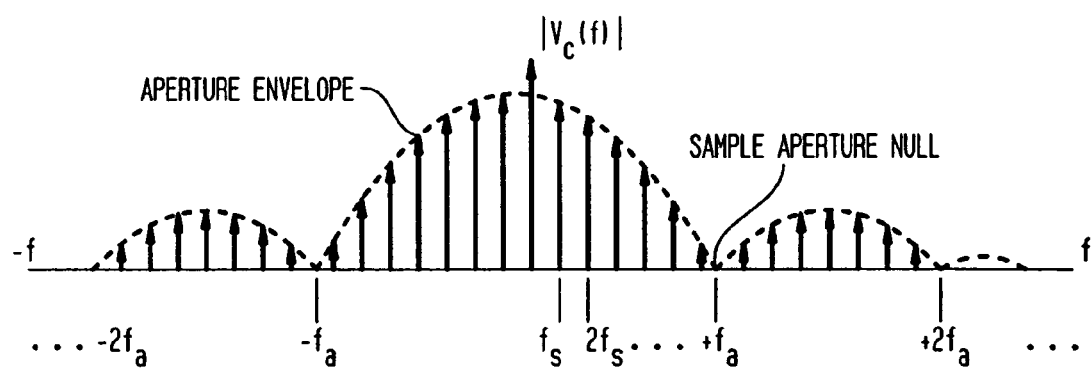
FIG. 77B illustrates an example clock frequency spectrum.

FIG. 77B illustrates that the, spectrum is a "picket fence" with harmonics separated by $f_S = T_S^{-1}$, and nulls at $N \cdot f_a$, where $f_a = T_A^{-1}$. Hence, the greater the value of ratio $T_S/T_A$, the greater the number of harmonics out to the first null, and the greater number of components, spectrally, which can excite the process parasitic at higher and higher frequencies.

A sequence of plots in FIGS. 79-83 and 86A illustrate this concept of clock waveform attributes and relationship to the DC offset.

Figure 78:
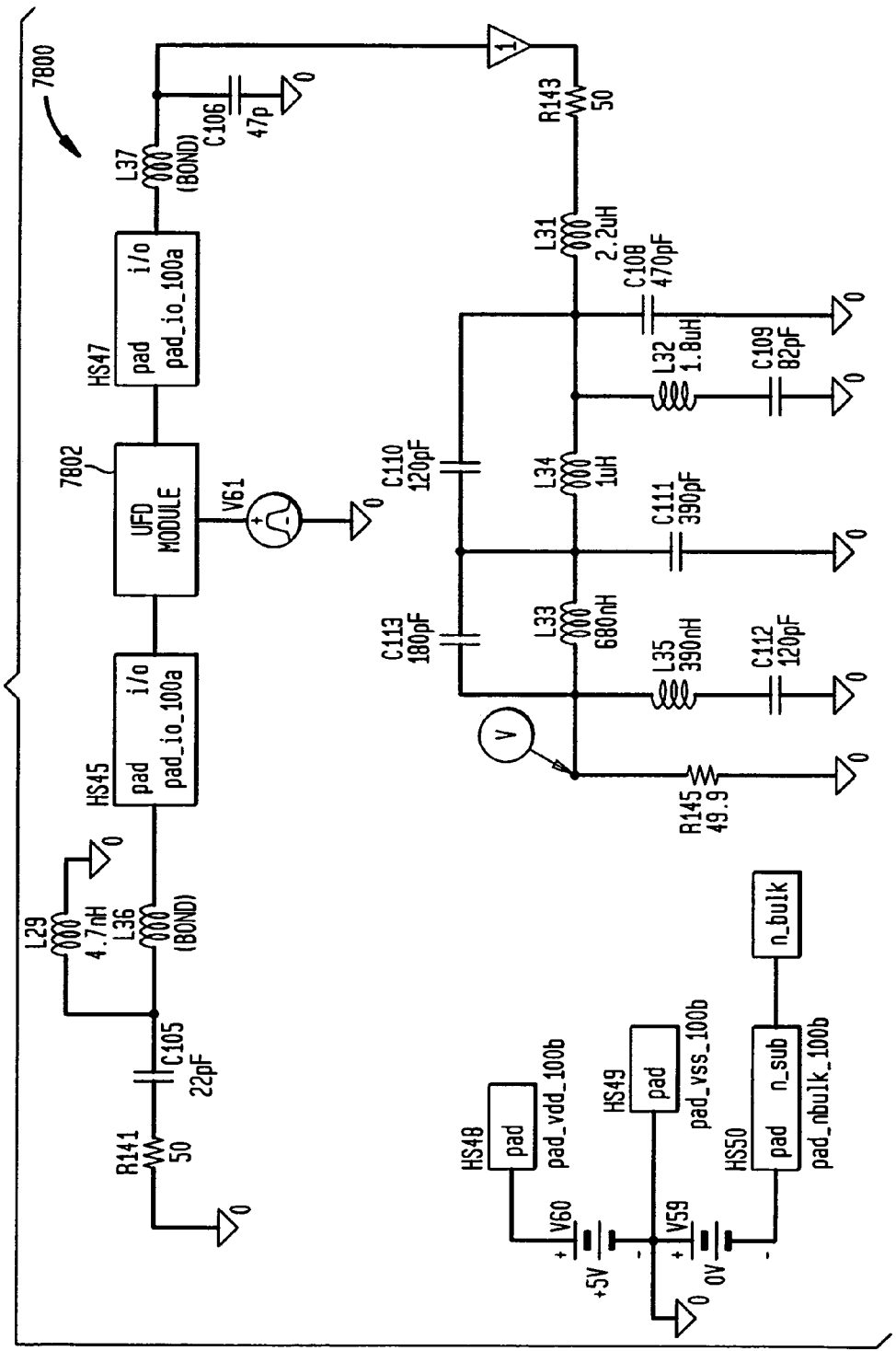
FIG. 78 illustrates a circuit diagram according to an embodiment of the present invention, which may be used to measure DC offsets.

FIG. 78 illustrates a down-conversion circuit 7800 used to determine DC offset due to charge injection, and possibly LO feed through, according to an embodiment of the present invention. Down-conversion circuit 7800 comprises a UFD module 7802. UFD module 7802 comprises a UFT module (not shown).

Figure 79:
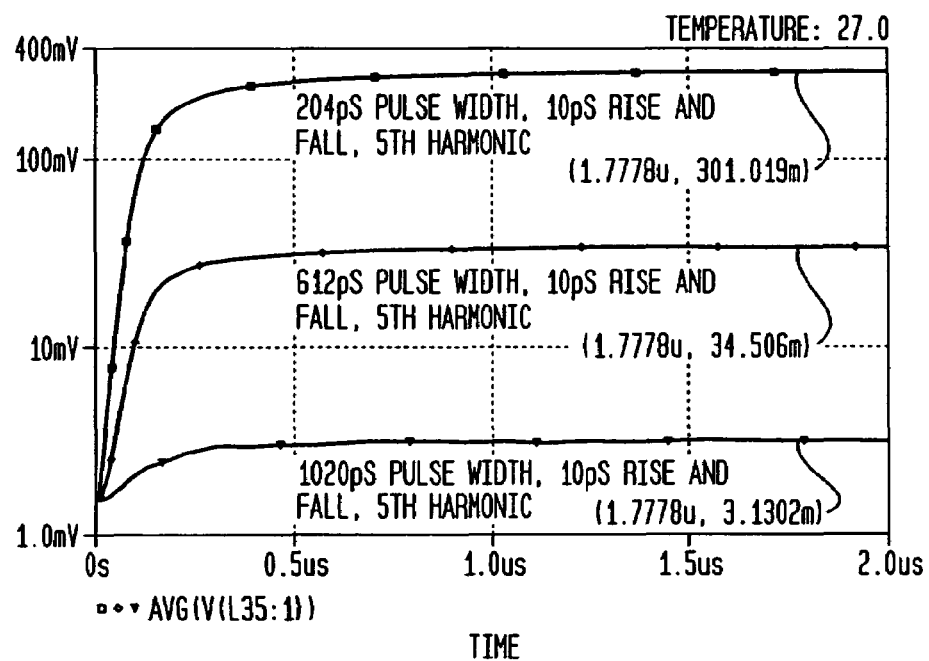
FIGS. 79 and 80 illustrate example output offset plots for the circuit diagram of FIG. 78, for a variety of clock signals.

FIG. 79 shows the offset obtained with 3 different clock pulse widths ($T_A$) for the circuit of FIG. 78. The clock is configured to operate on a 2.4-2.5 GHz band signal using a 5th harmonic technique. The clock for the offset plots of FIG. 79 was selected to down-convert 2.45 GHz.

Figure 80:
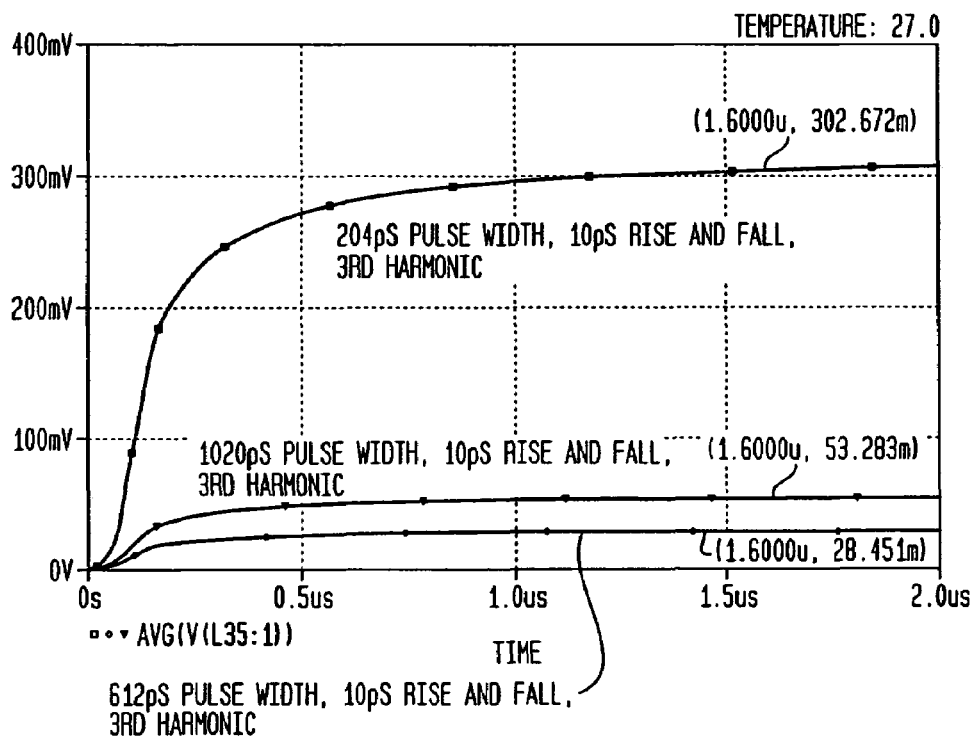

FIG. 79 shows that longer pulsewidths may produce lower CI related offsets. FIG. 80 illustrates a situation similar to that of FIG. 79 utilizing a 3rd harmonic clock approach. As shown in FIG. 80, reducing the clock frequency components did not continue to reduce $V_{OCI}$. This may be due in part to the surrounding complex impedances which will possess local resonances or favor certain Fourier spectrums.

Figure 81:
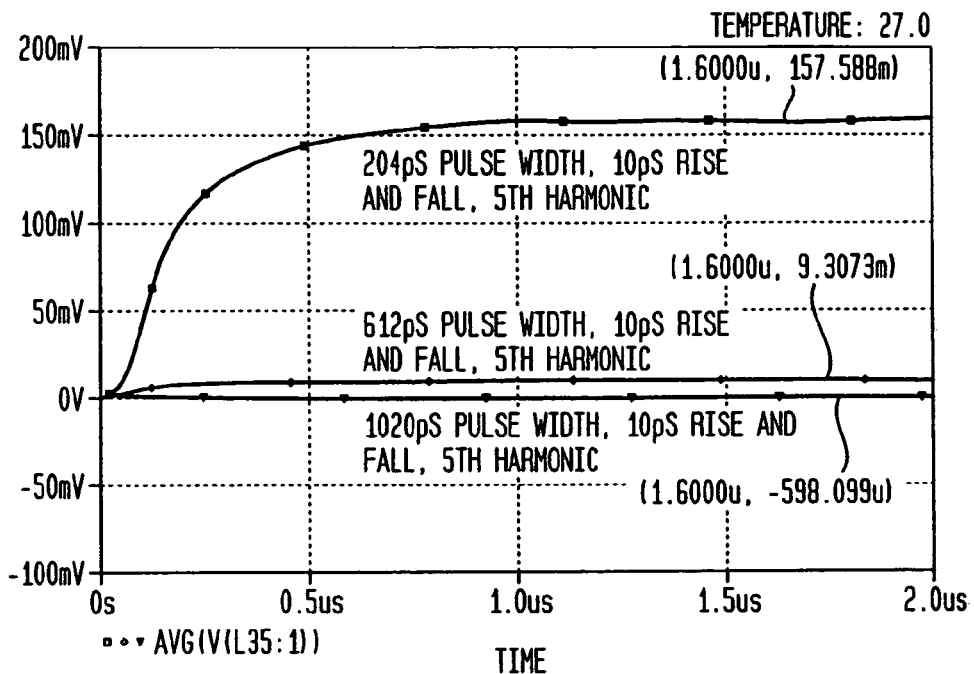
FIGS. 81 and 82 show example output offset plots obtained for the circuit model of FIG. 78, with variations in the bond wire inductance.

The circuitry surrounding UFD module 7802 may affect overall circuit performance. For example, FIG. 81 shows offsets obtained using slightly lower bond wire inductance. FIG. 81 illustrates how the results of FIG. 79 may be affected by these changes.

Figure 82:
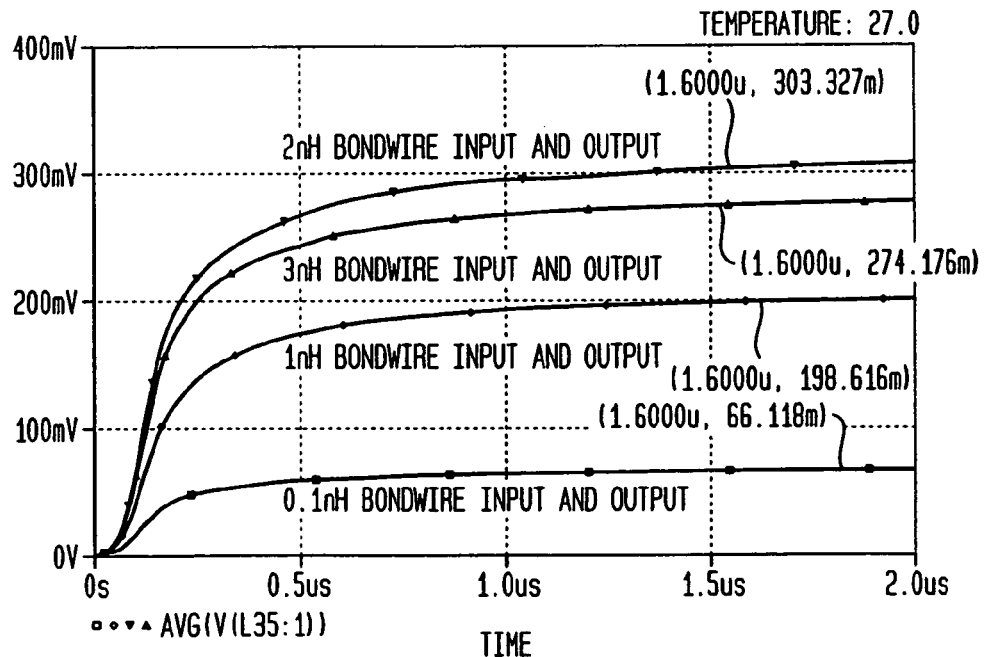

FIG. 82 illustrates the case of a fixed 204 ps $T_A$ with 10 ps rise and fall times, while permitting a variation in bond wire inductance. FIG. 82 indicates that lower inductance may be better in some situations.

Figure 83:
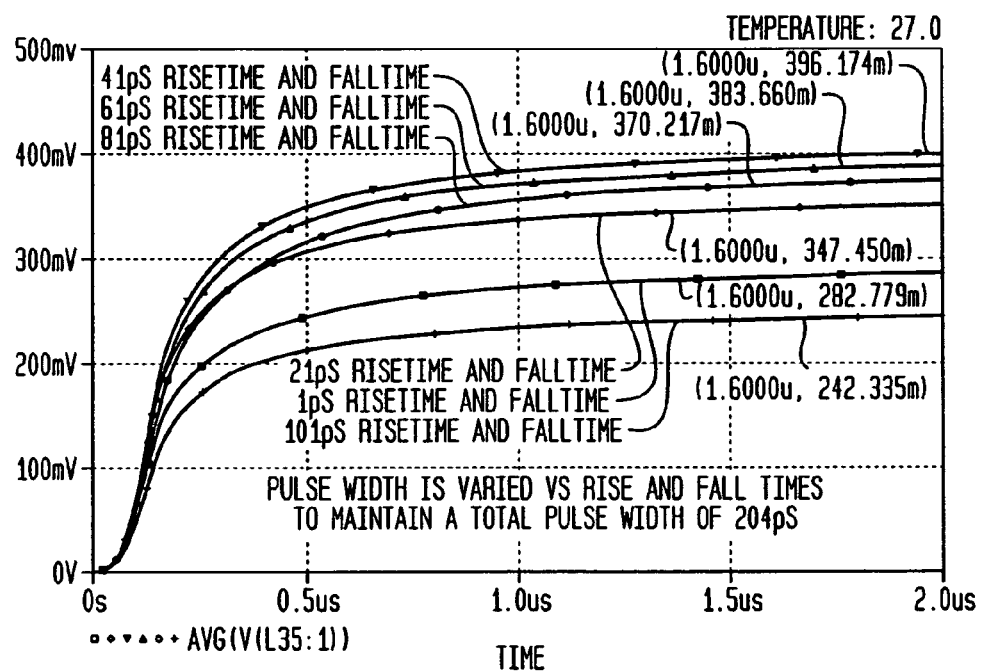
FIG. 83 illustrates example $V_{OCI}$ response for a variety of clock signal rise and fall times.
Figure 84A:
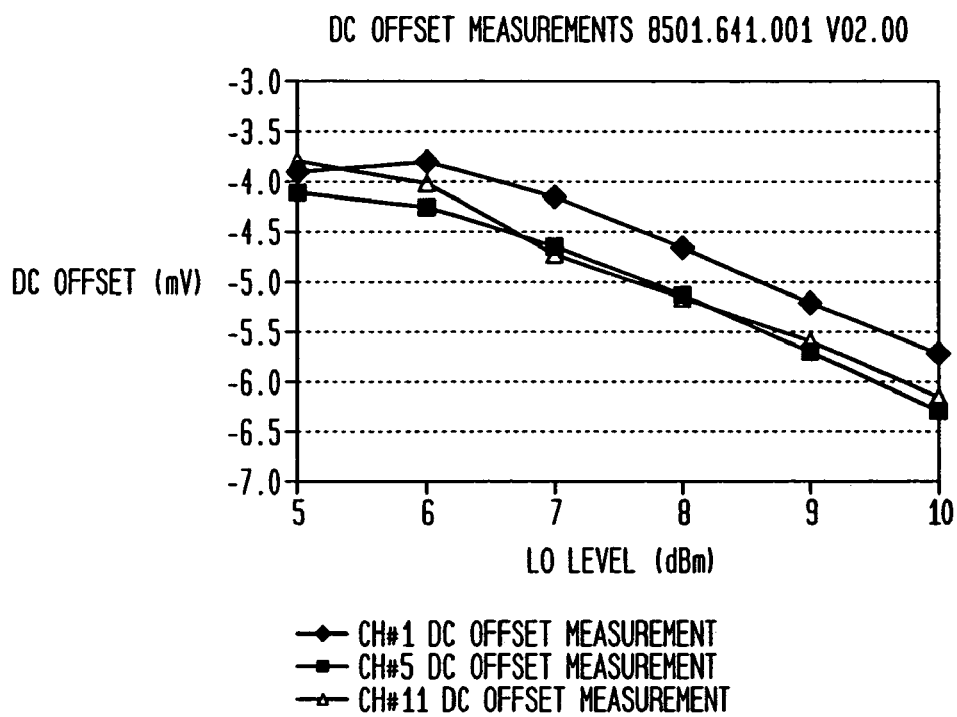
FIGS. 84A, 84B, 85A and 85B show the results on an I port of an I/Q receiver according to an embodiment of the present invention, for a variety of LO drive levels and 3 operating channels, for two different assemblies.
Figure 84B:
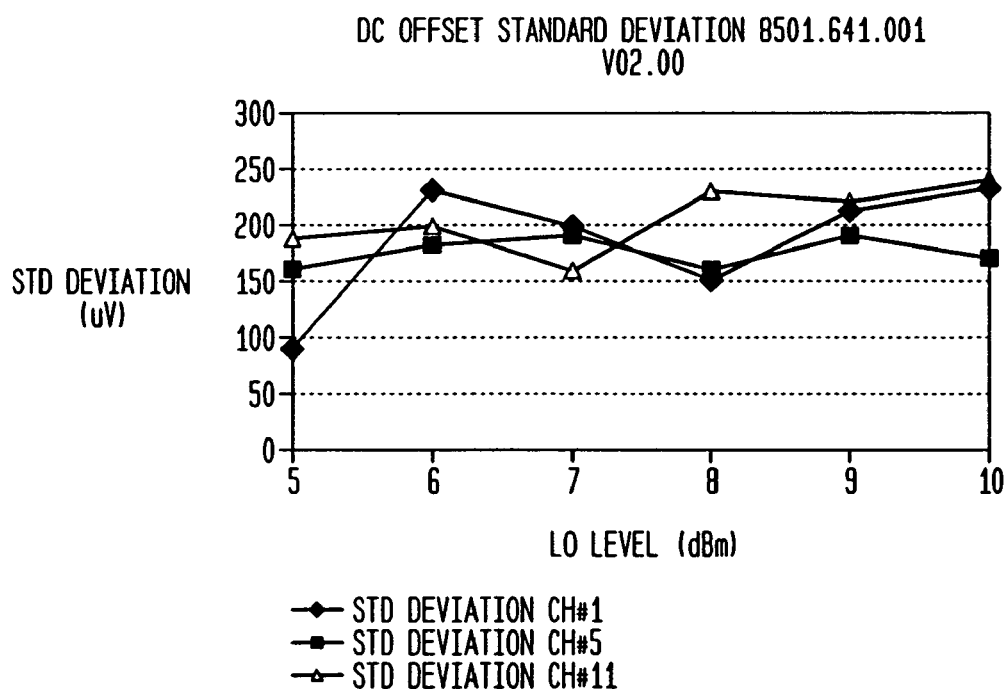
Figure 85A:
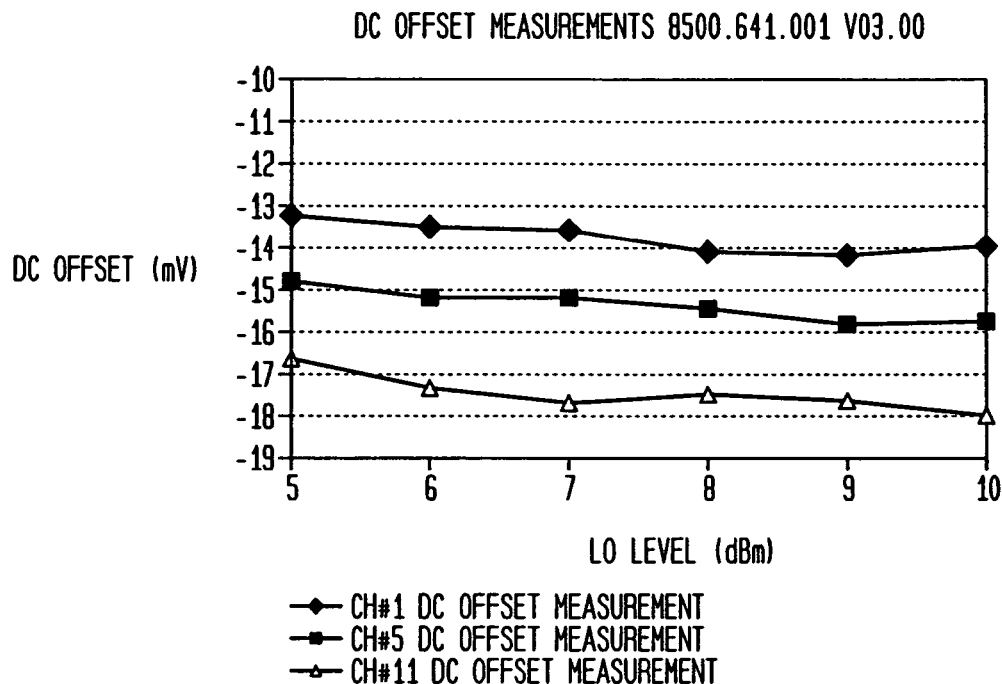
Figure 85B:
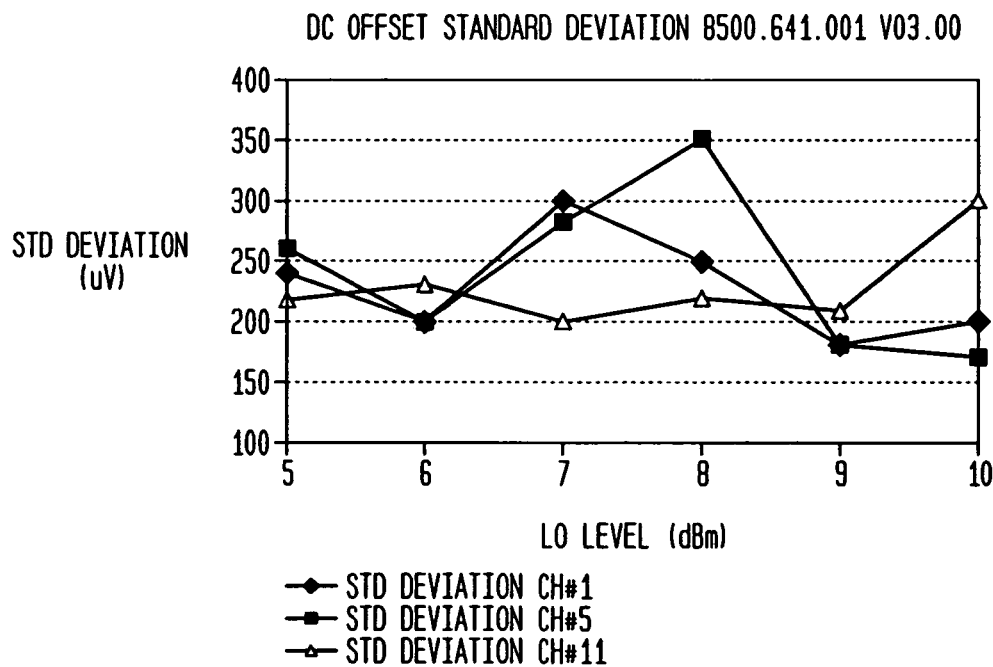

The previous plots related to cases with clock waveforms $V_C(t)$ possessing 10 ps rise and fall times. FIG. 83 illustrates the $V_{OCI}$ response for a variety of rise and fall times, 204 ps $T_A$, and 5th harmonic operation.

It is interesting to note that there are two local minima for the DC offset performance with fast rise times representing one of those cases. This implies resonance in the complex impedances surrounding (and including) UFD module 7802. Different circuit topologies will behave differently and different component types would operate differently due to their own parasitic elements. In addition, stretching to a 3× or 5× aperture would produce different results.

7.1.3.4 Bench Example

Experiments were conducted with hardware designed to operate in the 2.4 GHz ISM (industry, Scientific, and Medical) band. 5th harmonic mode was utilized for the clock, with the clock rate being varied between 482.4 MHZ and 492.4 MHZ. The UFD module configuration was an I/Q receiver with matching networks and DC coupling. The input to the I/Q assembly was terminated with 50Ω.

The charts shown in FIGS. 84A, 84B, 85A, and 85B record the results on the I port for a variety of LO drive levels and 3 operating channels, for two different assemblies: one with a clock port match and one without.

7.1.3.5 Complementary Architecture

Up to this point the UFD module cores have been based on a non-complimentary structure. Complementary structures can be used with the important advantage of lower UFD module losses and greater IP2, IP3 performance. In addition, some charge injection cancellation should be possible. The results in FIG. 86A correspond to results recorded in FIG. 79. Careful examination shows that there may be a 4. 25 dB reduction in CI induced DC offset possibly attributed either to the complementary UFD module architecture or the resulting modification to $Z_{UFDmodule}$.

7.1.3.6 Spreading Code Results

Sections 7.1.3 and 7.1.3.1 outline the concept of using a local PN code to reduce the DC offset generated at a UFD module, or created due to LO re-radiation recapture. Maximal length codes, balanced codes, and other related code types may be used. Furthermore, the statistical properties of a code may be tailored in the time domain or frequency domain to accomplish desired DC reduction while minimizing the impact to the desired signal.

Figure 86A:
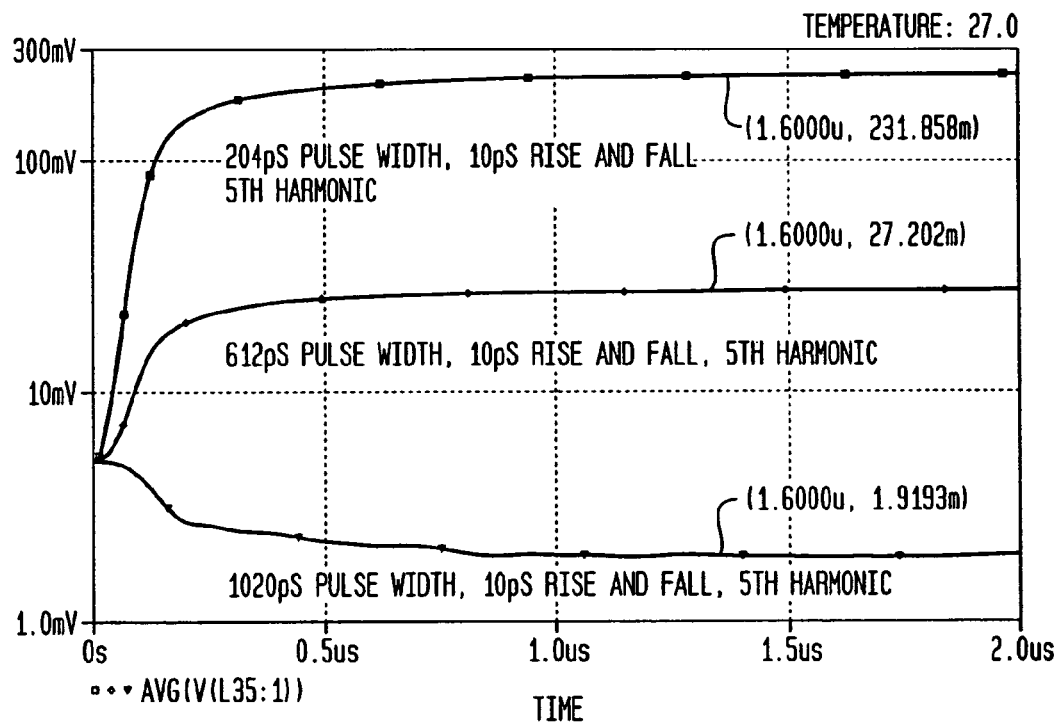
FIG. 86A illustrates example complimentary architecture output offset for a variety of clock signal pulse widths.
Figure 86B:
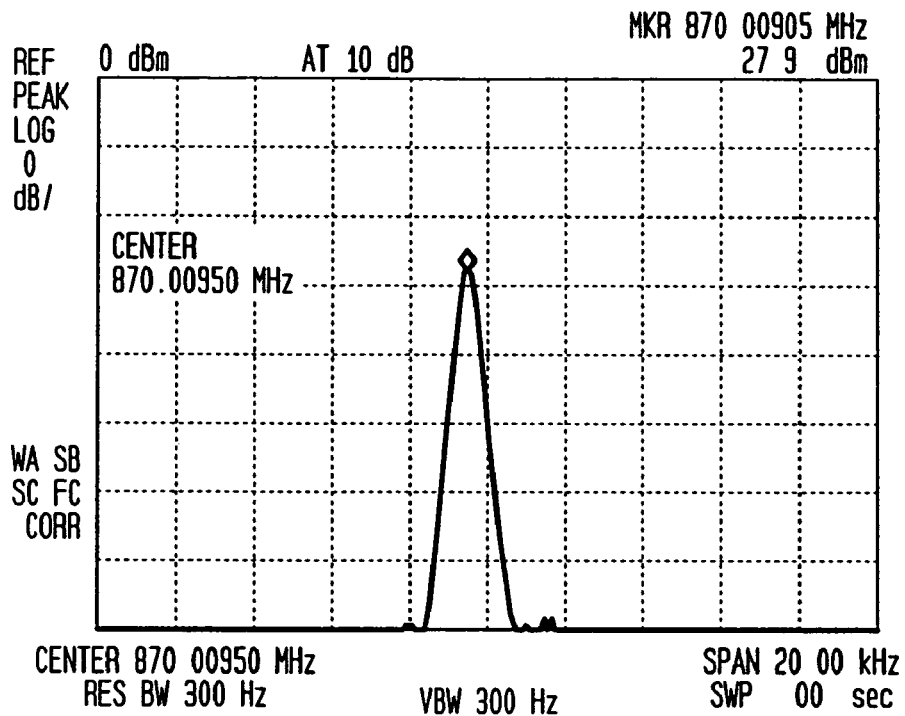
FIG. 86B shows an example spectral plot of a carrier tone at RF, corresponding to LO re-radiation at a UFD module.

Experiments have been accomplished with UFD module circuit embodiments to illustrate the potential of these techniques. FIG. 86B shows an example spectral plot of a carrier tone at RF, corresponding to LO re-radiation at a UFD module.

Figure 86C:
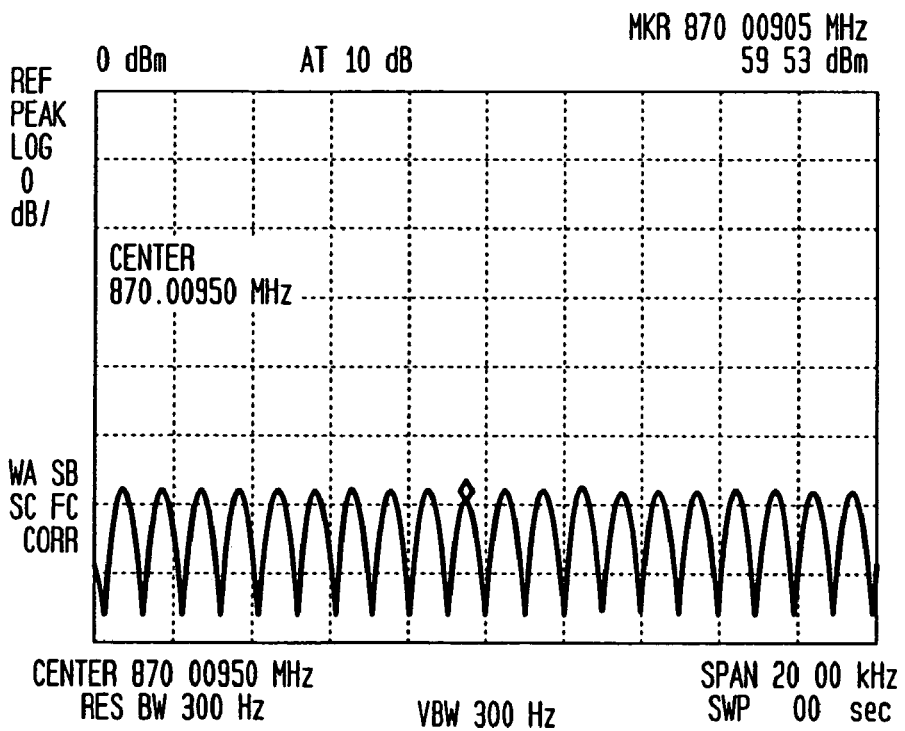
FIG. 86C illustrates the LO re-ration spectrum shown in FIG. 86B after modulation by an example modified maximal length linear PN sequence.

FIG. 86C illustrates the LO re-radiation spectrum shown in FIG. 86B after modulation by an example modified maximal length linear PN sequence. In this example, the power spectral density is substantially modified by the code. On average, the power spectral density has been lowered by approximately 32 dB. This benefit may not be completely obtained unless the specification desired for re-radiation is reference to the resolution bandwidth of the analyzer sweep. This is adjusted for wider bandwidth (faster) PN sequences with long repetition intervals. That is, the processing gain of interest here is the bandwidth expansion factor:

$$BW_E = \frac{BW_{pn}}{resBW_{spec}} \quad \text{Eq. 43}$$

-continued

Where:

$BW_E \triangleq$ Bandwidth expansion factor (unitless)

$BW_{pn} \triangleq$ Double Sided Bandwidth of PN Sequence $resBW_{spec} \triangleq$ Resolution bandwich for a particular re-radiation specification that is dictated by standards or regulatory agency.

Then:

$$P_{BW} = 10 \log_{10}(BW_E) \text{ dB} \qquad \text{Eq. 44}$$

$P_{BW}$ is the effective processing gain due to LO bandwidth expansion factor alone, that is attained by using a special sequence at a UFD module clock port superposed on the clock. To some extent, $BW_{pn}$ can be adjusted for a desired effect, although there may be other practical, system constraints.

As predicted by equations in section 7.1.3, the DC offset at a UFD module output maybe canceled using a special sequence, its correlation properties, and its effective system processing gain.

Figure 86D:
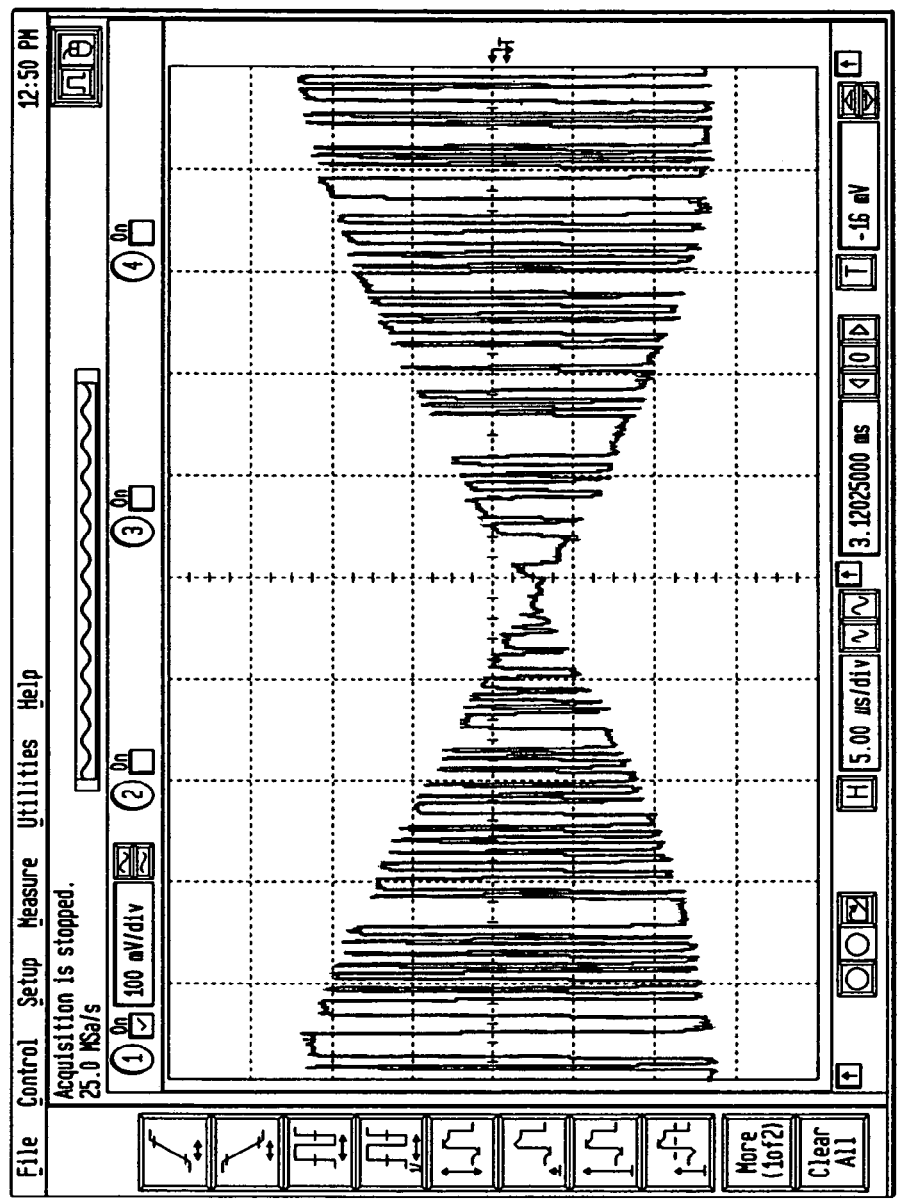
FIG. 86D shows an example PN modulated output of a UFD module.

FIG. 86D shows an example PN modulated output of a UFD module configured to receive a 870 MHZ RF signal with a slight carrier frequency offset. A beat note represents the slight carrier offset (envelope of the baseband). In addition, the PN code impressed on the received signal by the special UFD module clock signal is visible.

Figure 86E:
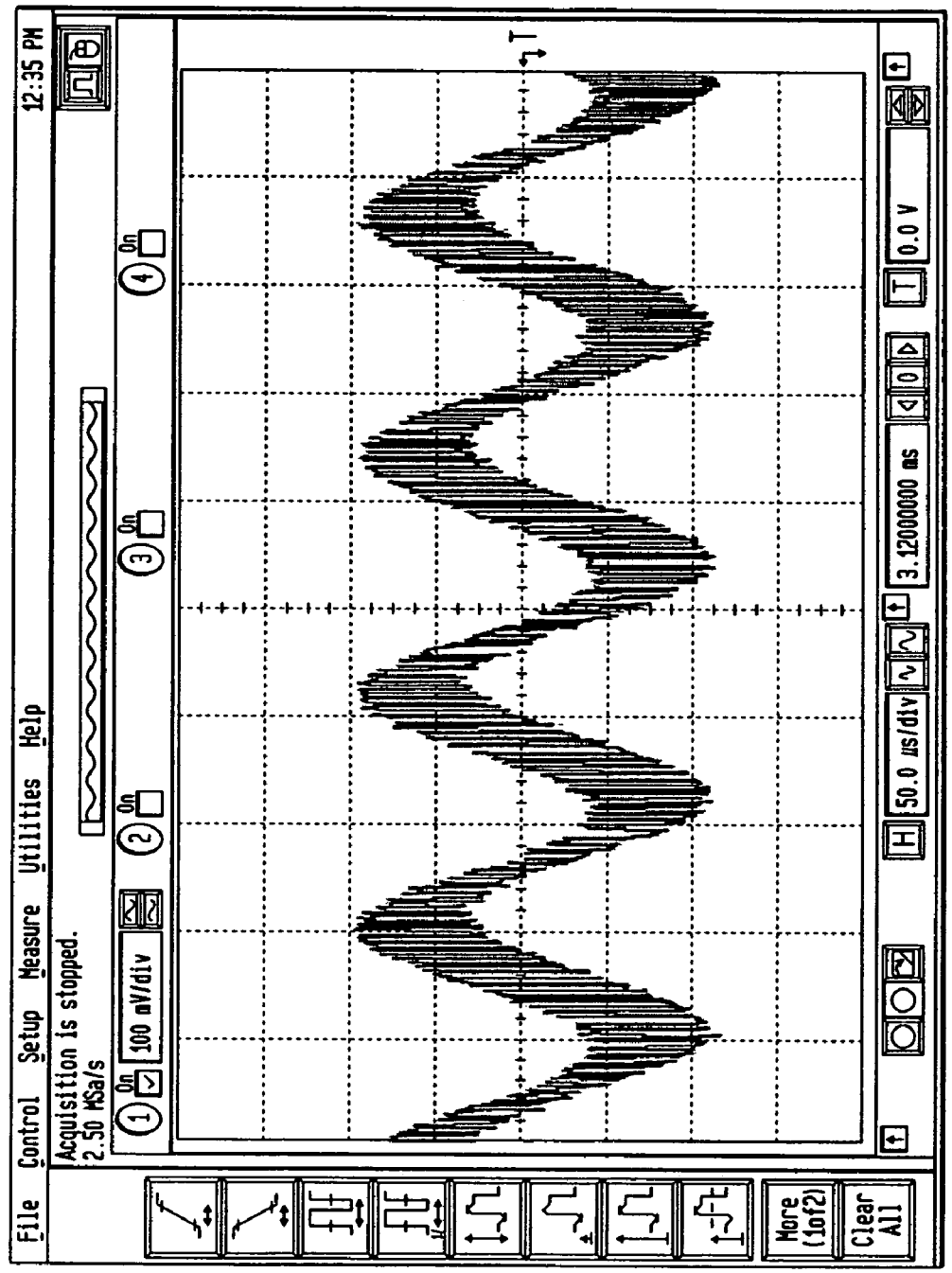
FIG. 86E illustrates the result of FIG. 86D after PN rectification or correlation.
Figure 86F:
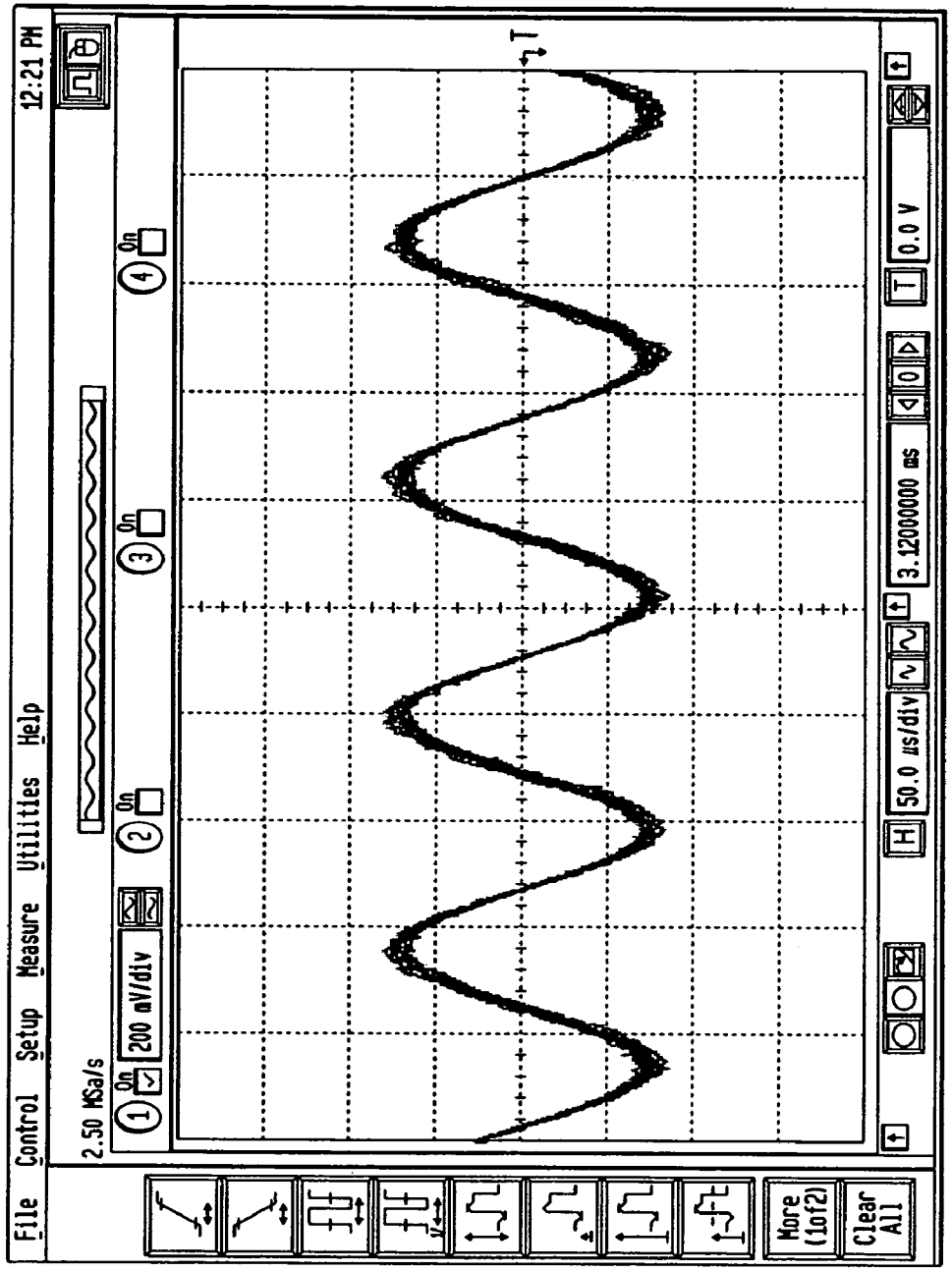
FIG. 86F illustrates the result of FIG. 86E after low pass filtering to recover the baseband beat note.

The signal illustrated in FIG. 86D possesses substantial DC offset. FIG. 86E illustrates the result after PN rectification or correlation. The DC offset produces a PN code summed to the desired signal while the balanced PN modulation envelope is removed by correlation. The power in the remaining summed PN signal is directly proportional to the original UFD module DC offset plus all system offsets thereafter up to the post-correlator. The bandwidth of this ancillary PN code power is substantially wider than the bandwidth of the baseband signal by design. Hence, the post filter (sometimes a baseband matched filter) can remove much of the variance of the PN sequence. FIG. 86F illustrates the low pass output to recover the baseband beat note.

A goal is to choose an effective system processing gain $PG_{sys}$, which is high enough to drive significant variance from the low pass result. $PG_{sys}$ is defined as follows:

$$PG_{sys} \triangleq 10 \log_{10} \frac{(BW_{pn}/2)}{BW_{MF}} \qquad \text{Eq. 45}$$

$BW_{pn} \triangleq$ Double Sided PN Code Bandwidth $BW_{MF} \triangleq$ BB Filter Bandwidth The example run in the lab utilized a 10 kHz baseband signal bandwidth and a spreading rate of 5 MHz. In addition, the code was modified as an RZ type. This technique may not provide all of the DC cancellation required but can be a powerful tool for many applications.

7.1.4 UFD Module DC Offsets from Non-Linearities

Because the UFD module is at least a conversion device, an intercept point will determine output waveform integrity to a large extent. Two tone $2^{nd}$ order intercept and two tone $3^{rd}$ order intercept points are important. In particular, the two tone second order intercept point, $IP2_{IN}$, relates to DC offset. As the input begins to approach the UFD module rails, harmonic spectrums are generated in the signal path. Because the UFD module clock may excite harmonics, each harmonic spectrum may down-convert to DC, adding some DC offset. Because the phases of the down-conversion harmonics generally are complicated, the resulting DC offset may be non-systematic, even though the process is predictable by using complex math.

FIG. 86G illustrates an exemplary signal input harmonic spectrum and conversion clock harmonic spectrum. The harmonic spectrums for the input signal at $f_2$ and $f_3$ become more significant as the UFD module is pushed harder on its input.

Another concept useful in considering the $IP2_{IN}$ mechanism comes from a different view on the frequency doubling phenomena. Frequency doubling occurs in a square law device. Hence, for the $2^{nd}$ order term, the non-linearity from the UFD module output may be approximated by;

$$(\tilde{A}(t)\cos(\omega_0 t + \Phi(t)))^2 = \tfrac{1}{2}\tilde{A}(t)_2(1+\cos(2\omega_0 t + 2\Phi(t))) \qquad \text{Eq. 46}$$

$\tilde{A}(t) \triangleq$ Amplitude Domain Modulation $\Phi(t) \triangleq$ Phase Domain Modulation $\tilde{A}(t)$ could represent the complex envelope of modulation from information impressed on the carrier (as well as noise). Likewise, $\Phi(t)$ could contain information modulated onto the carrier as well as phase noise. The above equation illustrates that the 2× frequency component can be formed from the non-linearity but that $\tilde{A}(t)^2$ is also formed. The equation indicates that a DC component results from the squared envelope. This DC component is not desirable. Likewise, higher order inter-modulation can contribute to the problem, particularly even order terms.

In general, the output voltage of a non-linear system can be expanded in terms of its input voltage by a power series of the form shown in FIG. 86H. Usually it is difficult to predict $k_1$, $k_2$ ... precisely. Extending properties of linear systems to non-linear system descriptions permits another useful and more general equation:

$$y_n(t) = \int_{-\infty}^{\infty} \ldots \int k_n(u_1, u_2, \ldots u_n) X(t - u_1) \qquad \text{Eq. 47}$$
$$X(t-u_2) \ldots X(t-u_n du_1, du_2 \ldots du_n)$$

where $y_n(t)$ is the system output and $X(t)$ is the system input. This is the so called nth order impulse response for the system, found by an n-fold convolution kernel. FIG. 86I shows a block diagram representation of this system.

$y_1(t)$ is the desired linear impulse response of the system. $y_2(t)$ is the two-dimensional system convolution involving $X(t)$. $y_3(t)$ is the three-dimensional convolution of $X(t)$ and the impulse response $h_3(u_1, u_2, u_3)$, etc. This is known as the Volterra functional series representation of a system. For weak non-linearities, the first 3 terms of the series may provide enough information to characterize a system. This is the case for many communications systems.

Such nth order analysis in practice is often complex and tedious, yielding only a general feel for the expected result, unless circuit and network models are extraordinarily accurate. Nevertheless, in the approximation, the $2^{nd}$ order term relating to the two tone $2^{nd}$ order input intercept ($IP2_{IN}$) is one useful metric for measuring down-conversion linearity. Essentially, the DC offset from $IP2_{IN}$ is bounded at the upper end by the power of the $2^{nd}$ order harmonic.

For instance, suppose that it is desired to suppress the power of the $2^{nd}$ order term by 20 dB in a direct down-conversion device (no interference present). If the highest expected input RF signal of interest is −25 dBm, the system will require an input intercept ($IP2_{IN}$) of −5 dBm. This establishes a signal-to-DC offset ratio of at least 20 dB due to the $2^{nd}$ order non linearity.

Now consider the case where other unwanted signals are present at the input to the non-linearity along with the signal of interest. Suppose the RF signal is at a level of −101 dBm, while the interference tone is a level of −30 dBm. Furthermore, assume that the system noise floor is near enough to −101 under linear conditions such that we desire an additional 10 dB margin on any $2^{nd}$ order non-linearity folded back in band, so that our benchmark at 101 dBm is not affected.

$$IP2_{IN}=(-30+111)-30=51dB \qquad \text{Eq. 48}$$

Therefore, $IP2_{IN}$ can become a significant specification when an interference or blocking tone is considered, and unfiltered due to a zero IF architecture.

This type of non-linear effect is dependent on input signal power to a great extent. Because the phenomenon is based on even-order intermods, differential design can cancel a significant portion of the difficulty, but imbalance may not remove it all. For instance, suppose that the input to the UFD module is at −15 dBm due to an LNA in front of the down-conversion. Suppose this is an interfering tone. Also, assume a 1KΩ baseband operating impedance and a 12 dB UFD module conversion loss. The suppression of the $IP2_{IN}$ at the UFD module output is then:

$$DC(IP2) \leq -15-12-8 \qquad \text{Eq. 49}$$

If the desired suppression is 81 dB, the output offset into 1KΩ is less than 0.126 mV due to $2^{nd}$ order non linearities. This may be accommodated with an op amp circuit, for example. If a differential architecture is assumed, then arguably this signal can be processed in terms of common mode range.

In fact, in embodiments a UFD module with $IP2_{IN}$ of +40 dBm could be tolerated if 10 dB of cancellation is available from a differential architecture. Differential architectures may extend as great as a 30 dB benefit, for example, without special trimming.

7.2 Example Embodiments to Address DC Offset and Re-radiation Problems

Section 7.1 above discussed problems related to DC offset and re-radiation that occur during and after the down-conversion process, and were provided for illustrative purposes, and are not limiting. Embodiments were as provided for reducing or eliminating unwanted DC offset and re-radiation using techniques of spectral spreading followed by de-spreading, according to the present invention. Various embodiments related to the problems, method(s), and structure(s) described above are presented in this section (and its subsections). In particular, further applications of the UFT module are provided below in circuit configurations that reduce or eliminate problems of DC offset and re-radiation.

These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

7.2.1 DC Offset

Exemplary embodiments are provided below for reducing or eliminating unwanted DC offset voltages. These unwanted DC offset voltages include unwanted DC offset voltages created by any source, including non-ideal circuit component operation, re-radiation recapture, local circuit signals traveling or radiating to other circuit sections, etc. The embodiments provided below are not limited to this use, but may have additional applications. For example, these embodiments may be applicable to reducing or eliminating unwanted circuit re-radiation.

7.2.1.1 Reducing DC Offset by Spectral Spreading and De-Spreading

Embodiments for reducing DC offset by spectral spreading and de-spreading, as described above, are further described in the following sub-sections, and additional related embodiments are presented.

7.2.1.1.1 Conventional Wireless Communications Receiver

Figure 87:
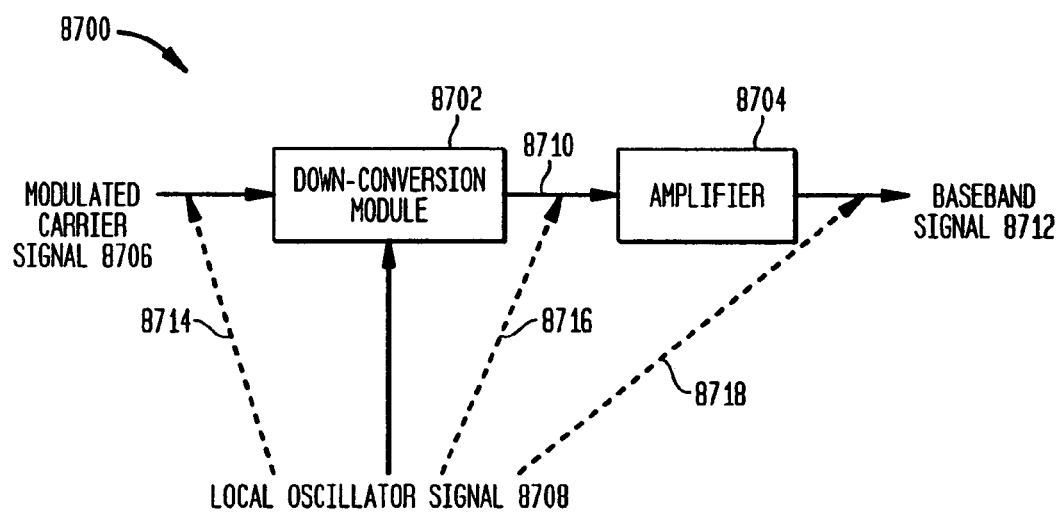
FIG. 87 shows a conventional wireless communications down-conversion system.

FIG. 87 shows an example conventional wireless communications down-conversion system 8700. Down-conversion system 8700 comprises a down-conversion module 8702 and an amplifier 8704. Down-conversion module 8702 typically comprises a super-heterodyne receiver. Down-conversion module 8702 may comprise multiple down-conversion stages. Amplifier 8704 may comprise an amplifier, a filter, other signal processing component(s), or any combination thereof.

Down-conversion module 8702 down-converts a modulated carrier signal 8706, according to at least one local oscillator signal 8708, to a down-converted baseband signal 8710.

Down-converted baseband signal 8710 is input to amplifier 8704. Amplifier 8704 amplifies, filters, and/or otherwise processes down-converted signal 8710, and outputs baseband signal 8712.

As described above, and shown in FIG. 87, DC offsets due to local oscillator signal 8708 may be input to the signal path at several points, with some possible points indicated by charge leakage and charge injection paths 8714, 8716, and 8718. As described above, charge leakage and charge injection are well known effects. These DC offsets disadvantageously affect at least the dynamic range and accuracy of baseband signal 8712. For instance, adding a significant DC offset to baseband signal 8712 may cause the output of subsequent amplifiers in the baseband signal path to approach the level of their power supplies, potentially causing the amplifiers to rail or become non-linear.

7.2.1.1.2 Spread/De-spread Receiver Embodiments of the Present Invention

An embodiment of the present invention addresses undesired DC offsets described above by modifying the local oscillator in such a manner that offsets are randomized and spectrally spread. This pseudo-random local oscillator signal is used to down-convert an input signal, such as a modulated carrier signal, and spread the spectrum of the down-converted signal. After some amount of amplification, filtering, and/or other optional processing, the randomized down-converted signal may be spectrally de-spread to a baseband signal. Because the down-converted signal is spectrally de-spread, offsets are spectrally spread. At least some of the offset, particularly the offset due to local oscillator re-radiation, is reduced or removed from the resulting baseband signal. The offset is spread over a frequency range.

Figure 88A:
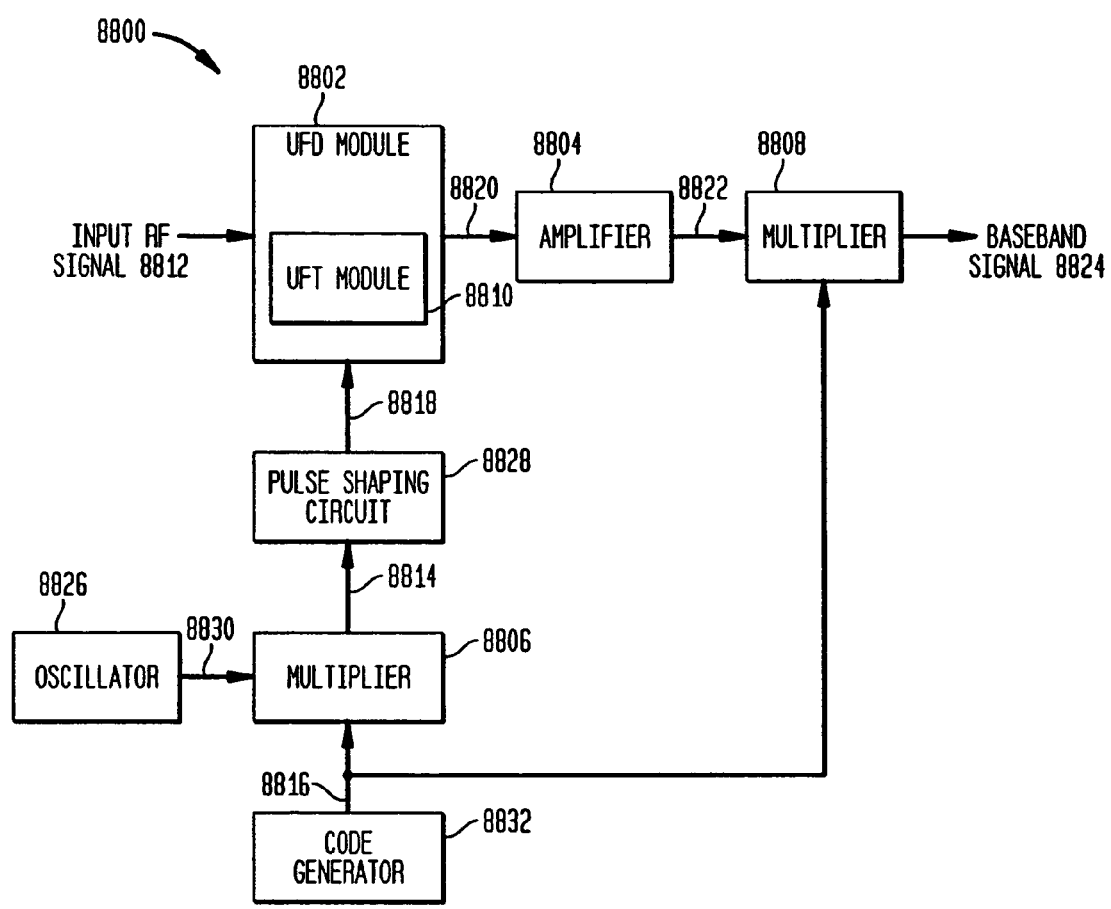
FIG. 88A shows an exemplary down-conversion system that reduces output DC offset, according to an embodiment of the present invention.

FIG. 88A shows an exemplary spreader/de-spreader down-conversion system 8800, according to an embodiment of the present invention. Spreader/de-spreader down-converter system 8800 comprises a UFD module 8802, an amplifier 8804, a first multiplier 8806, a second multiplier 8808, an oscillator 8826, a pulse shaping circuit 8828, and a code generator 8832. UFD module 8802 comprises at least one UFT module. Amplifier 8804 may introduce an unwanted DC offset voltage onto a signal being down-converted by system 8800. Spreader/de-spreader down-conversion system 8800 operates to reduce or eliminate this unwanted DC offset voltage.

Oscillator 8826 outputs oscillating signal 8830. FIG. 88C shows an example waveform for oscillating signal 8830. Oscillating signal 8830 is preferably a periodic sine wave, but maybe other periodic signal waveforms such as square wave, triangle wave, ramp wave, and other waveforms.

Code generator 8832 outputs coded sequence signal 8816. Coded sequence signal 8816 is preferably a signal coded according to a pseudo-random code sequence. For example, acceptable pseudo-random coding includes PN coding. Other applicable code schemes such as are also within the scope of the present invention, such as square waves and Manchester encoding. FIG. 88D shows at least a portion of an example coded sequence signal 8816.

First multiplier 8806 receives oscillating signal 8830 and coded sequence signal 8816. First multiplier 8806 multiplies oscillating signal 8830 and coded sequence signal 8816, and outputs a coded oscillating signal 8814. Coded oscillating signal 8814 comprises at least some cycles of oscillating signal 8830 modified (or spread or coded) according to coded sequence signal 8816. FIG. 88E shows an example waveform for coded oscillating signal 8814.

In a preferred embodiment, when coded sequence signal 8816 is a "high" signal and/or represents a "1", the phase of corresponding cycle(s) of oscillating signal 8830 are not modified, and when coded sequence signal 8816 is a "low" signal and/or represents a "0" or a "−1", the phase of corresponding cycle(s) of coded oscillating signal 8814 are shifted 180 degrees. For example, as shown in FIG. 88H, in the time that occurs prior to time line 8834, coded sequence signal 8816 is high, and hence coded oscillating signal 8814 is essentially equal to oscillating signal 8830. In the time occurring between time lines 8834 and 8836, coded sequence signal 8816 is low, and hence coded oscillating signal 8814 is essentially equal to oscillating signal 8830 with its phase shifted by 180 degrees.

Pulse-shaping circuit 8828 inputs coded oscillating signal 8814. The output of pulse-shaping circuit 8828 is a coded control signal 8818, which preferably Comprises a string of pulses. Coded control signal 8818 comprises at least some pulses that are modified (or spread or coded) according to coded sequence signal 8816. FIG. 88F shows an example waveform for coded control signal 8818. Pulse-shaping circuit 8828 controls the pulse width of pulses of coded control signal 8818.

UFD module 8802 receives an input RF signal 8812 (although it could be an unmodulated signal) and coded control signal 8818. FIG. 88B shows an example waveform for input RF signal 8812. UFD module 8802 frequency down-converts and spectrally spreads input RF signal 8812 to down-converted spread spectrum signal 8820, according to coded control signal 8818. FIG. 88G shows an example waveform for down-converted spread spectrum signal 8820.

For example, FIG. 88F shows an embodiment where coded control signal 8818 is PN coded. For a positive PN code chip (for example, prior to time line 8834), the input RF signal 8812 is effectively down-converted to down-converted spread spectrums signal 8820 in a normal, non-inverted fashion. For a negative PN code chip (for example, between time lines 8834 and 8836), the phase of one or more cycles of coded control signal 8818 are shifted by 180 degrees, and therefore the opposite phase of input RF signal 8812 is sampled. Hence, for a negative PN code chip, a segment of input RF signal 8812 is effectively inverted and down-converted to down-converted spread spectrum signal 8820.

Down-converted spread spectrum signal 8820 is optionally amplified and/or otherwise processed by amplifier 8804 (or other circuitry or processing modules), and a processed down-converted spread spectrum signal 8822 results.

Unwanted DC offset may be summed into down-converted spread spectrum signal 8820 during and after down-conversion and spectral spreading, and during and after processing by amplifier 8804.

Second multiplier 8808 receives coded sequence signal 8816 and processed down-converted spread spectrum signal 8822. Second multiplier 8808 multiplies coded sequence signal 8816 and amplified down-converted spread spectrum signal 8822. Down-converted spread spectrum signal 8822 is spectrally de-spread in second multiplier 8808, and signal 8824 is output. FIG. 88H shows an example waveform for signal 8824. The unwanted DC offset is spectrally spread in second multiplier 8808, reducing or removing the offset from baseband signal 8822. Baseband signal 8822 may be a baseband information signal, or may be an intermediate frequency (IF) signal.

For example, in an embodiment using PN coding, for a positive PN code chip, amplified down-converted spread spectrum signal 8822 is multiplied by 1 (not inverted) in second multiplier 8808. For a negative PN code chip, the amplified down-converted spread spectrum signal 8822 is multiplied by −1 (inverted). In this manner down-converted spread spectrum signal 8822 is spectrally de-spread.

FIG. 88H shows a pulse 8838 in the example waveform of baseband signal 8824. Pulse 8838 may result from the phase shift of coded oscillating signal 8814 in multiplier 8806 causing a delay between edges of coded sequence signal 8816 and down-converted spread spectrum signal 8820. In preferred embodiments, each chip or pulse of control signal 8816 may be equal in length to a substantial number of cycles of oscillating signal 8830, potentially in the hundreds or greater (the example of FIG. 88H does not show this). Because of this, pulse 8838 will occur relatively infrequently on baseband signal 8824, is of high frequency relative to baseband signal 8824, and hence may be filtered out of baseband signal 8824 by a conventional filter.

Although only a single down-conversion channel is illustrated in the example embodiment of FIG. 88A, the present invention may be extended to two or more channel embodiments, including I/Q modulation system embodiments. The spreading sequence, spreading rate, and sequence length may be selected according to the signaling scheme, data rate, and other factors, as would be apparent to persons skilled in the relevant art(s) from the teachings contained herein. Furthermore, the present invention is applicable to conventional down-converter embodiments, such as shown in FIG. 89.

Figure 89:
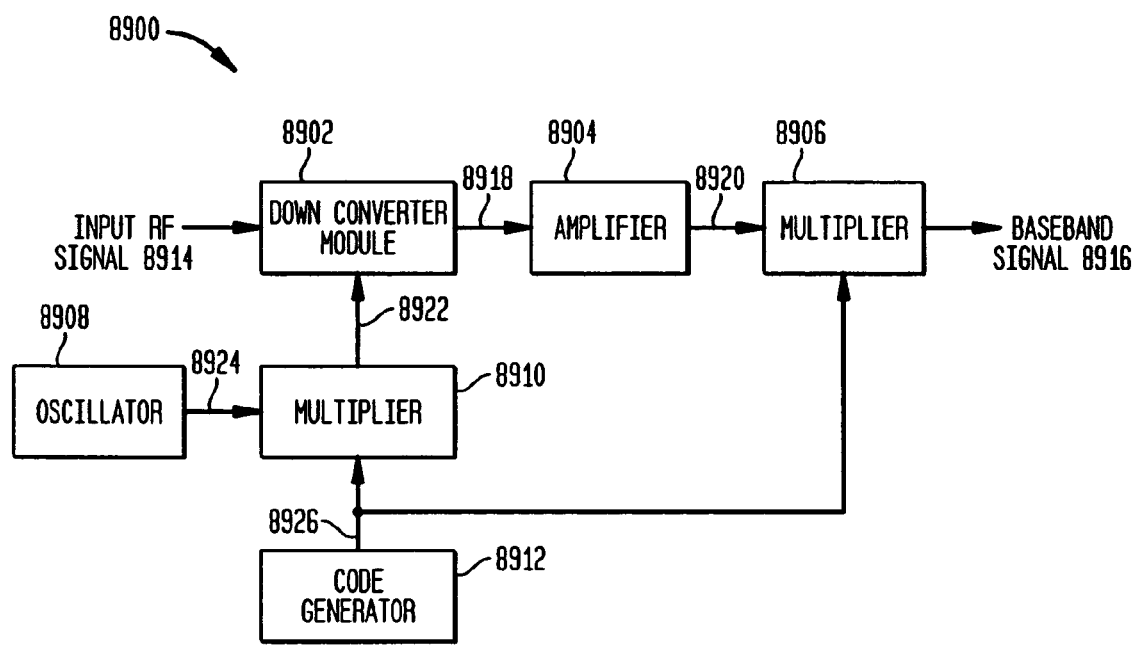
FIG. 89 shows an exemplary down-conversion system that reduces output DC offset, according to an embodiment of the present invention.

FIG. 108 depicts a flowchart 10800 that illustrates operational steps corresponding to the structures of FIGS. 88A and 89, for down-converting and spectrally spreading an input signal, according to an embodiment of the present invention. The invention is not limited to this operational description.

Rather, it will be apparent to persons skilled in the relevant art(s) from the teachings herein that other operational control flows are within the scope and spirit of the present invention. In the following discussion, the steps in FIG. 108 will be described.

In step 10802, an input signal is down-converted. In embodiments, the input signal is down-converted with a universal frequency down-conversion module according to a coded control signal.

In step 10804, the down-converted input signal is spectrally spread to a down-converted spread spectrum signal. In embodiments, step 10804 may be at least partially integral with step 10802.

In step 10806, the down-converted spread spectrum signal is processed. For instance, the down-converted spread spectrum signal may be amplified, filtered, or otherwise processed, as further described above. Furthermore, a DC offset voltage may be summed with the down-converted spread spectrum signal, as described further above.

In step 10808, the down-converted spread spectrum signal is spectrally de-spread to a baseband signal. The down-converted spread spectrum signal is multiplied with a code used to code the control signal. Furthermore, during this step, the DC offset voltage is spectrally spread, as further described above.

For illustrative purposes, the operation of the invention is often represented by flowcharts, such as flowchart 10800 in FIG. 108. It should be understood, however, that the use of flowcharts is for illustrative purposes only, and is not limiting. For example, the invention is not limited to the operational embodiment(s) represented by the flowcharts. Instead, alternative operational embodiments will be apparent to persons skilled in the relevant art(s) based on the discussion contained herein. Also the use of flowcharts should not be interpreted as limiting the invention to discrete or digital operation. In practice, as will be appreciated by persons skilled in the relevant art(s) based on the herein discussion, the invention can be achieved via discrete or continuous operation, or a combination thereof. Further, the flow of control represented by the flowcharts is provided for illustrative purposes only. Steps may occur in a different order than shown. Furthermore, as will be appreciated by persons skilled in the relevant art(s), other operational control flows are within the scope and spirit of the present invention.

7.2.1.3 Charge Injection Reduction Embodiment

Figure 90:
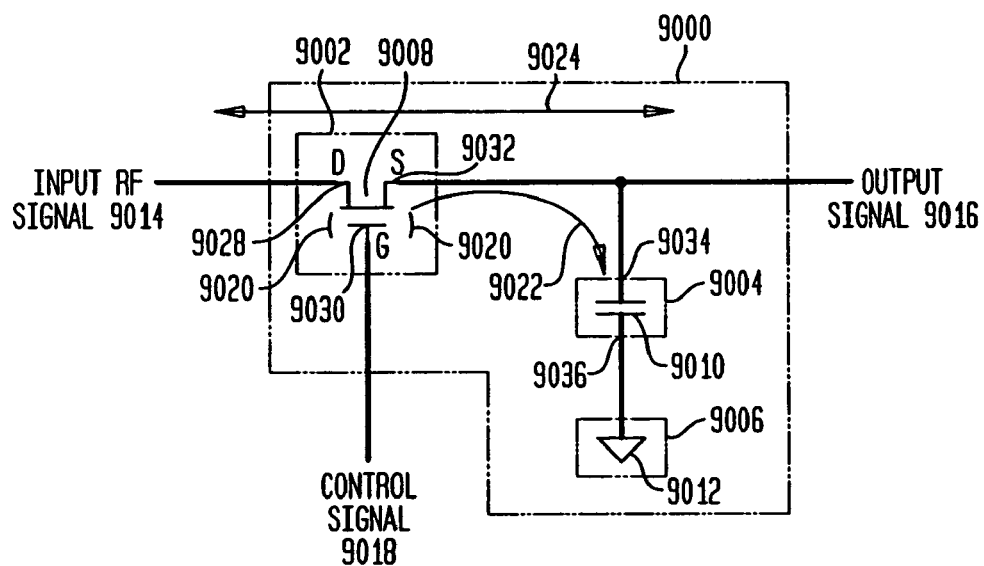
FIG. 90 illustrates some aspects of charge injection related to the present invention.

The spectral spreading/de-spreading embodiments described above reduce or eliminate DC offset from a variety of sources. In this section, an alternative embodiment, according to the present invention, is provided for reducing or eliminating DC offset due at least to charge injection. FIG. 90 illustrates some aspects of charge injection related to the present invention. FIG. 90 shows a UFD module 9000 comprising a UFT module 9002, a storage device 9004, and a reference potential 9006. In an embodiment, UFT module 9002 comprises a MOSFET 9008, and storage device 9004 comprises a capacitor 9010, although the invention is not limited to this example.

An input RF signal 9014 is received by a first terminal 9028 of MOSFET 9008. A control signal 9018 is received by a second terminal 9030 of MOSFET 9008. A third terminal 9032 of MOSFET 9008 is coupled to a first terminal 9034 of storage device 9004. A second terminal 9036 of storage device 9004 is coupled to reference potential 9006 such as a ground 9012, or some other potential. In an embodiment, MOSFET 9008 contained within UFT module 9002 opens and closes as a function of control signal 9018. As a result of the opening and closing of this switch, a down-converted signal, referred to as output signal 9016, results.

A well known phenomenon called charge injection may occur in such a switching environment. As control signal 9018 applies a pulse waveform to the gate of MOSFET 9008, MOSFET 9008 is caused to open and close. During this operation, charge allowed to flow along a DC path 9024 may build on the gate-to-drain and/or gate-to-source junctions of MOSFET 9008, as indicated on FIG. 90 as charge buildup 9020 (note that the source and drain terminals of MOSFET 9008 are essentially interchangeable). Charge buildup 9020 may leak from MOSFET. 9020 through leakage path 9022, and become stored on capacitor 9010. This charge that becomes stored on capacitor 9010 may cause a change in the voltage across capacitor 9010. This voltage change may accordingly appear on output signal 9016 as a potentially non-negligible DC offset voltage. This non-negligible DC offset voltage on output signal 9016 may lead to difficulties in recovering the baseband information content of output signal 9016. Hence, it would be advantageous to reduce or prevent this potential generation of DC offset voltage caused by this interaction of control signal 9018 with UFD module 9000.

Figure 91:
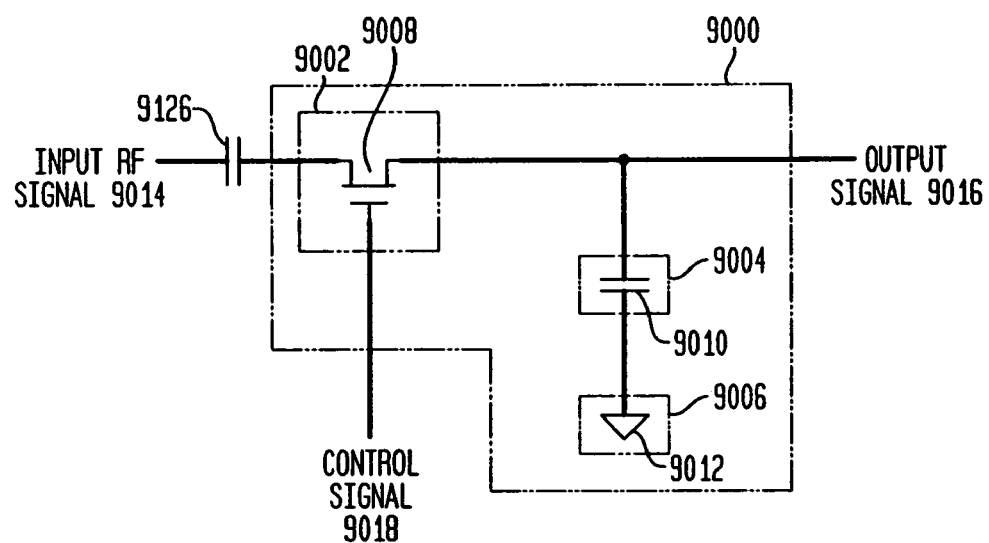
FIG. 91 illustrates an exemplary circuit configuration for reducing DC offset voltage caused by charge injection, according to an embodiment of the present invention.

FIG. 91 illustrates an exemplary circuit configuration for reducing unwanted DC offset voltage caused by charge injection, according to an embodiment of the present invention.

FIG. 91 shows UFD module 9000 of FIG. 90, with a capacitor 9126 coupled between input RF signal 9014 and UFD module 9000. Capacitor 9126 is preferably a small valued capacitor, such as, but not limited to, 10 pF. The value for capacitor 9126 will vary depending upon the application, and accordingly its characteristics are implementation and application specific. Capacitor 9126 prevents DC current from flowing along the path shown as DC path 9024 in FIG. 90, and thus reduces or prevents the flow of charge to, and build up of charge on capacitor 9010. This in turn reduces or prevents a DC offset voltage resulting from the above described charge injection from appearing on output signal 9016. Hence, the baseband information content of output signal 9016 may be more accurately ascertained.

FIG. 109 depicts a flowchart 10900 that illustrates operational steps corresponding to FIG. 91, for down-converting an input signal and reducing a DC offset voltage, according to an embodiment of the present invention. The invention is not limited to this operational description. Rather, it will be apparent to persons skilled in the relevant art(s) from the teachings herein that other operational control flows are within the scope and spirit of the present invention. In the following discussion, the steps in FIG. 109 will be described.

In step 10902, an input signal is coupled by a series capacitor to an input of a universal frequency down-conversion module.

In step 10904, the input signal is frequency down-converted with the universal frequency down-conversion module to a down-converted signal. The input signal is down-converted according to a control signal. The control signal undersamples the input signal.

In step 10906, a DC offset voltage in the down-converted signal generated during step 10904 is reduced. In an embodiment, the DC offset voltage is generated at least by charge injection effects due to interaction of the control signal with the universal frequency down-conversion module, as further described above.

It should be understood that the above examples are provided for illustrative purposes only. The invention is not limited to this embodiment. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

7.2.1.4 Auto-Zero Compensation

Unwanted DC offset may be injected by circuit components in the intermediate frequency (IF) processing path or baseband processing path following a UFD module. In some cases, this DC offset voltage must be reduced or eliminated. In some situations, the output signal down-converted by the UFD module may be a low level signal, where even small DC offsets inserted by components following the UFD module may undesirably affect its value.

The previous section described inserting a series capacitor prior to the UFD module to reduce DC offset voltages due to charge injection. In embodiments, a capacitor may be added in series in the baseband processing path after a UFD module to reduce or eliminate DC offset voltages. In some situations, however, adding a capacitor in series in the baseband processing path after the UFD module is not desirable. For instance, in some situations, it may be difficult to charge such a series capacitor reliably.

Figure 92A:
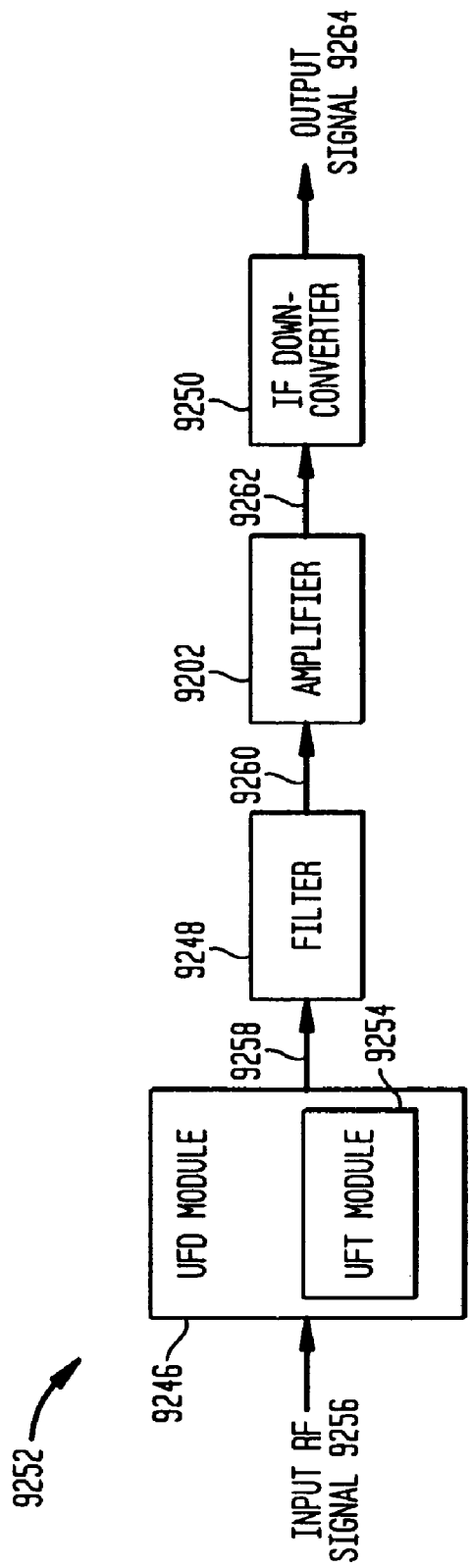
FIG. 92A illustrates an exemplary down-conversion system, according to an embodiment of the present invention, that may be used to indicate potential points in a signal path where DC offset voltages may be injected.

FIG. 92A illustrates an exemplary down-conversion system 9252, according to an embodiment of the present invention, that may be used to indicate potential points in a signal path where DC offset voltages may be injected. Down-conversion system 9252 comprises a UFD module 9246, a filter 9248, an amplifier 9202, and an optional IF down-converter 9250. UFD module 9246 comprises a UFT module 9254. UFD module 9246 down-converts an input RF signal 9256, as described elsewhere herein, and outputs a down-converted signal 9258. Down-converted signal 9258 may be a baseband signal, in which case IF down-converter 9250 is not required, or may be an intermediate frequency signal. Filter 9248 receives and filters down-converted signal 9258, and outputs a filtered signal 9260. Amplifier 9202 receives and amplifies filtered signal 9260, and outputs an amplified signal 9262. Optional IF dawn-converter 9250, when present, receives and further down-converts amplified signal 9262, and outputs an output signal 9264. Additional IF down-converter modules may be included as needed.

UFD module 9246, filter 9248, amplifier 9202, and optional IF down-converter 9250 may each add a DC offset voltage to their respective outputs signals. As described above, the DC offset voltage may undesirably affect the value of the down-converted signal. It would be desirable to provide a circuit that may be inserted for any of the components shown in FIG. 92A (such as following such components), and any other applicable circuit components, to eliminate DC offset voltages at that point.

Figure 92B:
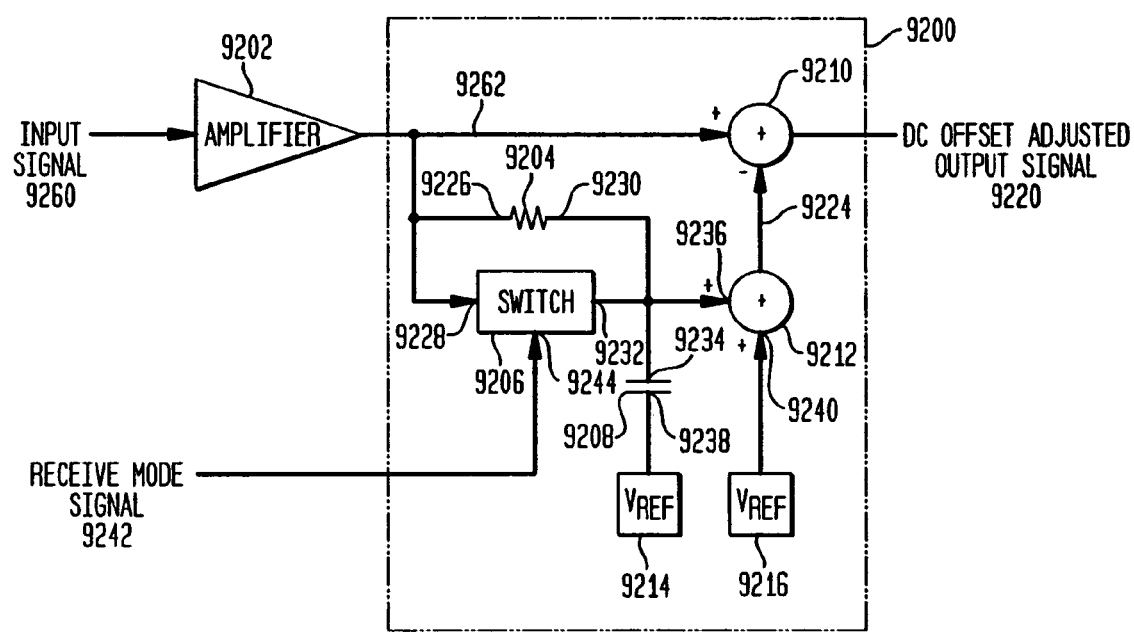
FIG. 92B illustrates an exemplary auto-zero compensation circuit for reducing or eliminating DC offset inserted by circuit components, according to an embodiment of the present invention.

FIG. 92B illustrates an exemplary auto-zero compensation circuit 9200 for reducing or eliminating DC offset inserted by any of the above described circuit components, with amplifier 9202 of FIG. 92A shown as an example, according to an embodiment of the present invention. The present invention is also applicable to reducing or eliminating DC offsets inserted by other types of circuit components.

In the example circuit shown, auto-zero compensation circuit 9200 is located following amplifier 9202 (see also FIG. 92A). In other implementations, auto-zero compensation circuit 9200 may follow any applicable circuit component in the down-converted signal path, including a UFD module. While amplifier 9202 is located in the down-converted signal path, components of auto-zero compensation circuit 9200 are located largely outside of the down-converted signal path. Auto-zero compensation circuit 9200 provides many of the same advantages as having a capacitor located in series in the down-converted signal path. Auto-zero compensation circuit 9200 comprises a resistor 9204, a switch 9206, a capacitor 9208, a first summer 9210, a second summer 9212, a first voltage reference 9214, and a second voltage reference 9216.

Amplifier 9202 receives an input signal 9260, and outputs an amplified input signal 9262. Amplified input signal 9262 may comprise an unwanted DC offset voltage due to amplifier 9202. While an ideal amplifier has zero input offset voltage (i.e., DC offset voltage referred to the input) and no offset voltage drift, most actual amplifiers have offset voltages due to a mismatch of input transistors and resistors on the monolithic circuit. This input offset voltage may drift across temperature, and hence most amplifiers are specified with an input offset voltage temperature coefficient. An amplifier may suffer from further offset voltage from input bias currents. While an ideal amplifier has zero current flowing into and out of its inputs, most actual amplifiers have non-zero input bias currents flowing into and out of their inputs. These currents can create an input voltage that resembles a DC offset voltage when they flow through resistors coupled to the amplifier inputs. Auto-zero compensation circuit 9200 removes DC offset voltages and voltage drift created by these mechanisms.

A first terminal 9226 of resistor 9204 and a first terminal 9228 of switch 9206 are coupled to amplified input signal 9262. A second terminal 9230 of resistor 9204 and a second terminal 9232 of switch 9206 are coupled to a first terminal 9234 of capacitor 9208 and a first input terminal 9236 of second summer 9212. A third terminal 9244 of switch 9206 is coupled to a receive mode signal 9242. A second terminal 9238 of capacitor 9208 is coupled to first voltage reference 9214. A second input terminal 9240 of second summer 9212 is coupled to second voltage reference 9216. First and second voltage references 9214 and 9216 may or may not be equal to the same voltage value.

A receiver system may incorporate one or more auto-zero compensation circuits 9200 in its down-converted signal path. When such a receiver system enters a receive mode, i.e., it has entered a mode where it is ready to down-convert received signals, a receive mode signal 9242 is activated. Receive mode signal 9242 causes switch 9206 to close, and capacitor 9208 charges to the output voltage of amplifier 9202. Hence, capacitor 9208 attains, or is charged with the value of the output of amplifier 9202, which comprises any DC offset voltage due to amplifier 9202. Capacitor 9208 may be a relatively large value capacitor, such as 1.0-0.1 µF, but the invention is not limited to this range.

After switch 9206 is closed for a length of time sufficient to charge capacitor 9208 to the value of amplified output signal 9262, (the output of amplifier 9202), receive mode signal 9242 causes switch 9206 to open. When switch 9206 is open, the path from amplifier 9202 to the first terminal 9234 of capacitor 9208 is through resistor 9204. Resistor 9204 may be a relatively large value resistor, but the invention is not limited to this example. In this configuration, capacitor 9208 relatively slowly follows the voltage of the output of amplifier 9202. In this way, capacitor 9208 maintain the DC offset voltage value of amplifier 9202, following any DC offset voltage drift due to changes in environmental temperature and the like.

Second summer 9212 adds the voltage stored in capacitor 9208 with the value of second voltage reference 9216, and outputs adjusted DC offset voltage 9224. Second voltage reference 9216 may be used to adjust or center the circuit output voltage, as described below. In alternate embodiments, second voltage reference 9216 and second summer 9212 are not present, and the first terminal 9234 of capacitor 9208 is coupled to first summer 9210.

First summer 9210 subtracts the adjusted DC offset voltage 9224 from amplified input signal 9262, and outputs DC offset adjusted output signal 9220 (which is received by the IF down-converter 9250 in the example of FIG. 92A). DC Offset adjusted output signal 9220 is substantially equal to input signal 9260 amplified by amplifier 9202, centered according to second voltage reference 9216 (if present), with the DC offset due to amplifier 9202 substantially reduced or eliminated.

FIG. 110 depicts a flowchart 11000 that illustrates operational steps corresponding to FIG. 92B, for reducing DC offset in a signal path, according to an embodiment of the present invention. The invention is not limited to this operational description. Rather, it will be apparent to persons skilled in the relevant art(s) from the teachings herein that other operational control flows are within the scope and spirit of the present invention. In the following discussion, the steps in FIG. 110 will be described.

In step 11002, a DC offset voltage in an input signal is stored while in a signal non-receive mode.

In step 11004, the mode is changed to a signal receive mode.

In step 11006, the input signal is followed relatively slowly to maintain the DC offset voltage ad any DC offset voltage drift.

In step 11008, the maintained DC offset voltage is summed with a centering voltage to form an adjusted DC offset voltage signal. A centering voltage such as second voltage reference 9216 may be used.

In step 11010, the adjusted DC offset voltage signal is subtracted from the input signal to form a DC offset adjusted output signal.

It should be understood that the above examples are provided for illustrative purposes only. The invention is not limited to this embodiment. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

7.2.1.5 Reducing DC Offset with Differential Configurations

DC offset voltages due to charge injection may also be reduced or eliminated through the use of differential UFD module configurations. Furthermore, circuit re-radiation may be reduced or eliminated through the use of differential UFD module configurations. Exemplary differential UFD module circuit embodiments are described below. However, it should be understood that these examples are provided for illustrative purposes only. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

In an embodiment, two UFD modules are arranged in a differential configuration, where a first UFD module receives an actual RF signal as an input, and a second UFD module receives circuit ground, or some other circuit voltage, as an input. Furthermore, both UFD modules receive the same control signal. As a result, the two UFD modules produce substantially similar DC offset voltages due to charge injection. The UFD module output signals may be subtracted from each other, and as a result the DC offset voltage due to charge injection in the output of the first UFD module will be subtracted out.

Figure 93:
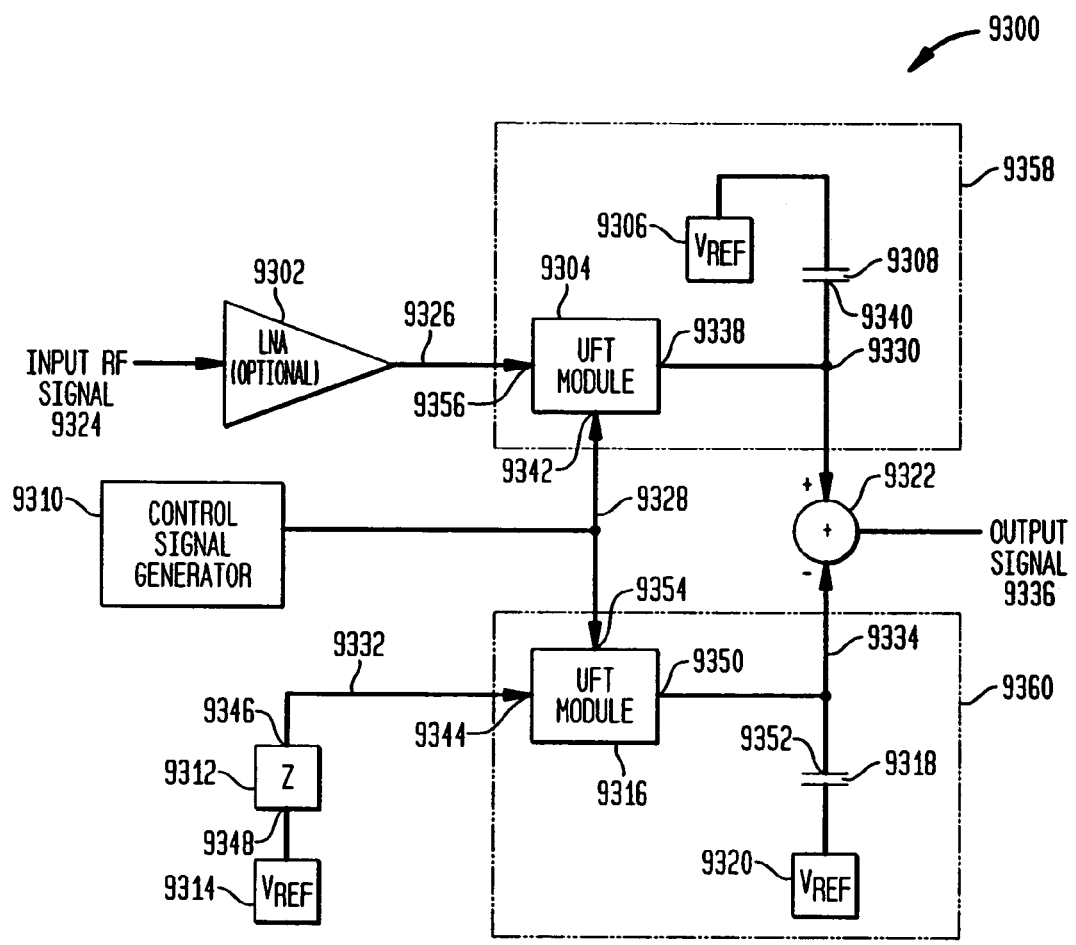
FIG. 93 illustrates an exemplary differential DC offset voltage cancellation circuit, according to an embodiment of the present invention.

FIG. 93 illustrates an exemplary differential DC offset voltage cancellation circuit 9300, according to an embodiment of the present invention. Differential DC offset voltage cancellation circuit 9300 includes an optional LNA 9302, a first UFD module 9358, a second UFD module 9360, a control signal generator 9310, a dummy impedance 9312, a second voltage reference 9314, and a summer 9322. In an embodiment, first UFD module 9358 comprises a first UFT module 9304, a first voltage reference 9306, and a first capacitor 9308, and second UFD module 9360 comprises a second UFT module 9316, a second capacitor 9318, and a third voltage reference 9320.

Optional LNA 9302 receives an input RF signal 9324 and outputs an amplified input RF signal 9326.

Amplified input RF signal 9326 is received by a first terminal 9356 of first UFT module 9304. A second terminal 9338 of first UFT module 9304 is coupled to a first terminal 9340 of first capacitor 9308. First capacitor 9308 may be any type of applicable storage device. A third terminal 9342 of first UFT module 9304 receives a control signal 9328. Control signal 9328 is generated by control signal generator 9310. First UFT module 9304 down-converts amplified input RF signal 9326 according to control signal 9328 in a manner as described elsewhere herein. First UFT module 9304 outputs actual output signal 9330 (it is called the "actual" output signal 9330 because it is derived from input RF signal 9324), which is stored on first capacitor 9308. As described above, first UFT module 9304 may add unwanted DC offset voltage to actual output signal 9330, due to charge injection effects.

A first terminal 9344 of second UFT module 9316 receives dummy input signal 9332 (it is called a "dummy" input signal 9332 because it is not a received signal, but is instead generated to address offset issues) from a first terminal 9346 of dummy impedance 9312. A second terminal 9348 of dummy impedance 9312 is coupled to second voltage reference 9314. Second voltage reference 9314 is a circuit voltage, preferably ground. Impedance 9312 approximates for second UFT module 9316 the input impedance presented to the input of first UFT module 9304 (that is, impedance 9312 is substantially equal to the input impedance of first UFT module 9304). Impedance 9312 is implemented using any well known combination of circuit elements. A second terminal 9350 of second UFT module 9316 is coupled to a first terminal 9352 of second capacitor 9318. A third terminal 9354 of second UFT module 9316 receives control signal 9328. Second UFT module 9316 down-converts dummy input signal 9332 according to control signal 9328 in a similar fashion as described above. Second UFT module 9316 outputs dummy output signal 9334, which is stored on second capacitor 9318. Dummy output signal 9334 comprises unwanted DC offset voltage due to charge injection effects in second UFT module 9316, similar to that generated by first UFT module 9304. The DC offset voltages due to charge injection on actual output signal 9330 and dummy output signal 9334 are substantially similar due to the similar UFT module configurations.

Summer 9322 subtracts dummy output signal 9334 from actual output signal 9330, and outputs output signal 9336. Output signal 9336 is a down-converted version of input RF signal 9324, with DC offset due to charge injection in UFT module 9304 substantially reduced or eliminated by subtracting out the DC offset similarly created in UFT module 9316.

Preferably, the noise entering on first terminals 9356 and 9344 of UFT modules 9304 and 9316 is matched. If the frequency spectrum of the noise entering first UFT module 9304 on input RF signal 9324 is different than the noise entering second UFT module 9316 from second voltage reference 9314, the difference may show up on output signal 9336. One example of where the noise spectrums may be different is when there is a filter on input RF signal 9324 prior to first UFT module 9304, which filters out some noise frequencies. This difference may be solved, for example, by placing a similar filter at the input of second UFT module 9316.

FIG. 111 depicts a flowchart 11100 that illustrates operational steps, corresponding to the structure of FIG. 93, for down-converting an input signal and canceling DC offset voltages, according to an embodiment of the present invention. The invention is not limited to this operational description. Rather, it will be apparent to persons skilled in the relevant art(s) from the teachings herein that other operational control flows are within the scope and spirit of the present invention. In the following discussion, the steps in FIG. 111 will be described.

In step 11102, an input signal is received.

In step 11104, the input signal is frequency down-converted with a first universal frequency down-conversion module to an actual down-converted signal.

In step 11106, a dummy input signal is received. In an embodiment, a dummy impedance is matched with the input impedance of an input of the first universal frequency down-conversion module. The matched dummy impedance is coupled to an input of the second universal frequency down-conversion module to form the dummy input signal.

In step 11108, the dummy signal is frequency down-converted with a second universal frequency down-conversion module to a dummy down-converted signal.

In step 11110, the dummy down-converted signal is subtracted from the actual down-converted signal to form an output signal. DC offset voltages due to said first and said second universal frequency down-conversion modules are canceled by the subtraction of step 11110, as further described above.

Figure 94A:
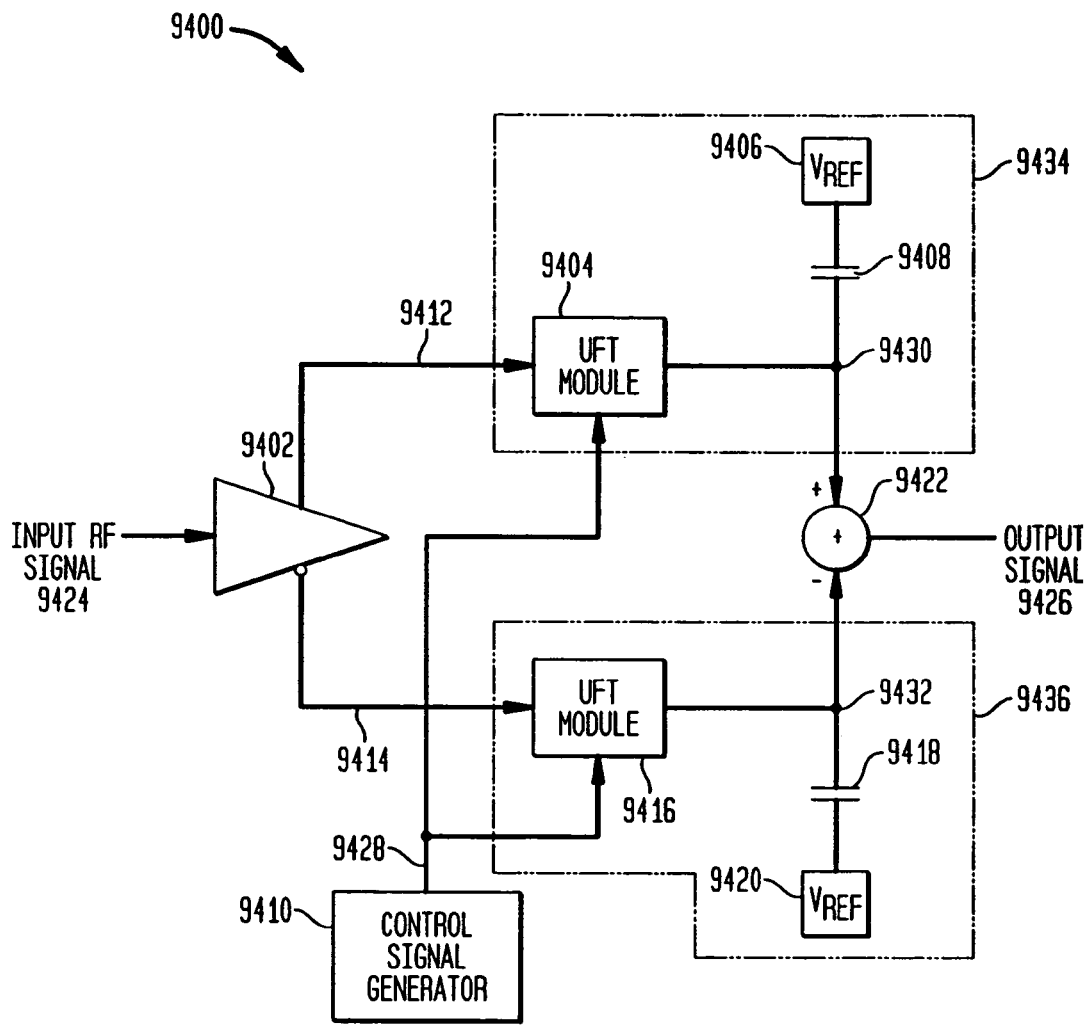
FIG. 94A illustrates a second exemplary differential DC offset voltage cancellation circuit, according to an embodiment of the present invention.

FIG. 94A illustrates a second exemplary differential DC offset voltage cancellation circuit 9400, according to an embodiment of the present invention. Differential DC offset voltage cancellation circuit 9400 is effective at reducing or eliminating DC offset voltages due to charge injection and at reducing or eliminating circuit re-radiation. Differential DC offset voltage cancellation circuit 9400 comprises a buffer/inverter 9402, a first UFD module 9434, a second UFD module 9436, a control signal generator 9410, and a summer 9422. In an embodiment, first UFD module 9434 comprises a first UFT module 9404, a first voltage reference 9406, and a first capacitor 9408, and second UFD module 9436 comprises a second UFT module 9416, a second capacitor 9418, and a second voltage reference 9420.

FIG. 94B illustrates example waveforms related to differential DC offset voltage cancellation circuit 9400 of FIG. 94A, according to an embodiment of the present invention.

Buffer/inverter 9402 receives an input RF signal 9424. FIG. 94B shows an example waveform for input RF signal 9424. Buffer/inverter 9402 outputs a non-inverted amplified input RF signal 9412 and an inverted amplified input RF signal 9414. Buffer/inverter 9402 may comprise any circuit component or equivalent that receives a single-ended signal and outputs a differential signal, such as a differential driver. Non-inverted amplified input RF signal 9412 and inverted amplified input RF signal 9414 are substantially similar signals, but inverted images of each other. FIGS. 94C and 94D show example waveforms for non-inverted amplified input RF signal 9412 and inverted amplified input RF signal 9414, respectively. In the example of FIGS. 94C and 94D, buffer/inverter 9402 has a gain of 2, and therefore the amplitudes of non-inverted amplified input RF signal 9412 (FIG. 94C) and inverted amplified input RF signal 9414 (FIG. 94D) are two times greater than that of input RF signal 9424 (FIG. 94B).

First and second UFT modules 9404 and 9416 operate similarly to first and second UFT modules 9304 and 9316 of FIG. 93. First UFT module 9404 receives non-inverted amplified input RF signal 9412. First UFT module 9404 operates to down-convert non-inverted amplified input RF signal 9412 according to a control signal 9428, which is output by control signal generator 9410. FIG. 94E shows an example waveform for control signal 9428. First UFT module 9404 outputs a non-inverted output signal 9430. Non-inverted output signal 9430 comprises DC offset voltage due to charge injection effects in first UFT module 9404, as described above. FIG. 94F shows an example waveform for non-inverted output signal 9430. In this example, amplified input RF signal 9412 is down-converted to inverted output signal 9430 at a value of 0.4 Volts, with a DC offset voltage of 0.1 Volts added, resulting in a total of 0.5 Volts.

Second UFT module 9416 receives inverted amplified input RF signal 9414. Second UFT module 9416 down-converts inverted amplified input RF signal 9414 according to control signal 9428, and outputs inverted output signal 9432. Inverted output signal 9432 comprises DC offset voltage due to charge injection in second UFT module 9416. FIG. 94G shows an example waveform for inverted output signal 9432. Due at least in part to the similarity in the layouts and circuit configurations of first and second UFT modules 9404 and 9416, their resulting DC offset voltages due to charge injection will be substantially similar, and of the same polarity. In the example of FIG. 94G, inverted amplified input RF signal 9414 is down-converted to inverted output signal 9432 at a value of −0.4 Volts, with a DC offset voltage of 0.1 Volts added, resulting in a total of −0.3 Volts. As shown in FIGS. 94F and 94G, the polarities of non-inverted output signal 9430 and inverted output signal 9432 are opposite. The DC offset voltages added respectively to these signals by first UFT module 9404 and second UFT module 9416 are equal at 0.1 Volts.

Summer 9422 subtracts inverted output signal 9432 from non-inverted output signal 9430, and outputs an output signal 9426. FIG. 94H shows an example waveform for output signal 9426. Because non-inverted output signal 9430 and inverted output signal 9432 comprise the same down-converted signal, but of opposite polarities, when subtracted by summer 9422, the respective down-converted signals will add. Because the DC offset voltages in non-inverted output signal 9430 and inverted output signal 9432 are of the same polarity and of substantially the same amplitude, when they are subtracted by summer 9422 the DC offset voltages will substantially cancel. As a result, any DC offset voltage in output signal 9426 will be substantially reduced or eliminated. As shown in the example of FIGS. 94F-94H, the amplitudes of non-inverted output signal 9430 and inverted output signal 9432 combine in summer 9422 to equal 0.8 Volts, while the DC offset voltages of 0.1 Volts cancel each other. Thus, the embodiment of FIG. 94A both enhances signal amplitude and addresses DC offset issues.

Additionally, re-radiation may be substantially reduced or eliminated due to this configuration. Control signal noise produced in first and second UFT modules 9404 and 9416 due to pulses on control signal 9428 may travel back through buffer/inverter 9402. If first and second UFT modules 9404 and 9416 are configured in a substantially similar fashion and receive the same control signal, they will produce substantially equivalent control signal noise. Because the control signal noise from second UFT module 9416 will be inverted by buffer/inverter 9402 when passing back through buffer/inverter 9402, it will cancel when combined with the non-inverted control signal noise from first UFT module 9404 passing back through buffer/inverter 9402. Furthermore, the noise matching concerns of the prior differential circuit embodiment of FIG. 93 are not present in this embodiment.

FIG. 112 depicts a flowchart 11200 that illustrates operational steps, corresponding to the structure of FIG. 94A, for down-converting an input signal and canceling DC offset voltages, according to an embodiment of the present invention. The invention is not limited to this operational description. Rather, it will be apparent to persons skilled in the relevant art(s) from the teachings herein that other operational control flows are within the scope and spirit of the present invention. In the following discussion, the steps in FIG. 112 will be described.

In step 11202, an input signal is received.

In step 11204, the received input signal is amplified to a non-inverted output signal and an inverted output signal.

In step 11206, the non-inverted output signal is down-converted with a first universal frequency down-conversion module to a non-inverted down-converted signal.

In step 11208, the inverted output signal is down-converted with a second universal frequency down-conversion module to an inverted down-converted signal.

In step 11210, the inverted down-converted signal is subtracted from the non-inverted down-converted signal to form an output signal. DC offset voltages in the non-inverted down-converted signal and the inverted down-converted signal produced by the first and second universal frequency down-conversion modules, respectively, are canceled.

In step 11212, the first universal frequency down-conversion module and the second universal frequency down-conversion module are configured to generate substantially equal DC offset voltages given the same input signal.

It should be understood that the above examples are provided for illustrative purposes only. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

7.2.1.6 Reducing DC Offset with Differential Outputs

Figure 95:
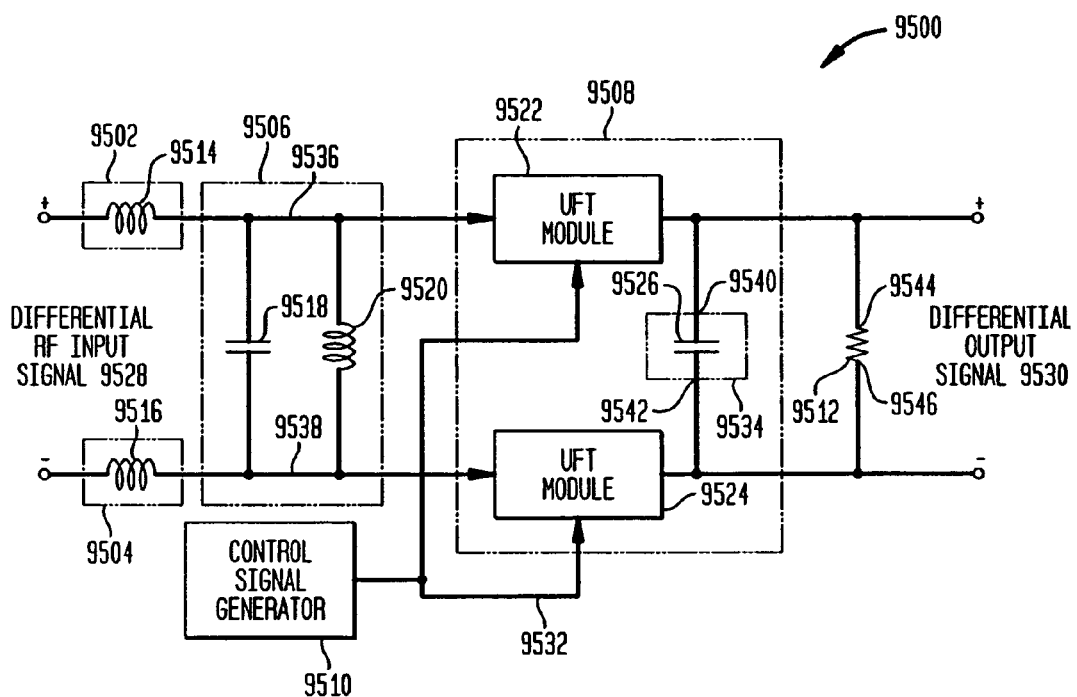

Unwanted DC offset voltages may be reduced or canceled through the use of differential receiver circuit outputs. FIG. 95 illustrates an exemplary differential receiver circuit 9500, according to an embodiment of the present invention. Differential receiver circuit 9500 comprises a first impedance match 9502, a second impedance match 9504, a tank circuit 9506, a differential UFD module 9508, a control signal generator 9510, and a resistor 9512.

First and second match 9502 and 9504 are optional, the necessity of which being determined on an application-by-application basis. In a preferred embodiment, first impedance match 9502 is a first inductor 9514. In a preferred embodiment, second impedance match 9504 is a second inductor 9516. However, other impedance match circuits may be used.

Tank circuit 9506 is optional, the necessity of which being determined on an application-by-application basis. In a preferred embodiment, tank circuit 9506 comprises a first capacitor 9518 and a third inductor 9520, although other circuits may be used.

In a preferred embodiment, differential UFD module 9508 comprises a first UFT module 9522, a second UFT module 9524, and a storage module 9534. In a preferred embodiment, storage module 9534 comprises a second capacitor 9526.

A positive or "plus" signal input of a differential RF input signal 9528 is input through first impedance match 9502 to a first terminal 9536 of tank circuit 9506. A negative or "minus" signal input of differential RF input signal 9528 is input through second impedance match 9504 to a second terminal 9538 of tank circuit 9506.

First UFT module 9522 is coupled to first terminal 9536 of tank circuit 9506, and receives the "plus" signal input of differential RF input signal 9528. Second UFT module 9524 is coupled to second terminal 9538 of tank circuit 9506, and receives the "minus" signal input of differential RF input signal 9528.

First and second UFT modules 9522 and 9524 down-convert differential RF input signal 9528 according to a control signal 9532, which is output by control signal generator 9510, in a manner as described elsewhere herein. The outputs of first and second UFT modules 9522 and 9524 are stored in storage module 9534, and output as differential output signal 9530.

First UFT module 9522 outputs a "plus" output of differential output signal 9530. Second UFT module 9524 outputs a "minus" output of differential output signal 9530. Differential output signal 9530 is equal to the difference voltage between these "plus" and "minus" outputs.

A first terminal 9540 of storage module 9534 is coupled to the "plus" output of differential output signal 9530. A second terminal 9542 of storage module 9534 is coupled to the "minus" output of differential output signal 9530.

Resistor 9512 is optional, the necessity of which being determined on an application-by-application basis. Resistor 9512, when present, operates as a load resistance, the value of which may be determined on an application-by-application basis. A first terminal 9544 of resistor 9512 is coupled to the "plus" output of differential output signal 9530. A second terminal 9546 of resistor 9512 is coupled to the "minus" output of differential output signal 9530.

Due to their similar layout and circuit configuration, and due to control signal 9532, first UFT module 9522 and second UFT module 9524 each generate substantially equal DC offset voltages due to charge injection effects. The DC offset voltage generated by first UFT module 9522 is applied to first terminal 9540 of storage module 9534. The DC offset voltage generated by second UFT module 9524 is applied to second terminal 9542 of storage module 9534. Because differential output signal 9532 is measured across storage module 9534, the DC offset voltages due to first and second UFT module 9522 and 9524 substantially cancel each other out.

FIG. 113 depicts a flowchart 11300 that illustrates operational steps, corresponding to the structure of FIG. 95, for differentially down-converting an input signal, according to an embodiment of the present invention. The invention is not limited to this operational description. Rather, it will be apparent to persons skilled in the relevant art(s) from the teachings herein that other operational control flows are within the scope and spirit of the present invention. In the following discussion, the steps in FIG. 113 will be described.

In step 11302, an input signal is differentially received. For example, a positive node input signal and a negative node input signal are received.

In step 11304, the differentially received input signal is down-converted with a differential universal frequency down-conversion module to a differential down-converted signal. The differential down-converted signal comprises a positive node down-converted signal and a negative node down-converted signal. In an embodiment, the differential universal frequency down-conversion module comprises a positive node switch (UFT) module and a negative node switch (UFT) module. The positive node switch module and the negative node switch module are configured to generate substantially equal DC offset voltages in the positive node down-converted signal and the negative node down-converted signal, respectively, as described above.

In step 11306, the differential down-converted signal is measured between the positive node down-converted signal and the negative node down-converted signal. The DC offset voltages in the positive node down-converted signal and the negative node down-converted signal substantially cancel, as described above.

Further differential circuit configurations for canceling DC offset voltages will be apparent to persons skilled in the relevant art(s) from the teaching herein. Exemplary differential receiver circuit output embodiments are described above. However, it should be understood that these examples are provided for illustrative purposes only. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

7.2.2 Re-radiation

Figure 44A:
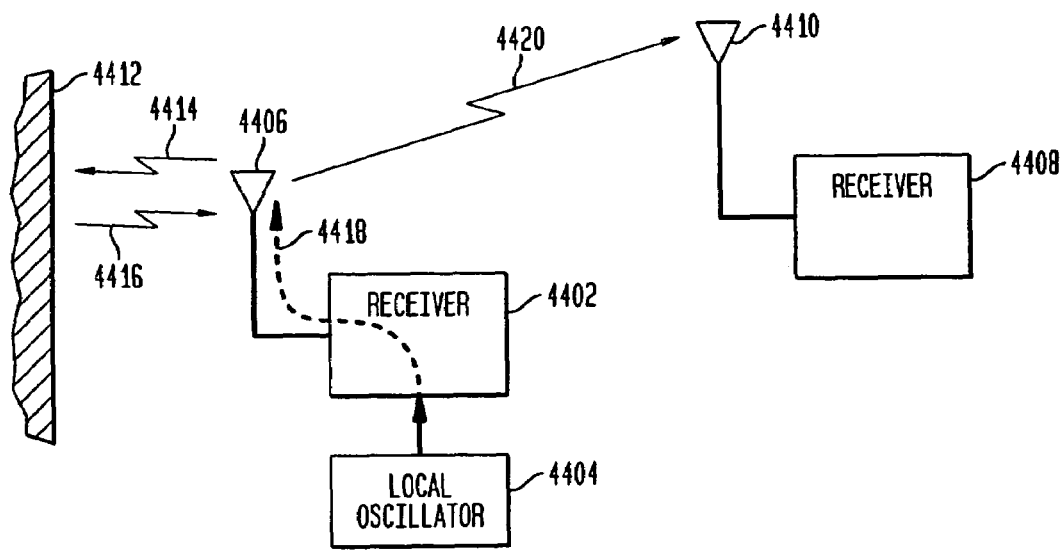
FIG. 44A illustrates an example antenna that transmits re-radiation.

Re-radiation, as described above, is an undesirable phenomenon where a signal comprising one or more frequency components generated by receiving circuitry is transmitted by an antenna. FIG. 44A illustrates an antenna 4406 that transmits circuit re-radiation signals 4414 and 4420. Receiving circuitry, for example shown as a receiver 4402 and a local oscillator 4404, related to antenna 4406 may produce the transmitted frequency components. For example, the frequency components may be generated in part by local oscillator 4404. These generated frequency components may travel along re-radiation path 4418, where they are transmitted by antenna 4406 as re-radiation signals 4414 and 4420. When transmitted, these frequency components may undesirably interfere with one or more nearby receivers, such as nearby receiver 4408. An antenna 4420 may receive re-radiation signal 4420, which is down-converted by nearby receiver 4408. One or more of the frequency components of received re-radiation signal 4420 may fall within a frequency range of interest of nearby receiver 4408, interfering with the quality of the signals intended to be down-converted by nearby receiver 4408.

Figure 44B:
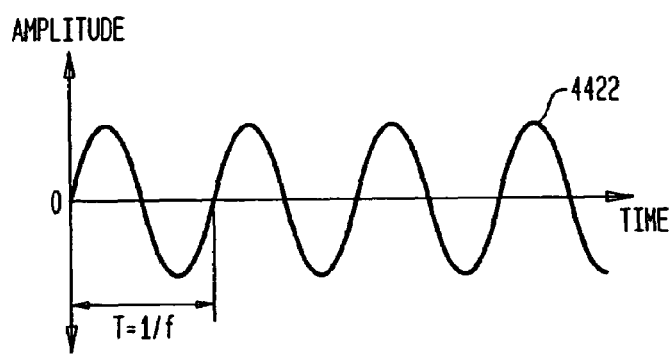
FIGS. 44B-D illustrates example signals and frequency spectrums related to re-radiation effects.
Figure 44C:
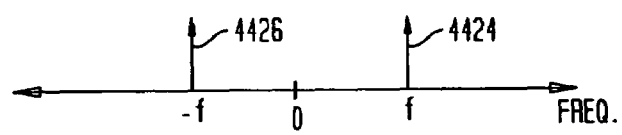
Figure 44D:
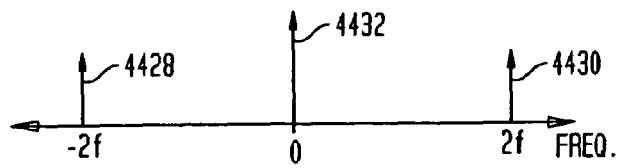

As described above, re-radiation may be undesirably received back by the same antenna that transmitted the re-radiation. As shown in FIG. 44A, receiver 4402 may transmit re-radiation signal 4414, which is subsequently reflected by an object 4412 as reflected re-radiation 4416, which is then received by antenna 4406. This is referred to as re-radiation recapture. If frequency components are received back by the same antenna that transmitted them, they may be down-converted, may further impair signals that are down-converted, and/or may cause undesirable DC offset voltages that may impair the down-converted signals. FIG. 44B shows an example local oscillator signal 4422, of a frequency of f. If a signal such as local oscillator signal 4422 is re-radiated, and subsequently received by the circuit that transmitted it, it may combine with itself to create an undesired DC offset voltage. FIG. 44C shows the Fourier transform of local oscillator signal 4422, with spectral components 4424 and 4426 at frequencies +f and −f. FIG. 44D shows a result of the convolution of local oscillator signal 4422 with itself, producing a DC spectral component 4432 representing an undesired DC offset voltage. FIG. 44D shows resulting spectral components 4428 and 4430 at frequencies +2f and −2f, and DC spectral component 4432 at a frequency of zero. DC spectral component 4432 may cause the same problems as DC offset voltages created by other mechanisms, such as those described elsewhere herein.

For at least these reasons, it is desirable to reduce or eliminate circuit re-radiation. Exemplary embodiments are provided below for reducing or eliminating circuit re-radiation. The embodiments provided below are not limited to this use, but may have additional applications. For example, these embodiments may be applicable to reducing or eliminating unwanted DC offset voltages.

7.2.2.1 Reducing Re-radiation by Adjusting Control Signal Attributes

In the present invention, a local oscillator may be used to generate a control signal used to down-convert received RF signals. The control signal may comprise frequency components related to the local oscillator frequency and its harmonics. As described above, one or more frequency components of the local oscillator signal may leak from a nearby antenna as circuit re-radiation. As a result, attributes of circuit re-radiation are directly related to attributes of control signal frequency components. Hence, re-radiation potentially may be reduced or eliminated by adjusting one or more attributes of the control signal frequency components. Control signal attributes that may be adjusted at least include control pulses width, control pulse amplitude, and/or control pulse phase.

Figure 96:
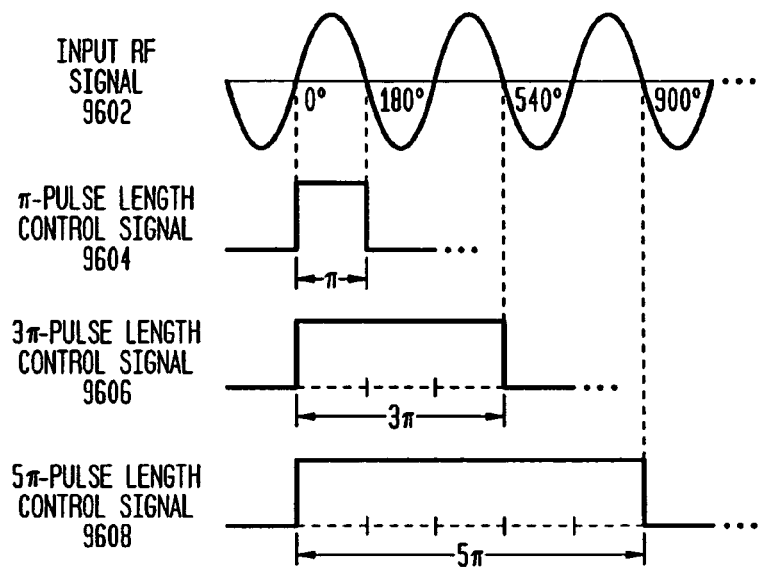

FIG. 96 shows an exemplary input RF signal 9602. A π-pulse length control signal 9604 is also shown that may be applied to a UFD module to down-convert input RF signal 9602. As shown, π-pulse length control signal 9604 comprises pulses that are of a length of π radians. In a receiver embodiment implementing a UFD module, a control signal such as π-pulse length control signal 9604 may be re-radiated from the receiver. In the time domain, the re-radiation may appear as noise pulses that are shaped similarly to pulses of the control signal. In certain situations, one or more of the frequencies of the re-radiated signal may undesirably fall within the output frequency bands of interest of the system implementing the receiver circuit. For instance, when down-converting a signal directly to baseband, a control signal frequency may be substantially equal to the frequency of the received RF carrier signal. If this control signal frequency is re-radiated, and then subsequently received and down-converted, it may result in one or more down-converted signal frequencies near or equal to DC, or at baseband, in a similar fashion to that described in FIGS. 44B-D above. It would be beneficial if the re-radiated signal components within the frequency bands of interest could be eliminated or moved.

In an exemplary embodiment for changing the frequency content of the re-radiated signal, the pulse width of the control pulses of the control signal may be lengthened. As shown in FIG. 96, a 3π-pulse length control signal 9606 has control pulses of a length of 3π. Because the control pulse width of 3π-pulse length control signal 9606 is wider than that of π-pulse length control signal 9604, 3π-pulse length control signal 9606 is made up of lower frequency components. It is well known that signals comprising substantially square or rectangular pulses include a plurality of signals of various frequencies that add together to form the pulse shapes. As pulses become wider, the frequencies of the signals required to form them tend to become lower. Because 3π-pulse length control signal 9606 has wider pulses, and therefore contains lower frequency components, a re-radiated signal due to 3π-pulse length control signal 9606 will have lower frequency components. Even if the lower frequency components are re-radiated, and then received and down-converted, the down-converted components should be out-of-band. In an embodiment, a 3π-pulse length control signal 9606 configuration re-radiated at a 19 dB lower level than that of a π-pulse length control signal 9604.

Frequency components of potential re-radiation can be lowered more by further widening the control pulses. For example, FIG. 96 shows a 5π-pulse length control signal 9608 with control signal pulses of a width of 5π. 5π-pulse length control signal 9608 includes pulses wider than those of 3π-pulse length control signal 9606. Because of this, as described above, 5π-pulse length control signal 9608 is made up of lower frequency signal components relative to 3π-pulse length control signal 9606. Hence, relative to 3π-pulse length control signal 9606, circuit re-radiation related to 5π-pulse length control signal 9608 is of lower frequency.

A pulse width can be widened even more as would be understood by persons skilled in the relevant arts from the teachings herein. To what degree the pulse width may be widened will be determined on an application by application basis. The pulse width may be varied by whole increments of π, or any fraction thereof. It should be understood that the above pulse width examples are provided for illustrative purposes only. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

FIG. 114 depicts a flowchart 11400 that illustrates operational steps for down-converting an input signal with a variety of control signal pulse widths, according to an embodiment of the present invention. The invention is not limited to this operational description. Rather, it will be apparent to persons skilled in the relevant art(s) from the teachings herein that other operational control flows are within the scope and spirit of the present invention. In the following discussion, the steps in FIG. 114 will be described.

In step 11402, an input signal is frequency down-converted with a universal frequency down-conversion module to a down-converted signal. The input signal is down-converted according to a control signal comprising a train of pulses having pulse widths.

In step 11404, a signal related to the control signal is re-radiated.

In step 11406, the pulse widths are increased to decrease a frequency of the re-radiated signal. In an embodiment, the pulse widths may be selected according to the equation: pulse width=180+360·n degrees of a frequency of said input signal, wherein n is any integer≧zero. As n is increased, a frequency of the re-radiated signal is decreased.

7.2.2.1.1 I/Q Modulation Receiver Control Signal Considerations and Embodiments Design considerations exist for I/Q modulation receiver circuits in regard to control signals. The embodiments provided above for changing control signal pulse widths are applicable to I/Q modulation receiver circuits. However, when modifying control signal pulse widths in regards to I/Q modulation receiver circuits to overcome problems with re-radiation as described above, or other problems, certain design constraints may need to be considered. For instance, in some embodiments, such as described below, pulses of the I-phase control signal and pulses of the Q-phase control signal may not overlap, and must be configured such that they do not overlap to fulfill this requirement. In alternate embodiments, such as described below, an I/Q modulation receiver circuit may be configured such that I-phase, and Q-phase control signals may overlap. Exemplary embodiments are provided below for overcoming at least some design constraints related to control signal pulses for I/Q modulation receiver circuits, according to the present invention.

It should be understood that the following I/Q modulation receiver examples are provided for illustrative purposes only. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

7.2.2.1.1.1 Non-overlapping I/Q Control Signal Pulses Embodiments

Figure 97:
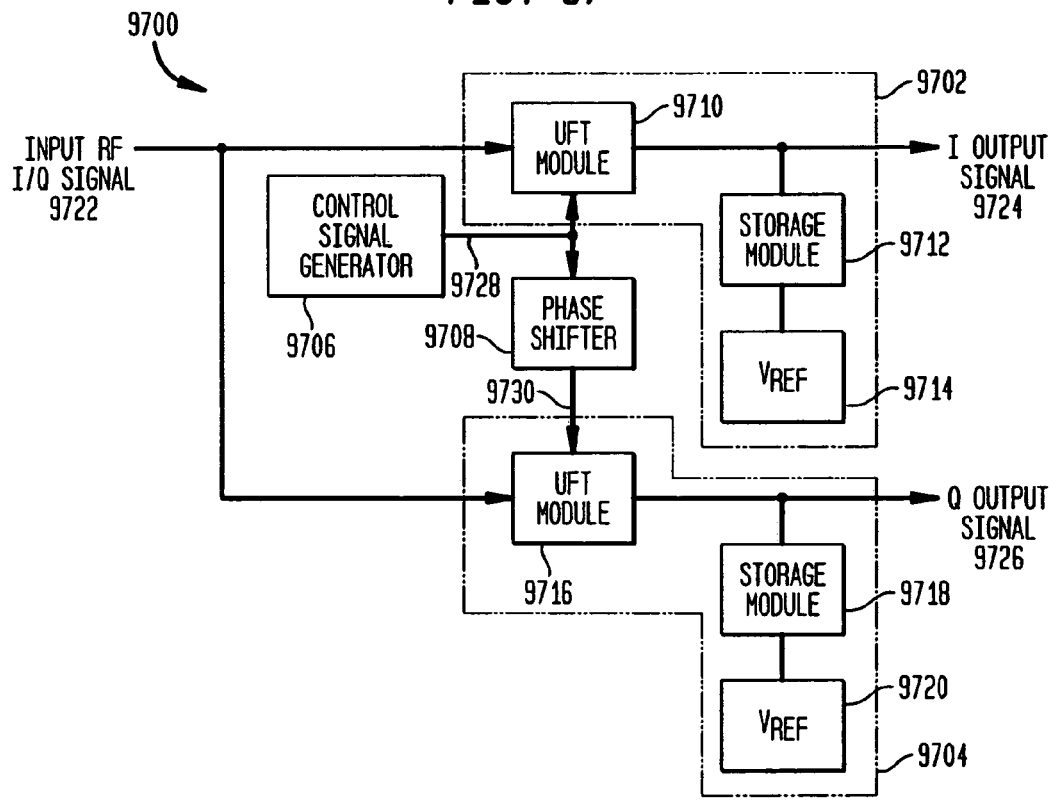
Figure 98:
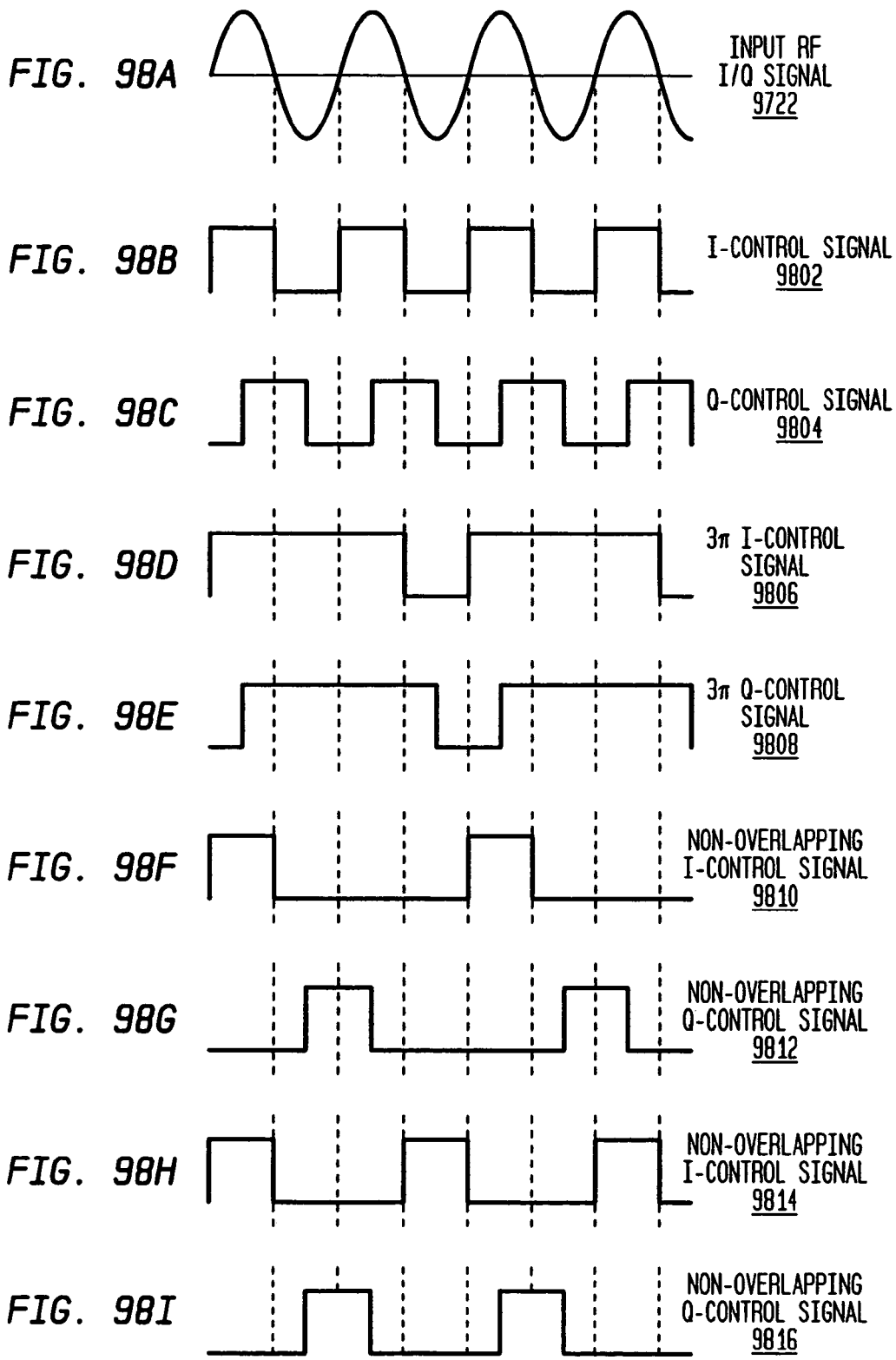

FIG. 97 illustrates an exemplary I/Q modulation receiver circuit 9700, according to an embodiment of the present invention I/Q modulation receiver circuit 9700 comprises a first UFD module 9702, a second UFD module 9704, a control signal generator 9706, and a phase shifter 9708. I/Q modulation circuit 9700 may use a variety of control signal configurations to down-convert I/Q modulated signals.

An input RF I/Q signal 9722 is received by first UFD module 9702. First UFD module 9702 down-converts the I-phase signal portion of input RF I/Q signal 9722 according to a control signal 9728, which is output by control signal generator 9706. First UFD module 9702 outputs an I output signal 9724.

In an embodiment, first UFD module 9702 comprises a first UFT module 9710, a first storage module 9712, and a first voltage reference 9714.

Control signal 9728 is received by phase shifter 9708. In an I/Q modulation embodiment, phase shifter 9708 preferably shifts the phase of control signal 9728 by 90 degrees, although other phase shifts are possible. Phase shifter 9708 outputs phase-shift control signal 9730.

Input RF I/Q signal 9722 is received by second UFD module 9704. Second UFD module 9704 down-converts the Q-phase signal portion of input RF I/Q signal 9722 according to phase-shifted control signal 9730. Second UFD module 9704 outputs a Q output signal 9726.

In an embodiment, second UFD module 9704 comprises a second UFT module 9716, a second storage module 9718, and a second voltage reference 9720. First and second voltage references 9714 and 9720 may or may not be equal to the same voltage value.

FIGS. 98A-98I shows an exemplary input RF I/Q signal 9722, and several exemplary control signal waveforms, which may be used to down-convert input RF I/Q signal 9722.

For example, an I-control signal 9802 is shown in FIG. 98B. I-control signal 9802 may be used to down-convert an I-phase signal portion of input RF I/Q signal 9722. A corresponding Q-control signal 9804 is shown in FIG. 98C. Q-control signal 9804 is output by phase shifter 9708. Q-control signal 9804 is shifted by 90 degrees from I-control signal 9802. Q-control signal 9804 may be used to down-convert a Q-phase signal portion of input RF I/Q signal 9722.

As illustrated in FIGS. 98B and 98C, pulses of I-control signal 9802 overlap the corresponding phase-shifted pulses of Q-control signal 9804. In some embodiments where first and second UFT modules 9710 and 9716 comprises switches, overlapping pulses of I-control signal 9802 and Q-control signal 9804 will cause the switches in first and second UFT modules 9710 and 9716 to be simultaneously closed during a period pulse of overlap. Due to the overlap, first and second UFD modules 9702 and 9704 may not be able to properly down-convert the I- and Q-phase components of input RF I/Q signal 9722. This is because during the period that switches inside the first and second UFD modules 9702 and 9704 are both closed, the switches will be attempting to transfer energy from input RF I/Q signal 9722 simultaneously. This may lead to non-negligible distortion of input RF I/Q signal 9722 in some embodiments. Hence, less than desirable input signal down-conversion accuracy may result.

In an another example, FIGS. 98D and 98E show a 3π I-control signal 9806 and a 3π Q-control signal 9808. Pulses of 3π I-control signal 9806 and 3π Q-control signal 9808 overlap. Using these control signals, in some embodiments first and second UFD modules 9702 and 9704 may not be able to properly down-convert the I- and Q-phase components of input RF I/Q signal 9722.

The overlap problem may be overcome by creating control signals with non-overlapping pulses. For example, FIGS. 98F and 98G show a non-overlapping I-control signal 9810 and a non-overlapping Q-control signal 9812. Pulses on non-overlapping I-control signal 9810 are separated by 720 degrees, and may be used to down-convert the I-phase signal component of input RF I/Q signal 9722. Pulses on non-overlapping Q-control signal 9812 are phased-shifted from pulses on non-overlapping I-control signal 9810 by 270 degrees, are separated from each other by 720 degrees, and may be used to down-convert the Q-phase signal component of input RF I/Q signal 9722.

In a further example, FIGS. 98H and 98I show a non-overlapping I-control signal 9814 and a non-overlapping Q-control signal 9816. Pulses on non-overlapping I-control signal 9814 are separated by 540 degrees, and may be used to down-convert the I-phase signal component of input RF I/Q signal 9722. (Note that when pulses on non-overlapping I-control signal 9814 are separated by 180 degrees, 540 degrees, 900 degrees, etc., the information down-converted on consecutive pulses may be inverted relative to one another, and hence an inverter may be required to correct for this.) Pulses on non-overlapping Q-control signal 9816 are phased-shifted from pulses on non-overlapping I-control signal 9814 by 270 degrees, are separated from each other by 540 degrees, and may be used to down-convert the Q-phase signal component of input RF I/Q signal 9722. (Note that when pulses on non-overlapping Q-control signal 9816 are separated by 180 degrees, 540 degrees, 900 degrees, etc., the information down-converted on consecutive pulses may be inverted relative to one another, and hence an inverter may be required to correct for this.)

Further control signal waveform configurations exist for implementing non-overlapping pulses, according to embodiments of the present invention, as would be recognized by persons skilled in the relevant art(s) from the teachings herein. I- and Q-control signal pulses may be widened, or made more narrow. I- and Q-control signal pulses may be made to occur further apart or closer together. A Q-control signal may be phase-shifted from a corresponding I-control signal by 90 degrees, 270 degrees, 450 degrees, 630 degrees, and so on, such that the I-control signal is matched with the I-phase input RF signal component, and the Q-control signal is matched with the Q-phase input RF signal component. Pulses on an I-phase control signal may be shifted from each other by any multiple of 180 (with one or more inverters possibly required, as described above) or 360 degrees. I- and Q-control signals may be formed to these requirements for use in I/Q modulation receiver circuit 9700 of FIG. 97, as long as their pulses do not overlap.

FIG. 115 depicts a flowchart 11500 that illustrates operational steps corresponding to the structure of FIG. 97, for down-converting an RF I/Q modulated input signal, according to an embodiment of the present invention. The invention is not limited to this operational description. Rather, it will be apparent to persons skilled in the relevant art(s) from the teachings herein that other operational control flows are within the scope and spirit of the present invention. In the following discussion, the steps in FIG. 115 will be described.

In step 11502, an input RF I/Q modulated signal is frequency down-converted with a first universal frequency down-conversion module according to a control signal. The input signal is down-converted to an in-phase information signal. The control signal comprises a train of pulses. In an embodiment, the train of pulses are generated to have apertures approximately equal to 180+360·n degrees of a frequency of said input RF I/Q modulated signal, wherein n is any integer greater than or equal to 0.

In step 11504, the control signal is phase-shifted. In embodiments, the control signal is phase-shifted by 90 degrees of a frequency of said input RF I/Q modulated signal. In alternative embodiments, the control signal may be shifted by 90+m·180 degrees, wherein m is any integer greater than or equal to 1. In embodiments, the control signal may be phase shifted such that pulses on the control signal do not overlap pulses on the phase-shifted control signal.

In step 11506, the input RF I/Q modulated signal is frequency down-converted with a second universal frequency down-conversion module according to the phase-shifted control signal. The input signal is down-converted to a quadrature-phase information signal.

7.2.2.1.1.2 Buffered I/Q Modulation Receiver Embodiment

Exemplary embodiments are provide below for I/Q modulation receiver circuits where control signal pulses may overlap. Such embodiments may provide advantages where it is desirable to modify control signal pulse attributes as described above to solve problems with circuit re-radiation, and other problems. Additional and alternate embodiments will be recognized by persons skilled in the relevant art(s) from the teachings herein, and are within the scope of the present invention.

Figure 99:
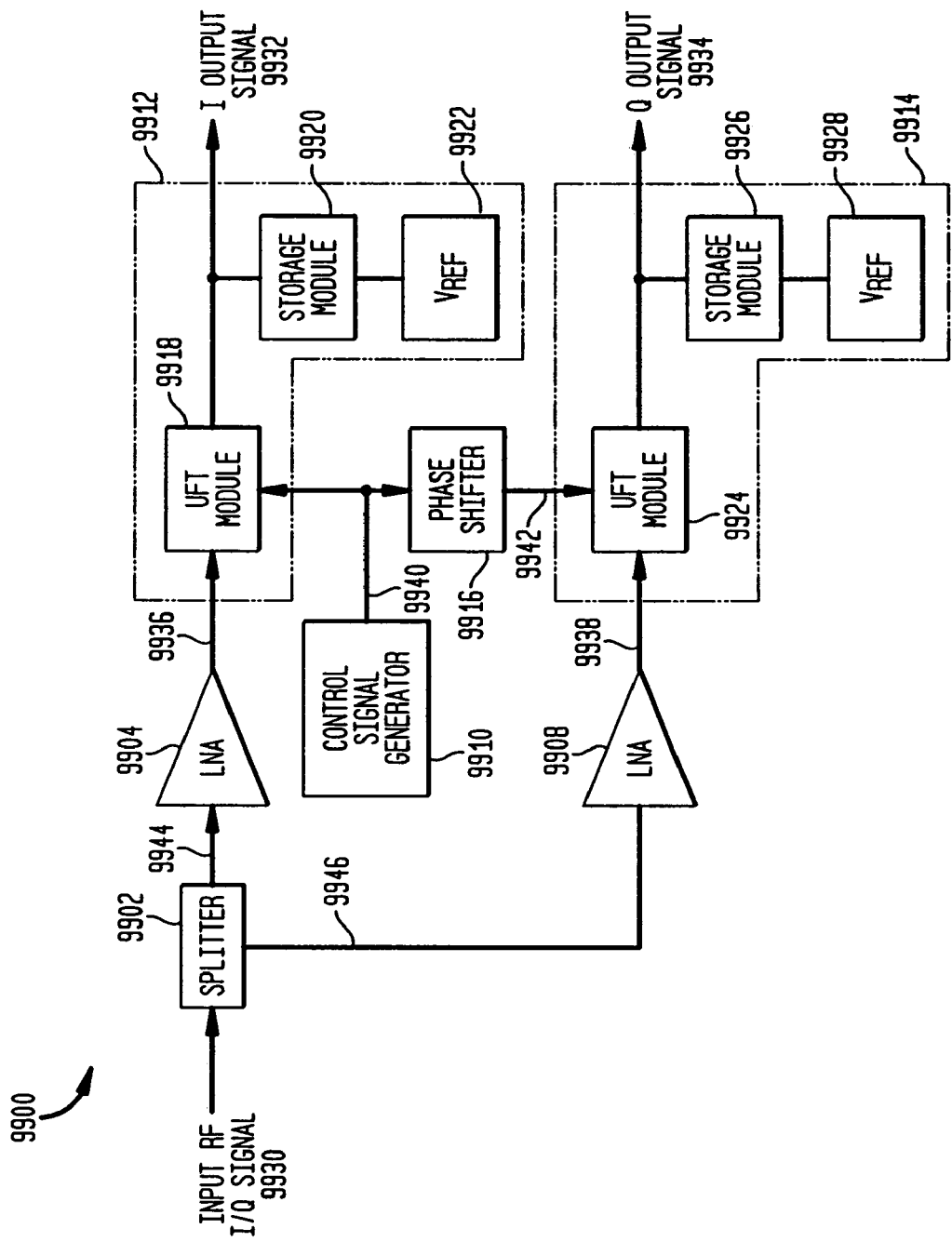

FIG. 99 illustrates an exemplary buffered I/Q modulation receiver circuit 9900, according to an embodiment of the present invention. Buffered I/Q modulation receiver circuit 9900 allows for overlapping I- and Q-control signal pulses such as I-control signal 9802 and Q-control signal 9804 of FIG. 98.

Buffered I/Q modulation receiver circuit 9900 comprises an optional splitter 9902, a first low noise amplifier (LNA) 9904, a second LNA 9908, a control signal generator 9910, a first UFD module 9912, a second UFD module 9914, and a phase shifter 9916. Buffered I/Q modulation receiver circuit 9900 is configured substantially similar to, and operates in a similar fashion to I/Q modulation receiver circuit 9700 of FIG. 97, with the addition of optional splitter 9902, first LNA 9904, and second LNA 9908.

Optional splitter 9902 optionally splits an input RF I/Q signal 9930, and outputs a first split input RF I/Q signal 9944 to first LNA 9904, and a second split input RF I/Q signal 9946 to second LNA 9908.

First LNA 9904 buffers and optionally amplifies first split input RF I/Q signal 9944, and outputs a first buffered input RF I/Q signal 9936.

Second LNA 9908 buffers and optionally amplifies second split input RF I/Q signal 9946, and outputs a second buffered input RF I/Q signal 9938.

First UFD module 9912 receives first buffered input RF I/Q signal 9936. First UFD module 9912 down-converts first buffered input RF I/Q signal 9936 according to a control signal 9940, which is output by control signal generator 9910. First UFD module 9912 outputs I output signal 9932. In an embodiment, first UFD module 9912 comprises a first UFT module 9918, a first storage module 9920, and a first voltage reference 9922.

Phase shifter 9916 receives control signal 9940, and outputs a phase-shifted control signal 9942. Phase-shifted control signal 9942 is preferably shifted by 90 degrees from control signal 9940, but may also be shifted by 270 degrees, 450 degrees, 630 degrees, and so on.

Second UFD module 9914 receives second buffered input RF I/Q signal 9938. Second UFD module 9914 down-converts second buffered input RF I/Q signal 9938 according to phase-shifted control signal 9942. Second UFD module 9914 outputs Q output signal 9934. In an embodiment, second UFD module 9914 comprises a second UFT module 9924, a second storage module 9926, and a second voltage reference 9928.

As described elsewhere herein, when first UFT module 9918 transfers energy from first buffered input RF I/Q signal 9936, first buffered input RF I/Q signal 9936 will be distorted to some degree. Likewise, when second UFT module 9924 transfers energy from second buffered input RF I/Q signal 9938, second buffered input RF I/Q signal 9938 will be distorted to some degree. First and second LNA 9904 and 9908 buffer the input RF I/Q signals entering first and second UFD modules 9912 and 9914 from input RF I/Q signal 9930. Hence, input RF I/Q signal 9930 will not be substantially distorted by energy transfer occurring in either of first and second UFD module 9912 and 9914. Because of this, the I- and Q-control signals used to cause first and second UFD modules 9912 and 9914 to down-convert their respective input RF I/Q signals may have overlapping I- and Q-pulses. Hence, for example, control signal 9940 may appear as I-control signal 9802 of FIG. 98, and phase-shifted control signal 9942 may appear as Q-control signal 9804, phase-shifted by 90 degrees from, and having pulses overlapping with, control signal 9940. It is noted that the invention is not limited to the example of FIG. 99. Other components to buffer or isolate first and second UFT modules 9918, 9924 from each other could alternatively be used.

FIG. 116 depicts a flowchart 11600 that illustrates operational steps corresponding to the structure of FIG. 99, for down-converting an RF I/Q modulated input signal, according to an embodiment of the present invention. The invention is not limited to this operational description. Rather, it will be apparent to persons skilled in the relevant art(s) from the teachings herein that other operational control flows are within the scope and spirit of the present invention. In the following discussion, the steps in FIG. 116 will be described.

In step 11602, an input RF I/Q modulated signal is buffered with a first low noise amplifier and a second low noise amplifier. In an alternative embodiment, instead of or in addition to buffering the input RF I/Q modulated signal as just described, the input RF I/Q modulated signal may be split into a first split RF I/Q modulated signal and a second split RF I/Q modulated signal.

In step 11604, the first buffered (and/or first split) RF I/Q modulated signal is frequency down-converted with a first universal frequency down-conversion module according to a control signal. The input signal is down-converted to an in-phase information signal. The control signal comprises a train of pulses. In an embodiment, the train of pulses are generated to have apertures approximately equal to 180+360·n degrees of a frequency of said input RF I/Q modulated signal, wherein n is any integer greater than or equal to 0.

In step 11606, the control signal is phase-shifted. In embodiments, the control signal is phase-shifted by 90+m·180 degrees of a frequency of said input RF I/Q modulated signal, wherein m is any integer greater than or equal to 0. In embodiments, the control signal may be phase shifted such that pulses on the control signal overlap pulses on the phase-shifted control signal.

In step 11608, the second buffered (and/or second split) RF I/Q modulated signal is frequency down-converted with a second universal frequency down-conversion module according to the phase-shifted control signal. The input signal is down-converted to a quadrature-phase information signal.

7.2.2.2 Reducing Re-radiation with Placebo Down-conversion Modules

FIG. 100 illustrates an exemplary receiver 10000 with placebo circuit 10004, according to an embodiment of the present invention. Receiver 10000 with placebo circuit 10004 reduces or frequency shifts potentially re-radiated control signal components such that their potentially adverse impact on a down-converted signal is reduced. The potentially re-radiated control signal components may be shifted out of the frequency bands of interest, such that they will have a reduced adverse impact on the down-converted signal.

Control signal frequency components may be adjusted or shifted through the use of one or more UFT modules, called "placebo" UFT modules, and one or more corresponding "placebo" control signals. In a placebo embodiment, an "actual" UFT module receives and down-converts a received RF input signal with an "actual" control signal as described elsewhere herein. Furthermore, a placebo UFT module receives a placebo control signal, and may also down-convert the received RF input signal, to output a down-converted signal. The actual control signal and one or more placebo control signals may cause circuit re-radiation. This resulting circuit re-radiation will be related to a combination of the actual control signal waveform and the one or more placebo control signal waveforms. Hence, attributes of the resulting circuit re-radiation may be manipulated by using various placebo control signal waveforms, to cause overall circuit re-radiation to be less harmful to circuit performance. Characteristics of a particular placebo control signal waveform may be determined on an application-by-application basis. The term "placebo" is used because the signal down-converted by the placebo circuitry is not necessarily used by subsequent signal processing hardware and software, but may actually remain unutilized. The signal down-converted by the "actual" circuitry is used by subsequent signal processing.

Receiver 10000 with placebo circuit 10004 comprises an actual UFD module 10002, a placebo UFD module 10004, a control signal generator 10006, and a phase shifter 10008.

Actual UFD module 10002 receives an input RF signal 10022. Actual UFD module 10002 down-converts actual input RF signal 10022 according to a control signal 10028, which is output by control signal generator 10006, in a manner as described elsewhere herein. Actual UFD module 10002 outputs an actual output signal 10024. In an embodiment, actual UFD module 10002 comprises an actual UFT module 10010, an actual storage module 10012, and an actual voltage reference 10014.

Phase shifter 10008 receives control signal 10028, and outputs a phase-shifted placebo control signal 10030. Phase-shifted placebo control signal 10030 is preferably shifted such that pulses on phase-shied placebo control signal 10030 do not overlap with pulses on control signal 10028. In other embodiments, pulses on phase-shifted placebo control signal 10030 may overlap pulses on control signal 10028, as would be understood by persons skilled in the relevant art(s) from the teachings herein.

Placebo UFD module 10004 receives input RF signal 10022. Placebo UFD module 10004 down-converts input RF signal 10022 according to phase-shifted placebo control signal 10030. Placebo UFD module 10004 outputs placebo output signal 10026. In an embodiment, placebo UFD module 10004 comprises a placebo UFT module 10016, a placebo storage module 10018, and a placebo voltage reference 10020.

FIG. 101 shows an exemplary control signal waveform 10102, and a corresponding exemplary placebo control signal waveform 10104 that is a delayed (or phase-shifted) version of control signal waveform 10102. Control signal 10028 may comprise a control signal waveform such as control signal waveform 10102. Phase-shifted placebo control signal 10030 may comprise a corresponding control signal waveform such as placebo control signal waveform 10104.

In a receiver circuit embodiment that does not include a placebo UFD module 10004, potential circuit re-radiation (and the frequency spectrum of such radiation) will be related to the control signal waveform being used, such as control signal waveform 10102. In a receiver circuit embodiment that includes a placebo UFD module 10004, the potential circuit re-radiation (and the frequency spectrum of such re-radiation) will be related to the control signal being used, such as control signal waveform 10102, and the placebo control signal waveform being used, such as placebo control signal waveform 10104.

FIG. 101 shows a combined signal waveform 10106 that represents a combination of control signal waveform 10102 and placebo control signal waveform 10104. The potential circuit re-radiation (and the frequency spectrum thereof) due to control signal waveform 10102 and placebo control signal waveform 10104 will be related to combined signal waveform 10106 (and the frequency spectrum thereof). As would be apparent to persons skilled in the relevant art(s), combined signal waveform 10106 has a different frequency spectrum than control signal waveform 10102. By utilizing at least one placebo control signal in addition to an actual control signal, a potentially re-radiated frequency spectrum can be adjusted to move potentially harmful circuit noise and potentially resulting DC offset and/or re-radiated components to a non-critical frequency band in output signal 10024.

Furthermore, as shown in FIG. 101, placebo control signal waveform 10104 may be phase-shifted by lesser or greater amounts from control signal waveform 10102. Arrows 10108, 10110, 10112, and 10114 indicate possible variations in the phase of placebo control signal waveform 10104, with the corresponding variations in combined signal waveform 10106 indicated by arrows 10116, 10118, 10120, and 10122. By changing the phase of placebo control signal waveform 10104 in relation to control signal waveform 10102, the frequency spectrum of potential re-radiation may be adjusted. Furthermore, changes in the amplitude and/or width of pulses on placebo control signal waveform 10104 may also be used to adjust the frequency spectrum and amplitude of potential re-radiation.

In embodiments, placebo output signal 10026 is not used in down-stream information signal processing. In alternative embodiments, placebo output signal 10026 may be used in down-stream information signal processing.

FIG. 117 depicts a flowchart 11700 that illustrates operational steps corresponding to the structure of FIG. 100 and waveforms of FIG. 101, for down-converting an input signal and altering circuit re-radiation, according to an embodiment of the present invention. The invention is not limited to this operational description. Rather, it will be apparent to persons skilled in the relevant art(s) from the teachings herein that other operational control flows are within the scope and spirit of the present invention. In the following discussion, the steps in FIG. 117 will be described.

In step 11702, an input signal is frequency down-converted with a first universal frequency down-conversion module to a first down-converted signal, wherein the input signal is down-converted according to a control signal, wherein the control signal comprises a train of pulses, wherein pulses of the control signal occur every 360+360·n degrees of a frequency of the input signal, wherein n is equal to any integer greater or equal 0.

In step 11704, the control signal is phase-shifted, wherein the control signal is phase shifted in a range between 0 degrees and 360+360·n degrees of a frequency of the input signal (pulses of control signal and phase-shifted control signal may overlap). In alternative embodiments, the pulses are of width m degrees, and the control signal is phase-shifted in a range between degrees and 360−m+360·n degrees of a frequency of the input signal (no overlap of pulses between control signal and phase-shifted control signal). In embodiments, the control signal is phase shifted to a phase-shifted control signal in order to adjust at least one frequency of the re-radiated signal. In further embodiments, the control signal is phase shifted to a phase-shifted control signal in order to adjust at least one frequency of the re-radiated signal to be above a frequency range of interest of the input signal.

In step 11706, the input signal is frequency down-converted with a second universal frequency down-conversion module to a second down-converted signal, wherein the input signal is down-converted according to the phase-shifted control signal. The second universal frequency down-conversion module is used as a placebo universal frequency down-conversion module.

In step 11708, a signal is re-radiated that is at least a function of the control signal and the phase-shifted control signal.

Exemplary receiver with placebo circuit embodiments are described above. However, it should be understood that these examples are provided for illustrative purposes only. The invention is not limited to these embodiments. Alternate embodiments (including equivalents, extensions, variations, deviations, etc., of the embodiments described herein) will be apparent to persons skilled in the relevant art(s) based on the teachings contained herein. For example, further placebo UFD modules with additional placebo control signals may be added. The invention is intended and adapted to include such alternate embodiments.

7.2.2.3 Reducing Re-radiation with Adjacent Apertures

Potential control signal circuit re-radiation may be reduced or eliminated by the use of adjacent control signal pulses or apertures. By creating control signal pulses that are adjacent, the rising and falling edges of adjacent pulses may partially or entirely cancel out any re-radiation due to the individual pulses.

Figure 102:
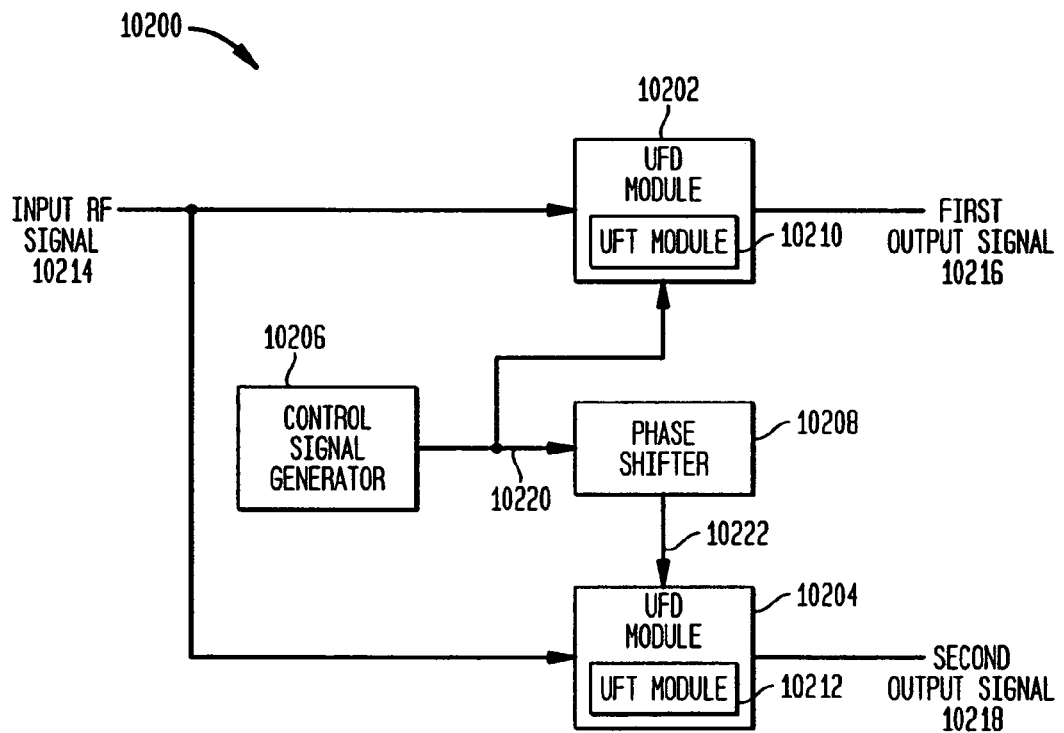

FIG. 102 illustrates an adjacent apertures receiver circuit 10200, according to an embodiment of the present invention. Adjacent apertures receiver circuit 10200 comprises a first UFD module 10202, a second UFD module 10204, a control signal generator 10206, and a phase shifter 10208.

An input RF signal 10214 is received by first UFD module 10202. First UFD module 10202 down-converts input RF signal 10214 according to a control signal 10220, which is output by control signal generator 10206, in a manner as described elsewhere herein. First UFD module 10202 outputs first output signal 10216. First UFD module 10202 comprises a first UFT module 10210.

Phase shifter 10208 receives control signal 10220, and outputs a phase-shifted control signal 10222. In an embodiment, the width of pulses on control signal 10220 and on phase-shifted control signal 10222 approach $\pi$ radians, although other values could be used. Phase-shifted control signal 10222 is preferably shifted by $\pi$ radians from control signal 10220, although other values could be used.

Input RF signal 10214 is received by second UFD module 10204. Second UFD module 10204 down-converts input RF signal 10214 according to phase-shifted control signal 10222, in a manner as described elsewhere herein. Second UFD module 10204 outputs second output signal 10218. Second UFD module 10204 comprises a second UFT module 10212.

Figure 103:
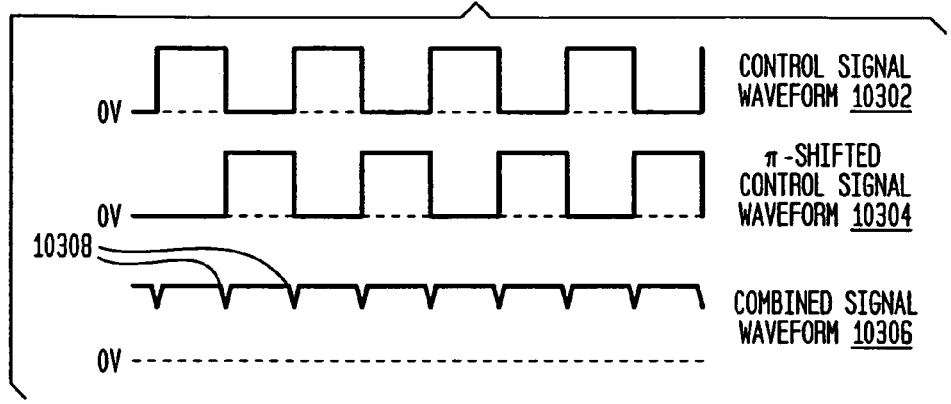

FIG. 103 shows an exemplary control signal waveform 10302, and a corresponding $\pi$-shifted control signal waveform 10304. The potentially re-radiated signals (and their associated frequency spectrums) due to control signal 10220 and phase-shifted control signal 10222 will be related to their waveforms and frequency spectrums, which may be represented by control signal waveform 10302 and $\pi$-shifted control signal waveform 10304, respectively, for example.

Because the width of pulses on control signal waveform 10302 and $\pi$-shifted control signal waveform 10304 are equal to or less than $\pi$ radians, their combined potentially re-radiated signal will be related to combined signal waveform 10306. As control signal waveform 10302 and $\pi$-shifted control signal waveform 10306 approach having pulse widths equal to $\pi$ radians, combined signal waveform 10306 will approach the equivalent of a DC level, with a voltage level substantially equivalent to the pulse amplitudes. In other words, combined signal waveform 10306 will approach a DC level because as pulses of waveforms 10302 and 10304 approach a width of $\pi$, the rising and falling edges of the waveforms 10302 and 10304 will increasingly cancel each other.

The use of adjacent apertures may lead to reduced levels of circuit re-radiation, and improved circuit performance. Re-radiated signal components will be due to combined signal waveform 10306. Specifically, re-radiated signal components will be due to transitions from low to high and high to low in waveform 10306, shown as spikes 10308, but the frequency content of such re-radiated signal components due to spikes 10308 will primarily be above the frequency bands of interest.

FIG. 118A depicts a flowchart 11800 that illustrates operational steps corresponding to the structure of FIG. 102 and waveforms of FIG. 103, for down-converting an input signal and altering circuit re-radiation, according to an embodiment of the present invention. The invention is not limited to this operational description. Rather, it will be apparent to persons skilled in the relevant art(s) from the teachings herein that other operational control flows are within the scope and spirit of the present invention. In the following discussion, the steps in FIG. 118A will be described.

In step 11802, an input signal is frequency down-converted with a first universal frequency down-conversion module to a first down-converted signal, wherein the input signal is down-converted according to a control signal, wherein the control signal comprises a train of pulses, wherein the pulses have widths less than or equal to 180+360·n degrees of a frequency of the input signal, wherein n is any integer greater than or equal to 0.

In step 11804, the control signal is phase shifted, wherein the control signal is phase-shifted by 180+360·n degrees of a frequency of the input signal. In an embodiment, the pulses of the control signal are substantially adjacent to pulses of the phase-shifted control signal.

In step 11806, the input signal is frequency down-converted with a second universal frequency down-conversion module to a second down-converted signal, wherein the input signal is down-converted according to the phase-shifted control signal.

In step 11808, a signal is re-radiated that is at least a function of the control signal and the phase-shifted control signal. In an embodiment, a spike is formed in the re-radiated signal at a transition of the adjacent pulses of the control signal and the phase-shifted control signal. In an embodiment, a voltage amplitude of the spike approaches zero as the pulses of the control signal and the pulses of the phase-shifted control signal approach 180+360·n degrees in width (i.e., the pulses become more adjacent). In an embodiment, at least one frequency of the spike is above a frequency range of interest of the input signal. In embodiments, as the pulse widths approach 180+360·n degrees of a frequency of the input signal, the re-radiated signal approaches a DC level.

Figure 104:
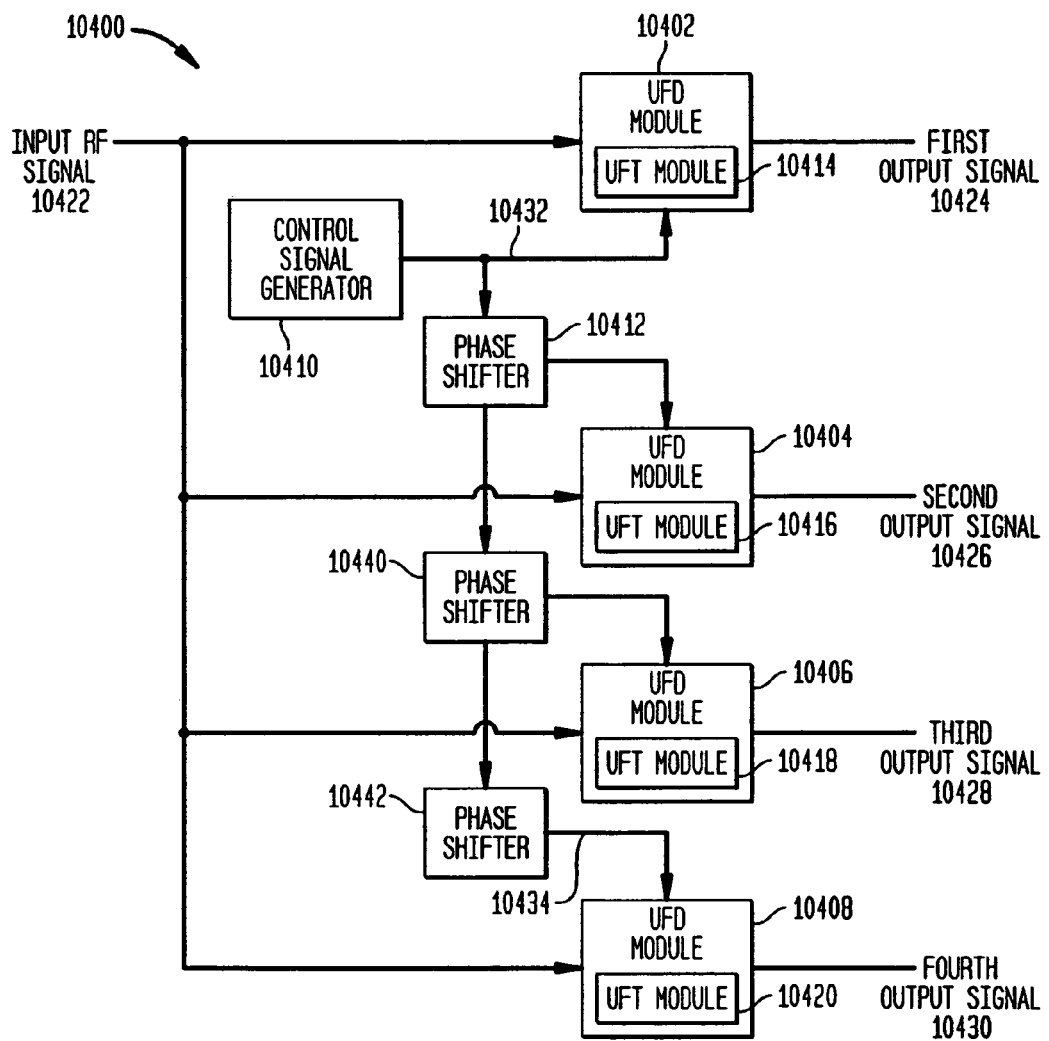

In alternate embodiments, other adjacent control signal pulse configurations may be used. FIG. 104 illustrates an exemplary adjacent apertures receiver circuit 10400, according to an embodiment of the present invention. Circuit 10400 operates substantially similarly to circuit 10200, but produces four control signals instead of two. Control signal generator 10410 outputs control signal 10432, with pulse widths of $\pi$, which occur once every $4\pi$ radians. Circuit 10400 comprises a first phase shifter 10412, a second phase shifter 10440, and a third phase shifter 10442, each of which further shifts the phase of control signal 10432 by $\pi$ radians. In this manner, four adjacent control signal generator pulses, each of pulse width $\pi$ radians, are generated that approach the equivalent of a DC level. Other control signal aperture durations and/or sequences will be apparent to persons skilled in the relevant art(s) based on the teachings contained herein.

Additional control signals may be used to produce even longer strings of adjacent pulses.

Furthermore, the use of adjacent apertures may reduce the need for input impedance matching and tank circuitry. This is because with adjacent apertures, the UFT modules in combination are closed for longer fractions of a control signal cycle and hence, the input signal is being stored more continuously (by a storage module, for example). Because the input signal is being stored more continuously, there is less opportunity or need to store the input signal in one or more input tank circuits during the periods when the UFT modules are open. In other words, more of the energy of the input waveform is being stored and used with adjacent apertures. Furthermore, having the UFT module(s) closed for longer periods of time affects the circuit input impedance, and may alter or decrease the need for input impedance matching.

FIG. 118B depicts a continuation of flowchart 11800 that illustrates additional operational steps to those shown in FIG. 118A corresponding to further adjacent aperture generators, such as shown in FIG. 104, for down-converting an input signal and altering circuit re-radiation, according to an embodiment of the present invention. The invention is not limited to this operational description. Rather, it will be apparent to persons skilled in the relevant art(s) from the teachings herein that other operational control flows are within the scope and spirit of the present invention. In the following discussion, the steps in FIG. 118B will be described.

In step 11810, a phase-shifted control signal is phase shifted to a further phase-shifted control signal. The phase-control signal is phase shifted by the same amount as the prior phase shifter. This causes the current aperture or pulse to be the same width as, and adjacent to, the prior aperture.

In step 11812, the input signal is frequency down-converted with a further universal frequency down-conversion module to a corresponding down-converted signal, wherein the input signal is down-converted according to the further phase-shifted control signal.

In step 11814, a signal is re-radiated that is a function of at least the control signal and the phase-shifted control signals.

In step 11816, operation proceeds to step 11810 if the number of universal frequency down-conversion modules (adjacent apertures) is less than some desired number x. This process forms a chain of adjacent apertures, of a number of pulses x.

Exemplary receives using adjacent apertures embodiments are described above. However, it should be understood that these examples are provided for illustrative purposes only. The invention is not limited to these embodiments. Alternate embodiments (including equivalents, extensions, variations, deviations, etc., of the embodiments described herein) will be apparent to persons skilled in the relevant art(s) based on the teachings contained herein. For example, control signals with pulses of widths other than π radians where the control signals have different pulse widths, may be used. The invention is intended and adapted to include such alternate embodiments.

7.2.3 Additional DC Offset and Re-radiation Reduction Embodiments

Exemplary embodiments for DC Offset and/or re-radiation reduction or cancellation are described above. Such embodiments may be used alone or in combination, based on the application and on implementation issues. It should be understood that these examples are provided for illustrative purposes only. The invention is not limited to these embodiments. Alternate embodiments (including equivalents, extensions, variations, deviations, etc., of the embodiments described herein) will be apparent to persons skilled in the relevant art(s) based on the teachings contained herein. For example, many of the components described herein are optional, whether or not explicitly indicated as such. The invention is intended and adapted to include such alternate embodiments.

7.3 Example Embodiments to Improve Dynamic Range

Receivers, amplifiers, and other electronic circuits, may suffer from problems related to dynamic range. Generally, "dynamic range" refers to the ratio of the maximum to minimum signal input capability over which an amplifier or other component can operate within some specified range of performance. For instance, if an input signal to an amplifier causes the amplifier to exceed its dynamic range, i.e., the input signal amplitude is too large, the amplifier may no longer amplify properly, the amplifier may rail, and/or may operate in a non-linear region. In a receiver, the signal being amplified may be a down-converted signal. If the dynamic range of the amplifier, or other component, is exceeded, the value of the down-converted signal may be adversely affected.

The concept of dynamic range is further described in the following sub-sections. Furthermore, example methods and systems are provided in subsequent sections below for improving dynamic range.

7.3.1 Adjusting Universal Frequency Down-conversion Module Dynamic Range

Some circuit implementations may suffer from a lack of dynamic range. For instance, when input RF signals become too high or too low, they may-cause a switch in a UFT module to remain continuously open or closed, regardless of the level of the control signal. This may result in problems with output signal linearity and output signal clipping, which may lead to errors in decoding the baseband output signal.

Figure 105:
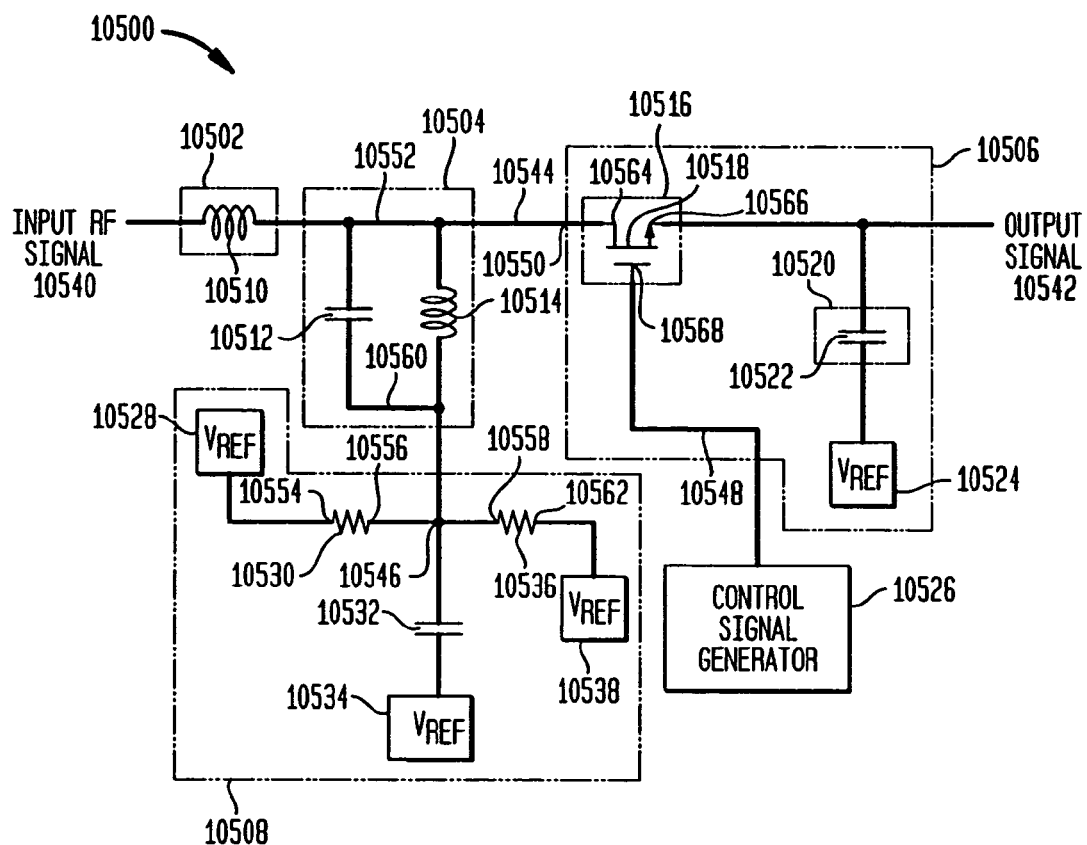

FIG. 105 illustrates an exemplary circuit for improving dynamic range, according to an embodiment of the present invention. Improved dynamic range circuit 10500 of FIG. 105 comprises a impedance match 10502, a tank circuit 10504, a UFD module 10506, and a bias circuit 10508. Bias circuit 10508 is used to adjust the center point of the input voltage range for UFD module 10506, providing for greater input signal range.

In an embodiment, impedance match 10502 comprises an inductor 10510. The operation of the present and of additional embodiments for impedance match 10502 are further described elsewhere herein.

In an embodiment, tank circuit 10504 comprises a capacitor 10512 and an inductor 10514. The operation of the present and of additional embodiments for tank circuit 10504 are further described elsewhere herein.

UFD module 10506 comprises a UFT module 10516, a storage module 10520, and a first voltage reference 10524. The operation of the present and of additional embodiments for UFD module 10506 are further described elsewhere herein. UFT module 10516 comprises a MOSFET switch 10518 in the example embodiment of FIG. 105. Storage module 10520 comprises a capacitor 10522 in the example embodiment of FIG. 105. The structure and operation of the present and of additional embodiments for UFT module 10516 and storage module 10520 are further described elsewhere herein.

An input RF signal 10540 is input through impedance match 10502 to be received by a first terminal 10550 of UFD module 10506. First terminal 10550 of UFD module 10506 is coupled to a first terminal 10552 of tank circuit 10504. MOS- FET switch 10518 in UFD module 10506 down-converts input RF signal 10540 according to a control signal 10548, which is output by control signal generator 10526. The output of MOSFET switch 10518 is stored in storage module 10520. MOSFET switch 10518 outputs an output signal 10542. In the example embodiment of FIG. 105, MOSFET switch 10518 comprises a first terminal 10564 coupled to first terminal 10552 of tank circuit 10504, a second terminal 10566 coupled to output signal 10542, and a third terminal 10568 (gate) coupled to control signal 10548.

Control signal generator 10526 generates control signal 10548, as described elsewhere herein. Control signal 10548 preferably comprises a periodic signal, which preferably comprises a string of pulses. These pulses vary between a minimum and maximum voltage. Far example, control signal 10548 may output pulses that vary between 0 volts and 2 volts, as shown in FIG. 106A.

Input RF signal 10540 also comprises a range of signal values. For instance, input RF signal 10540 may vary between +0.75 volts and −0.75 volts, as shown in FIG. 106B. In the current example, when the value of input RF sign 10540 is equal to −0.75 volts, this value is less than the minimum voltage of control signal 10548 (0 volts) applied to MOSFET switch 10518, and hence MOSFET switch 10518 will be in the closed state for all values of control signal 10518 because the voltage from terminal 10568 (gate) to terminal 10564 of MOSFET switch 10518 is always positive, causing MOSFET switch 10518 to always conduct.

Likewise, it will be recognized by persons skilled in the relevant art(s) that input RF signal 10540 may comprise signal amplitudes greater than the maximum voltage of control signal 10548 (not illustrated in FIGS. 106A and 106B) applied to MOSFET switch 10518. When input RF signal 10540 is equal to such a value, MOSFET switch 10518 will remain in the open state, for all values of control signal 10548, because the voltage from terminal 10568 (gate) to terminal 10564 of MOSFET switch 10518 would always be negative, preventing MOSFET switch 10518 from ever conducting. Both conditions where control signal 10548 cannot effect switching of MOSFET switch 10518 are undesirable.

One solution is to modify the voltage swing of control signal 10548 such that it varies from +0.75 to −0.75 volts or greater, as does input RF signal 10540. This solution may not be possible in all situations, however. For instance, this solution may not be possible when only a single voltage supply is available.

A further solution for this problem is to bias input RF signal 10540 such that it varies within the maximum and minimum voltage range of pulses of control signal 10548. Thus, as long as input RF signal 10540 varies within the voltage range of control signal 10548, control signal 10548 will control the turning on and turning off of MOSFET switch 10518. FIG. 106C shows an example biased input RF signal 10544, that is biased to vary between +1.75 and +0.25 volts, within the range of control signal 10548.

Bias circuit 10508 is used to adjust the bias applied to input RF signal 10540. (It is noted that other bias configurations could alternatively be used.) Bias circuit 10508 comprises a second voltage reference 10528, a first resistor 10530, an optional capacitor 10532, a third voltage reference 10534, a second resistor 10536, and a fourth voltage reference 10538.

A first terminal 10554 of first resistor 10530 is coupled to a first voltage reference 10528. A second terminal 10556 of first resistor 10530 is coupled to a first terminal 10558 of second resistor 10536 to create a bias point 10546. Bias point 10546 is coupled to a second terminal 10560 of tank circuit 10504. A second terminal 10562 of second resistor 10536 is coupled to fourth voltage reference 10538.

First resistor 10530 and second resistor 10536 form a voltage divider circuit, to create bias point 10546, as would be understood by persons skilled in the relevant art(s) from the teachings herein. Bias point 10546 provides a biasing voltage for input RF signal 10540. A biased input RF signal 10544 is equal to input RF signal 10540 adjusted (e.g., added or subtracted) by the amount of voltage at bias point 10546. In a preferred embodiment, biased input RF signal 10544 may be biased at the midpoint of the voltage swing of control signal 10548. For example, biased input RF signal 10544 may be biased by bias point 10546 with a level of one volt, for a 0 volt to 2 volt varying control signal 10548.

Optional capacitor 10532 coupled between bias point 10546 and third voltage reference 10534 may be optionally inserted to aid in stabilizing bias point 10546.

Other embodiments for bias circuit 10508 will be apparent to persons skilled in the relevant art(s) from the teachings herein. For instance, FIG. 107 illustrates an exemplary bias circuit 10708 according to an embodiment of the present invention, wherein a tank circuit 10504 and/or an impedance match circuit 10502 as shown in FIG. 105 are not present. Bias circuit 10708 in FIG. 107 adjusts a bias point for an input to UFD module 10506. Bias circuit 10708 of FIG. 107 places a bias directly on input RF signal 10540, as opposed to bias circuit 10508 of FIG. 105 which applies a bias voltage through tank circuit 10504.

FIG. 119 depicts a flowchart 11900 that illustrates operational steps corresponding to FIGS. 105-107, for improving dynamic range, according to an embodiment of the present invention. The invention is not limited to this operational description. Rather, it will be apparent to persons skilled in the relevant art(s) from the teachings herein that other operational control flows are within the scope and spirit of the present invention. In the following discussion, the steps in FIG. 119 will be described.

In step 11902, a bias voltage is applied to an input signal. In embodiments, the center voltage of the input signal is adjusted by application of the bias voltage. In embodiments, the input signal is coupled to a center terminal of a resistor divider circuit, which supplies the bias voltage. In an embodiment, a tank circuit is used to couple the input signal to the center terminal of the resistor divider circuit.

In step 11904, the biased input signal is frequency down-converted with a first universal frequency down-conversion module to a down-converted signal.

Other embodiments for improving dynamic range include the use of complementary FETs. Complementary FET embodiments are further described in the co-pending U.S. patent application entitled "Method and System for Down-converting Electromagnetic Signals Having Optimized Switch Structures," Ser. No. 09/293,095. Complementary FETs also have the advantage of using control signals of opposite polarity, which tends to reduce or cancel re-radiation due to a control signal.

Other circuit embodiments for improving dynamic range include modifying control signal pulse amplitude, and/or modifying the switch, or FET, size, as would be understood by persons skilled in the relevant art(s) from the teachings herein. It should be understood that the above bias circuit examples are provided for illustrative purposes only. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

7.4 Example Receiver and Transmitter Embodiments for Addressing DC Offset and Re-radiation In this section, embodiments, according to the present invention, are provided for reducing or eliminating DC offset and/or reducing or eliminating circuit re-radiation in receivers, including I/Q modulation receivers and other modulation scheme receivers. These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

7.4.1 Example I/Q Modulation Receiver Embodiments

Figure 25:
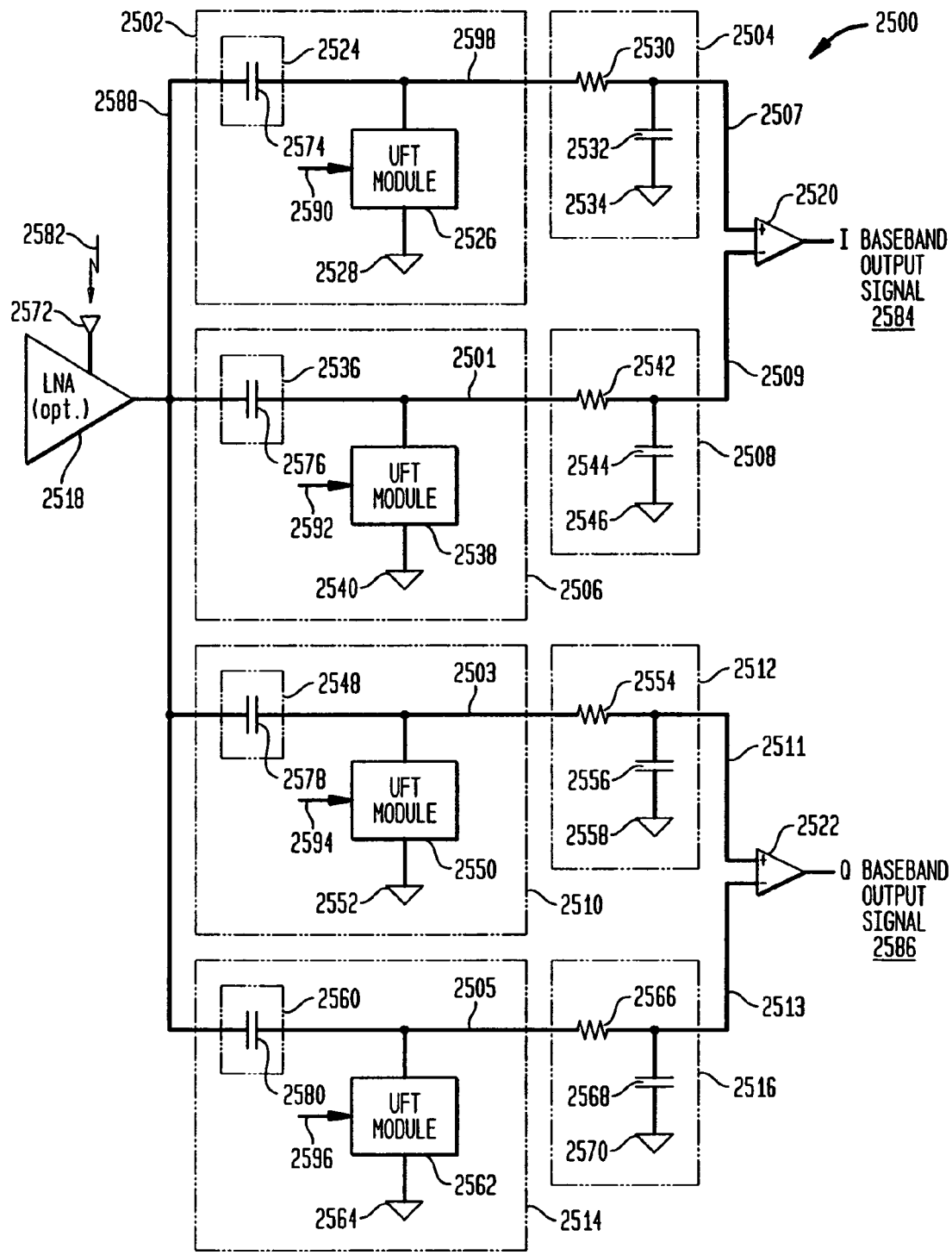
FIG. 25 illustrates an exemplary I/Q modulation receiver, according to an embodiment of the present invention.

FIG. 25 illustrates an exemplary I/Q modulation receiver 2500, according to an embodiment of the present invention. I/Q modulation receiver 2500 has additional advantages of reducing or eliminating unwanted DC offsets and circuit re-radiation.

I/Q modulation receiver 2500 comprises a first UFD module 2502, a first optional filter 2504, a second UFD module 2506, a second optional filter 2508, a third UFD module 2510, a third optional filter 2512, a fourth UFD module 2514, a fourth filter 2516, an optional LNA 2518, a first differential amplifier 2520, a second differential amplifier 2522, and an antenna 2572.

I/Q modulation receiver 2500 receives, down-converts, and demodulates a I/Q modulated RF input signal 2582 to an I baseband output signal 2584, and a Q baseband output signal 2586. I/Q modulated RF input signal comprises a first information signal and a second information signal that are I/Q modulated onto an RF carrier signal I baseband output signal 2584 comprises the first baseband information signal. Q baseband output signal 2586 comprises the second baseband information signal.

Antenna 2572 receives I/Q modulated RF input signal 2582. I/Q modulated RF input signal 2582 is output by antenna 2572 and received by optional LNA 2518. When present, LNA 2518 amplifies I/Q modulated RF input signal 2582, and outputs amplified I/Q signal 2588.

First UFD module 2502 receives amplified I/Q signal 2588. First UFD module 2502 down-converts the I-phase signal portion of amplified input I/Q signal 2588 according to an I control signal 2590. First UFD module 2502 outputs an I output signal 2598.

In an embodiment, first UFD module 2502 comprises a first storage module 2524, a first UFT module 2526, and a first voltage reference 2528. In an embodiment, a switch contained within first UFT module 2526 opens and closes as a function of I control signal 2590. As a result of the opening and closing of this switch, which respectively couples and de-couples first storage module 2524 to and from first voltage reference 2528, a down-converted signal, referred to as I output signal 2598, results. First voltage reference 2528 may be any reference voltage, and is preferably ground. I output signal 2598 is stored by first storage module 2524.

In a preferred embodiment, first storage module 2524 comprises a first capacitor 2574. In addition to storing I output signal 2598, first capacitor 2574 reduces or prevents a DC offset voltage resulting from above described charge injection from appearing on I output signal 2598, in a similar fashion to that of capacitor 9126 shown in FIG. 91. Refer to section 7.2.1.3 above for further discussion on reducing or eliminating charge section wit a series capacitor such as capacitor 9126.

I output signal 2598 is received by optional first filter 2504. When present, first filter 2504 is a high pass filter to at least filter I output signal 2598 to remove any carrier signal "bleed through". In a preferred embodiment, when present, first filter 2504 comprises a first resistor 2530, a first filter capacitor 2532, and a first filter voltage reference 2534. Preferably, first resistor 2530 is coupled between I output signal 2598 and a filtered I output signal 2507, and first filter capacitor 2532 is coupled between filtered I output signal 2507 and first filter voltage reference 2534. Alternately, first filter 2504 may comprise any other applicable filter configuration as would be understood by persons skilled in the relevant art(s). First filter 2504 outputs filtered I output signal 2507.

Second UFD module 2506 receives amplified I/Q signal 2588. Second UFD module 2506 down-converts the inverted I-phase signal portion of amplified input I/Q signal 2588 according to an inverted I control signal 2592. Second UFD module 2506 outputs an inverted I output signal 2501.

In an embodiment, second UFD module 2506 comprises a second storage module 2536, a second UFT module 2538, and a second voltage reference 2540. In an embodiment, a switch contained within second UFT module 2538 opens and closes as a function of inverted I control signal 2592. As a result of the opening and closing of this switch, which respectively couples and de-couples second storage module 2536 to and from second voltage reference 2540, a down-converted signal, referred to as inverted I output signal 2501, results. Second voltage reference 2540 may be any reference voltage, and is preferably ground. Inverted I output signal 2501 is stored by second storage module 2536.

In a preferred embodiment, second storage module 2536 comprises a second capacitor 2576. In addition to storing inverted I output signal 2501, second capacitor 2576 reduces or prevents a DC offset voltage resulting from above described charge injection from appearing on inverted I output signal 2501, in a similar fashion to that of capacitor 9126 shown in FIG. 91. Refer to section 7.2.1.3 above for further discussion on reducing or eliminating charge injection with a series capacitor such as capacitor 9126.

Inverted I output signal 2501 is received by optional second filter 2508. When present second filter 2508 is a highpass filter to at least filter inverted I output signal 2501 to remove any carrier signal "bleed through". In a preferred embodiment, when present, second filter 2508 comprises a second resistor 2542, a second filter capacitor 2544, and a second filter voltage reference 2546. Preferably, second resistor 2542 is coupled between inverted I output signal 2501 and a filtered inverted I output signal 2509, and second filter capacitor 2544 is coupled between filtered inverted I output signal 2509 and second filter voltage reference 2546. Alternately, second filter 2508 may comprise any other applicable filter configuration as would be understood by persons skilled in the relevant art(s). Second filter 2508 outputs filtered inverted I output signal 2509.

First differential amplifier 2520 receives filtered I output signal 2507 at its non-inverting input and receives filtered inverted I output signal 2509 at its inverting input. First differential amplifier 2520 subtracts filtered inverted I output signal 2509 from filtered I output signal 2507, amplifies the result, and outputs I baseband output signal 2584. Other suitable subtractor and/or amplification modules may be substituted for first differential amplifier 2520, and second differential amplifier 2522, as would be understood by persons skilled in the relevant art(s) from the teachings herein. Because filtered inverted I output signal 2509 is substantially equal to an inverted version of filtered I output signal 2507, I baseband output signal 2584 is substantially equal to filtered I output signal 2509, with its amplitude doubled. Furthermore, filtered I output signal 2507 and filtered inverted I output signal 2509 may comprise substantially equal noise and DC offset contributions of the same polarity from prior down-conversion circuitry, including first UFD module 2502 and second UFD module 2506, respectively. When first differential amplifier 2520 subtracts filtered inverted I output signal 2509 from filtered I output signal 2507, these noise and DC offset contributions substantially cancel each other.

Third UFD module 2510 receives amplified I/Q signal 2588. Third UFD module 2510 down-converts the Q-phase signal portion of amplified input I/Q signal 2588 according to an Q control signal 2594. Third UFD module 2510 outputs an Q output signal 2503.

In an embodiment, third UFD module 2510 comprises a third storage module 2548, a third UFT module 2550, and a third voltage reference 2552. In an embodiment, a switch contained within third UFT module 2550 opens and closes as a function of Q control signal 2594. As a result of the opening and closing of this switch, which respectively couples and de-couples third storage module 2548 to and from third voltage reference 2552, a down-converted signal, referred to as Q output signal 2503, results. Third voltage reference 2552 may be any reference voltage, and is preferably ground. Q output signal 2503 is stored by third storage module 2548.

In a preferred embodiment, third storage module 2548 comprises a third capacitor 2578. In addition to storing Q output signal 2503, third capacitor 2578 reduces or prevents a DC offset voltage resulting from above described charge injection from appearing on Q output signal 2503, in a similar fashion to that of capacitor 9126 shown in FIG. 91. Refer to section 7.2.1.3 above for further discussion on reducing or eliminating charge injection with a series capacitor such as capacitor 9126.

Q output signal 2503 is received by optional third filter 2512. When present, third filter 2512 is a high pass filter to at least filter Q output signal 2503 to remove any carrier signal "bleed through". In a preferred embodiment, when present, third filter 2512 comprises a third resistor 2554, a third filter capacitor 2558, and a third filter voltage reference 2558. Preferably, third resistor 2554 is coupled between Q output signal 2503 and a filtered Q output signal 2511, and third filter capacitor 2556 is coupled between filtered Q output signal 2511 and third filter voltage reference 2558. Alternately, third filter 2512 may comprise any other applicable filter configuration as would be understood by persons skilled in the relevant art(s). Third filter 2512 outputs filtered Q output signal 2511.

Fourth UFD module 2514 receives amplified I/Q signal 2588. Fourth UFD module 2514 down-converts the inverted Q-phase signal portion of amplified input I/Q signal 2588 according to an inverted Q control signal 2596. Fourth UFD module 2514 outputs an inverted Q output signal 2505.

In an embodiment, fourth UFD module 2514 comprises a fourth storage module 2560, a fourth UFT module 2562, and a fourth voltage reference 2564. In an embodiment, a switch contained within fourth UFT module 2562 opens and closes as a function of inverted Q control signal 2596. As a result of the opening and closing of this switch, which respectively couples and de-couples fourth storage module 2560 to and from fourth voltage reference 2564, a down-converted signal, referred to as inverted Q output signal 2505, results. Fourth voltage reference 2564 may be any reference voltage, and is preferably ground. Inverted Q output signal 2505 is stored by fourth storage module 2560.

In a preferred embodiment, fourth storage module 2560 comprises a fourth capacitor 2580. In addition to storing inverted Q output signal 2505, fourth capacitor 2580 reduces or prevents a DC offset voltage resulting from above described charge injection from appearing on inverted Q output signal 2505, in a similar fashion to that of capacitor 9126 shown in FIG. 91. Refer to section 7.2.1.3 above for further discussion on reducing or eliminating charge injection with a series capacitor such as capacitor 9126.

Inverted Q output signal 2505 is received by optional fourth filter 2516. When present, fourth filter 2516 is a high pass filter to at least filter inverted Q output signal 2505 to remove any carrier signal "bleed through". In a preferred embodiment, when present, fourth filter 2516 comprises a fourth resistor 2566, a fourth filter capacitor 2568, and a fourth filter voltage reference 2570. Preferably, fourth resistor 2566 is coupled between inverted Q output signal 2505 and a filtered inverted Q output signal 2513, and fourth filter capacitor 2568 is coupled between filtered inverted Q output signal 2513 and fourth filter voltage reference 2570. Alternately, fourth filter 2516 may comprise any other applicable filter configuration as would be understood by persons skilled in the relevant art(s). Fourth filter 2516 outputs filtered inverted Q output signal 2513.

Second differential amplifier 2522 receives filtered Q output signal 2511 at its non-inverting input and receives filtered inverted Q output signal 2513 at its inverting input. Second differential amplifier 2522 subtracts filtered inverted Q output signal 2513 from filtered Q output signal 2511, amplifies the result, and outputs Q baseband output signal 2586. Because filtered inverted Q output signal 2513 is substantially equal to an inverted version of filtered Q output signal 2511, Q baseband output signal 2586 is substantially equal to filtered Q output signal 2513, with its amplitude doubled. Furthermore, filtered Q output signal 2511 and filtered inverted Q output signal 2513 may comprise substantially equal noise and DC offset contributions of the same polarity from prior down-conversion circuitry, including third UFD module 2510 and fourth UFD module 2514, respectively. When second differential amplifier 2522 subtracts filtered inverted Q output signal 2513 from filtered Q output signal 2511, these noise and DC offset contributions substantially cancel each other.

FIG. 120 depicts a flowchart 12000 that illustrates operational steps corresponding to FIG. 25, for down-converting a RF I/Q modulated signal and reducing DC offset voltages, according to an embodiment of the present invention. The invention is not limited to this operational description. Rather, it will be apparent to persons skilled in the relevant art(s) from the teachings herein that other operational control flows are within the scope and spirit of the present invention. In the following discussion, the steps in FIG. 120 will be described.

In step 12002, an input signal is received, wherein the input signal comprises an RF I/Q modulated signal.

In step 12004, the input signal is frequency down-converted with a first universal frequency down-conversion module to a first down-converted signal, according to a first control signal. In an embodiment, the input signal is frequency down-converted to a non-inverted I-phase signal portion of the RF I/Q modulated signal. For instance, in an embodiment, a first phase of the in-phase signal portion of the RF I/Q modulated signal is under-sampled. In an embodiment, the RF I/Q modulated signal may be under-sampled every 3.0 cycles of a frequency of the RF I/Q modulated signal by the first control signal. Furthermore, in embodiments, a first DC offset voltage in the first down-converted signal is reduced by a capacitor of the first universal frequency down-conversion module.

In step 12006, the input signal is frequency down-converted with a second universal frequency down-conversion module to a second down-converted signal, according to a second control signal. In an embodiment, the input signal is frequency down-converted to an inverted I-phase signal portion of the RF I/Q modulated signal. For instance, in an embodiment, a second phase of the in-phase signal portion of the RF I/Q modulated signal is under-sampled, wherein the second phase of the in-phase signal portion is of an opposite phase to the first phase under-sampled of the in-phase signal portion. The RF I/Q modulated signal may be sampled 1.5 cycles of a frequency of the RF I/Q modulated signal after under-sampling the RF I/Q modulated signal in step 12004, for example. Furthermore, in embodiments, a second DC offset voltage in the second down-converted signal is reduced by a capacitor of the second universal frequency down-conversion module.

In step 12008, the second down-converted signal is subtracted from the first down-converted signal to form a first output signal. In embodiments, a first DC offset voltage in the fire down-converted signal and a second DC offset voltage in the second down-converted signal cancel one another.

In step 12010, the input signal is frequency down-converted with a third universal frequency down-conversion module to a third down-converted signal, according to a third control signal. In an embodiment, the input signal is frequency down-converted to a non-inverted Q-phase signal portion of the RF I/Q modulated signal. For instance, in an embodiment, a third phase of the quadrature-phase signal portion of the RF I/Q modulated signal is under-sampled. The RF I/Q modulated signal may be under-sampled 0.75 cycles of the frequency of the RF I/Q modulated signal after under-sampling of the RF I/Q modulated signal occurs in step 12004, for example. Furthermore, in embodiments, a third DC offset voltage in the third down-converted signal is reduced by a capacitor of the third universal frequency down-conversion module.

In step 12012, the input signal is frequency down-converted with a fourth universal frequency down-conversion module to a fourth down-converted signal, according to a fourth control signal. In an embodiment, the input signal is frequency down-converted to an inverted Q-phase signal portion of the RF I/Q modulated signal. For instance, in an embodiment, a fourth phase of the quadrature-phase signal portion of the RF I/Q modulated signal is under-sampled, wherein the fourth phase of the quadrature-phase signal portion is of an opposite phase to the third phase under-sampled of the quadrature-phase signal portion. In an embodiment, the RF I/Q modulated signal may be sampled 1.5 cycles of the frequency of the RF I/Q modulated signal after under-sampling of the RF I/Q modulated signal occurs in step 12010, for example. Furthermore, in embodiments, a fourth DC offset voltage in the fourth down-converted signal is reduced by a capacitor of fourth universal frequency down-conversion module.

In step 12014, the fourth down-converted signal is subtracted from the third down-converted signal to form a second output signal. In embodiments, a third DC offset voltage in the third down-converted signal and a fourth DC offset voltage in the fourth down-converted signal cancel one another.

In step 12016, a signal is re-radiated that comprises attenuated components of first, second, third, and fourth control signal pulses, wherein the attenuated components of the first, second, third, and fourth control signal pulses form a cumulative frequency, as discussed above.

In step 12018, the first, second, third, and fourth control signal pulses are configured such that the cumulative frequency is greater than a frequency of the input signal, as discussed above.

7.4.1.1 Example I/Q Modulation Control Signal Generator Embodiments

Figure 26:
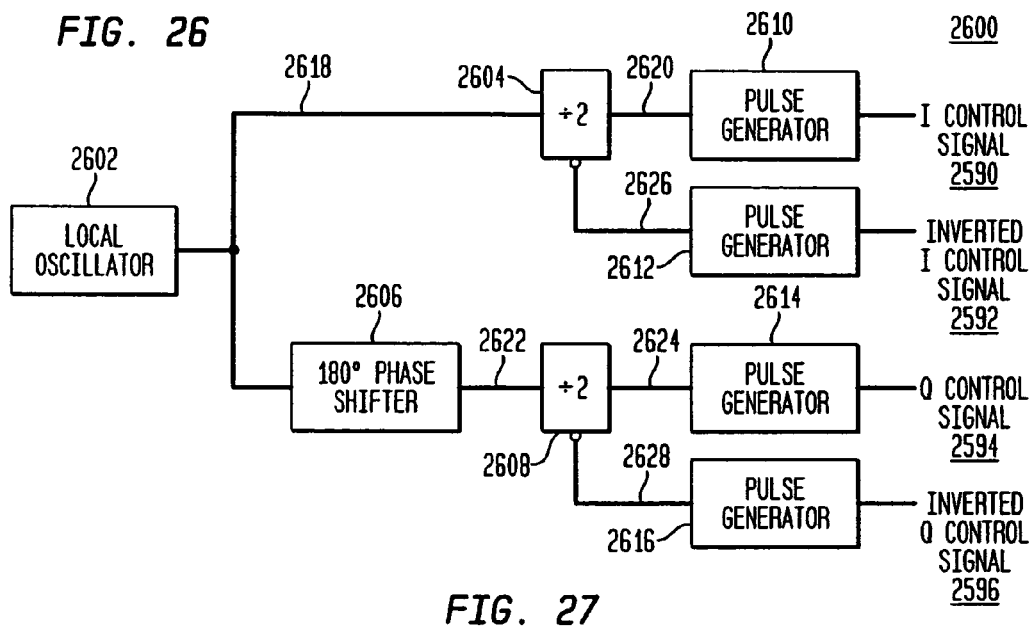
FIG. 26 illustrates a I/Q modulation control signal generator, according to an embodiment of the present invention.

FIG. 26 illustrates an exemplary block diagram for I/Q modulation control signal generator 2600, according to an embodiment of the present invention. I/Q modulation control signal generator 2600 generates I control signal 2590, inverted I control signal 2592, Q control signal 2594, and inverted Q control signal 2596 used by I/Q modulation receiver 2500 of FIG. 25. I control signal 2590 and inverted I control signal 2592 operate to down-convert the I-phase portion of an input I/Q modulated RF signal. Q control signal 2594 and inverted Q control signal 2596 act to down-convert the Q-phase portion of the input I/Q modulated RF signal. Furthermore, I/Q modulation control signal generator 2600 has the advantage of generating control signals in a manner such that resulting collective circuit re-radiation is radiated at one or more frequencies outside of the frequency range of interest. For instance, potential circuit re-radiation is radiated at a frequency substantially greater than that of the input RF carrier signal frequency.

I/Q modulation control signal generator 2600 comprises a local oscillator 2602, a first divide-by-two module 2604, a 180 degree phase shifter 2606, a second divide-by-two module 2608 a first pulse generator 2610, a second pulse generator 2612, a third pulse generator 2614, and a fourth pulse generator 2616.

Figure 27:
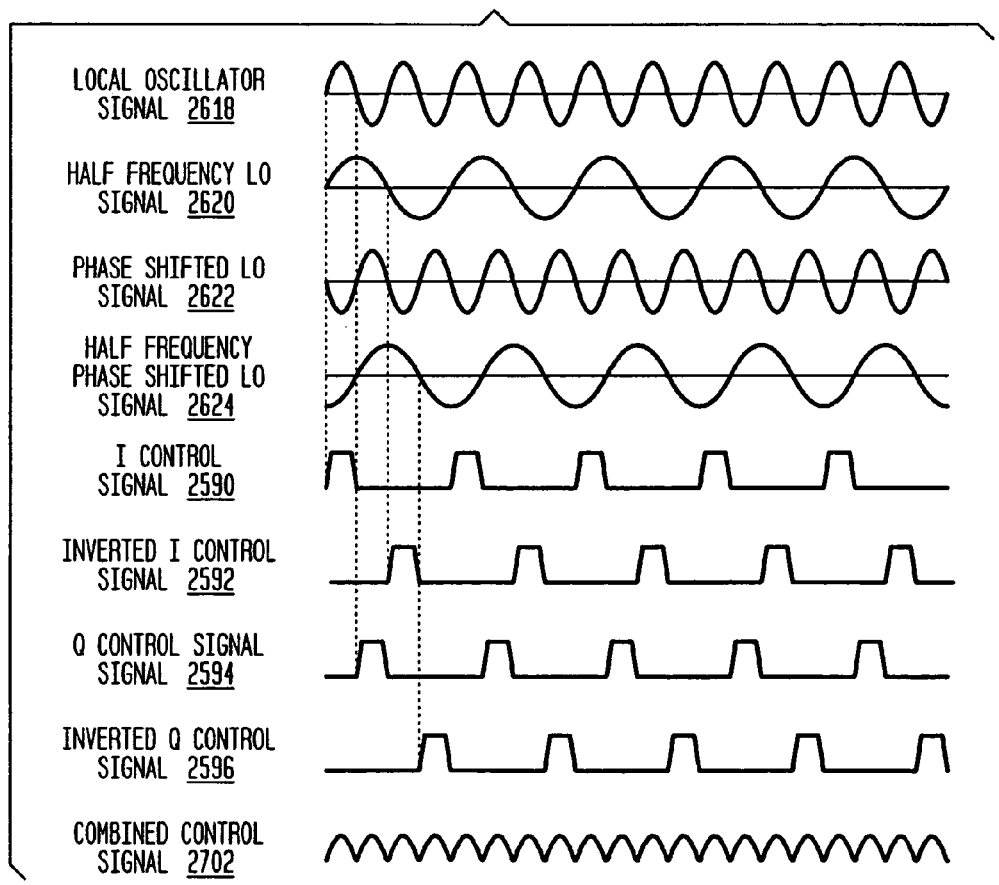
FIG. 27 illustrates example waveforms related to the I/Q modulation control signal generator of FIG. 26.

Local oscillator 2602 outputs an oscillating signal 2618. FIG. 27 shows an exemplary oscillating signal 2618.

First divide-by-two module 2604 receives oscillating signal 2618, divides oscillating signal 2618 by two, and outputs a half frequency LO signal 2620 and a half frequency inverted LO signal 2626. FIG. 27 shows an exemplary half frequency LO signal 2620. Half frequency inverted LO signal 2626 is an inverted version of half frequency LO signal 2620. First divide-by-two module 2604 may be implemented in circuit logic, hardware, software, or any combination thereof, as would be known by persons skilled in the relevant art(s).

180 degree phase shifter 2606 receives oscillating signal 2618, shifts the phase of oscillating signal 2618 by 180 degrees, and outputs phase-shifted LO signal 2622. 180 degree phase shifter 2606 may be implemented in circuit logic, hardware, software, or any combination thereof, as would be known by persons skilled in the relevant art(s). In alternative embodiments, other amounts of phase shift may be used.

Second divide-by two module 2608 receives phase-shifted LO signal 2622, divides phase-shifted LO signal 2622 by two, and outputs a half frequency phase-shifted LO signal 2624 and a half frequency inverted phase-shifted LO signal 2628. FIG. 27 shows an exemplary half frequency phase-shifted LO signal 2624. Half frequency inverted phase-shifted LO signal 2628 is an inverted version of half frequency phase-shifted LO signal 2624. Second divide-by-two module 2608 may be implemented in circuit logic, hardware, software, or any combination thereof, as would be known by persons skilled in the relevant art(s).

First pulse generator 2610 receives half frequency LO signal 2620, generates an output pulse whenever a rising edge is received on half frequency LO signal 2620, and outputs I-control signal 2590. FIG. 27 shows an exemplary I control signal 2590.

Second pulse generator 2612 receives half frequency inverted LO signal 2626, generates an output pulse whenever a rising edge is received on half frequency inverted LO signal 2626, and outputs inverted I control signal 2592. FIG. 27 shows an exemplary inverted I control signal 2592.

Third pulse generator 2614 receives half frequency phase-shifted LO signal 2624, generates an output pulse whenever a rising edge is received on half frequency phase-shifted LO signal 2624, and outputs Q control signal 2594. FIG. 27 shows an exemplary Q control signal 2594.

Fourth pulse generator 2616 receives half frequency inverted phase-shifted LO signal 2628, generates an output pulse whenever a rising edge is received on half frequency inverted phase-shifted LO signal 2628, and outputs inverted Q control signal 2596. FIG. 27 shows an exemplary inverted Q control signal 2596.

In a preferred embodiment, control signals 2590, 2592, 2594 and 2596 output pulses having a width equal to one-half of a period of I/Q modulated RF input signal 2582. The invention, however, is not limited to these pulse widths, and control signals 2590, 2592, 2594, and 2596 may comprise pulse widths of any fraction of, or multiple and fraction of, a period of I/Q modulated RF input signal 2582.

First, second, third, and fourth pulse generators 2610, 2612, 2614, and 2616 may be implemented in circuit logic, hardware, software, or any combination thereof, as would be known by persons skilled in the relevant art(s).

As shown in FIG. 27, control signals 2590, 2592, 2594, and 2596 comprise pulses that are non-overlapping. Furthermore, in this example, pulses appear on these signals in the following order: I control signal 2590, Q control signal 2594, inverted I control signal 2592, and inverted Q control signal 2596. Potential circuit re-radiation from I/Q modulation receiver 2500 may comprise frequency components from a combination of these control signals.

Figure 28:
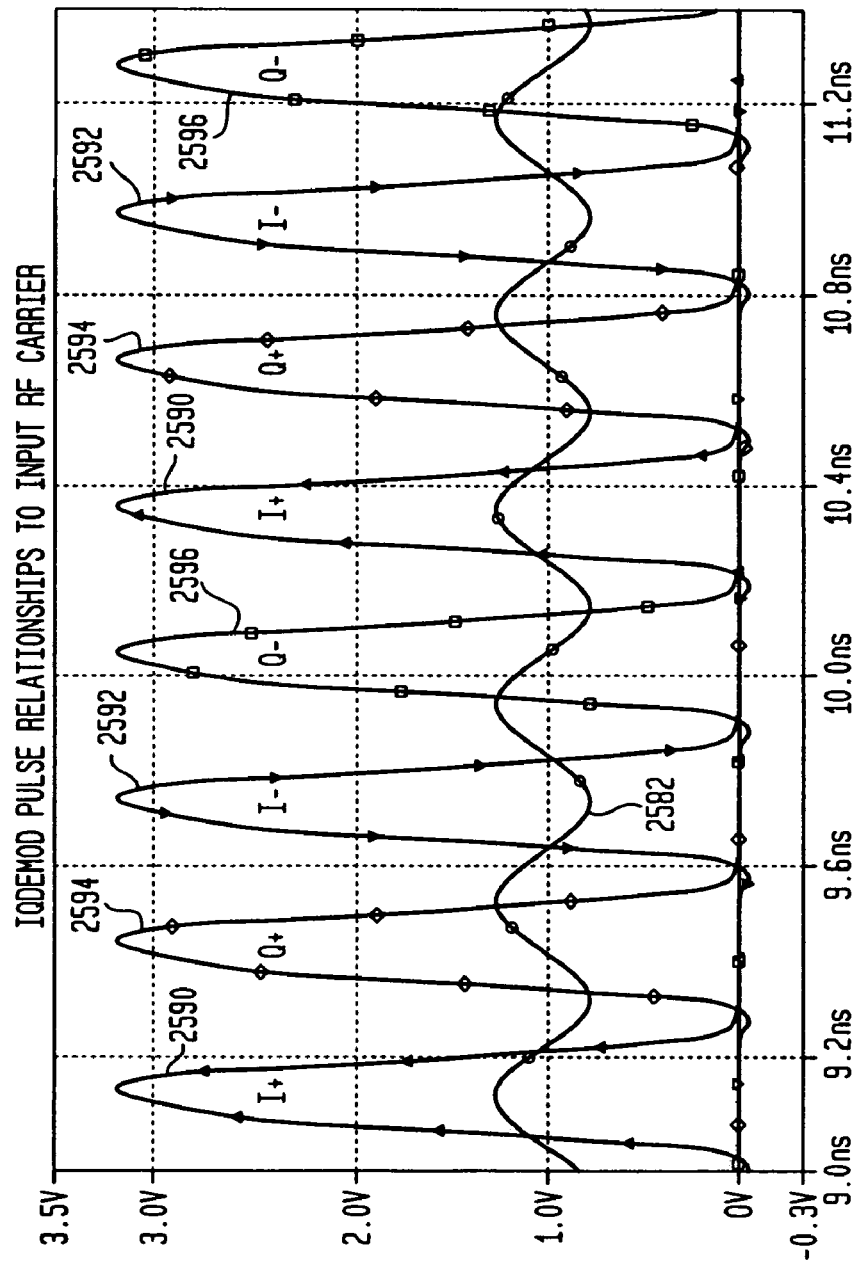
FIG. 28 illustrates example control signal waveforms overlaid upon an input RF signal.

For example, FIG. 28 shows an overlay of pulses from I control signal 2590, Q control signal 2594, inverted I control signal 2592, and inverted Q control signal 2596. When pulses from these control signals leak to through first, second, third, and fourth UFD modules 2502, 2506, 2510, and 2514 of to antenna 2582 (shown in FIG. 25), they may be radiated from I/Q modulation receiver 2500, with a combined waveform that appears to have a primary frequency equal to four times the frequency of any single one of control signals 2590, 2592, 2594, and 2596. FIG. 27 shows an example combined control signal 2702.

FIG. 28 also shows an example I/Q modulation RF input signal 2582 overlaid upon control signals 2590, 2592, 2594, and 2596. As shown in FIG. 28, pulses on I control signal 2590 overlay and act to down-convert a positive I-phase portion of I/Q modulation RF input signal 2582. Pulses on inverted I control signal 2592 overlay and act to down-convert a negative I-phase portion of I/Q modulation RF input signal 2582. Pulses on Q control signal 2594 overlay and act to down-convert a rising Q-phase portion of I/Q modulation RF input signal 2582. Pulses on inverted Q control signal 2596 overlay and act to down-convert a falling Q-phase portion of I/Q modulation RF input signal 2582.

As FIG. 28 further shows in this example, the frequency ratio between the combination of control signals 2590, 2592, 2594, and 2596 and I/Q modulation RF input signal 2582 is 4:3. Because the frequency of the potentially re-radiated signal, combined control signal 2702, is substantially different from that of the signal being down-converted, I/Q modulation RF input signal 2582, it does not interfere with signal down-conversion as it is out of the frequency band of interest, and hence may be filtered out. In this manner, I/Q modulation receiver 2500 reduces problems due to circuit re-radiation. As will be understood by persons skilled in the relevant art(s) from the teachings herein, frequency ratios other than 4:3 may be implemented to achieve similar reduction of problems of circuit re-radiation.

It should be understood that the above control signal generator circuit example is provided for illustrative purposes only. The invention is not limited to these embodiments. Alternative embodiments (including equivalents, extensions, variations, deviations, etc., of the embodiments described herein) for I/Q modulation control signal generator 2600 will be apparent to persons skilled in the relevant art(s) from the teachings herein, and are within the scope of the present invention.

Figure 29:
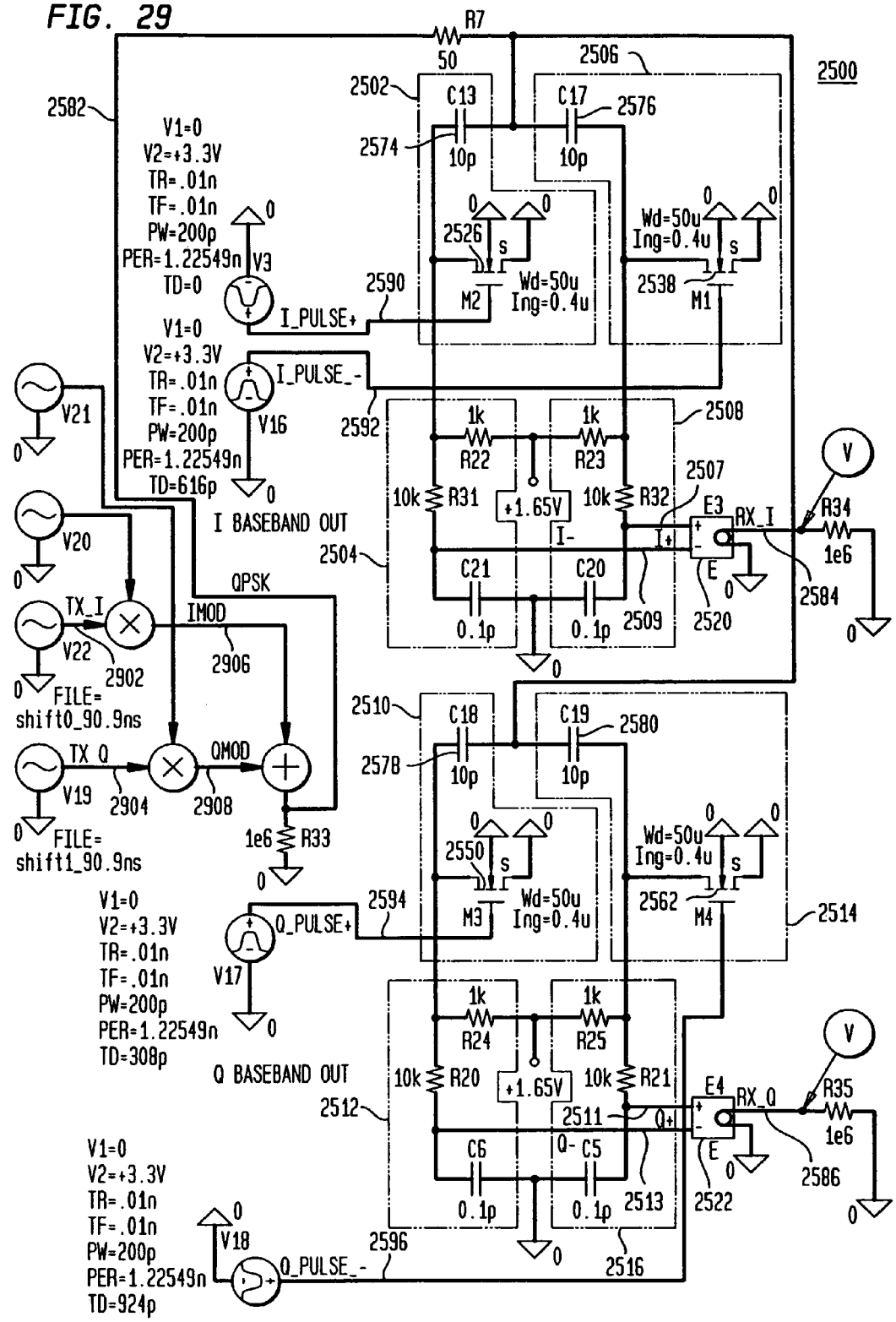
FIG. 29 illustrates a I/Q modulation receiver circuit diagram, according to an embodiment of the present invention.

7.4.1.2 Detailed Example I/Q Modulation Receiver Embodiment with Exemplary Waveforms FIG. 29 illustrates a more detailed example circuit implementation of I/Q modulation receiver 2500, according to an embodiment of the present invention. FIGS. 30-40 show waveforms related to an example implementation of I/Q modulation receiver 2500 of FIG. 29.

Figure 30:
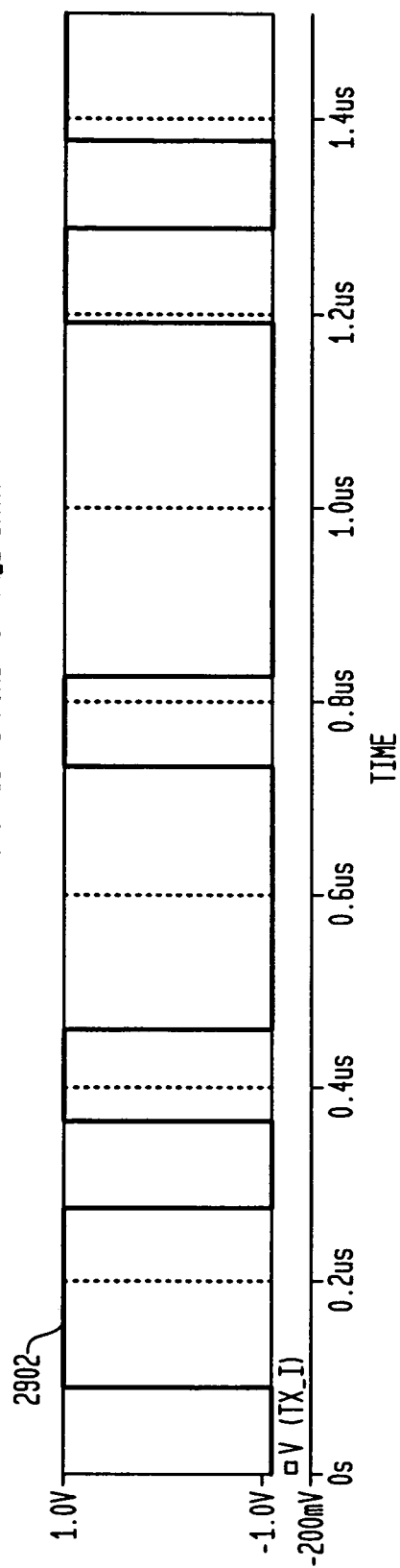
Figure 31:
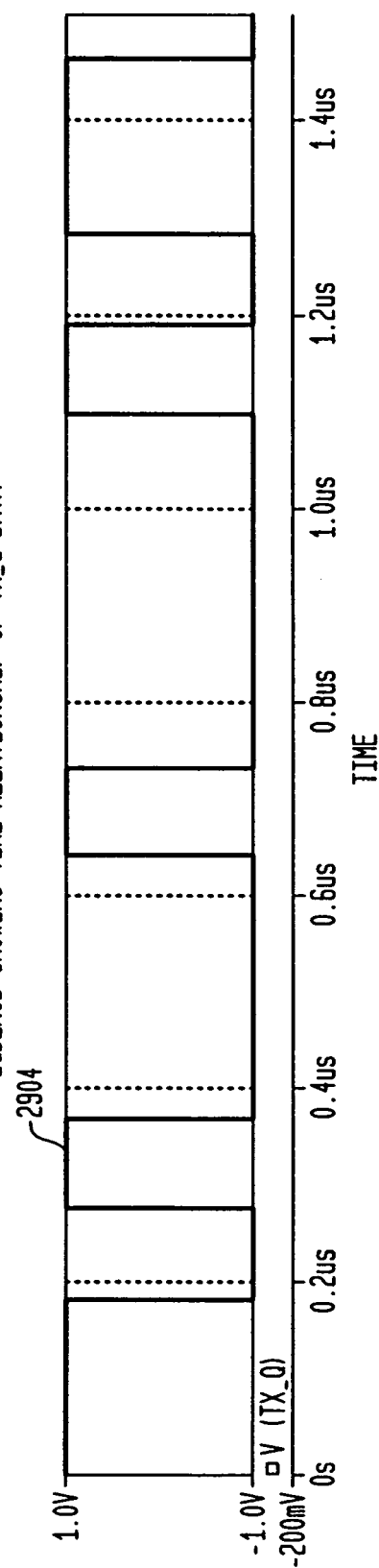

FIGS. 30 and 31 show first and second input data signals 2902 and 2904 to be I/Q modulated with a RF carrier signal frequency as the I-phase and Q-phase information signals, respectively.

FIGS. 33 and 34 show the signals of FIGS. 30 and 31 after modulation with a RF carrier signal frequency, respectively, as I-modulated signal 2906 and Q-modulated signal 2908.

FIG. 32 shows an I/Q modulation RF input signal 2582 formed from I-modulated signal 2906 and Q-modulated signal 2908 of FIGS. 33 and 34, respectively.

FIG. 39 shows an overlaid view of filtered I output signal 3902 and filtered inverted I output signal 3904.

FIG. 40 shows an overlaid view of filtered Q output signal 4002 and filtered inverted Q output signal 4004.

FIGS. 35 and 36 show I baseband Output signal 2584 and Q baseband output signal 2586, respectfully. A data transition 3202 is indicated in both I baseband output signal 2584 and Q baseband output signal 2586. The corresponding data transition 3202 is indicated in I-modulated 2906 of FIG. 33, Q-modulated signal 2908 of FIG. 34, and I/Q modulation RE input signal 2582 of FIG. 32.

FIGS. 37 and 38 show I baseband output signal 2584 and Q baseband output signal 2586 over a wider time interval.

7.4.1.3 Example Single Channel Receiver Embodiment

Figure 41:
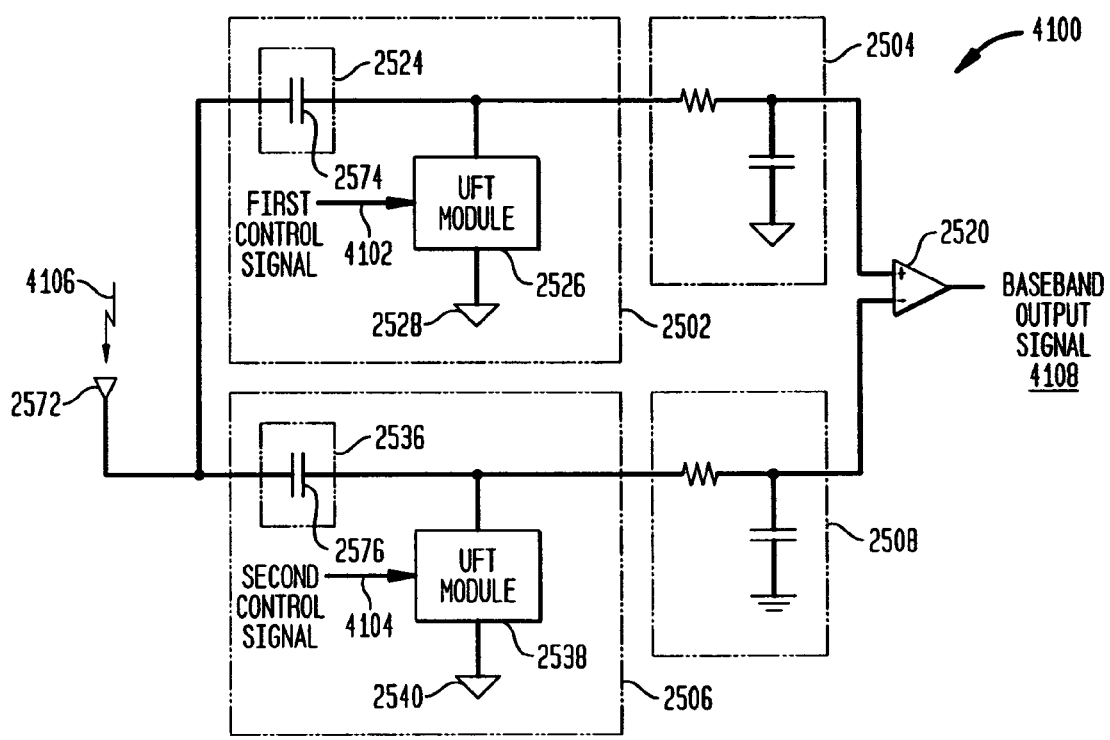
FIG. 41 illustrates a single channel receiver, according to an embodiment of the present invention.

FIG. 41 illustrates an exemplary single channel receiver 4100, corresponding to either the I or Q channel of I/Q modulation receiver 2500, according to an embodiment of the present invention. Single channel receiver 4100 can down-convert an input RF signal 4106 modulated according to AM, PM, FM, and other modulation schemes. Refer to section 7.4.1 above for further description on the operation of single channel receiver 4100.

7.4.1.4 Alternative Example I/Q Modulation Receiver Embodiment

Figure 42:
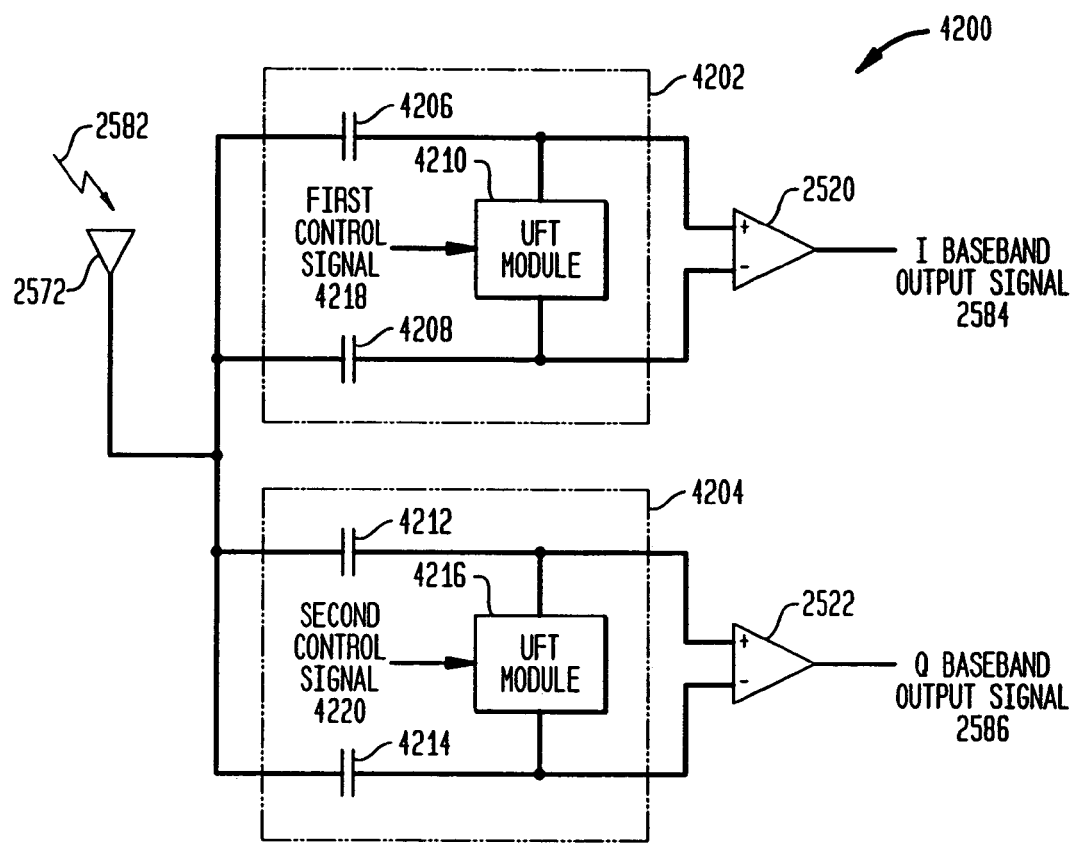
FIG. 42 illustrates an alternative I/Q modulation receiver, according to an embodiment of the present invention.

FIG. 42 illustrates an exemplary I/Q modulation receiver 4200, according to an embodiment of the present invention.

I/Q modulation receiver 4200 receives, down-converts, and demodulates an I/Q modulated RF input signal 2582 to an I baseband output signal 2584, and a Q baseband output signal 2586. I/Q modulation receiver 4200 has additional advantages of reducing or eliminating unwanted DC offsets and circuit re-radiation, in a similar fashion to that of I/Q modulation receiver 2500 described above.

7.4.1.5 Example Transmitter Embodiment

Figure 43:
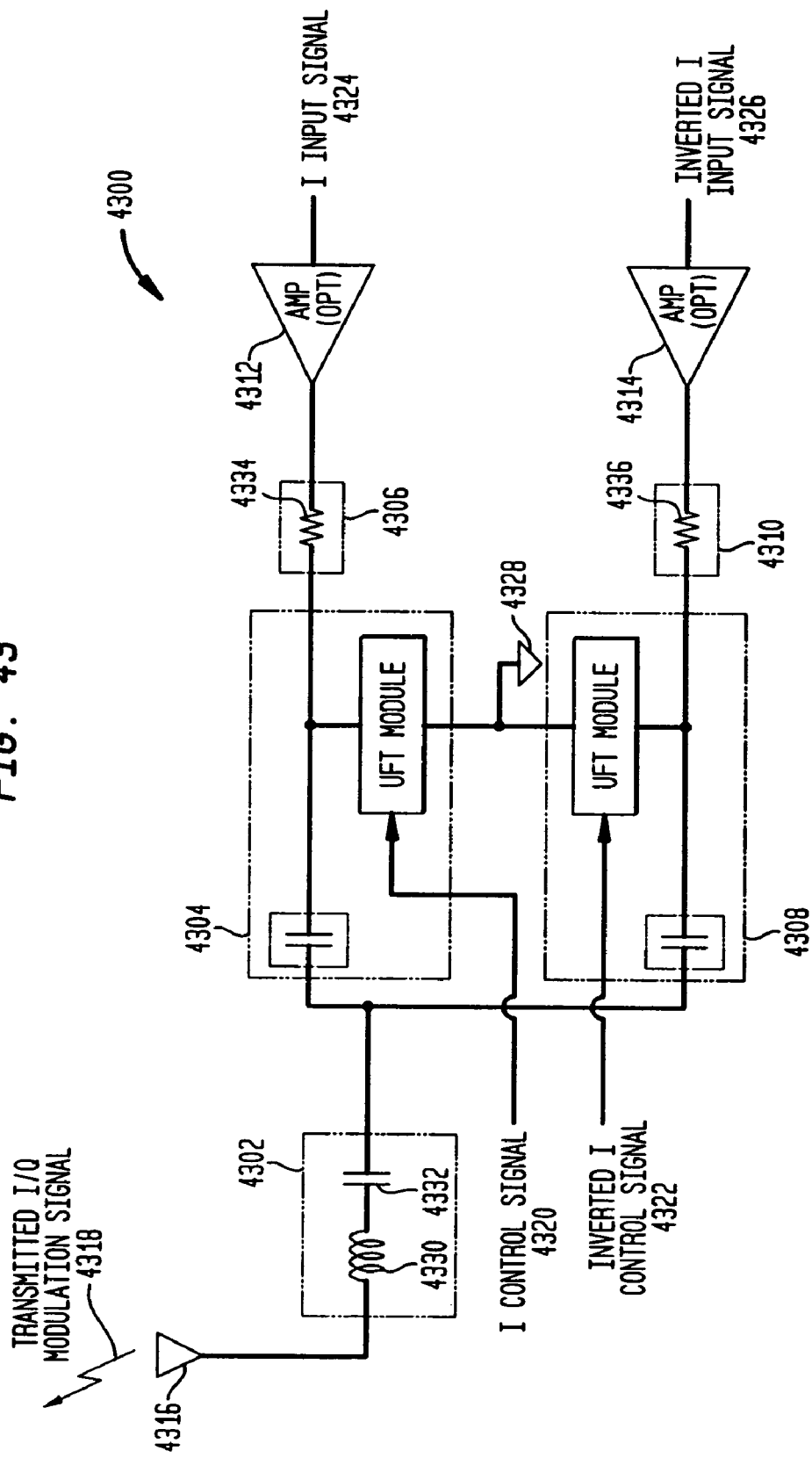
FIG. 43 illustrates an I/Q modulation transmitter, according to an embodiment of the present invention.

FIG. 43 illustrates an exemplary I/Q modulation transmitter 4300 (only I channel is shown), according to an embodiment of the present invention. I/Q modulation transmitter has a configuration substantially similar to I/Q modulation receiver 2500. Hence, an I/Q modulation transmitter 4300 and an I/Q modulation receiver 2500 may be implemented with at least some common circuit components.

I/Q modulation transmitter 4300 comprises an optional first filter 4302, a second optional filter 4306, and a third optional filter 4310. When present, second and third optional filters 4306 and 4310 may comprise first and second resistors 4334 and 4336, respectively. In alternative embodiments, second and third optional filters 4306 and 4310 may comprise inductors, capacitors, and/or other filtering elements, alone or in combination.

8. Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An apparatus for down-converting an input signal, comprising:
   a first frequency down-conversion module that receives an input signal, wherein the first frequency down-conversion module down-converts the input signal according to a first control signal and outputs a first down-converted signal;
   a second frequency down-conversion module that receives the input signal, wherein the second frequency down-conversion module down-converts the input signal according to a second control signal and outputs a second down-converted signal; and
   a combining module that combines the second down-converted signal with the first down-converted signal and outputs a single channel down-converted signal;
   wherein the first frequency down-conversion module comprises a first switch and a first storage element, wherein the first switch is coupled to the first storage element at a first node and coupled to a first reference potential; and
   wherein the second frequency down-conversion module comprises a second switch and a second storage element, wherein the second switch is coupled to the second storage element at a second node and coupled to a second reference potential.

2. The apparatus of claim 1, wherein:
the first switch is coupled in parallel to the input signal; and the second switch is coupled in parallel to the input signal.

3. The apparatus of claim 1, wherein:
the first storage element is coupled in series between the input signal and the first node; and
the second storage element is coupled in series between the input signal and the second node.

4. The apparatus of claim 3, wherein:
the first storage element comprises a first capacitor; and
the second storage element comprises a second capacitor.

5. The apparatus of claim 4, wherein:
the first capacitor reduces a first DC offset voltage in the first down-converted signal; and
the second capacitor reduces a second DC offset voltage in the second down-converted signal;
wherein the first DC offset voltage is at least due to charge injection effects in the first down-conversion module; and
wherein the second DC offset voltage is at least due to charge injection effects in the second down-conversion module.

6. The apparatus of claim 1, wherein:
the first switch under-samples the input signal according to the first control signal; and
the second switch under-samples the input signal according to the second control signal.

7. The apparatus of claim 1, wherein:
the first control signal comprises a first pulse; and
the second control signal comprises a second pulse;
wherein the second pulse is delayed relative to the first pulse by 0.5+n cycles of the input signal, where n is an integer.

8. The apparatus of claim 1, further comprising:
a first amplifier coupled between the input signal and the first frequency down-conversion module; and
a second amplifier coupled between the input signal and the second frequency down-conversion module.

9. The apparatus of claim 1, wherein:
the first reference potential is a first ground potential; and
the second reference potential is a second ground potential.

10. The apparatus of claim 1, further comprising:
a first filter coupled between the first node and a non-inverting input of the combining module; and
a second filter coupled between the second node and an inverting input of the combining module.

11. The apparatus of claim 10, wherein:
the first filter comprises a first low pass filter; and
the second filter comprises a second low pass filter.

12. A method of down-converting an electromagnetic signal, comprising the steps of:
   (1) receiving an input signal;
   (2) frequency down-converting the input signal to a first down-converted signal;
   (3) frequency down-converting the input signal to a second down-converted signal;
   (4) combining the second down-converted signal with the first down-converted signal to form a first output signal;
   (5) frequency down-converting the input signal to a third down-converted signal;
   (6) frequency down-converting the input signal to a fourth down-converted signal; and
   (7) combining the fourth down-converted signal with the third down-converted signal to form a second output signal;

wherein the input signal comprises an in-phase/quadrature-phase (I/Q) modulated signal, and wherein step (2) comprises the step of:
(A) frequency down-converting the input signal to a non-inverted I-phase signal portion of the I/Q modulated signal;

wherein step (3) comprises the step of:
(A) frequency down-converting the input signal to an inverted I-phase signal portion of the I/Q modulated signal;

wherein step (5) comprises the step of:
(A) frequency down-converting the input signal to a non-inverted Q-phase signal portion of the I/Q modulated signal; and wherein step (6) comprises the step of:
(A) frequency down-converting the input signal to an inverted Q-phase signal portion of the I/Q modulated signal.

13. The method of claim 12,
wherein step (2)(A) comprises the step of:
(i) under-sampling a first phase of the in-phase signal portion of the I/Q modulated signal;

wherein step (3)(A) comprises the step of:
(i) under-sampling a second phase of the in-phase signal portion of the I/Q modulated signal, wherein the second phase of the in-phase signal portion is of an opposite phase to the first phase of the in-phase signal portion;

wherein step (5)(A) comprises the step of:
(i) under-sampling a third phase of the quadrature-phase signal portion of the I/Q modulated signal; and wherein step (6)(A) comprises the step of:
(i) under-sampling a fourth phase of the quadrature-phase signal portion of the I/Q modulated signal, wherein the fourth phase of the quadrature-phase signal portion is of an opposite phase to the third phase of the quadrature-phase signal portion.

14. The method of claim 13,
wherein step (3)(A)(i) comprises the step of:
(a) under-sampling the I/Q modulated signal 1.5 cycles of a frequency of the I/Q modulated signal after under-sampling the I/Q modulated signal in step (2)(A)(i);

wherein step (5)(A)(i) comprises the step of:
(a) under-sampling the I/Q modulated signal 0.75 cycles of the frequency of the I/Q modulated signal after under-sampling of the I/Q modulated signal occurs in step (2)(A)(i); and wherein step (6)(A)(i) comprises the step of:
(a) under-sampling the I/Q modulated signal 1.5 cycles of the frequency of the I/Q modulated signal after under-sampling of the I/Q modulated signal occurs in step (5)(A)(i).

15. The method of claim 14, wherein step (2)(A) further comprises the step of:
(ii) under-sampling the I/Q modulated signal 3.0 cycles of the frequency of the I/Q modulated signal after a previous under-sample of the I/Q modulated signal.

16. The method of claim 12, wherein said first down-converted signal is generated using a first down-conversion module, wherein said second down-converted signal is generated using a second down-conversion module, wherein said third down-converted signal is generated using a third down-conversion module, wherein said fourth down-converted signal is generated using a fourth down-conversion module, wherein the first, second, third, and fourth frequency down-conversion modules each comprise a capacitor in series with the input signal, wherein step (2) further comprises the step of:
(B) reducing a first DC offset voltage in the first down-converted signal using the capacitor of the first frequency down-conversion module;

wherein step (3) further comprises the step of:
(B) reducing a second DC offset voltage in the second down-converted signal using the capacitor of the second frequency down-conversion module;

wherein step (5) further comprises the step of:
(B) reducing a third DC offset voltage in the third down-converted signal using the capacitor of the third frequency down-conversion module; and wherein step (6) further comprises the step of:
(B) reducing a fourth DC offset voltage in the fourth down-converted signal using the capacitor of the fourth frequency down-conversion module;

wherein the first, second, third, and fourth DC offset voltages are due to at least charge injection effects in the first, second, third, and fourth frequency down-conversion modules, respectively, from interaction with the first, second, third, and fourth control signals, respectively.

17. A method of down-converting an input signal, comprising:
(1) receiving a radio-frequency (RF) I/Q input signal;
(2) down-converting the RF I/Q signal with a first down-conversion module according to a first energy transfer signal to form a first down-converted signal, wherein down-converting the RF I/Q signal with the first down-conversion module comprises under-sampling the RF I/Q input signal with said first down-conversion module according to the first energy transfer signal, wherein under-sampling the RF I/Q input signal comprises generating the first energy transfer signal, wherein generating the first energy transfer signal comprises generating a first train of pulses that have non-negligible apertures that tend away from zero time in duration, thereby lowering an impedance of the first down-conversion module; and (3) down-converting the RF I/Q signal with a second down-conversion module according to a second energy transfer signal to form a second down-converted signal, wherein down-converting the RF I/Q signal with the second down-conversion module comprises under-sampling the RF I/Q input signal with said second down-conversion module according to the second energy transfer signal, wherein under-sampling the RF I/Q input signal comprises generating the second energy transfer signal, wherein generating the second energy transfer signal comprises generating a second train of pulses that have non-negligible apertures that tend away from zero time in duration, thereby lowering an impedance of the second down-conversion module;

wherein the second energy transfer signal is phase-shifted by 90+m·180 degrees of a frequency of the RF I/Q input signal relative to the first energy transfer signal, wherein m is any integer greater than or equal to 1;

wherein the first down-converted signal comprises an in-phase information signal; and wherein the second down-converted signal comprises a quadrature-phase information signal.

18. The method of claim 17, wherein steps (2) and (3) comprise generating the first and the second train of pulses, respectively, to have apertures approximately equal to 180+ 360 ·n degrees of a frequency of the RF I/Q input signal, wherein n is any integer greater than or equal to 0.

19. The method of claim 18, wherein steps (2) and (3) comprise generating the first and the second train of pulses, respectively, to have non-overlapping pulses with respect to each other.

20. The method of claim 17,
wherein steps (2) and (3) comprise the step of:
(i) transferring non-negligible amounts of energy from the RF I/Q input signal, at a rate that is substantially equal to a harmonic of the RF I/Q input signal, to form the first and the second down-converted signals, respectively.

21. The method of claim 17,
wherein steps (2) and (3) comprise the step of:
(i) transferring non-negligible amounts of energy from the RF I/Q input signal, at a rate that is substantially equal to a sub-harmonic of the RF I/Q input signal, to form the first and the second down-converted signals, respectively.

\* \* \* \* \*

UNITED STATES PATENT AND TRADEMARK OFFICE
CERTIFICATE OF CORRECTION

PATENT NO. : 7,539,474 B2  Page 1 of 1
APPLICATION NO. : 11/059536
DATED : May 26, 2009
INVENTOR(S) : Sorrells et al.

It is certified that error appears in the above-identified patent and that said Letters Patent is hereby corrected as shown below:

Title Page

Title Page, Item (12), Title, please remove, "Sorrels et al." and replace with --Sorrells et al.--.

Title Page, Item (75), Inventors, please remove, "David F. Sorrels" and replace with --David F. Sorrells--.

Signed and Sealed this

Twenty-eighth Day of July, 2009

JOHN DOLL
*Acting Director of the United States Patent and Trademark Office*